(12) United States Patent
Hamasaki et al.

(10) Patent No.: US 12,433,047 B2
(45) Date of Patent: Sep. 30, 2025

(54) PHOTODETECTOR

(71) Applicant: ActLight SA, Lausanne (CH)

(72) Inventors: Takahiro Hamasaki, Kanagawa (JP); Hiroyuki Takashino, Kanagawa (JP); Koji Nagahiro, Kanagawa (JP); Hiroyuki Ohri, Kanagawa (JP); Satoe Miyata, Kanagawa (JP); Takahiro Miura, Kanagawa (JP); Hisao Yoshimura, Tokyo (JP)

(73) Assignee: ActLight SA, Lausanne (CH)

( * ) Notice: Subject to any disclaimer, the term of this patent is extended or adjusted under 35 U.S.C. 154(b) by 565 days.

(21) Appl. No.: 17/624,887

(22) PCT Filed: Mar. 30, 2020

(86) PCT No.: PCT/JP2020/014627
§ 371 (c)(1),
(2) Date: Jan. 5, 2022

(87) PCT Pub. No.: WO2021/009979
PCT Pub. Date: Jan. 21, 2021

(65) Prior Publication Data
US 2022/0278141 A1 Sep. 1, 2022

Related U.S. Application Data

(60) Provisional application No. 62/880,497, filed on Jul. 30, 2019, provisional application No. 62/880,214, (Continued)

(51) Int. Cl.
*H10F 39/00* (2025.01)
*H10F 30/223* (2025.01)
(Continued)

(52) U.S. Cl.
CPC ... *H10F 39/8033* (2025.01); *H10F 39/80373* (2025.01); *H10F 39/807* (2025.01);
(Continued)

(58) Field of Classification Search
CPC .............. H01L 31/105; H01L 27/1461; H01L 27/1463; H10F 39/807; H10F 39/1865; H10D 44/462; G01S 7/4863
See application file for complete search history.

(56) References Cited

U.S. PATENT DOCUMENTS 10,204,950 B1    2/2019  Yamashita
11,183,524 B2 *  11/2021 Sato .................... H10F 39/8037
(Continued)

FOREIGN PATENT DOCUMENTS

CN    102460763 A    5/2012
CN    105849908 A    8/2016
(Continued)

OTHER PUBLICATIONS

International Search Report prepared by the Japan Patent Office on Jun. 1, 2020, for International Application No. PCT/JP2020/014627, 4 pgs.
(Continued)

*Primary Examiner* — Moazzam Hossain
(74) *Attorney, Agent, or Firm* — Wilmer Cutler Pickering Hale and Dorr LLP

(57) ABSTRACT

A photodetector according to an embodiment of the present disclosure including a plurality of photoelectric conversion sections that is provided to a semiconductor substrate. The photoelectric conversion sections each include a first region of a first electrical conduction type that is provided on a first surface side of the semiconductor substrate, a second region of a second electrical conduction type that is provided on a second surface side of the semiconductor substrate opposite
(Continued)

to the first surface, a third region of a third electrical conduction type that is provided in a region between the first region and the second region of the semiconductor substrate, a first electrode that extends from the second surface in a thickness direction of the semiconductor substrate, a pixel separation layer having an insulation property, and a second electrode that is electrically coupled to the second region from the second surface side. The third region absorbs incident light. The first electrode is electrically coupled to the first region on a bottom surface. The pixel separation layer is provided to a side surface of the first electrode.

20 Claims, 148 Drawing Sheets

Related U.S. Application Data filed on Jul. 30, 2019, provisional application No. 62/873,527, filed on Jul. 12, 2019.

(51) Int. Cl.
*H10F 39/12* (2025.01)
*H10F 39/18* (2025.01)

(52) U.S. Cl.
CPC .......... *H10F 30/223* (2025.01); *H10F 39/182* (2025.01); *H10F 39/1865* (2025.01); *H10F 39/199* (2025.01); *H10F 39/809* (2025.01)

(56) References Cited

U.S. PATENT DOCUMENTS

| | | |
|---|---|---|
| 2005/0221541 A1 | 10/2005 | Metzler |
| 2006/0022223 A1 | 2/2006 | Kumesawa |
| 2006/0163618 A1 | 7/2006 | Park |
| 2007/0164387 A1 | 7/2007 | Furuta |
| 2011/0272561 A1 | 11/2011 | Sanfilippo et al. |
| 2012/0126213 A1 | 5/2012 | Gresser |
| 2014/0054662 A1* | 2/2014 | Yanagita .......... H01L 27/14612 438/73 |
| 2014/0319640 A1 | 10/2014 | Major et al. |
| 2015/0145082 A1 | 5/2015 | Lee |
| 2015/0187826 A1 | 7/2015 | Suzuki |
| 2017/0287958 A1 | 10/2017 | Ohri |
| 2019/0103504 A1 | 4/2019 | Yamashita |
| 2019/0157323 A1* | 5/2019 | Ogi ....................... H10F 39/014 |
| 2019/0252442 A1 | 8/2019 | Tanaka et al. |
| 2020/0135776 A1* | 4/2020 | Finkelstein ........... G01S 7/4816 |

FOREIGN PATENT DOCUMENTS

| | | |
|---|---|---|
| CN | 106229323 A | 12/2016 |
| CN | 109155325 A | 1/2019 |
| CN | 110416335 A | 11/2019 |
| JP | H09-331051 | 12/1997 |
| JP | 2006-210919 | 8/2006 |
| JP | 2007-194911 | 8/2007 |
| JP | 2012-527748 | 11/2012 |
| JP | 2016-066766 | 4/2016 |
| JP | 2018-088488 | 6/2018 |
| JP | 2018-190797 | 11/2018 |
| TW | 446196 U | 7/2001 |
| WO | WO 2014/021115 | 2/2014 |
| WO | WO-2018/160721 A1 | 9/2018 |
| WO | WO 2018/167567 | 9/2018 |
| WO | WO 2018/174090 | 9/2018 |

OTHER PUBLICATIONS

Okhonin et al., "A dynamic operation of a PIN photodiode," Applied Physics Letters, vol. 106, No. 031115, Jan. 22, 2015, 6 pages.

* cited by examiner

PHOTODETECTOR

CROSS REFERENCE TO RELATED APPLICATIONS

This application is a national stage application under 35 U.S.C. 371 and claims the benefit of PCT Application No. PCT/JP2020/014627 having an international filing date of 30 Mar. 2020, which designated the United States, which PCT application claimed the benefit of U.S. Provisional Application Nos. 62/873,527 filed 12 Jul. 2019, 62/880,214 filed 30 Jul. 2019 and 62/880,497 filed 30 Jul. 2019, the entire disclosures of each of which are incorporated herein by reference.

TECHNICAL FIELD

The present disclosure relates to a photodetector.

BACKGROUND ART

In recent years, photodetectors have been proposed that are usable for both imaging and sensing applications. Specifically, a photodetector has been proposed that detects the amount of incident light as a dynamic current change or a dynamic voltage change (e.g., PTL 1). Such a photodetector is operable as a photon count sensor, a ToF (Time of Flight) sensor, and the like.

CITATION LIST

Patent Literature

PTL 1: International Publication No. WO 2018/167567

Non-Patent Literature

NPTL 1: Okhonin et al., "A dynamic operation of a PIN photodiode" Applied Physics Letters, (the United States of America), 2015, 106, 031115

SUMMARY OF THE INVENTION

It is desired to study the specific structure of such a photodetector applied to an image sensor or the like. For example, it is desired to study the above-described photodetector applied to a pixel array in which a plurality of pixels is arranged in a matrix.

It is thus desirable to provide the photodetector that makes it possible to increase the detection characteristics of incident light on the pixel array.

A photodetector according to an embodiment of the present disclosure includes a plurality of photoelectric conversion sections that is provided to a semiconductor substrate. The photoelectric conversion sections each include a first region of a first electrical conduction type that is provided on a first surface side of the semiconductor substrate, a second region of a second electrical conduction type that is provided on a second surface side of the semiconductor substrate opposite to the first surface, a third region of a third electrical conduction type that is provided in a region between the first region and the second region of the semiconductor substrate, a first electrode that extends from the second surface in a thickness direction of the semiconductor substrate, a pixel separation layer having an insulation property, and a second electrode that is electrically coupled to the second region from the second surface side. The third region absorbs incident light. The first electrode is electrically coupled to the first region on a bottom surface. The pixel separation layer is provided to a side surface of the first electrode.

A photodetector according to an embodiment of the present disclosure includes: a first region of a first electrical conduction type that is provided on a first surface side of a semiconductor substrate; a second region of a second electrical conduction type that is provided on a second surface side of the semiconductor substrate opposite to the first surface; and a third region of a third electrical conduction type that is provided in a region between the first region and the second region. The third region absorbs incident light. The photodetector according to the present embodiment allows a first electrode to extend from the second surface of the semiconductor substrate in a thickness direction of the semiconductor substrate and be electrically coupled to the first region on a bottom surface and allows a second electrode to be electrically coupled to the second region from the second surface side of the semiconductor substrate. This makes it possible to provide the photodetector according to the present embodiment with the wiring layer that is electrically coupled, for example, to the first electrode or the second electrode on the surface of the semiconductor substrate opposite to the light incidence surface.

BRIEF DESCRIPTION OF DRAWING

FIG. 81B is a plan view of an example of the region in which the pinning layer 741 is formed at the interface between the semiconductor layer including the third region and the buried insulating film.

FIG. 82A is a plan view of an example of the region in which the pinning layer is formed on the front surface side of the electric charge generation layer.

FIG. 82B is a plan view of an example of the region in which the pinning layer is formed on the front surface side of the electric charge generation layer.

FIG. 83A is a plan view of an example of the region in which the pinning layer is formed at the interface between the semiconductor layer including the third region and the buried insulating film.

FIG. 83B is a plan view of an example of the region in which the pinning layer is formed at the interface between the semiconductor layer including the third region and the buried insulating film.

FIG. 84 is a vertical cross-sectional view of a structure of a photodetector according to a fifth structure example.

FIG. 85 is a vertical cross-sectional view of a structure of a photodetector according to a sixth structure example.

FIG. 86 is a vertical cross-sectional view of a structure of a photodetector according to a seventh structure example.

FIG. 87 is a vertical cross-sectional view of a structure of a photodetector according to an eighth structure example.

FIG. 88 is a vertical cross-sectional view of a structure of a photodetector according to a ninth structure example.

FIG. 89 is a vertical cross-sectional view of a structure of a photodetector according to a tenth structure example.

FIG. 90 is a vertical cross-sectional view of a structure of a photodetector according to an eleventh structure example.

Figure 91:
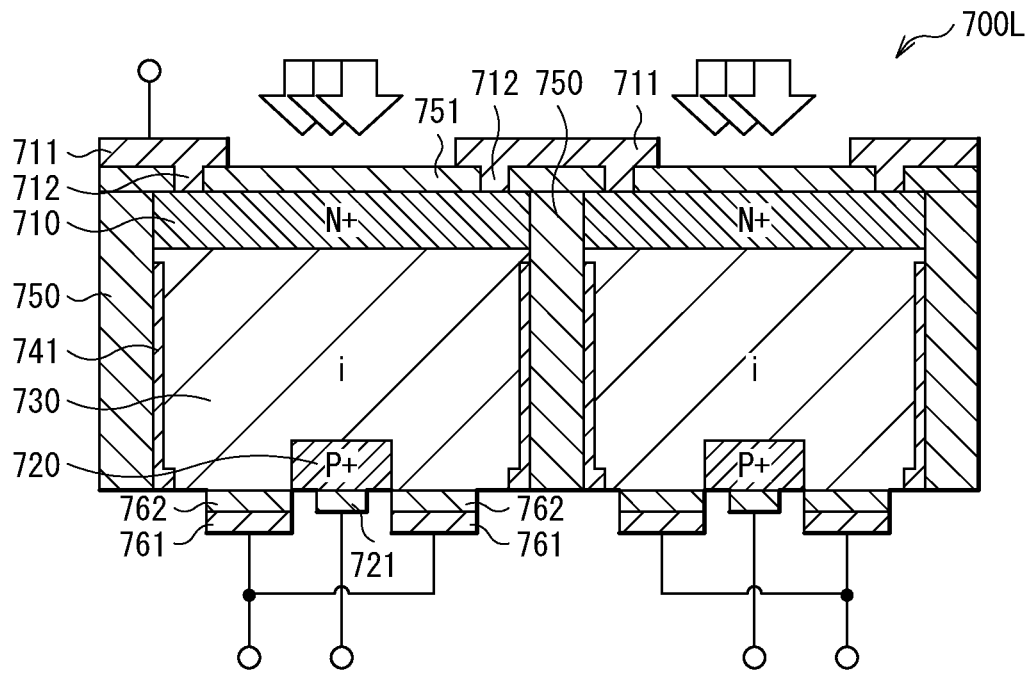

FIG. 91 is a vertical cross-sectional view of a structure of a photodetector according to a twelfth structure example.

Figure 92:
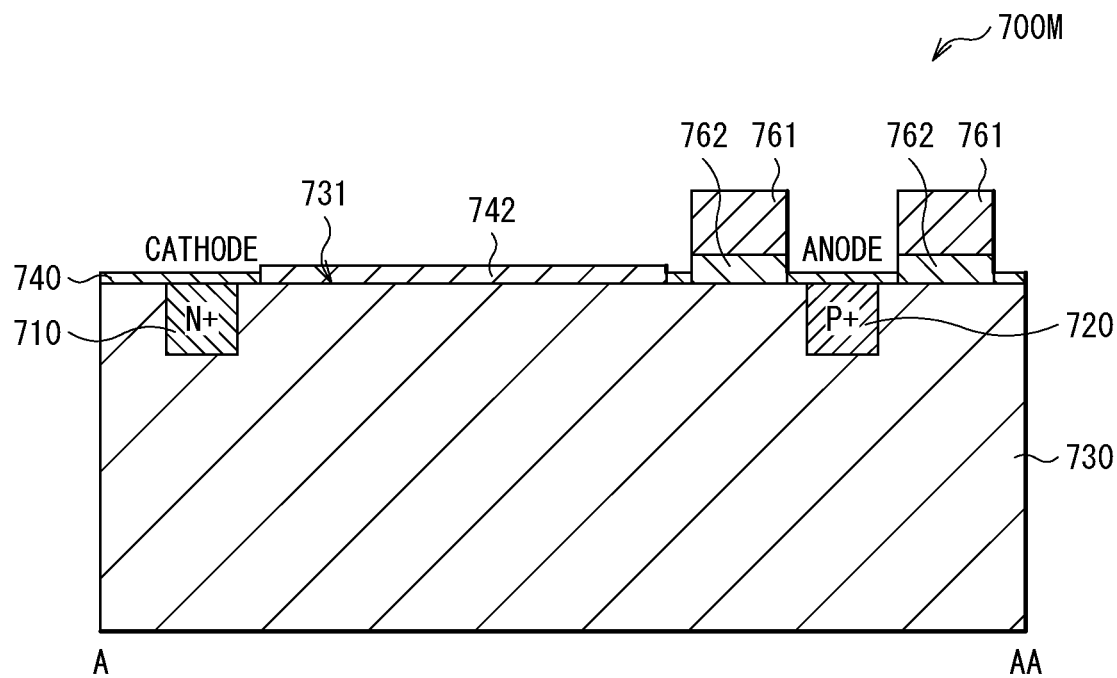

FIG. 92 is a vertical cross-sectional view of a structure of a photodetector according to a thirteenth structure example.

Figure 93A:
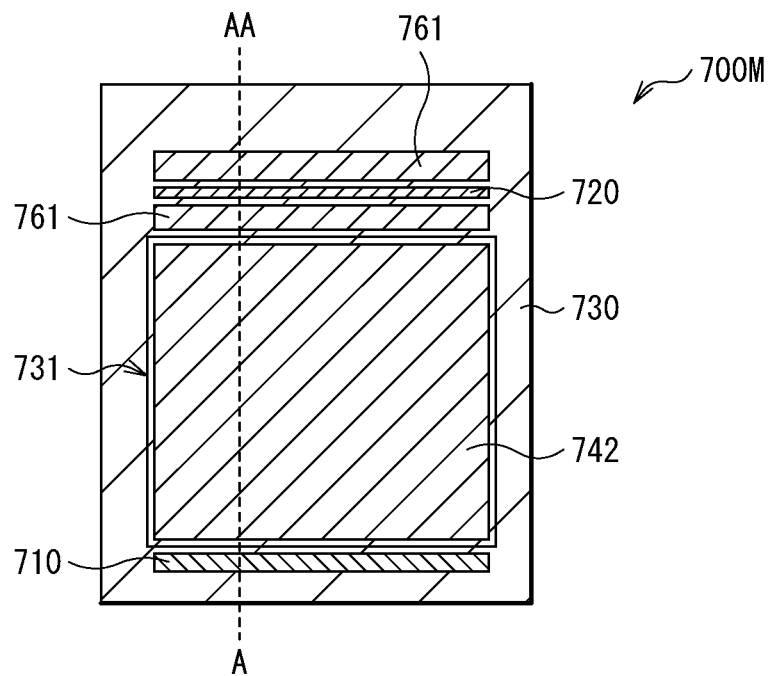

FIG. 93A is a top view of an example of a planar structure of the photodetector according to the thirteenth structure example.

Figure 93B:
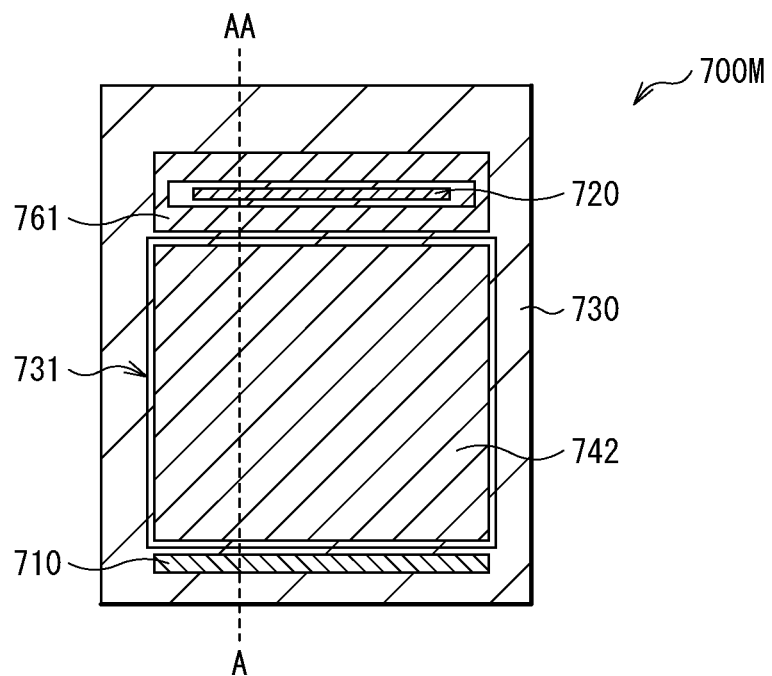

FIG. 93B is a top view of an example of the planar structure of the photodetector according to the thirteenth structure example.

Figure 94:
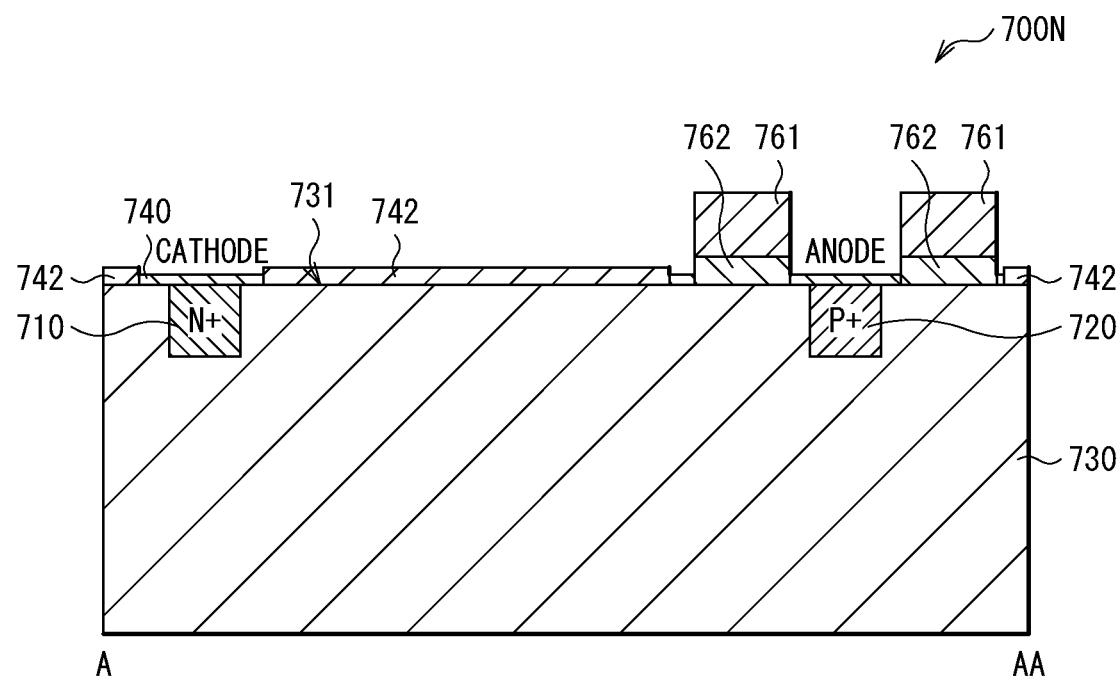

FIG. 94 is a vertical cross-sectional view of a structure of a photodetector according to a fourteenth structure example.

Figure 95A:
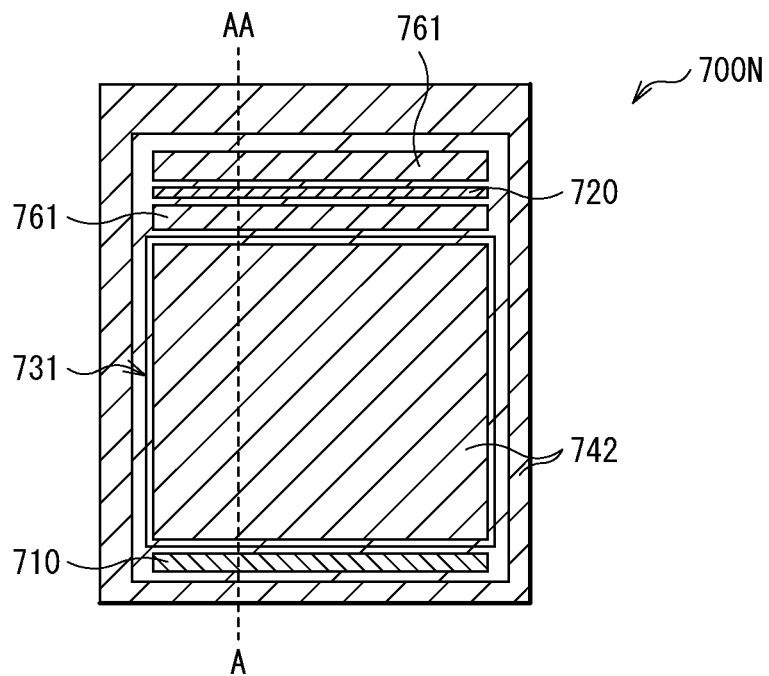

FIG. 95A is a top view of an example of a planar structure of the photodetector according to the fourteenth structure example.

Figure 95B:
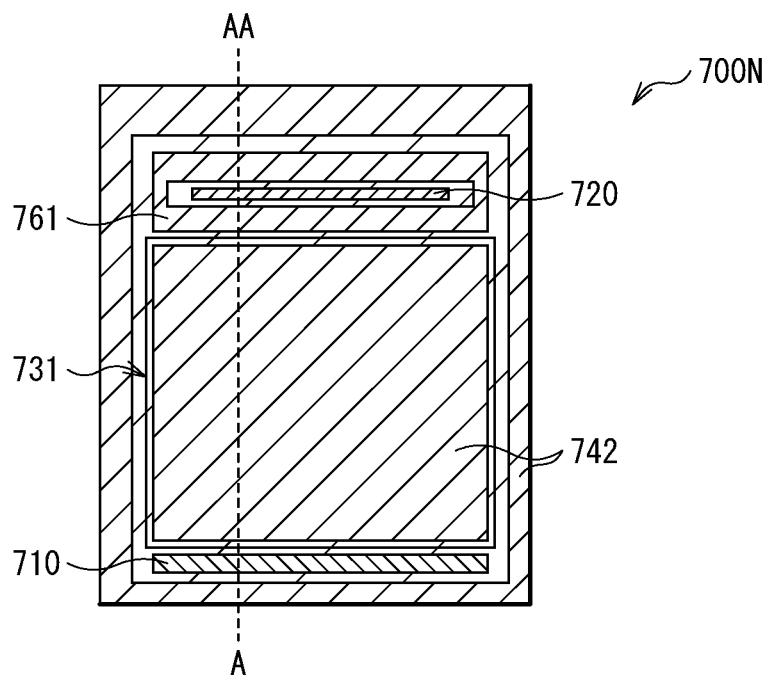

FIG. 95B is a top view of an example of the planar structure of the photodetector according to the fourteenth structure example.

Figure 96:
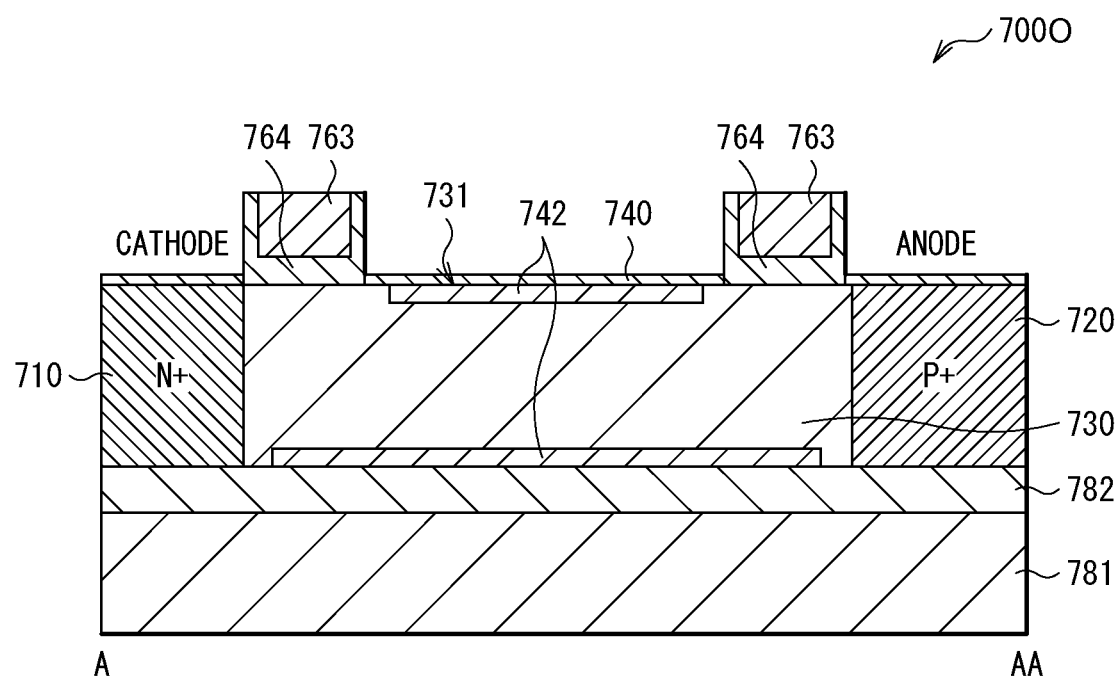

FIG. 96 is a vertical cross-sectional view of a structure of a photodetector according to a fifteenth structure example.

Figure 97A:
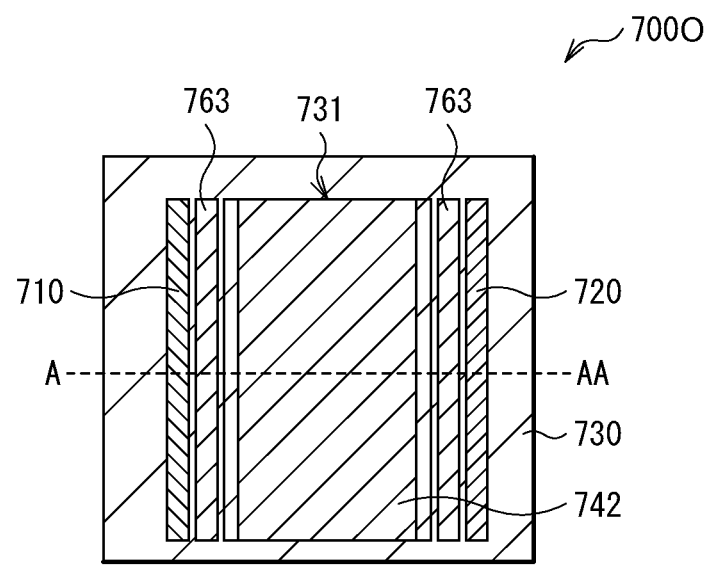

FIG. 97A is a plan view of an example of the region in which the pinning layer is formed on the front surface side of the semiconductor layer including the third region.

Figure 97B:
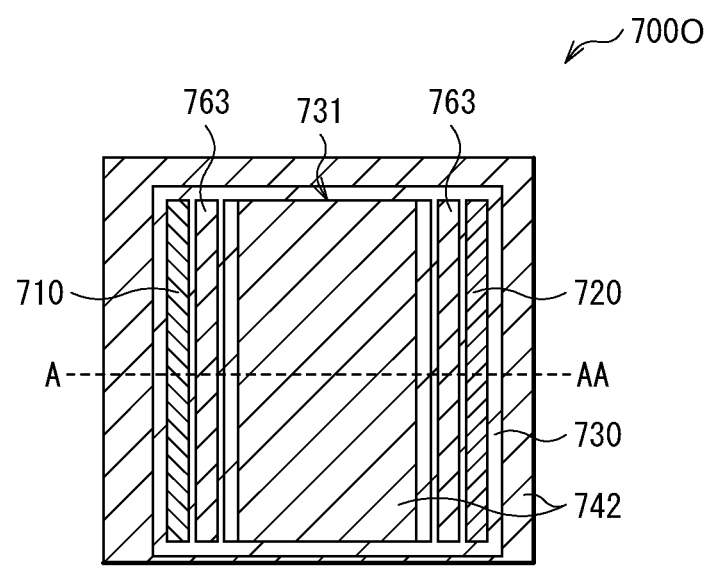

FIG. 97B is a plan view of an example of the region in which the pinning layer is formed on the front surface side of the semiconductor layer including the third region.

Figure 98A:
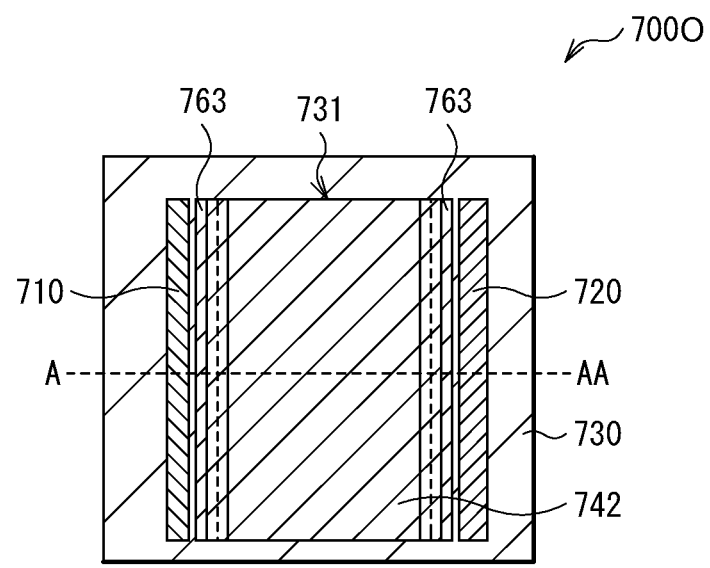

FIG. 98A is a plan view of an example of the region in which the pinning layer is formed at the interface between the semiconductor layer including the third region and the buried insulating film.

Figure 98B:
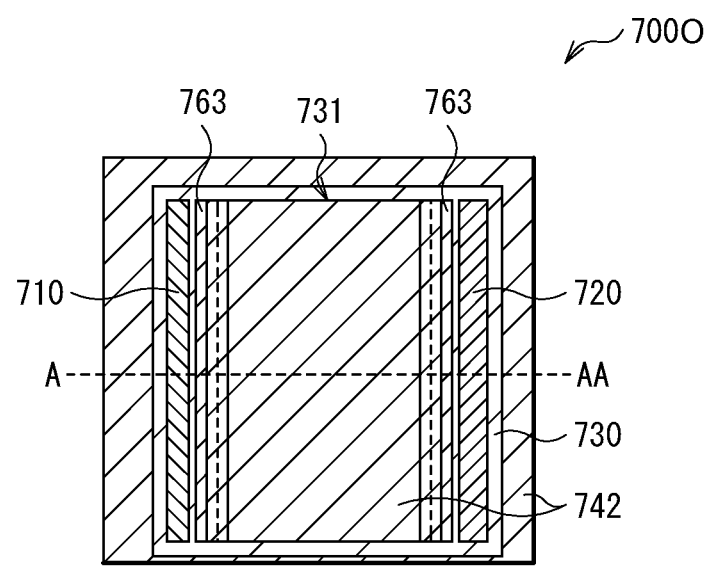

FIG. 98B is a plan view of an example of the region in which the pinning layer is formed at the interface between the semiconductor layer including the third region and the buried insulating film.

Figure 99A:
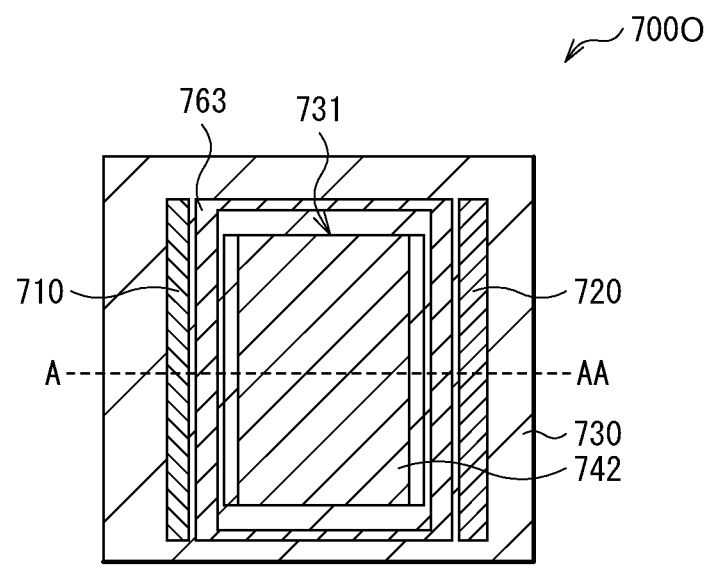

FIG. 99A is a plan view of an example of the region in which the pinning layer is formed on the front surface side of the semiconductor layer including the third region.

Figure 99B:
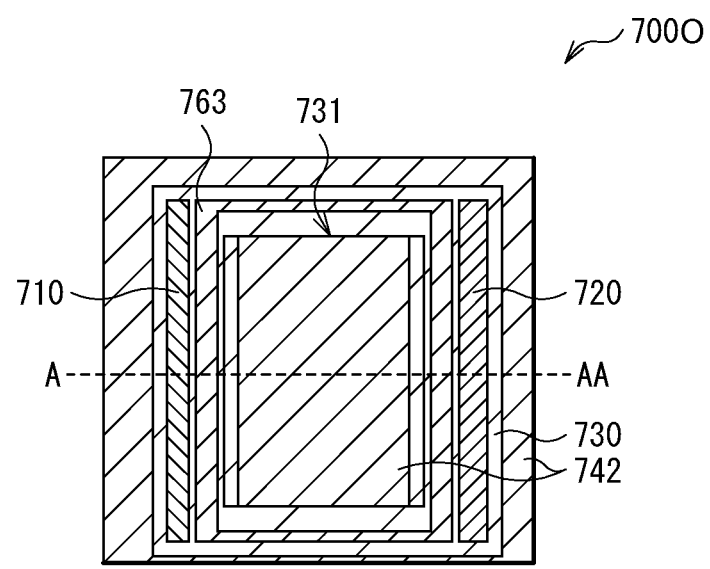

FIG. 99B is a plan view of an example of the region in which the pinning layer is formed on the front surface side of the semiconductor layer including the third region.

Figure 100A:
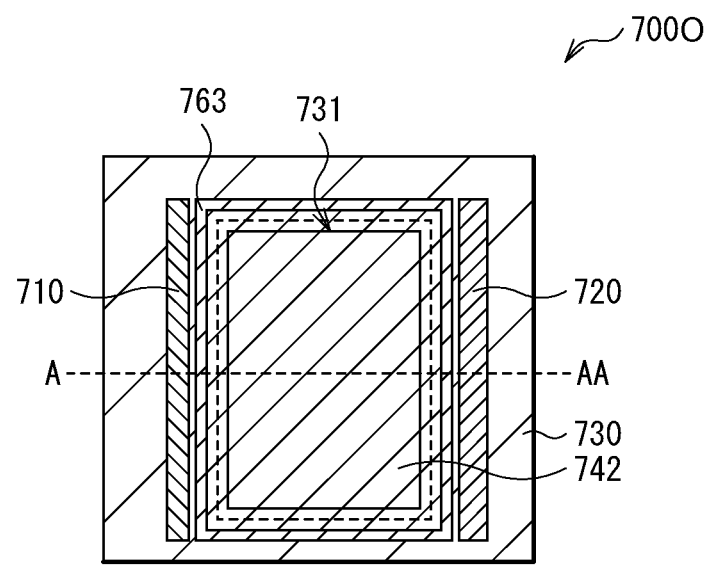

FIG. 100A is a plan view of an example of the region in which the pinning layer is formed at the interface between the semiconductor layer including the third region and the buried insulating film.

Figure 100B:
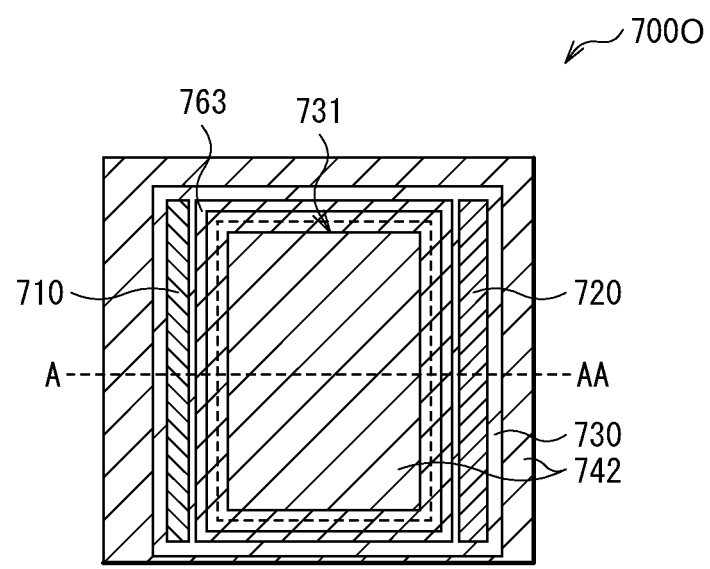

FIG. 100B is a plan view of an example of the region in which the pinning layer is formed at the interface between the semiconductor layer including the third region and the buried insulating film.

Figure 101:
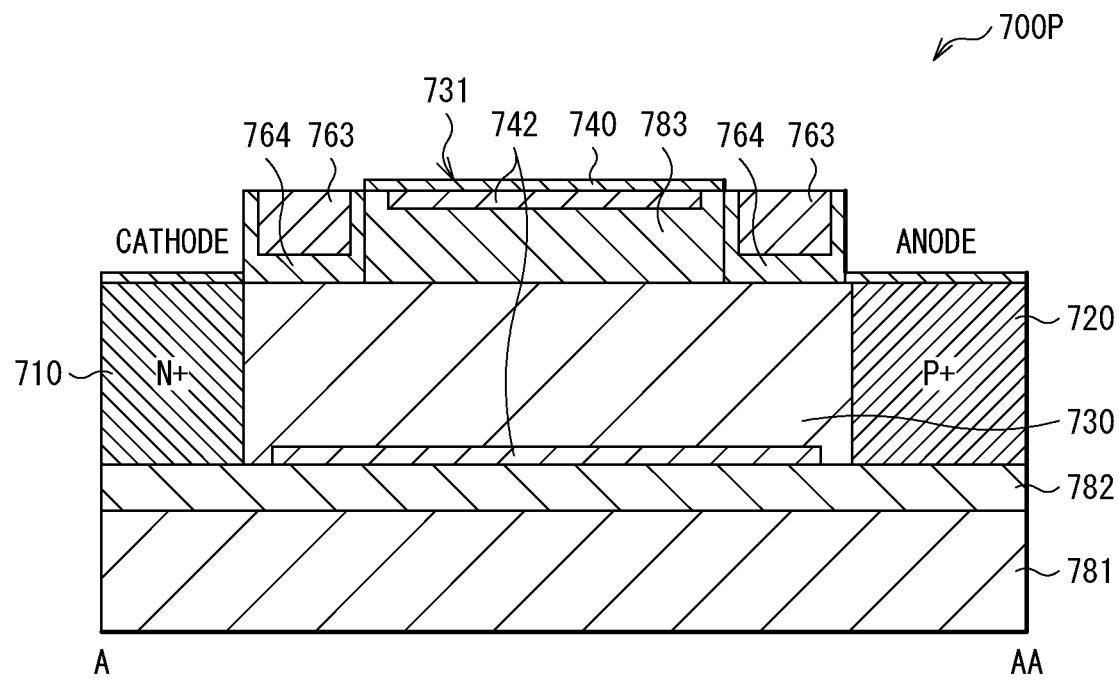

FIG. 101 is a vertical cross-sectional view of a structure of a photodetector according to a sixteenth structure example.

Figure 102A:
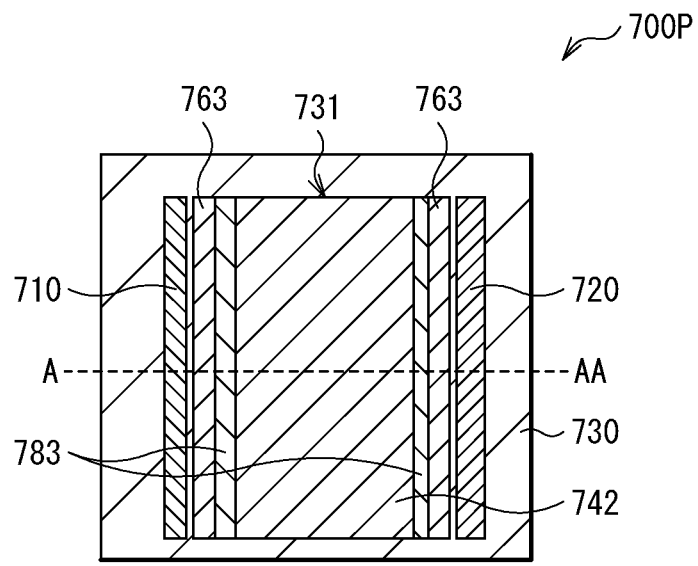
Figure 102B:
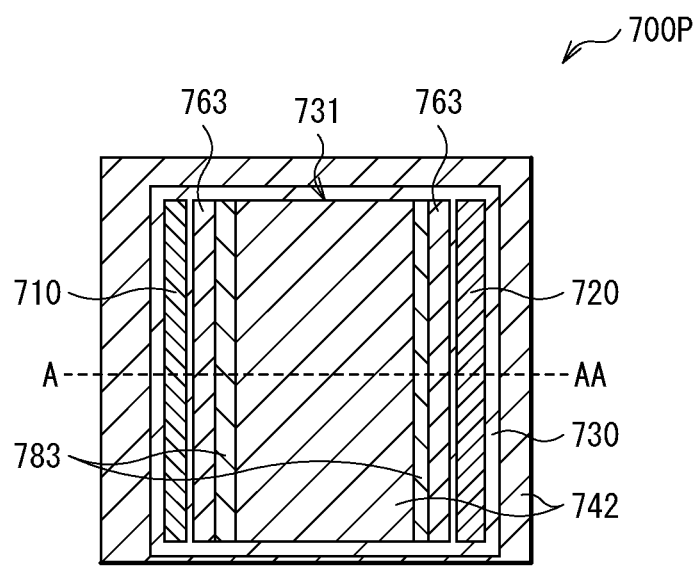
Figure 103A:
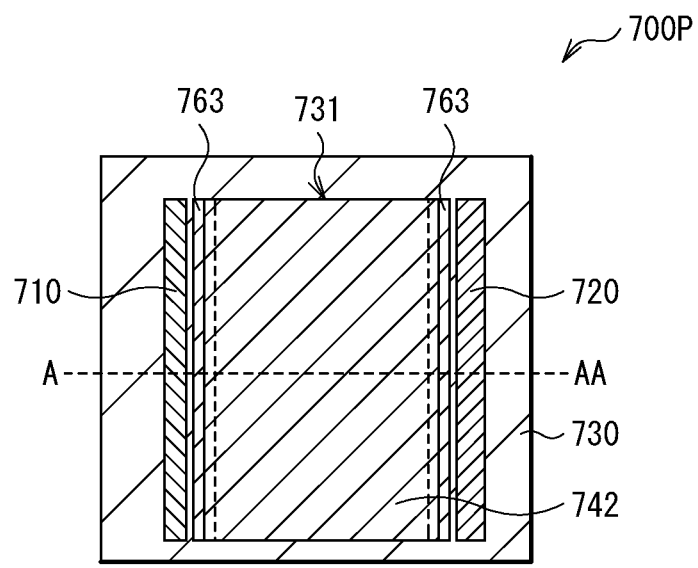

FIG. 102A is a plan view of an example of the region in which the pinning layer is formed on the front surface side of the electric charge generation layer FIG. 102B is a plan view of an example of the region in which the pinning layer is formed on the front surface side of the electric charge generation layer FIG. 103A is a plan view of an example of the region in which the pinning layer is formed at the interface between the semiconductor layer including the third region and the buried insulating film.

Figure 103B:
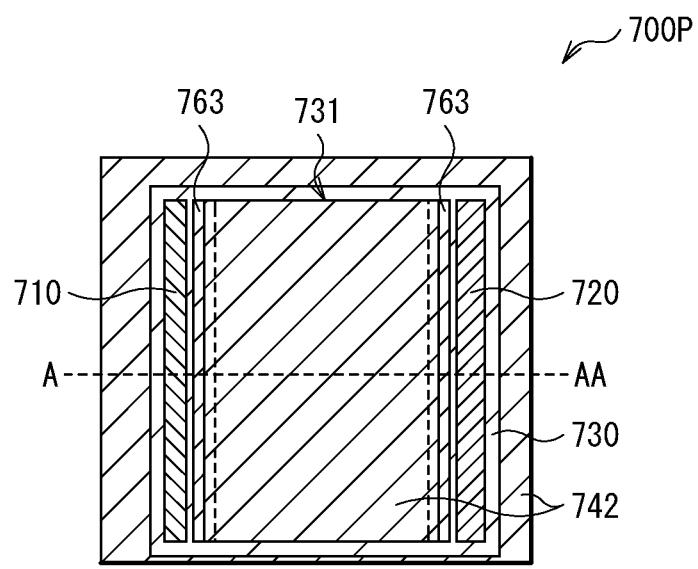

FIG. 103B is a plan view of an example of the region in which the pinning layer is formed at the interface between the semiconductor layer including the third region and the buried insulating film.

Figure 104A:
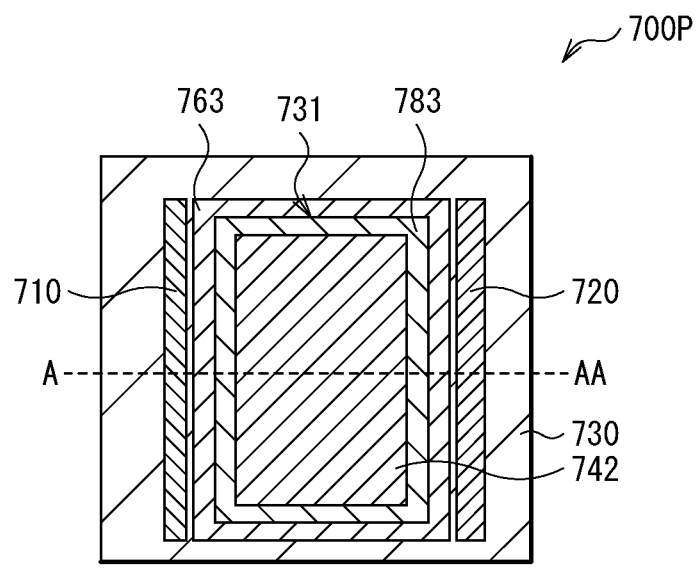

FIG. 104A is a plan view of an example of the region in which the pinning layer is formed on the front surface side of the electric charge generation layer.

Figure 104B:
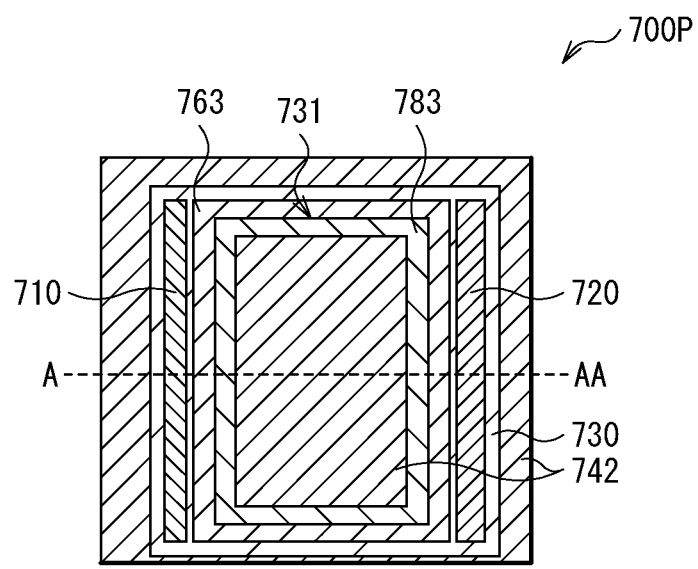

FIG. 104B is a plan view of an example of the region in which the pinning layer is formed on the front surface side of the electric charge generation layer.

Figure 105A:
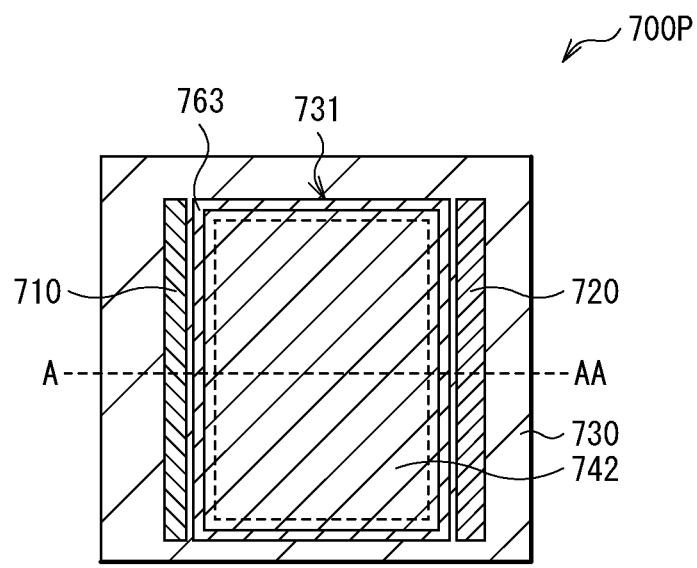

FIG. 105A is a plan view of an example of the region in which the pinning layer is formed at the interface between the semiconductor layer including the third region and the buried insulating film.

Figure 105B:
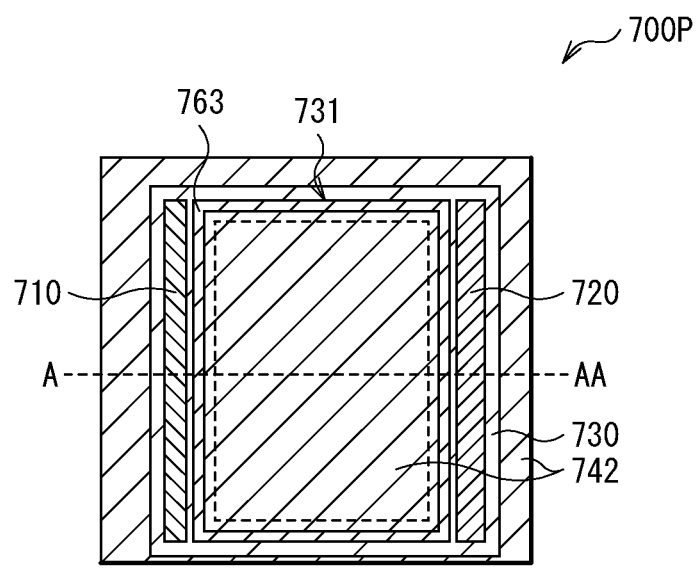

FIG. 105B is a plan view of an example of the region in which the pinning layer is formed at the interface between the semiconductor layer including the third region and the buried insulating film.

Figure 106:
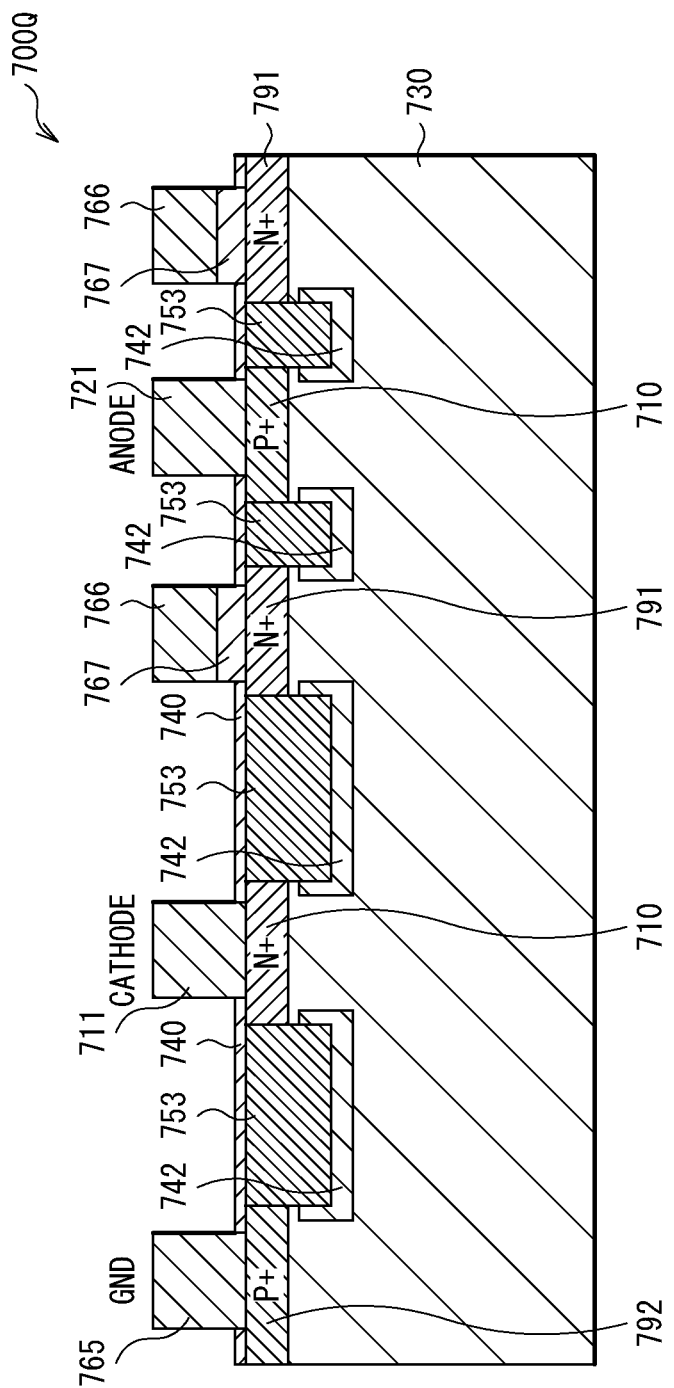

FIG. 106 is a vertical cross-sectional view of a structure of a photodetector according to a seventeenth structure example.

Figure 107:
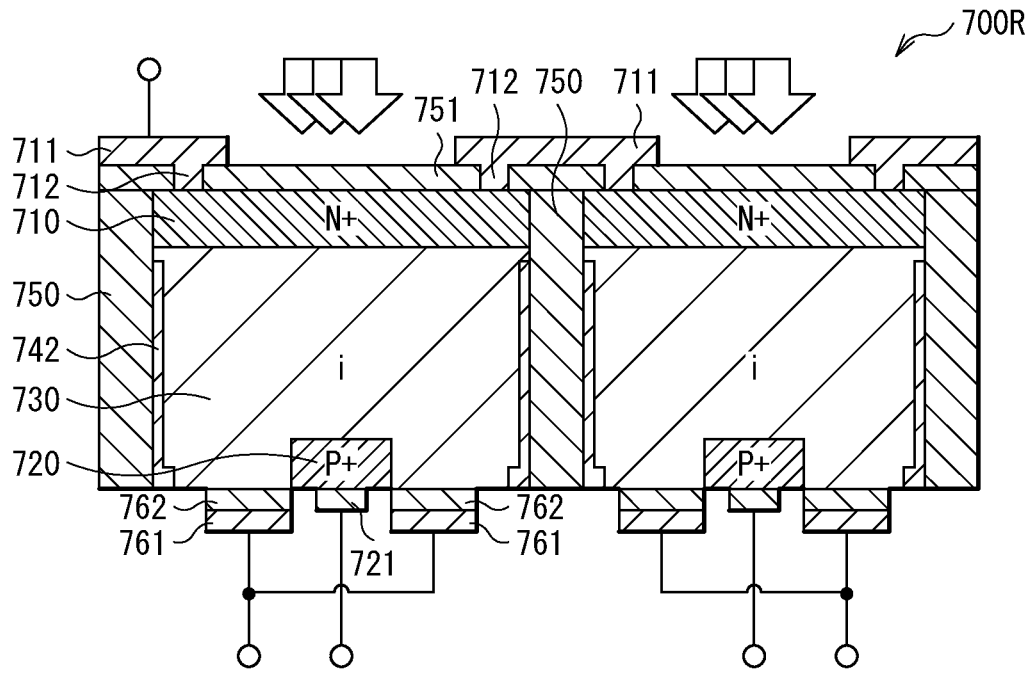

FIG. 107 is a vertical cross-sectional view of a structure of a photodetector according to an eighteenth structure example.

Figure 108A:
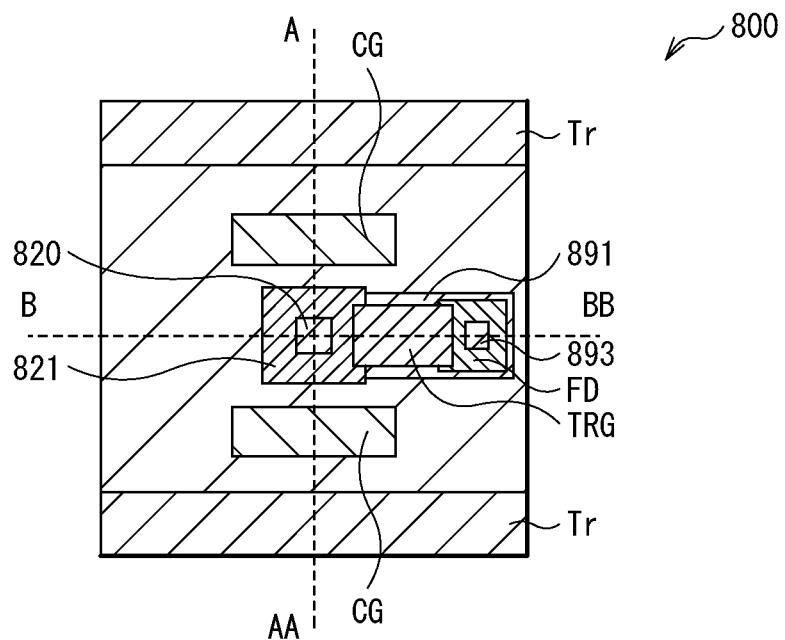

FIG. 108A is a plan view of a structure of a photodetector according to a sixth embodiment of the present disclosure from a second surface side.

Figure 108B:
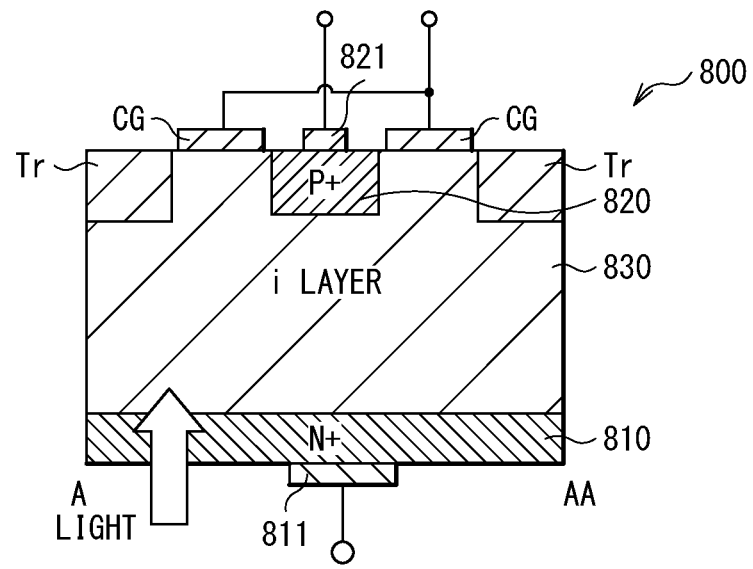

FIG. 108B is a vertical cross-sectional view of a structure of the photodetector in an A-AA cutting plane of FIG. 108A.

Figure 108C:
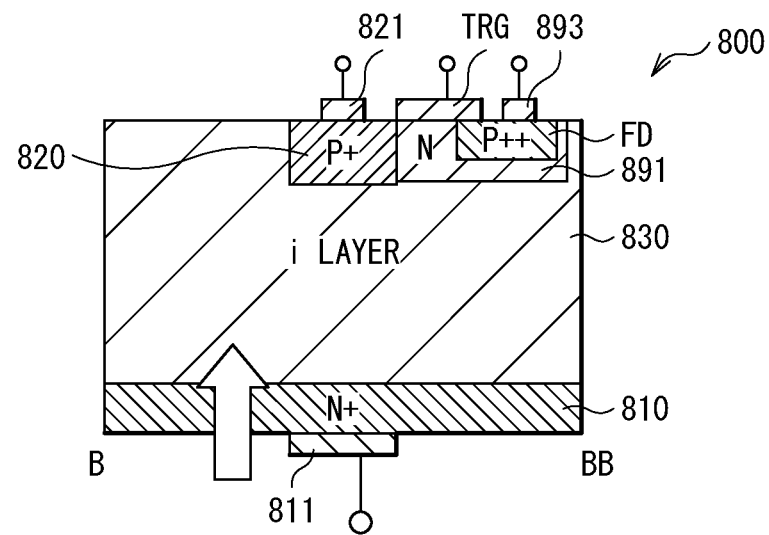

FIG. 108C is a vertical cross-sectional view of a structure of the photodetector in a B-BB cutting plane of FIG. 108A.

Figure 109:
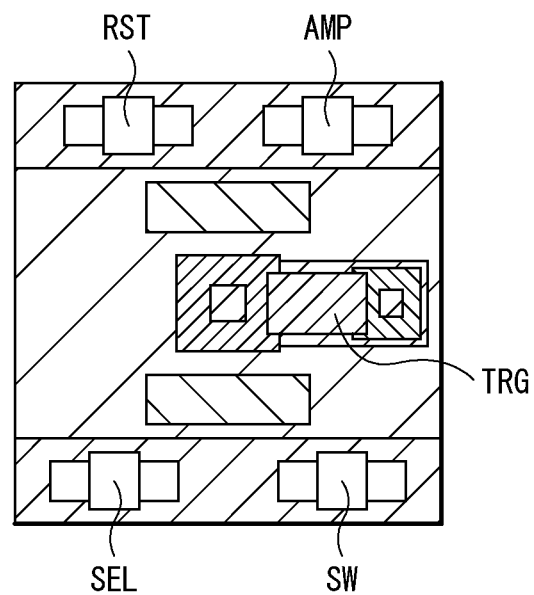

FIG. 109 is a plan view of an example of disposition of a pixel transistor included in the pixel circuit included in the photodetector.

Figure 110:
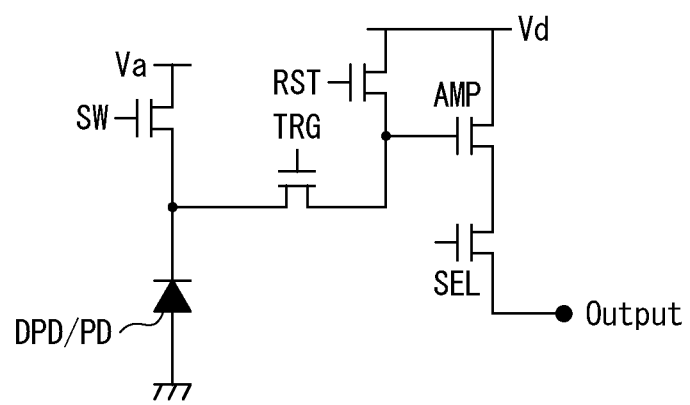

FIG. 110 is a circuit diagram illustrating an example of the equivalent circuit of the pixel circuit included in the photodetector that functions as the DPD sensor and the PD.

Figure 111:
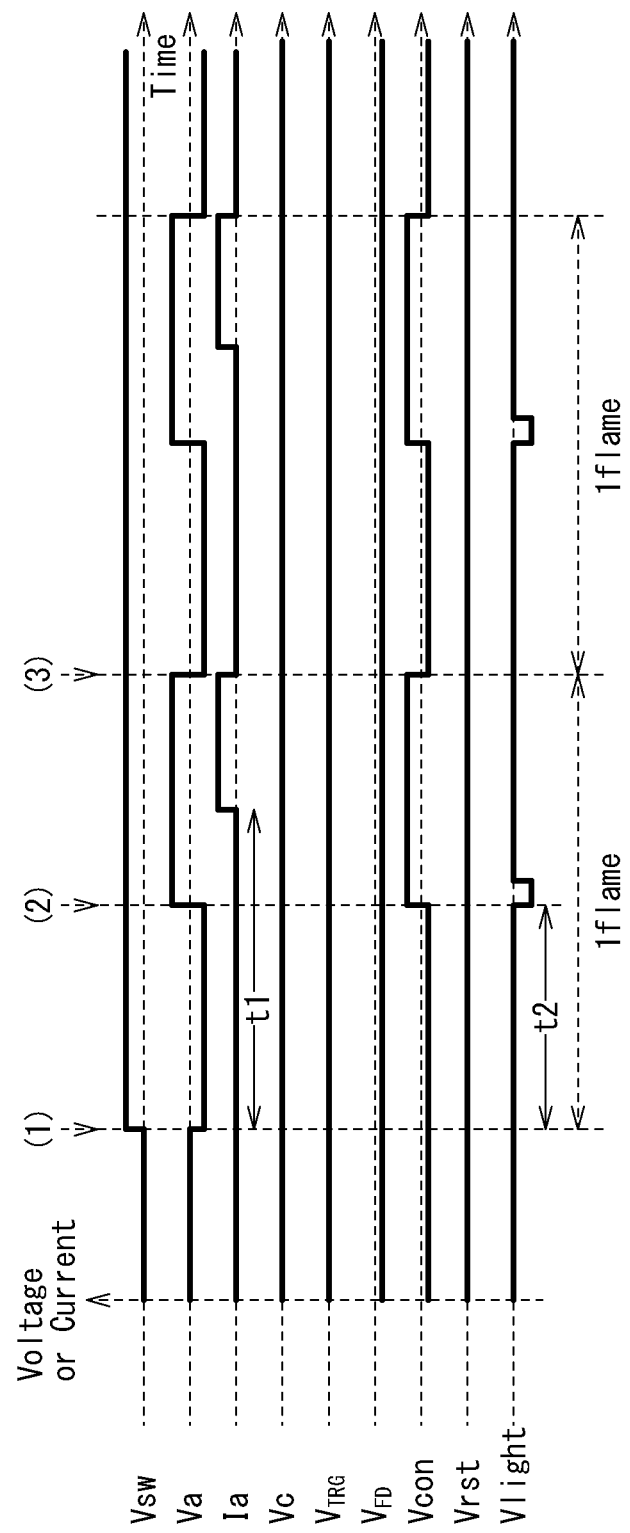

FIG. 111 is a timing chart diagram illustrating an example of the ToF sensor operation of the photodetector according to the embodiment.

Figure 112:
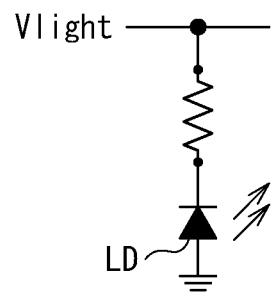

FIG. 112 is an explanatory diagram describing the light source used for the ToF sensor.

Figure 113A:
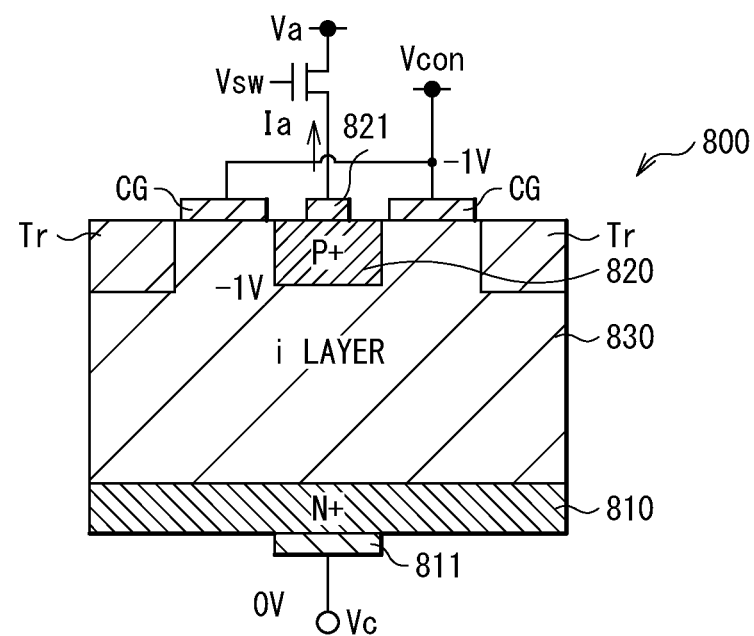

FIG. 113A is a vertical cross-sectional view describing a state of the photodetector at a timing of (1) in FIG. 111.

Figure 113B:
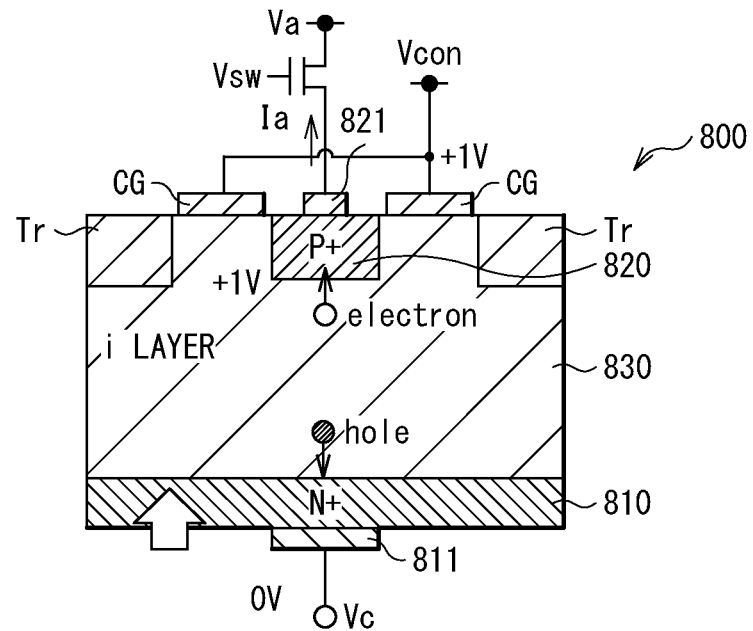

FIG. 113B is a vertical cross-sectional view describing a state of the photodetector at a timing of (2) in FIG. 111.

Figure 113C:
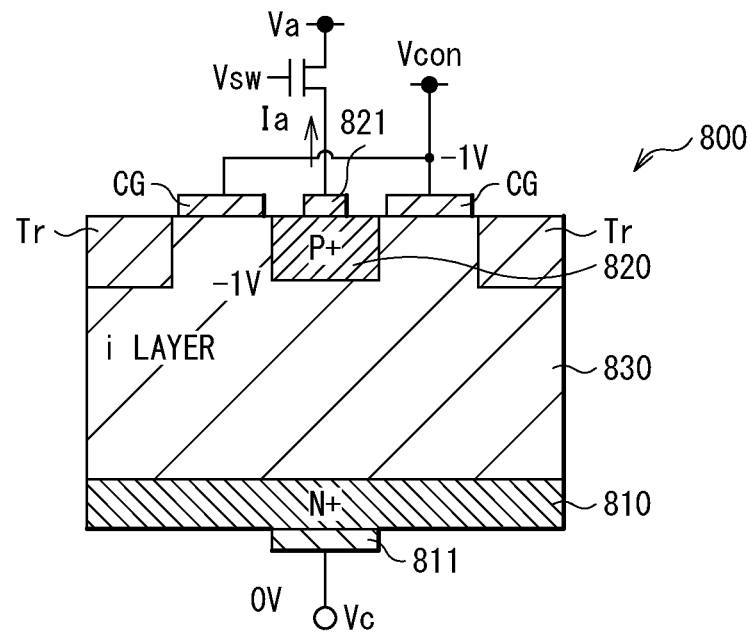

FIG. 113C is a vertical cross-sectional view describing a state of the photodetector at a timing of (3) in FIG. 111.

Figure 114:
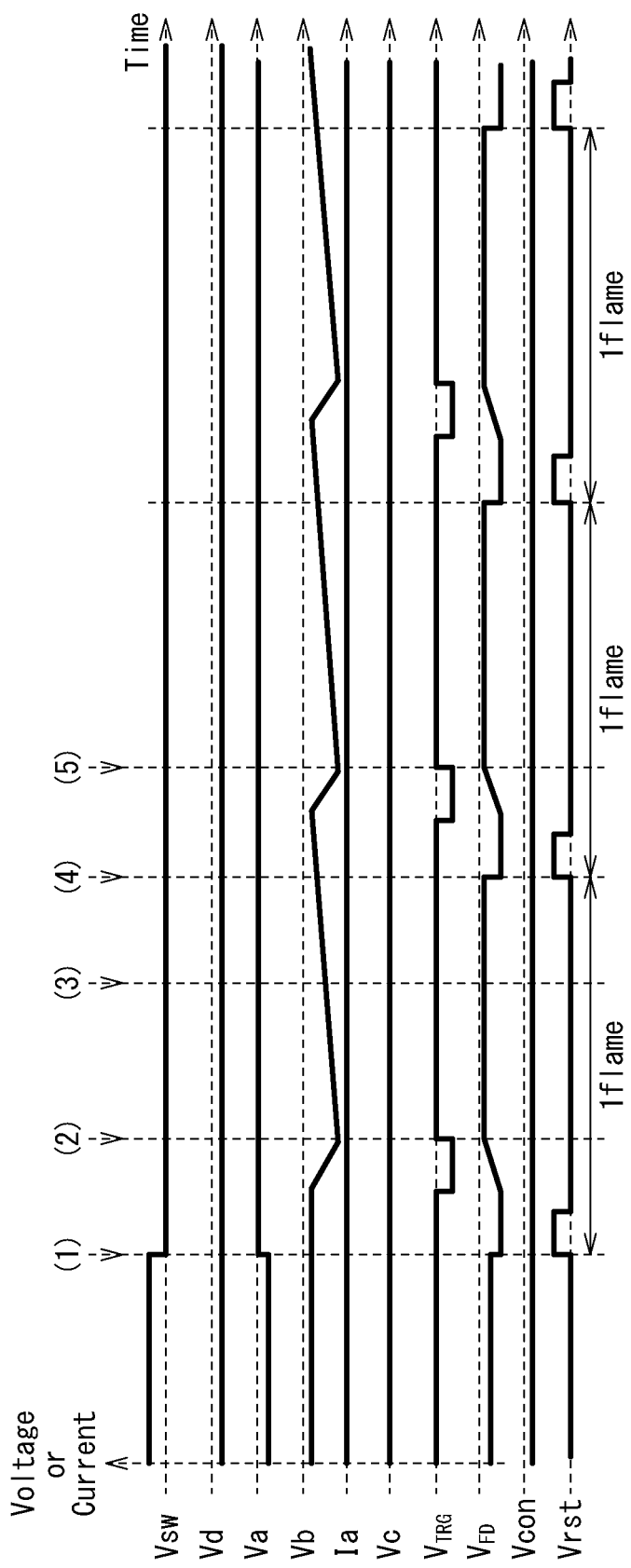

FIG. 114 is a timing chart diagram illustrating an example of a PD operation of the photodetector according to the embodiment.

Figure 115A:
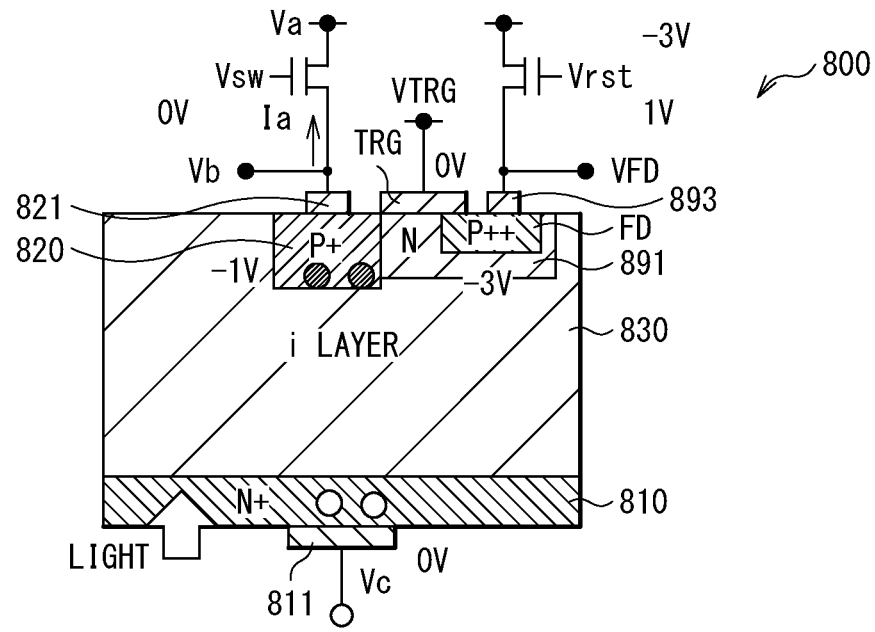

FIG. 115A is a vertical cross-sectional view describing a state of the photodetector at a timing of (1) in FIG. 114.

Figure 115B:
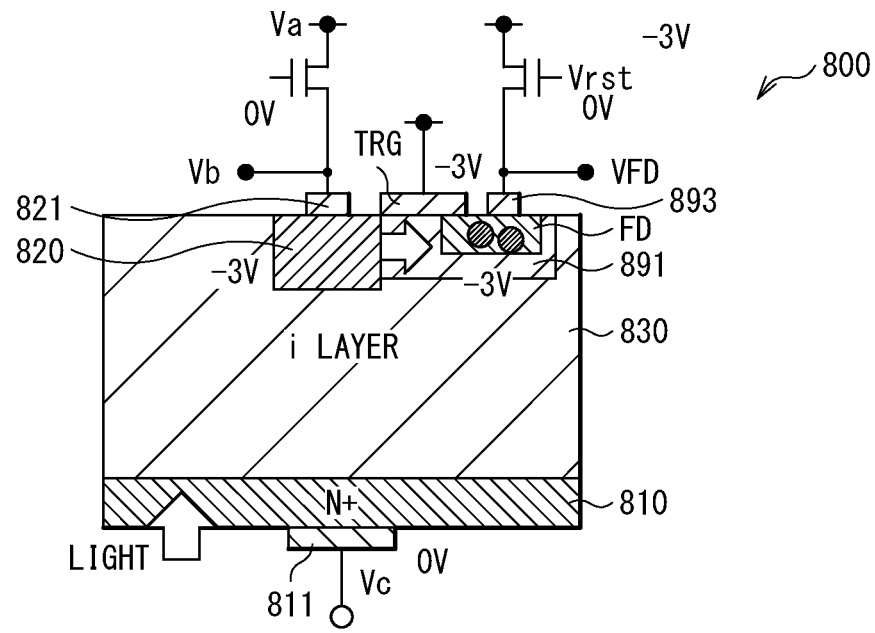

FIG. 115B is a vertical cross-sectional view describing a state of the photodetector at a timing of (2) in FIG. 114.

Figure 115C:
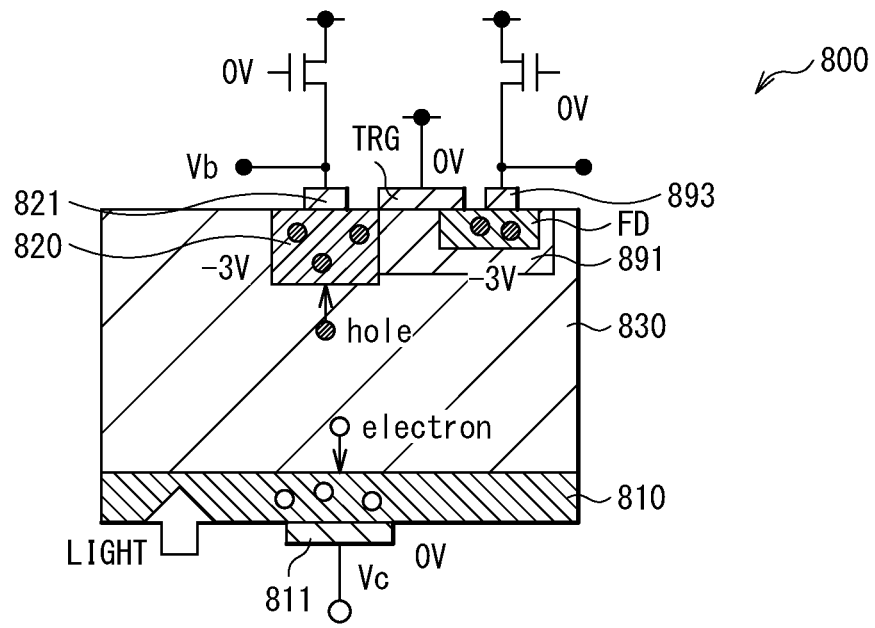

FIG. 115C is a vertical cross-sectional view describing a state of the photodetector at a timing of (3) in FIG. 114.

Figure 115D:
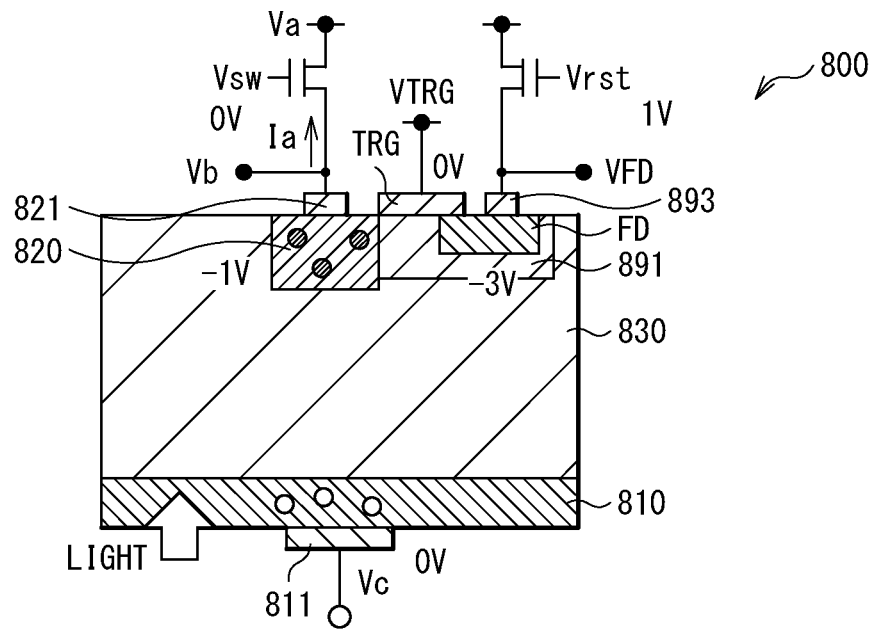

FIG. 115D is a vertical cross-sectional view describing a state of the photodetector at a timing of (4) in FIG. 114.

Figure 115E:
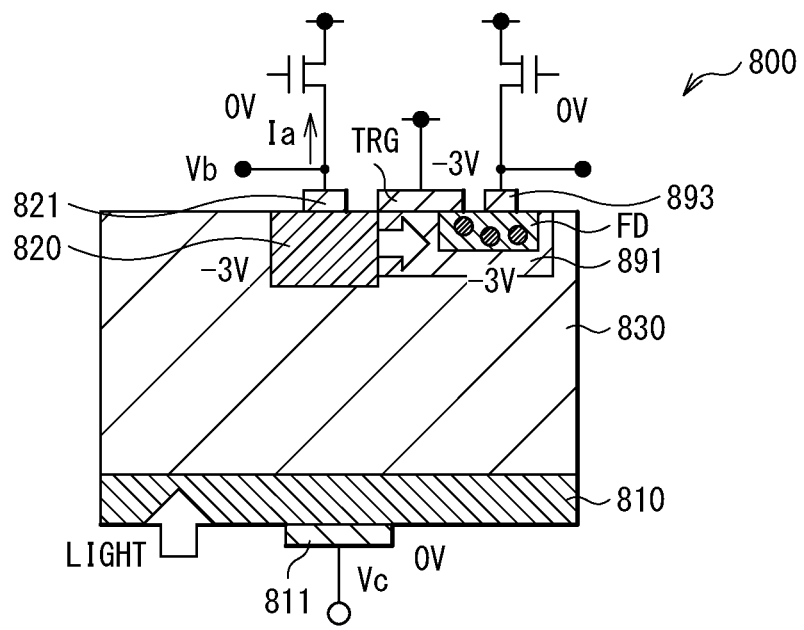

FIG. 115E is a vertical cross-sectional view describing a state of the photodetector at a timing of (5) in FIG. 114.

Figure 116:
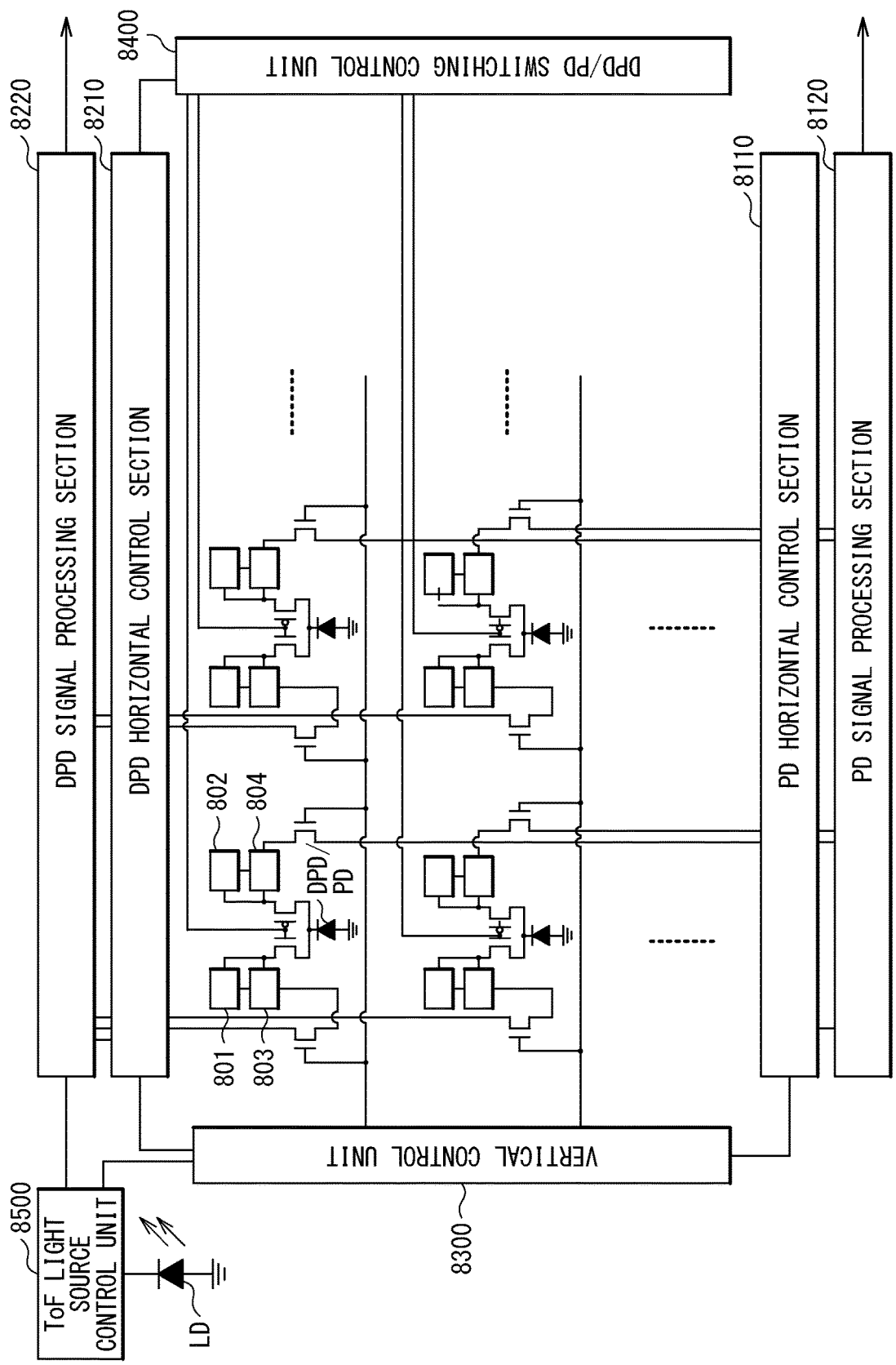

FIG. 116 is a block diagram illustrating a functional configuration in which the photodetector according to the embodiment is a pixel array.

Figure 117A:
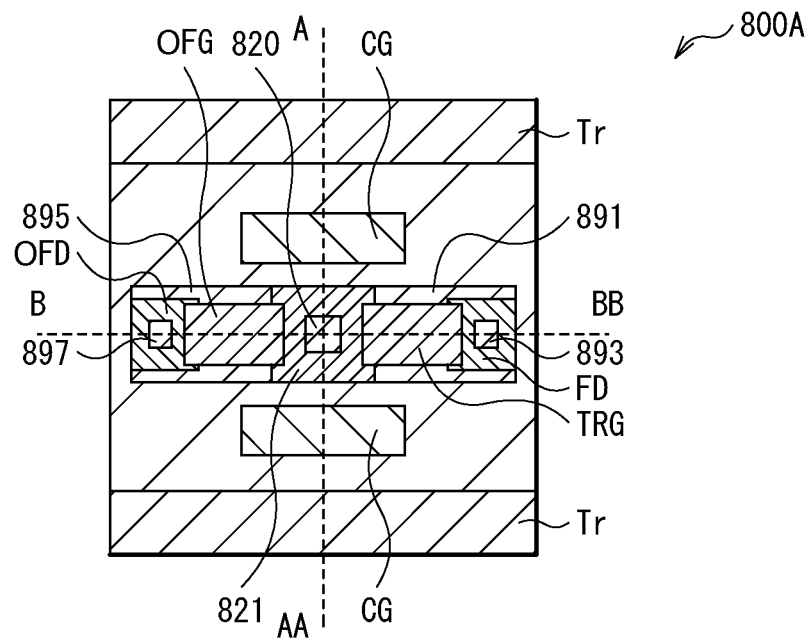

FIG. 117A is a plan view of a structure of a photodetector according to a first variation from a second surface side.

Figure 117B:
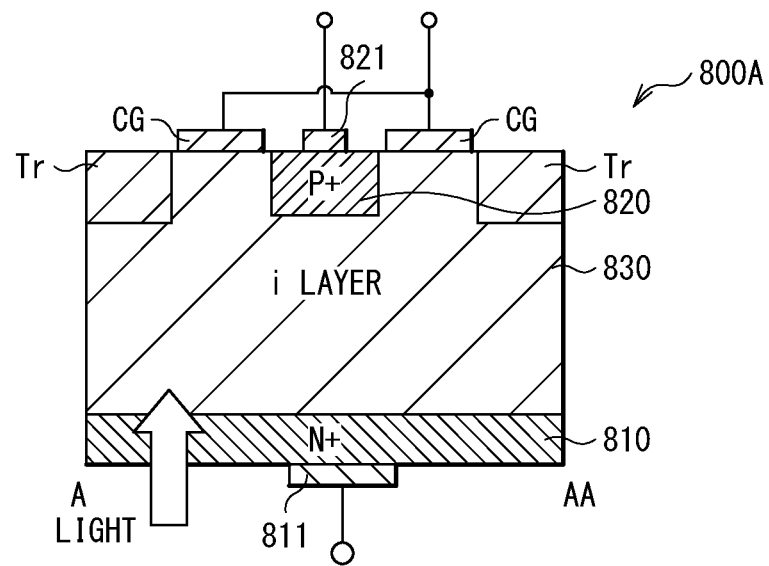

FIG. 117B is a vertical cross-sectional view of a structure of the photodetector in an A-AA cutting plane of FIG. 117A.

Figure 117C:
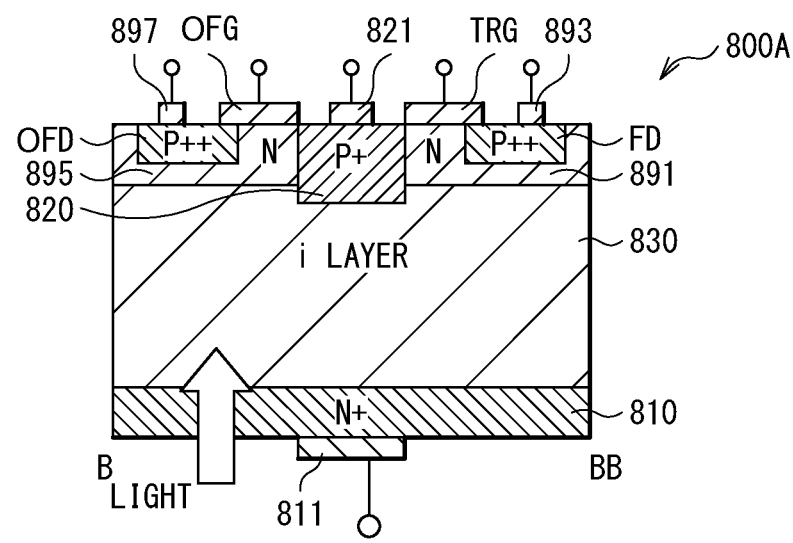

FIG. 117C is a vertical cross-sectional view of a structure of the photodetector in a B-BB cutting plane of FIG. 117A.

Figure 118A:
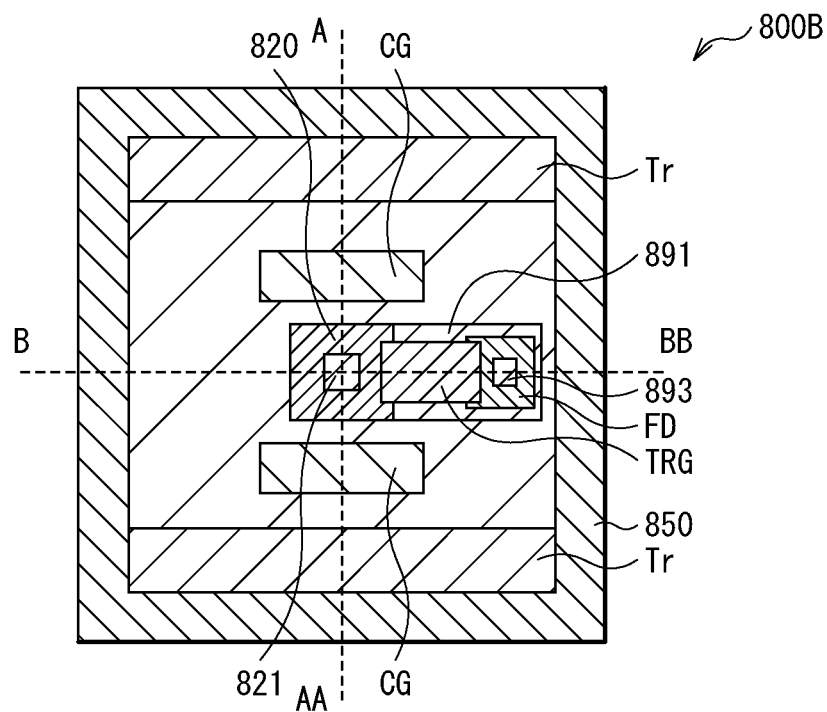

FIG. 118A is a plan view of a structure of a photodetector according to a second variation from a second surface side.

Figure 118B:
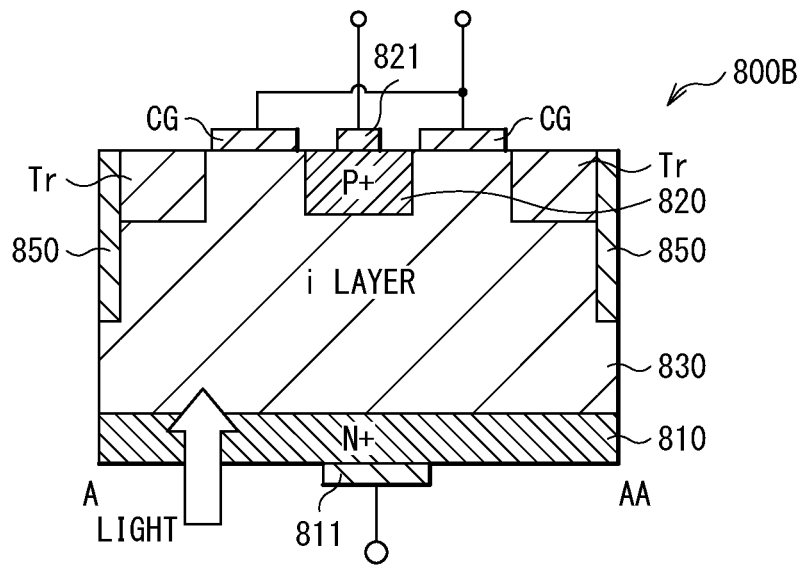

FIG. 118B is a vertical cross-sectional view of a structure of the photodetector in an A-AA cutting plane of FIG. 118A.

Figure 118C:
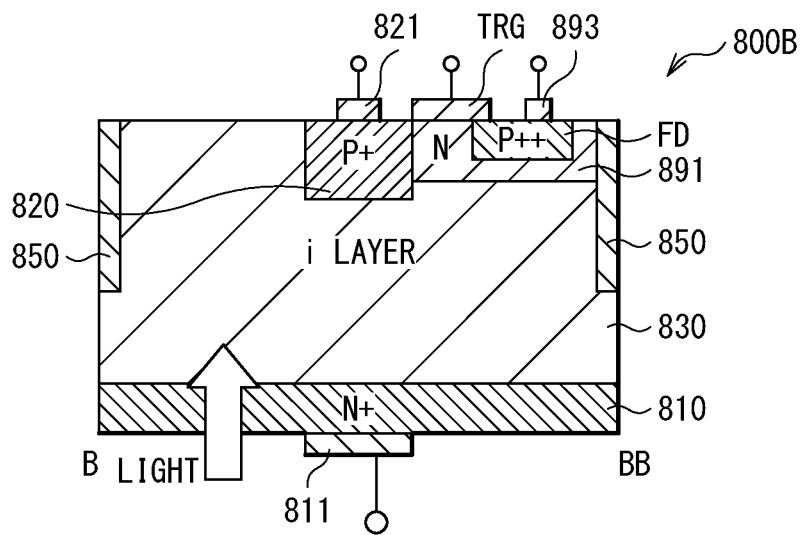

FIG. 118C is a vertical cross-sectional view of a structure of the photodetector in a B-BB cutting plane of FIG. 118A.

Figure 119A:
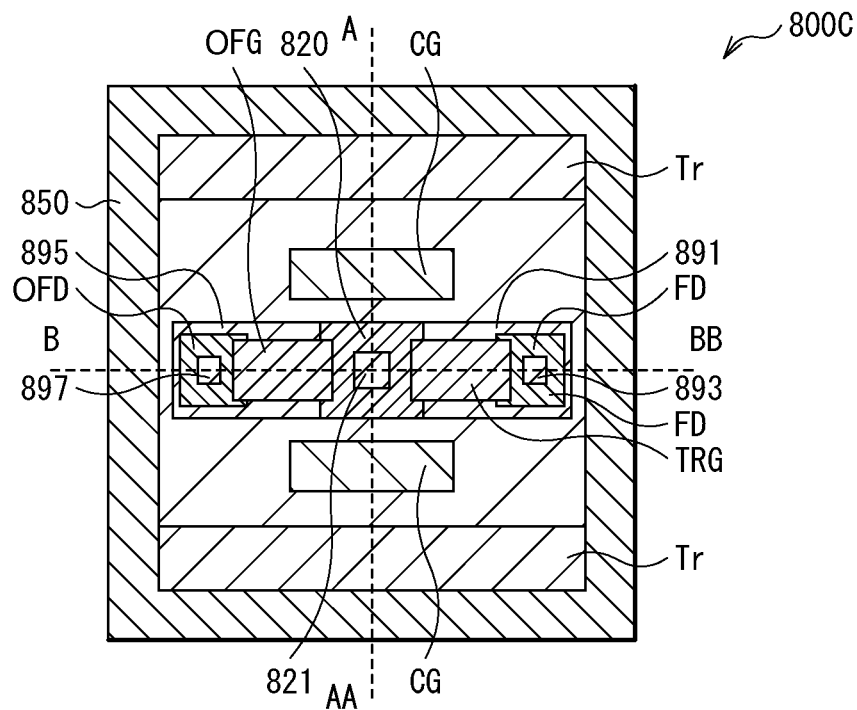

FIG. 119A is a plan view of a structure of a photodetector according to a third variation from a second surface side.

Figure 119B:
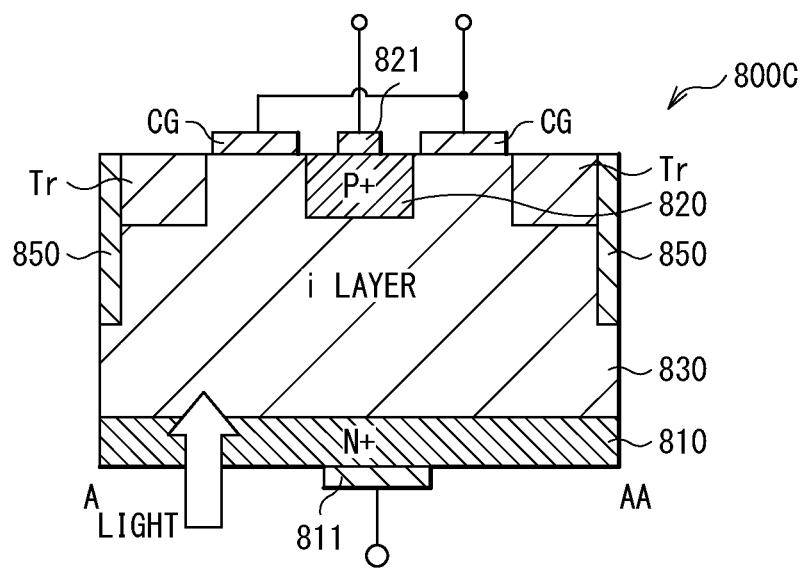

FIG. 119B is a vertical cross-sectional view of a structure of the photodetector in an A-AA cutting plane of FIG. 119A.

Figure 119C:
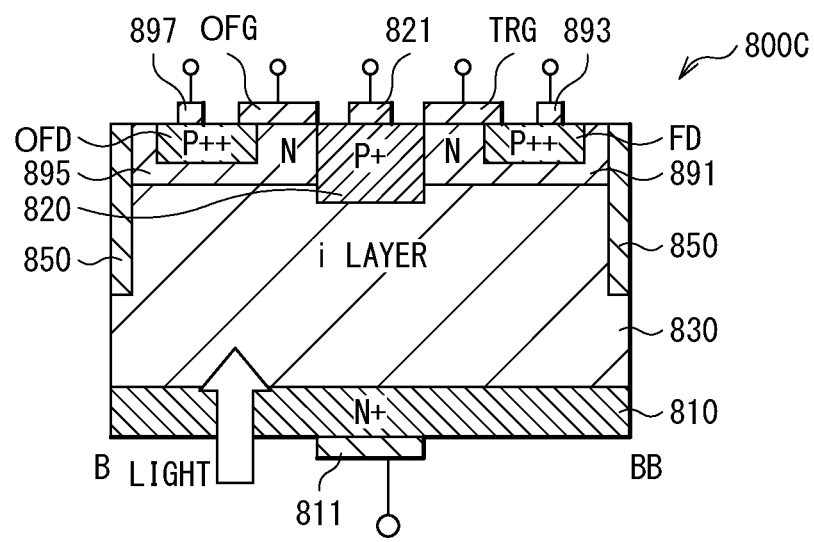

FIG. 119C is a vertical cross-sectional view of a structure of the photodetector in a B-BB cutting plane of FIG. 119A.

Figure 120A:
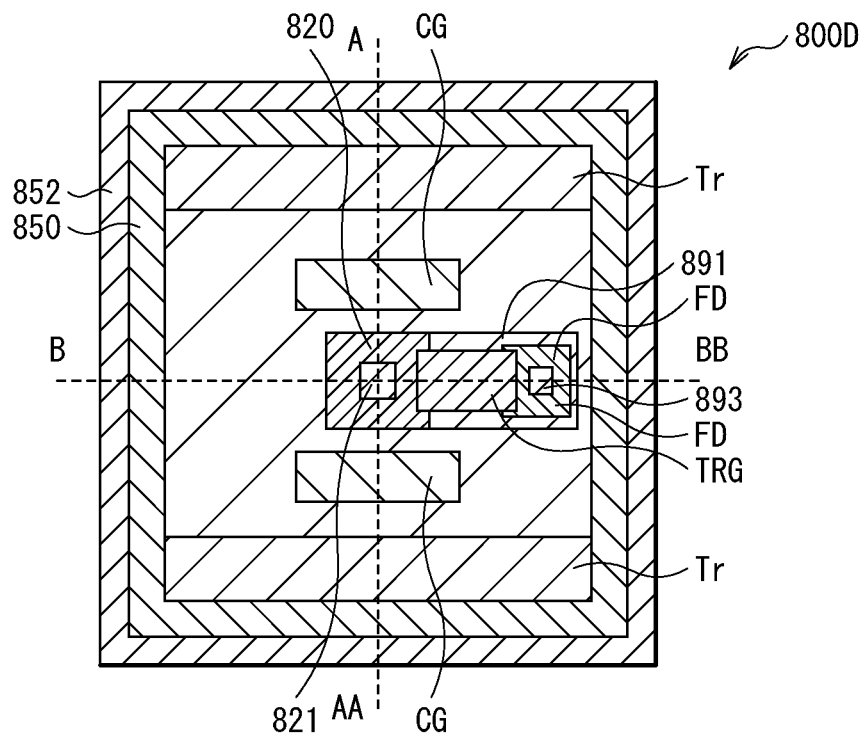

FIG. 120A is a plan view of a structure of a photodetector according to a fourth variation from a second surface side.

Figure 120B:
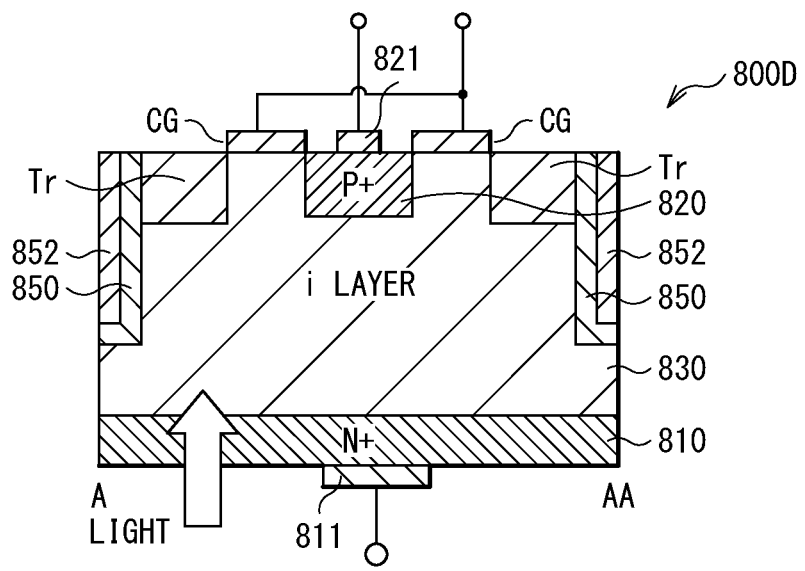

FIG. 120B is a vertical cross-sectional view of a structure of the photodetector in an A-AA cutting plane of FIG. 120A.

Figure 120C:
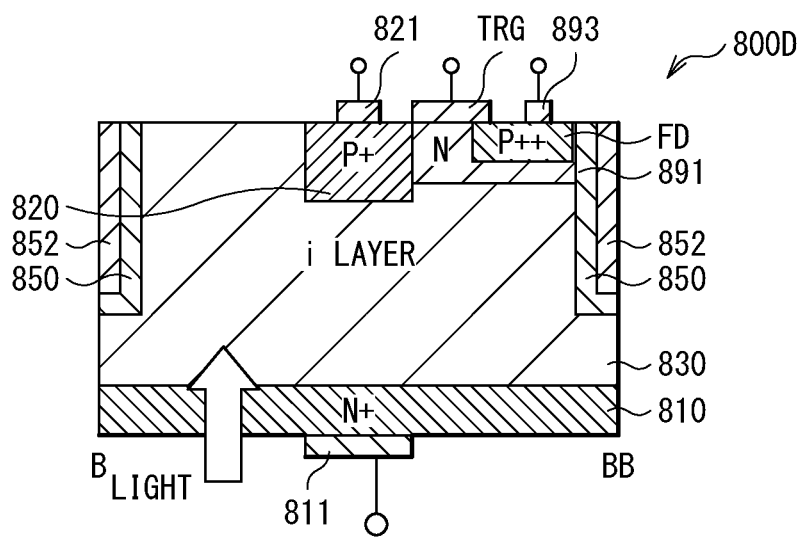

FIG. 120C is a vertical cross-sectional view of a structure of the photodetector in a B-BB cutting plane of FIG. 120A.

Figure 121A:
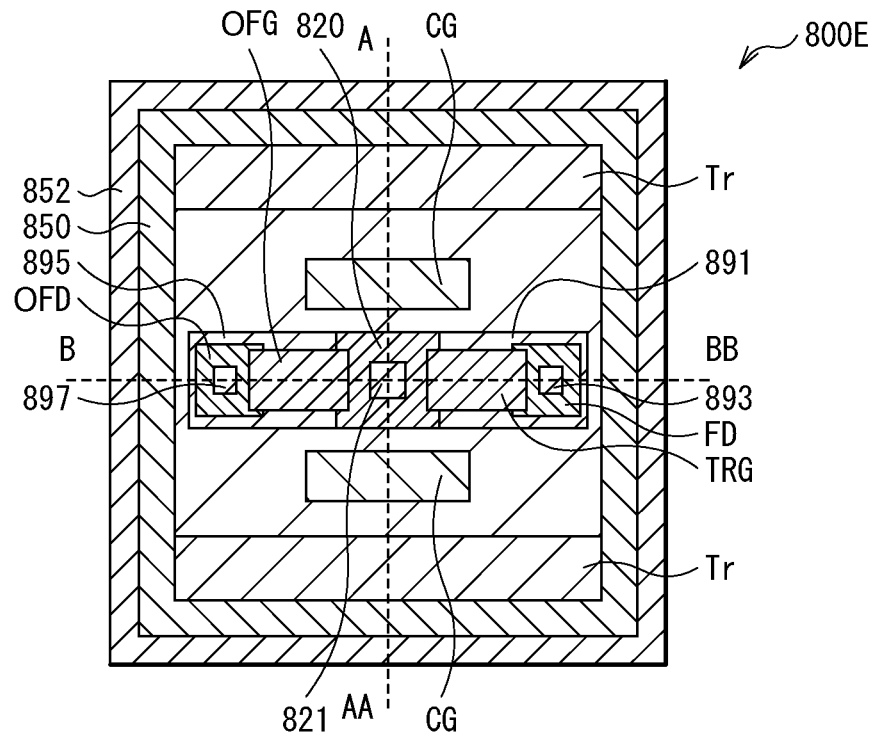

FIG. 121A is a plan view of a structure of a photodetector according to a fifth variation from a second surface side.

Figure 121B:
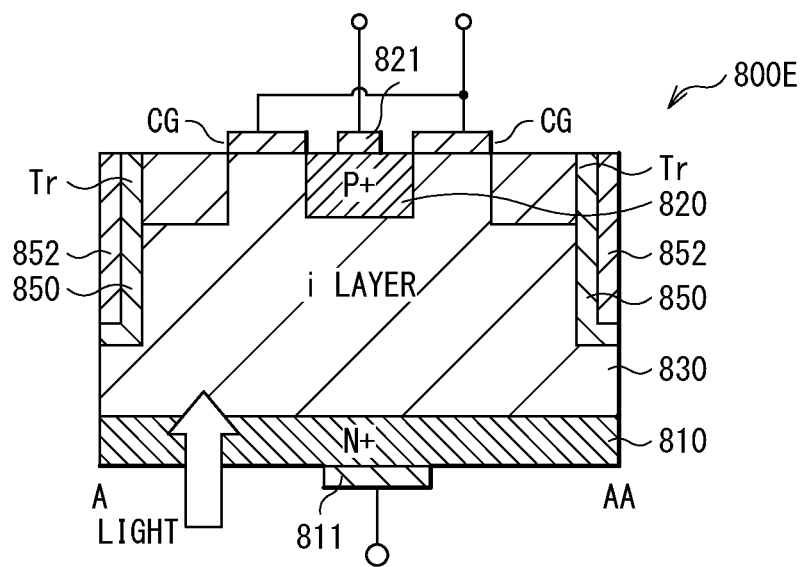

FIG. 121B is a vertical cross-sectional view of a structure of the photodetector in an A-AA cutting plane of FIG. 121A.

Figure 121C:
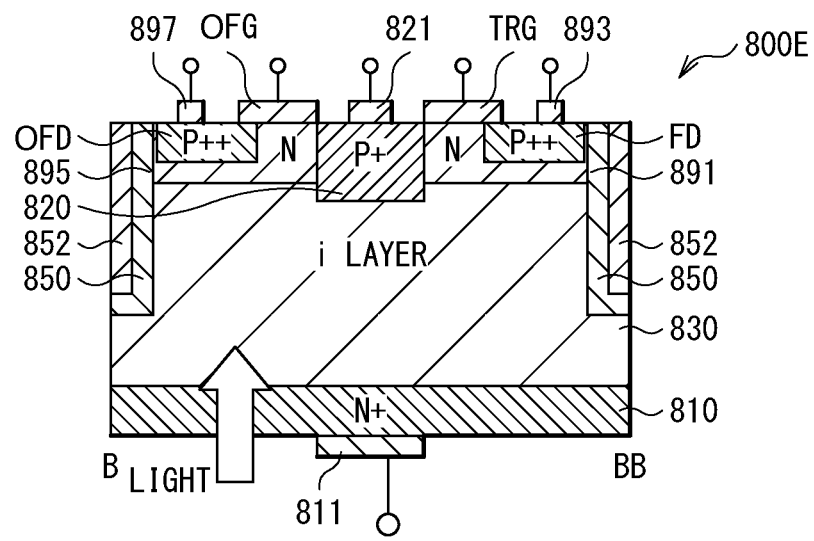

FIG. 121C is a vertical cross-sectional view of a structure of the photodetector in a B-BB cutting plane of FIG. 121A.

Figure 122A:
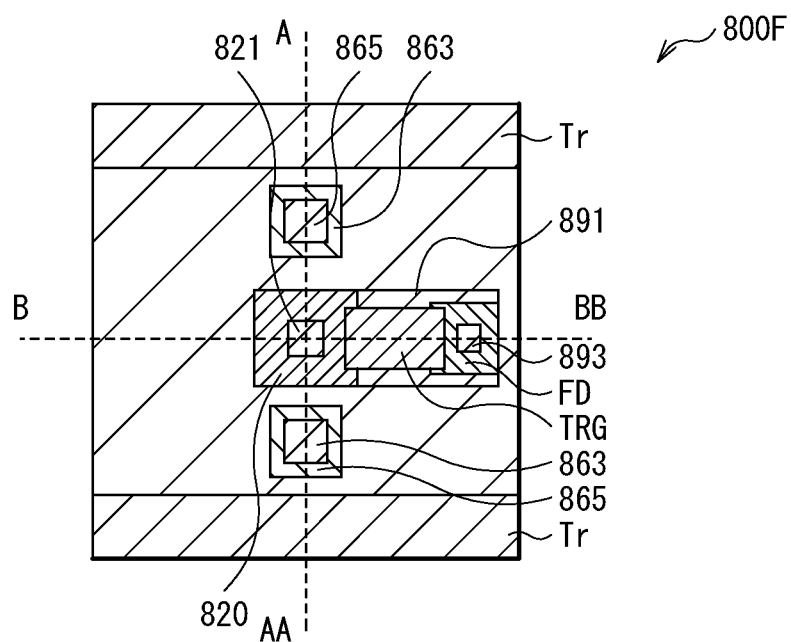

FIG. 122A is a plan view of a structure of a photodetector according to a sixth variation from a second surface side.

Figure 122B:
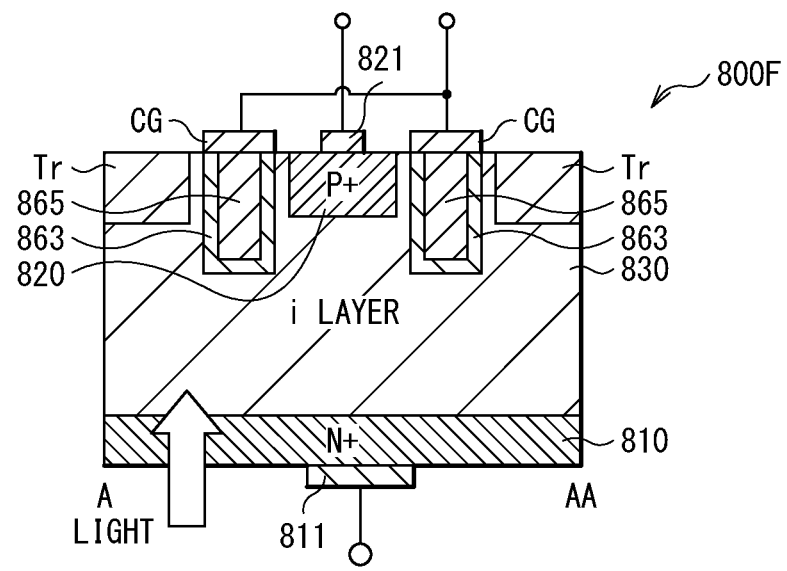

FIG. 122B is a vertical cross-sectional view of a structure of the photodetector in an A-AA cutting plane of FIG. 122A.

Figure 122C:
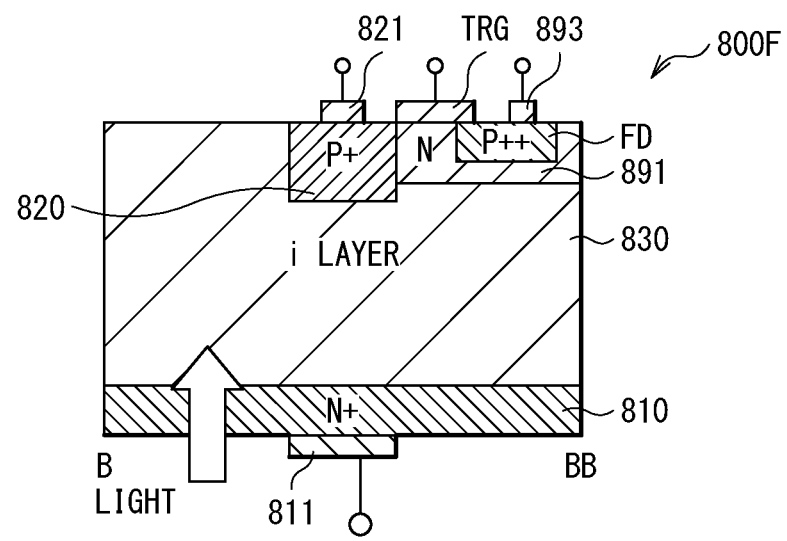

FIG. 122C is a vertical cross-sectional view of a structure of the photodetector in a B-BB cutting plane of FIG. 122A.

Figure 123A:
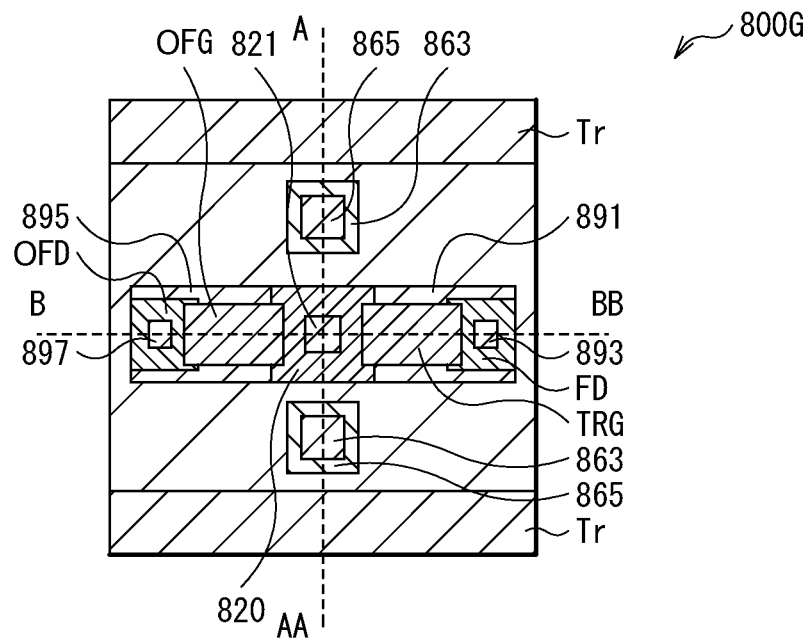

FIG. 123A is a plan view of a structure of a photodetector according to a seventh variation from a second surface side.

Figure 123B:
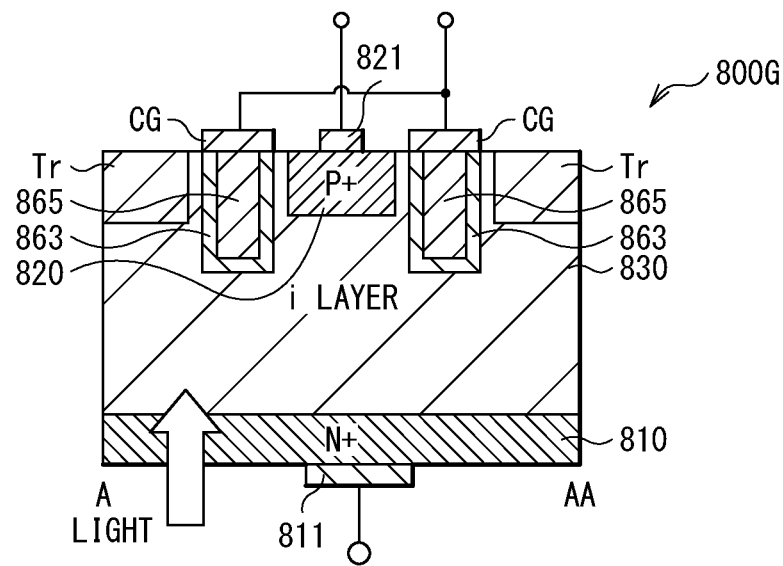

FIG. 123B is a vertical cross-sectional view of a structure of the photodetector in an A-AA cutting plane of FIG. 123A.

Figure 123C:
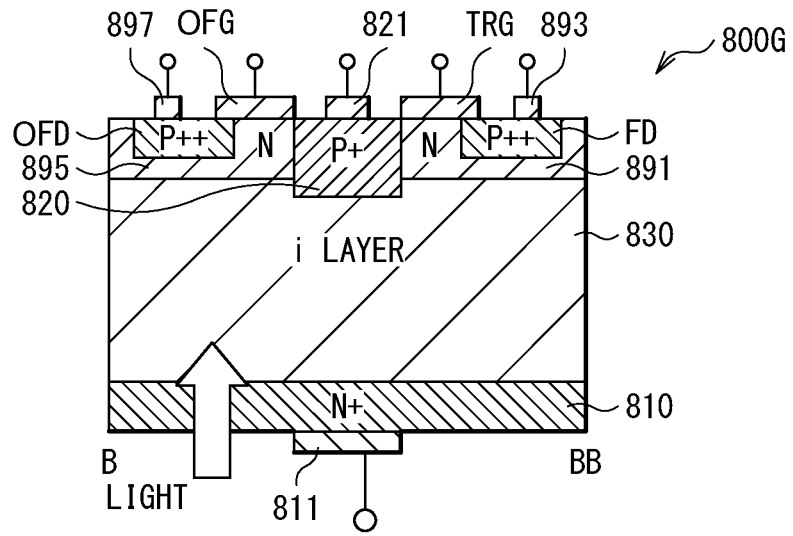

FIG. 123C is a vertical cross-sectional view of a structure of the photodetector in a B-BB cutting plane of FIG. 123A.

Figure 124A:
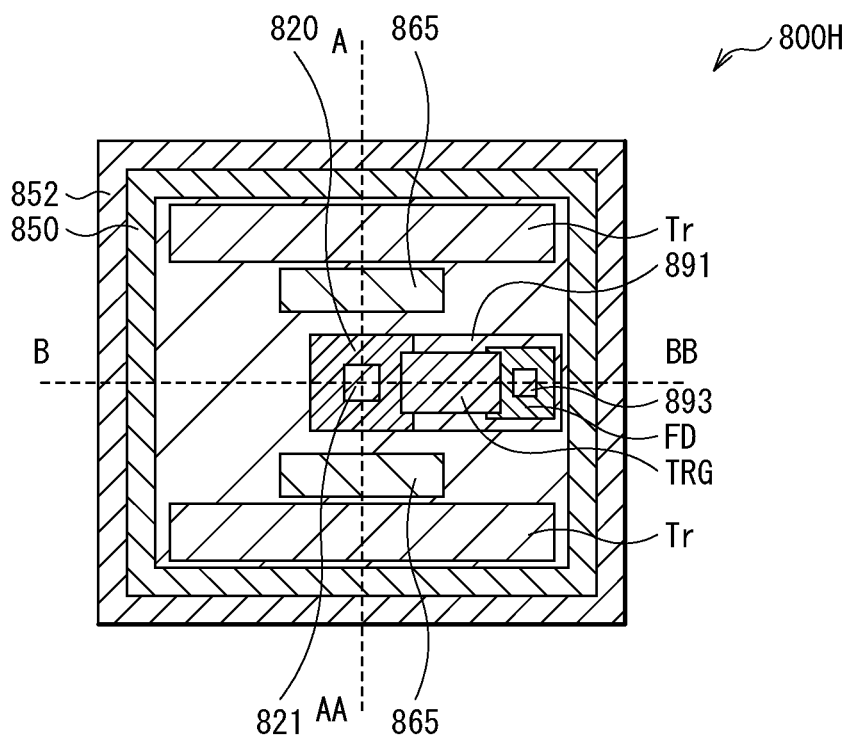

FIG. 124A is a plan view of a structure of a photodetector according to an eighth variation from a second surface side.

Figure 124B:
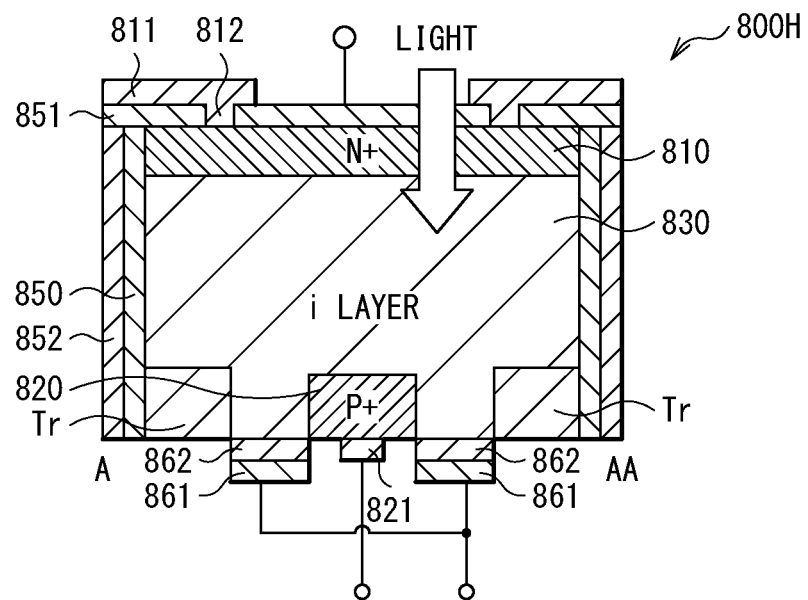

FIG. 124B is a vertical cross-sectional view of a structure of the photodetector in an A-AA cutting plane of FIG. 124A.

Figure 124C:
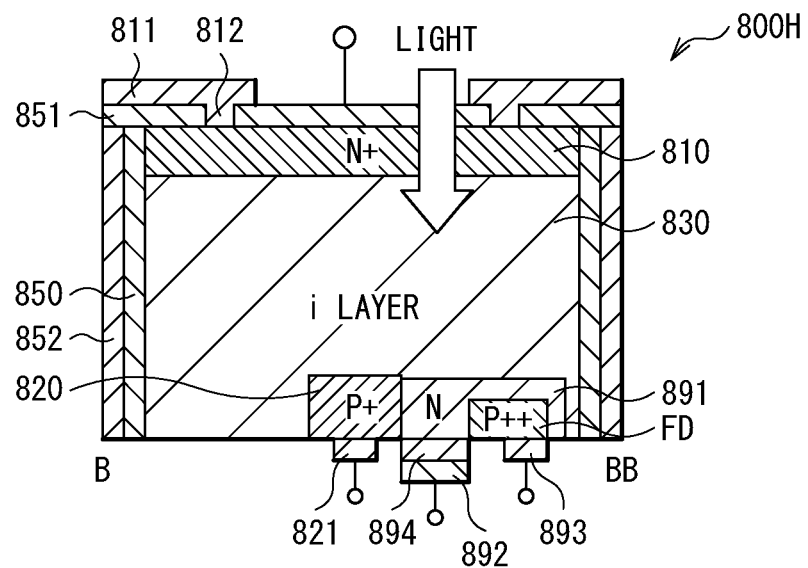

FIG. 124C is a vertical cross-sectional view of a structure of the photodetector in a B-BB cutting plane of FIG. 124A.

Figure 125A:
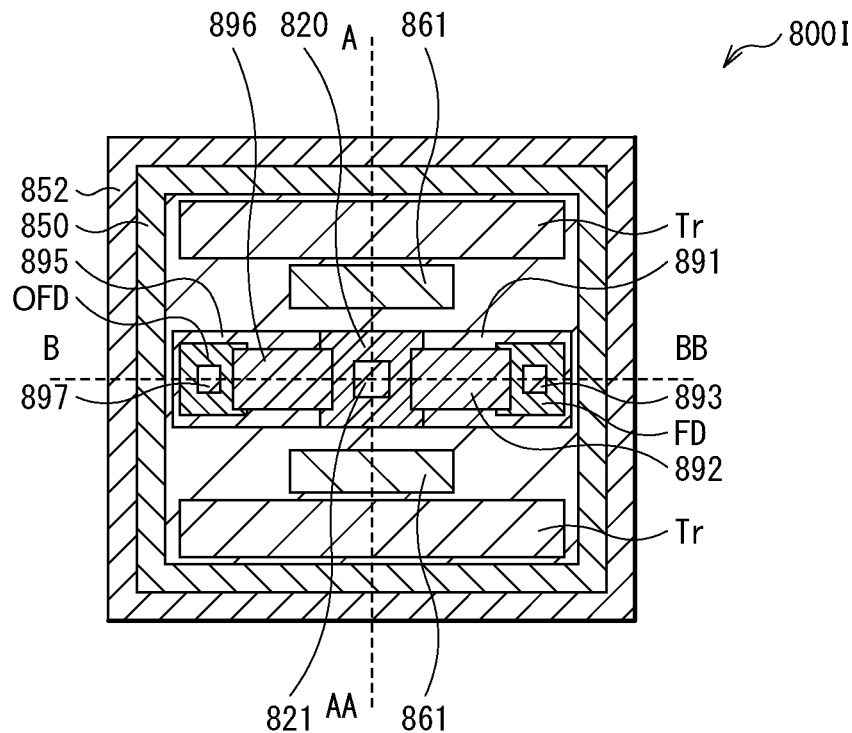

FIG. 125A is a plan view of a structure of a photodetector according to a ninth variation from a second surface side.

Figure 125B:
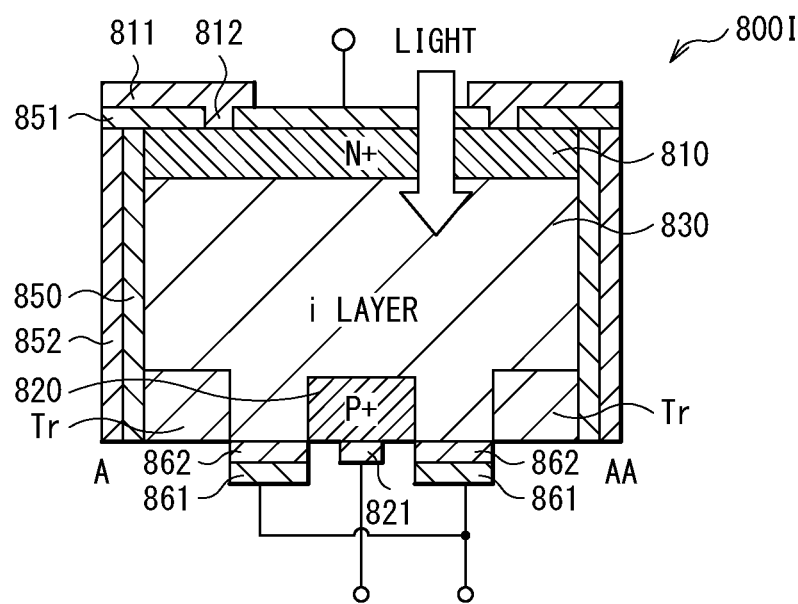

FIG. 125B is a vertical cross-sectional view of a structure of the photodetector in an A-AA cutting plane of FIG. 125A.

Figure 125C:
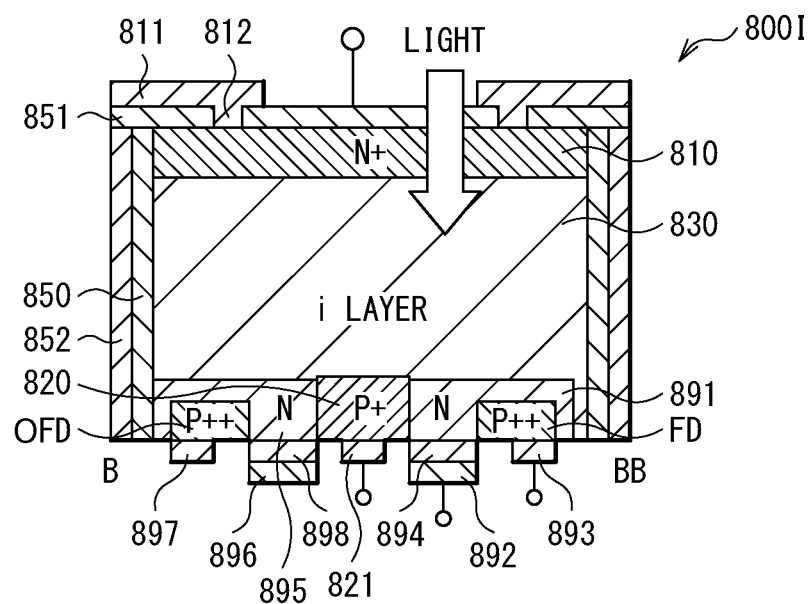

FIG. 125C is a vertical cross-sectional view of a structure of the photodetector in a B-BB cutting plane of FIG. 125A.

Figure 126A:
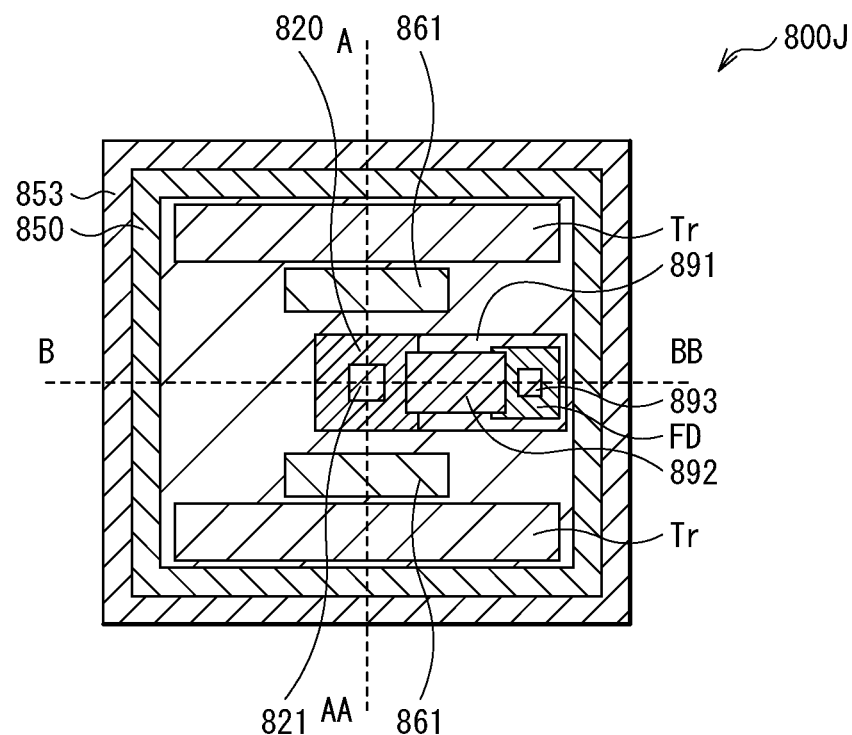

FIG. 126A is a plan view of a structure of a photodetector according to a tenth variation from a second surface side.

Figure 126B:
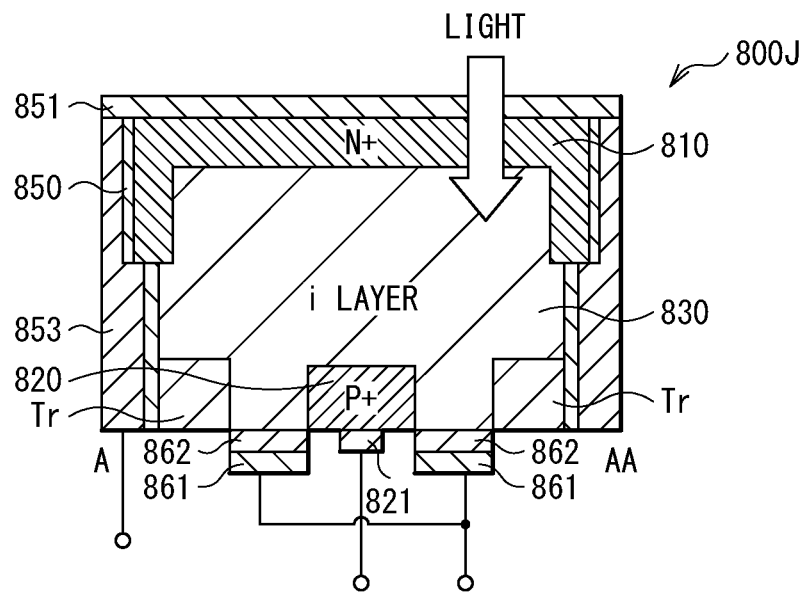

FIG. 126B is a vertical cross-sectional view of a structure of the photodetector in an A-AA cutting plane of FIG. 126A.

Figure 126C:
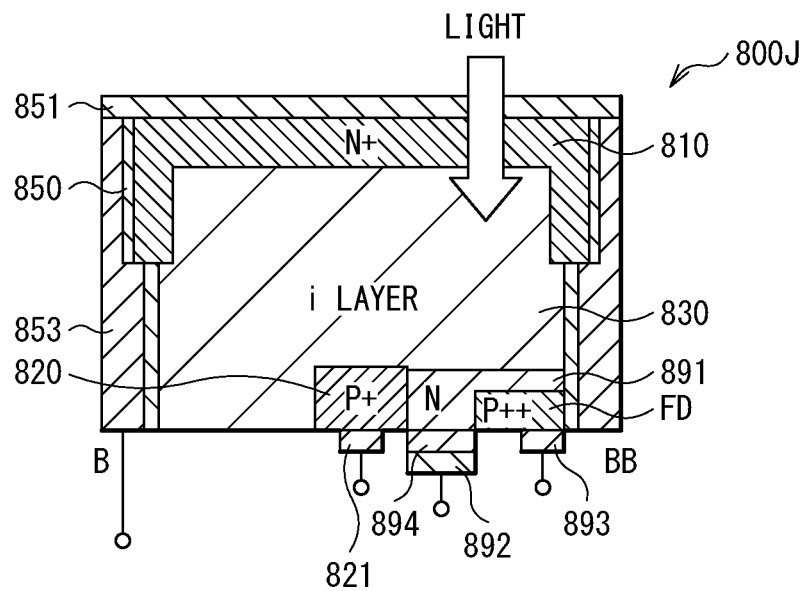

FIG. 126C is a vertical cross-sectional view of a structure of the photodetector in a B-BB cutting plane of FIG. 126A.

Figure 127A:
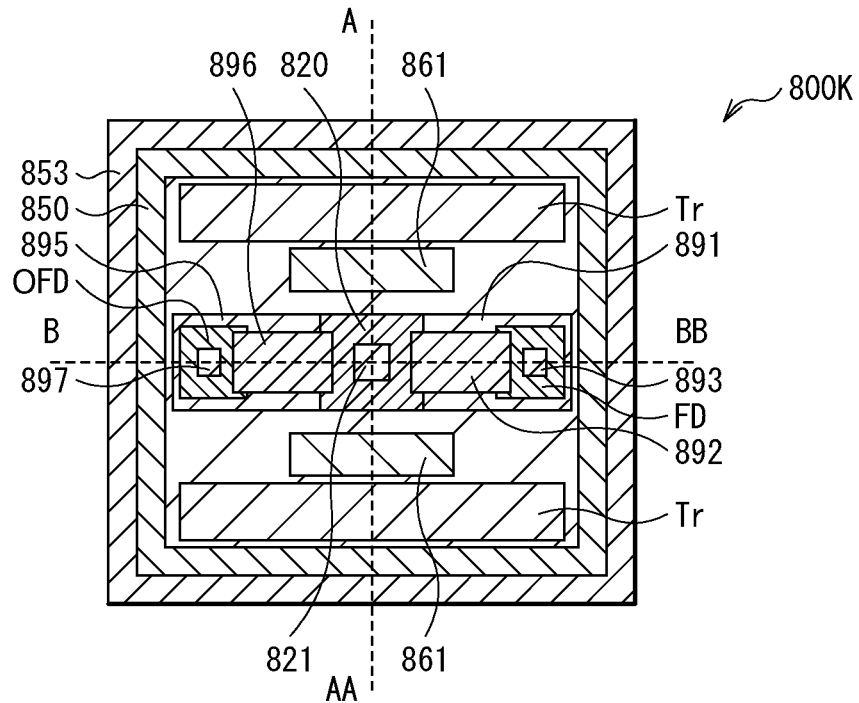

FIG. 127A is a plan view of a structure of a photodetector according to an eleventh variation from a second surface side.

Figure 127B:
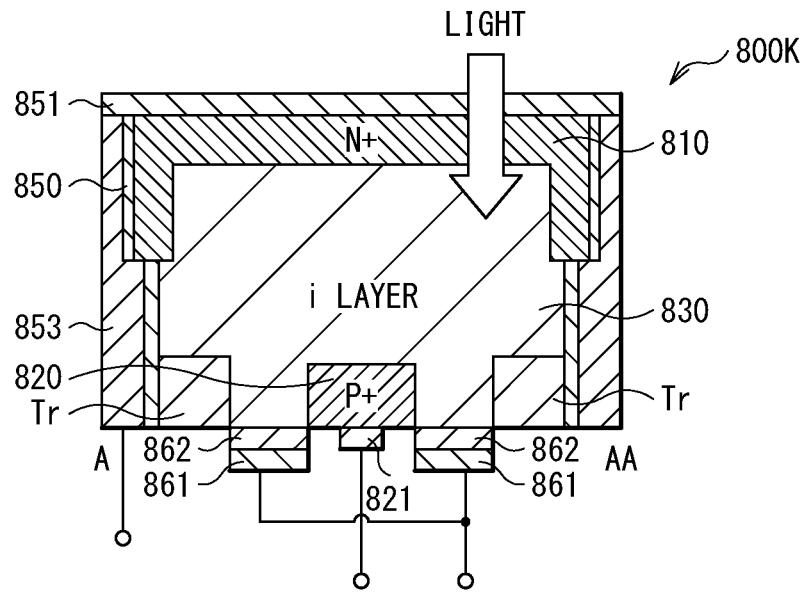

FIG. 127B is a vertical cross-sectional view of a structure of the photodetector in an A-AA cutting plane of FIG. 127A.

Figure 127C:
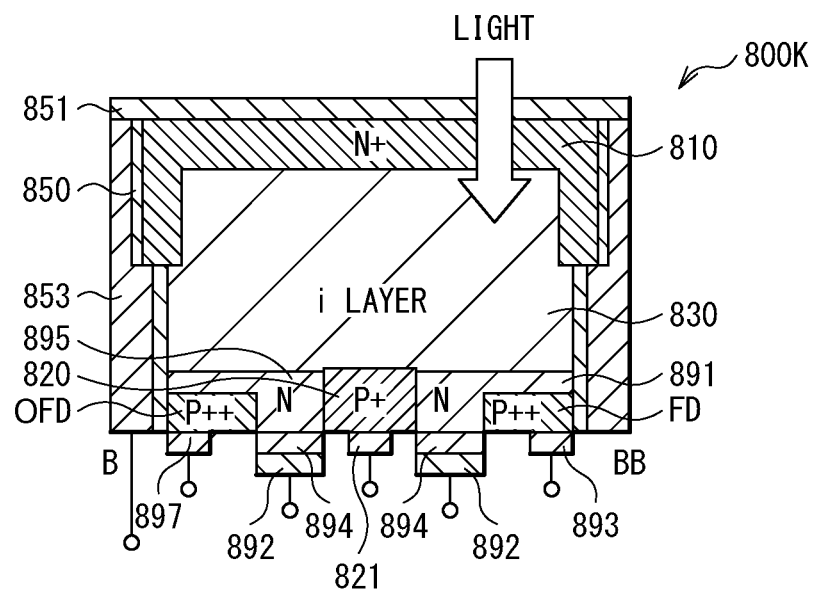

FIG. 127C is a vertical cross-sectional view of a structure of the photodetector in a B-BB cutting plane of FIG. 127A.

Figure 128:
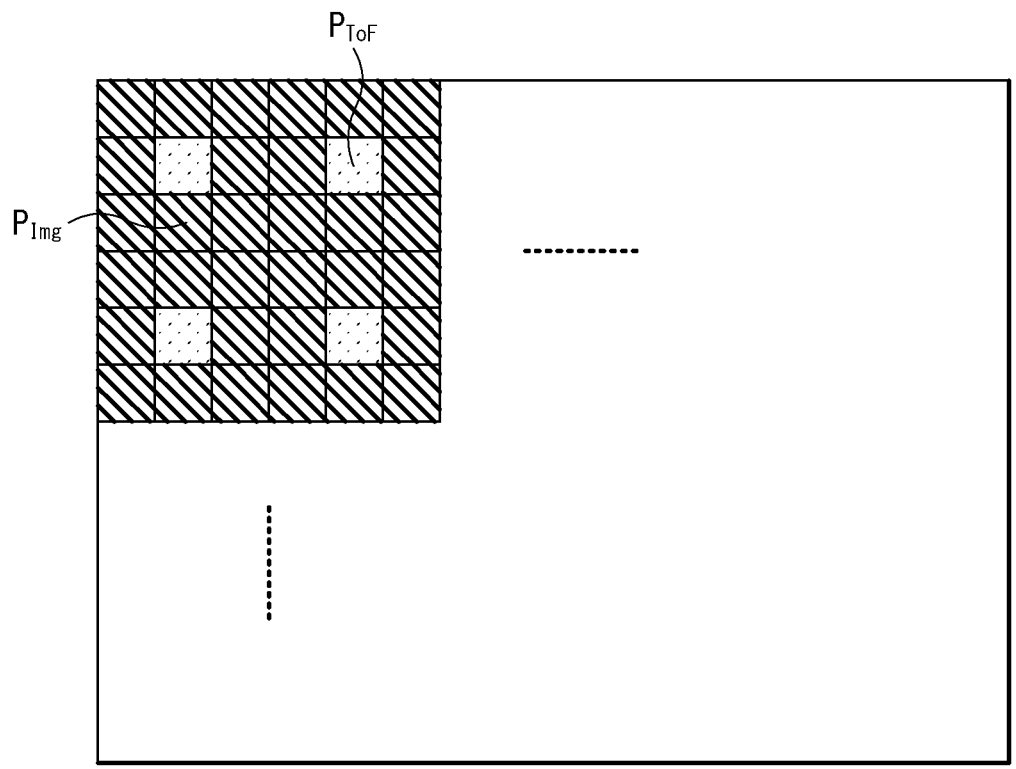

FIG. 128 is a schematic diagram illustrating an example of a planar configuration of a pixel array in which a plurality of pixels is arranged in a matrix.

Figure 129:
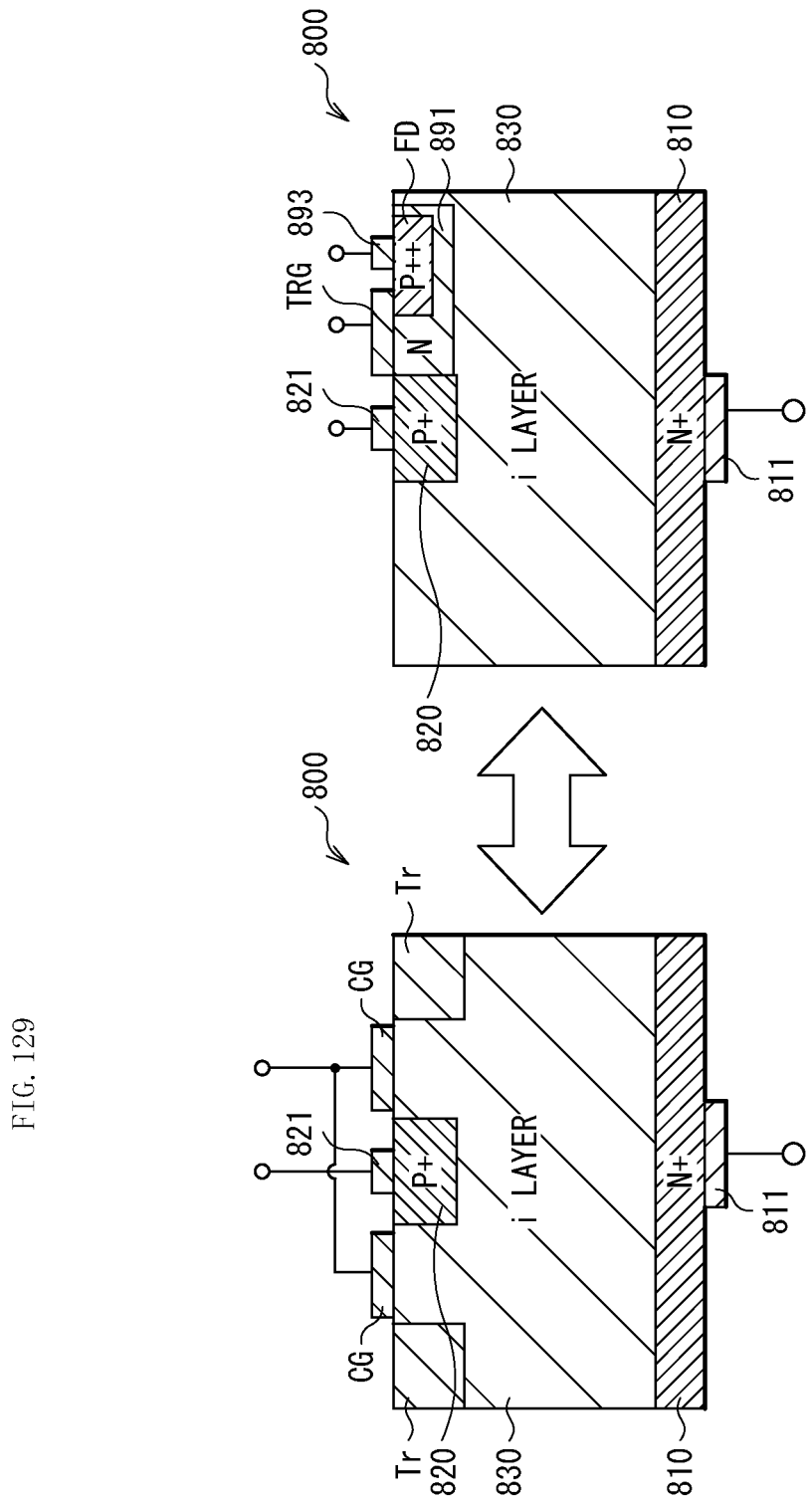

FIG. 129 is a conceptual diagram describing switching between a DPD operation and a PD operation of the photodetector according to the embodiment.

Figure 130:
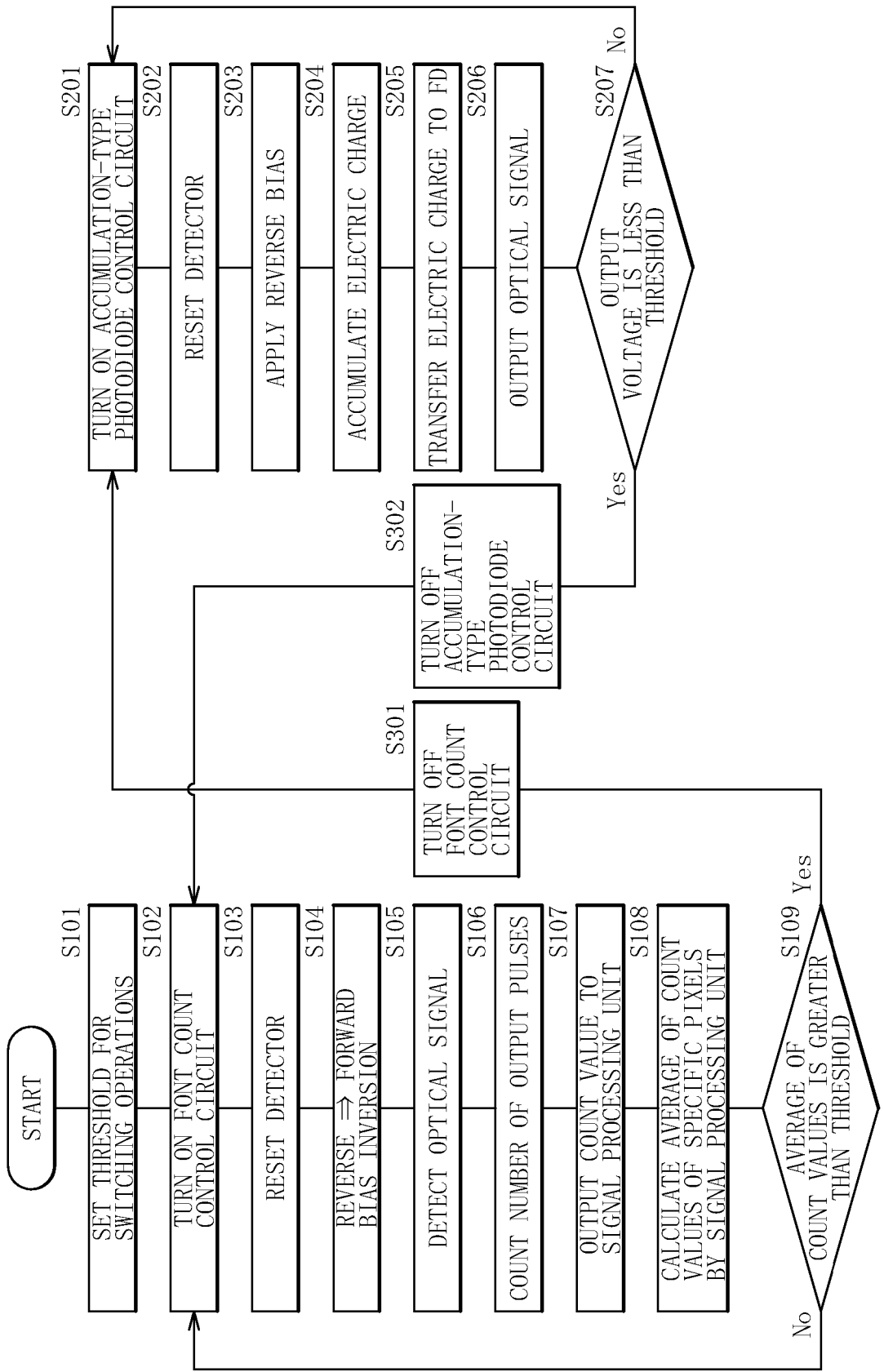

FIG. 130 is a flowchart diagram illustrating an example of a flow of the switching between the DPD operation and PD operation of the photodetector according to the embodiment.

Figure 131:
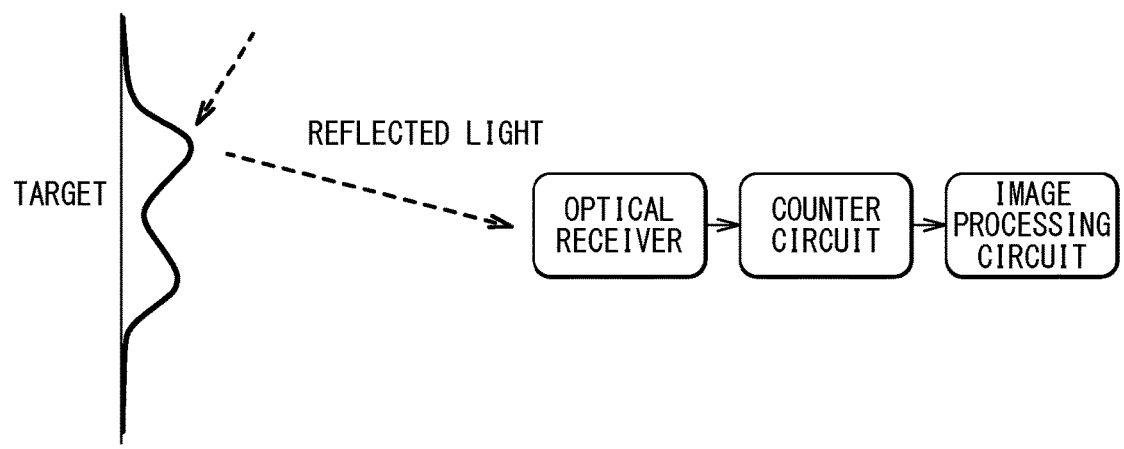

FIG. 131 is a block diagram illustrating an overview of a photon count operation by DPD.

Figure 132:
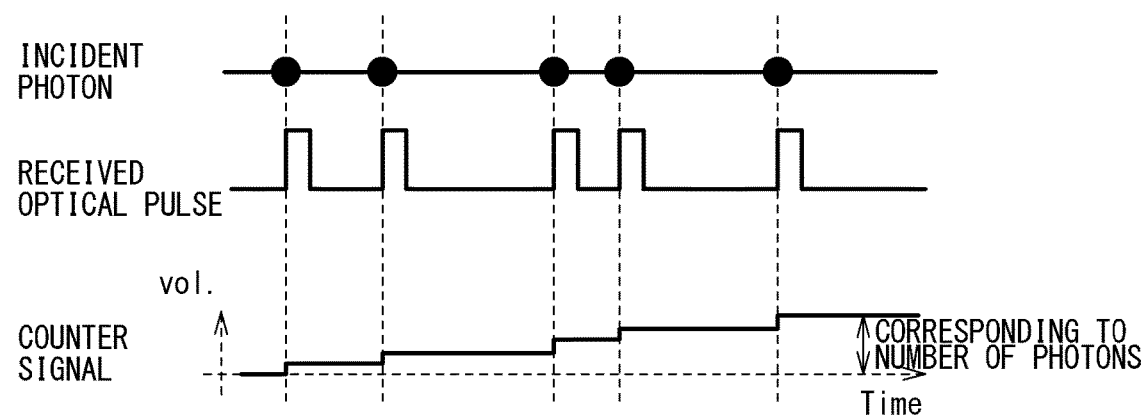

FIG. 132 is a graphical chart illustrating a relationship between a photon entering the DPD and a detected signal.

Figure 133:
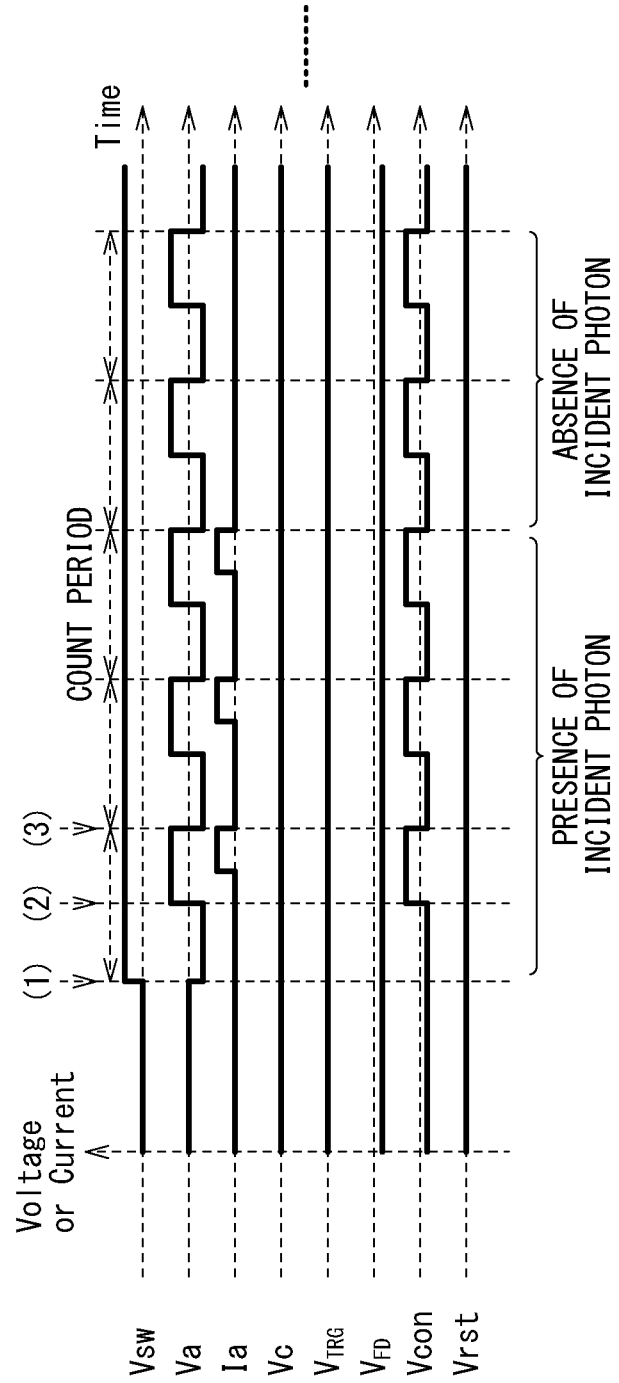

FIG. 133 is a timing chart diagram illustrating an example of the photon count operation of the photodetector according to the embodiment.

Figure 134A:
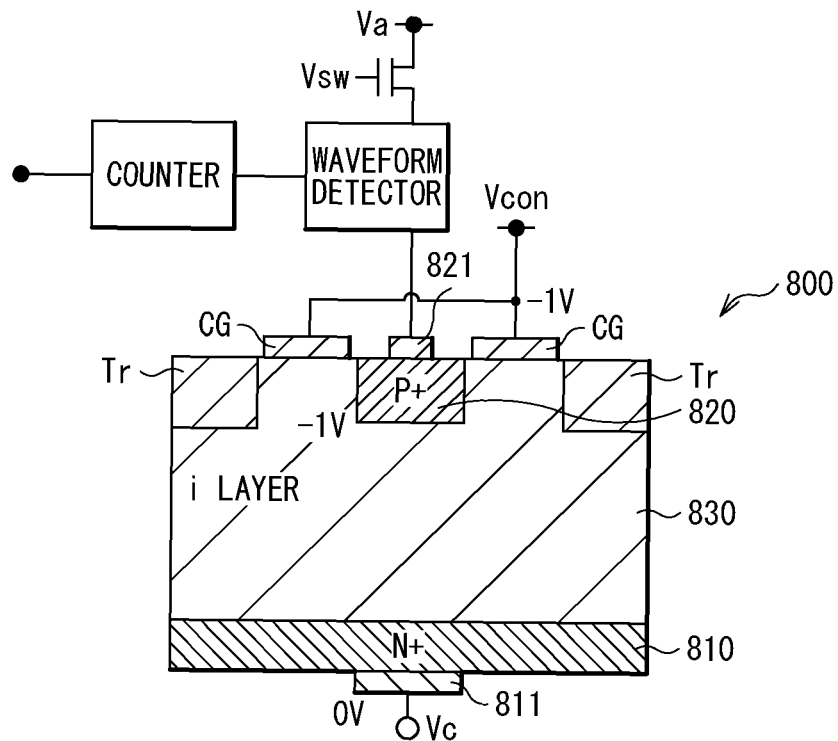

FIG. 134A is a vertical cross-sectional view describing a state of the photodetector at a timing of (1) in FIG. 133.

Figure 134B:
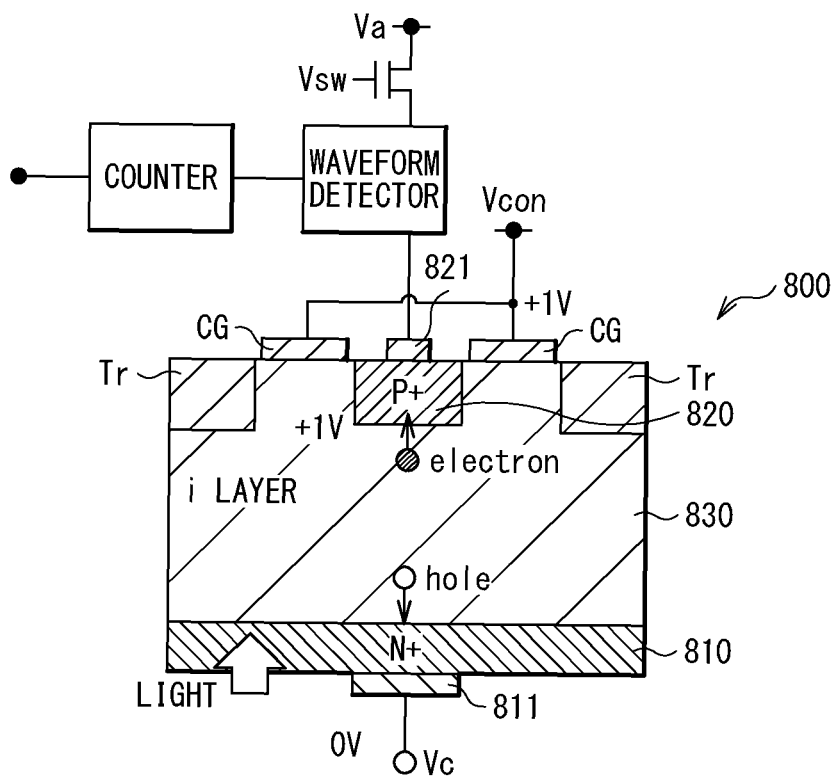

FIG. 134B is a vertical cross-sectional view describing a state of the photodetector at a timing of (2) in FIG. 133.

Figure 134C:
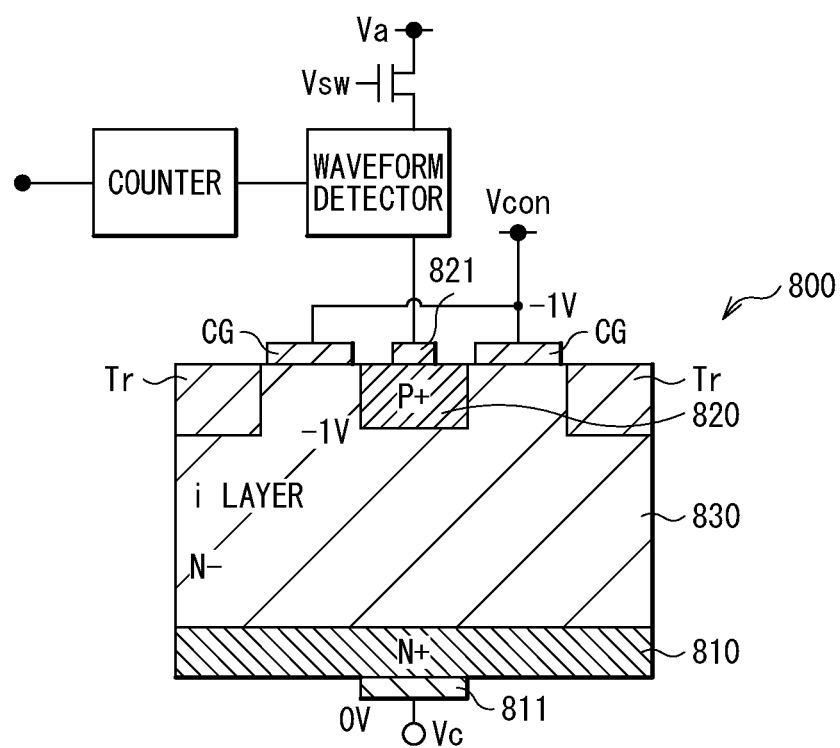

FIG. 134C is a vertical cross-sectional view describing a state of the photodetector at a timing of (3) in FIG. 133.

Figure 135:
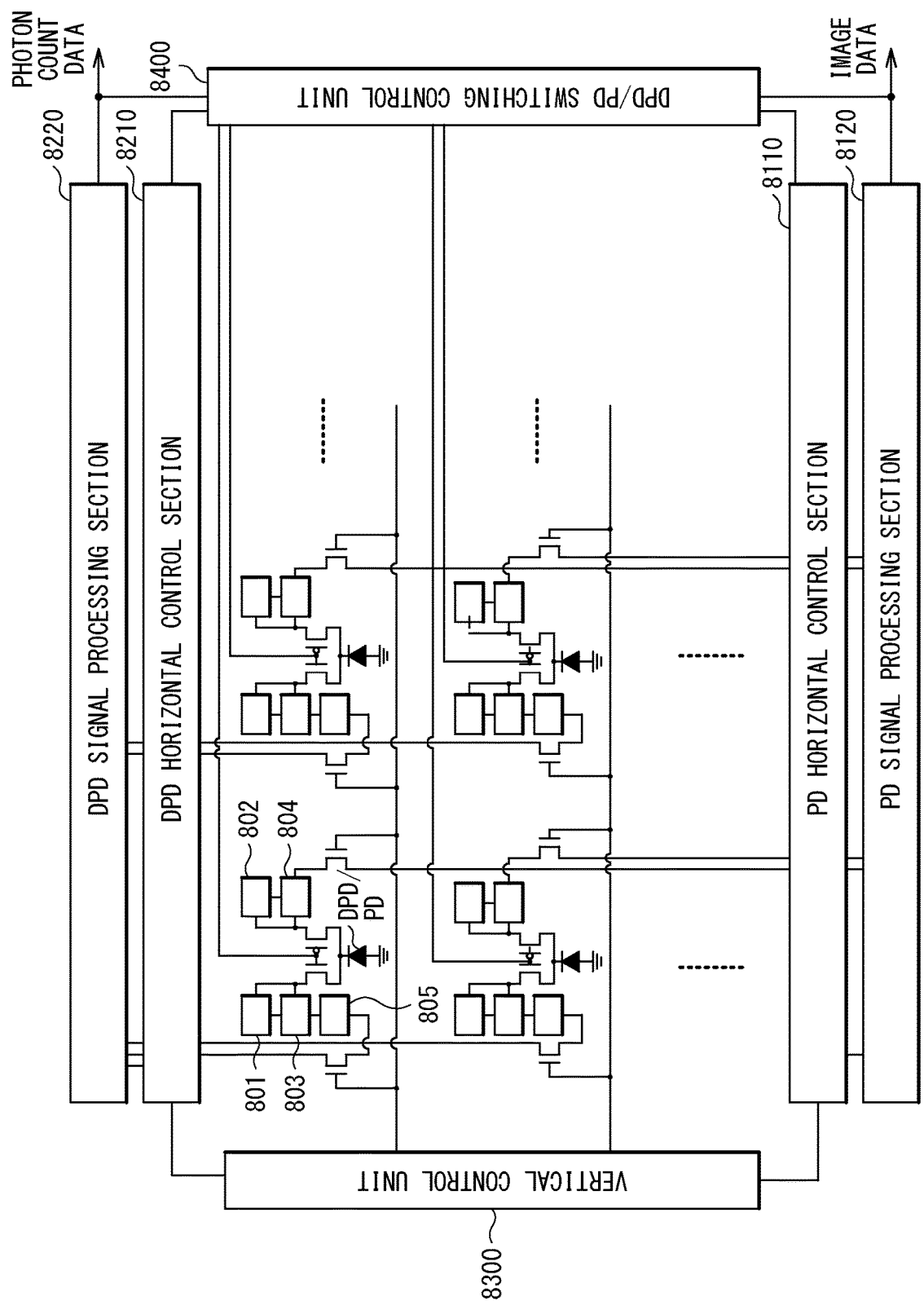

FIG. 135 is a block diagram illustrating a functional configuration in which the photodetector according to the present embodiment is applied to a pixel array that executes the photon count operation.

Figure 136:
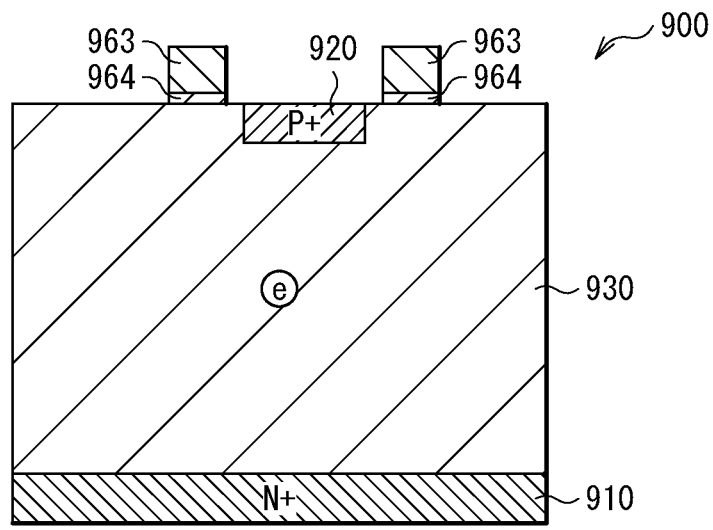

FIG. 136 is a vertical cross-sectional view of a structure of a photodetector according to a seventh embodiment of the present disclosure.

Figure 137:
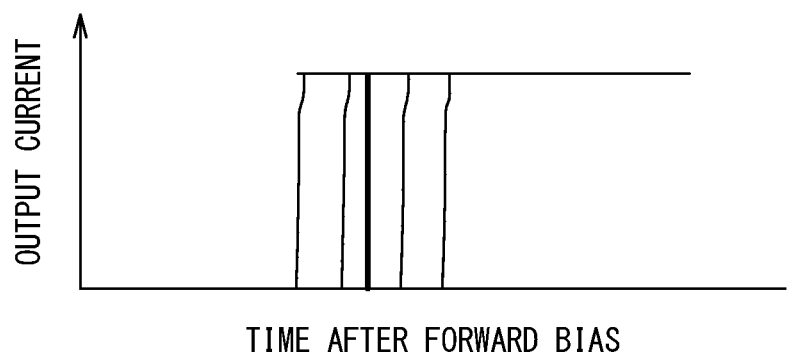

FIG. 137 is a graphical chart describing various time responses of a current outputted from the photodetector.

Figure 138:
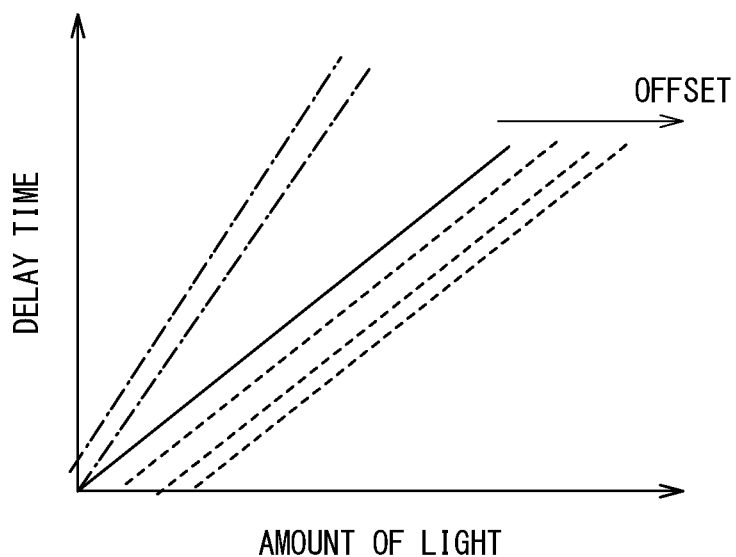

FIG. 138 is a graphical chart illustrating a linearity deviation for the various time responses illustrated in FIG. 137.

Figure 139:
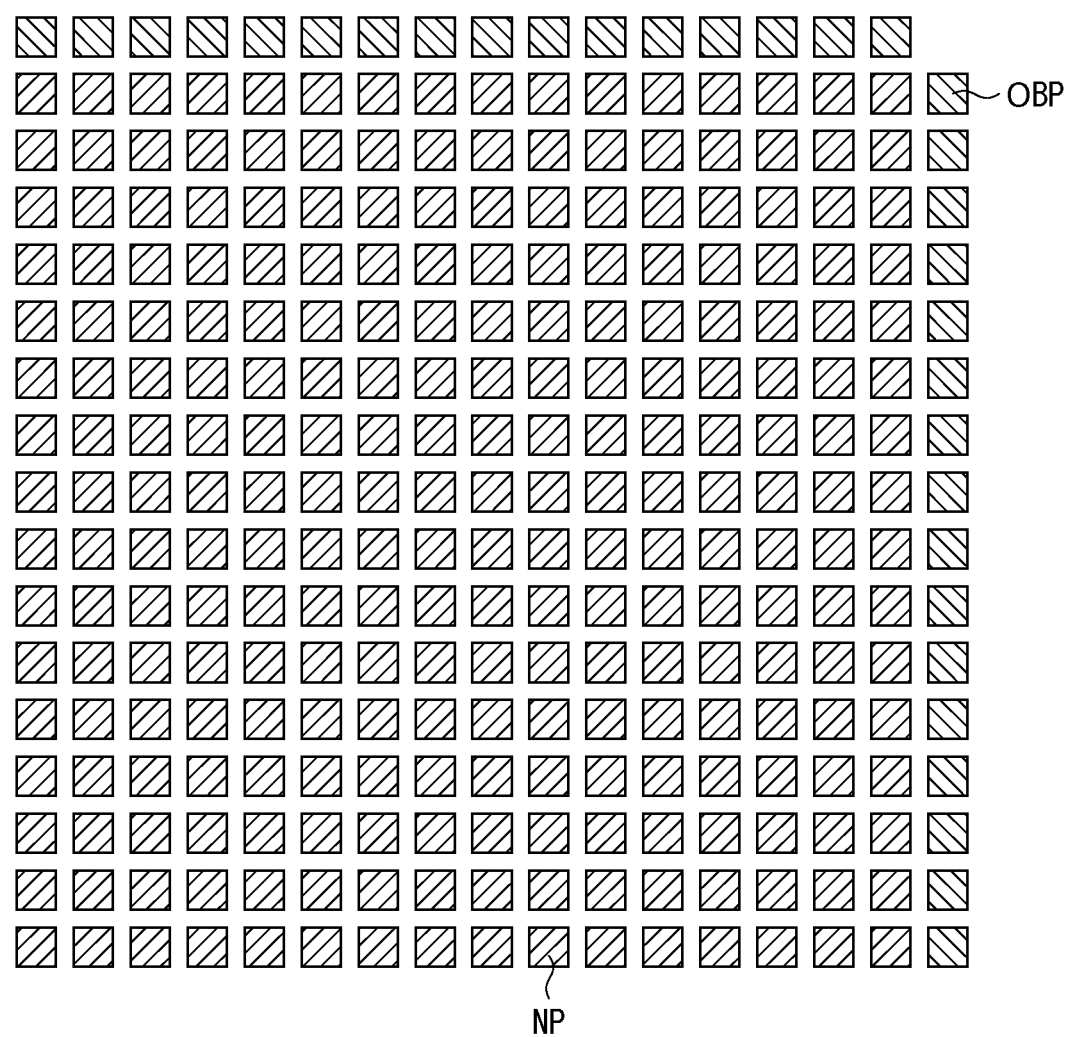

FIG. 139 is a plan view of a pixel array configuration of the photodetector according to the embodiment.

Figure 140:
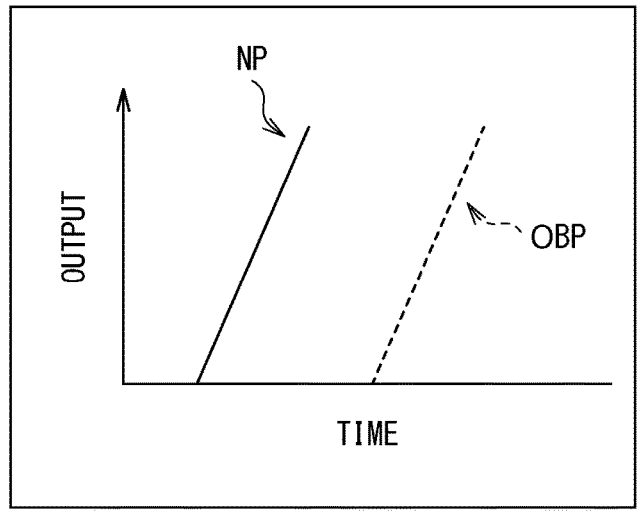

FIG. 140 is a graphical chart illustrating a relationship between an output of a normal pixel and an output of a reference pixel in the pixel array illustrated in FIG. 139.

Figure 141:
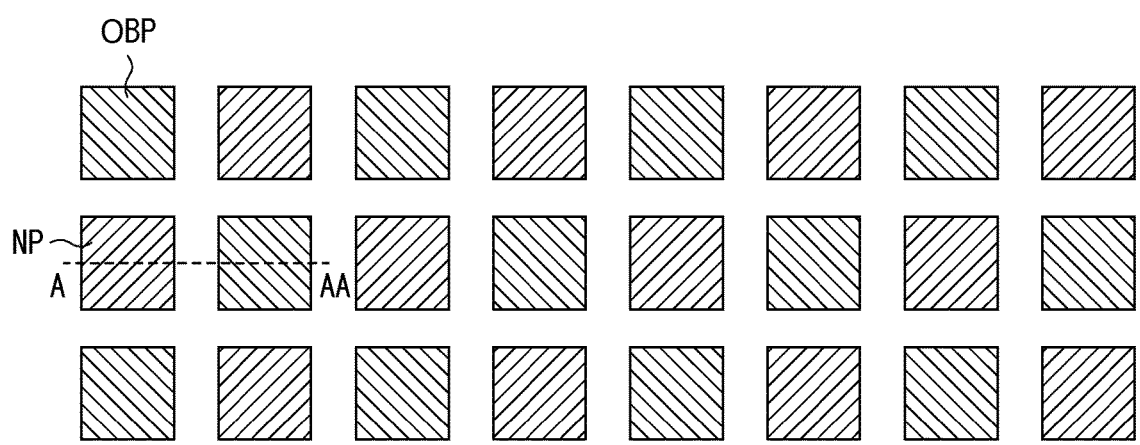

FIG. 141 is a schematic plan view describing a first variation of planar disposition of the normal pixel and the reference pixel.

Figure 142:
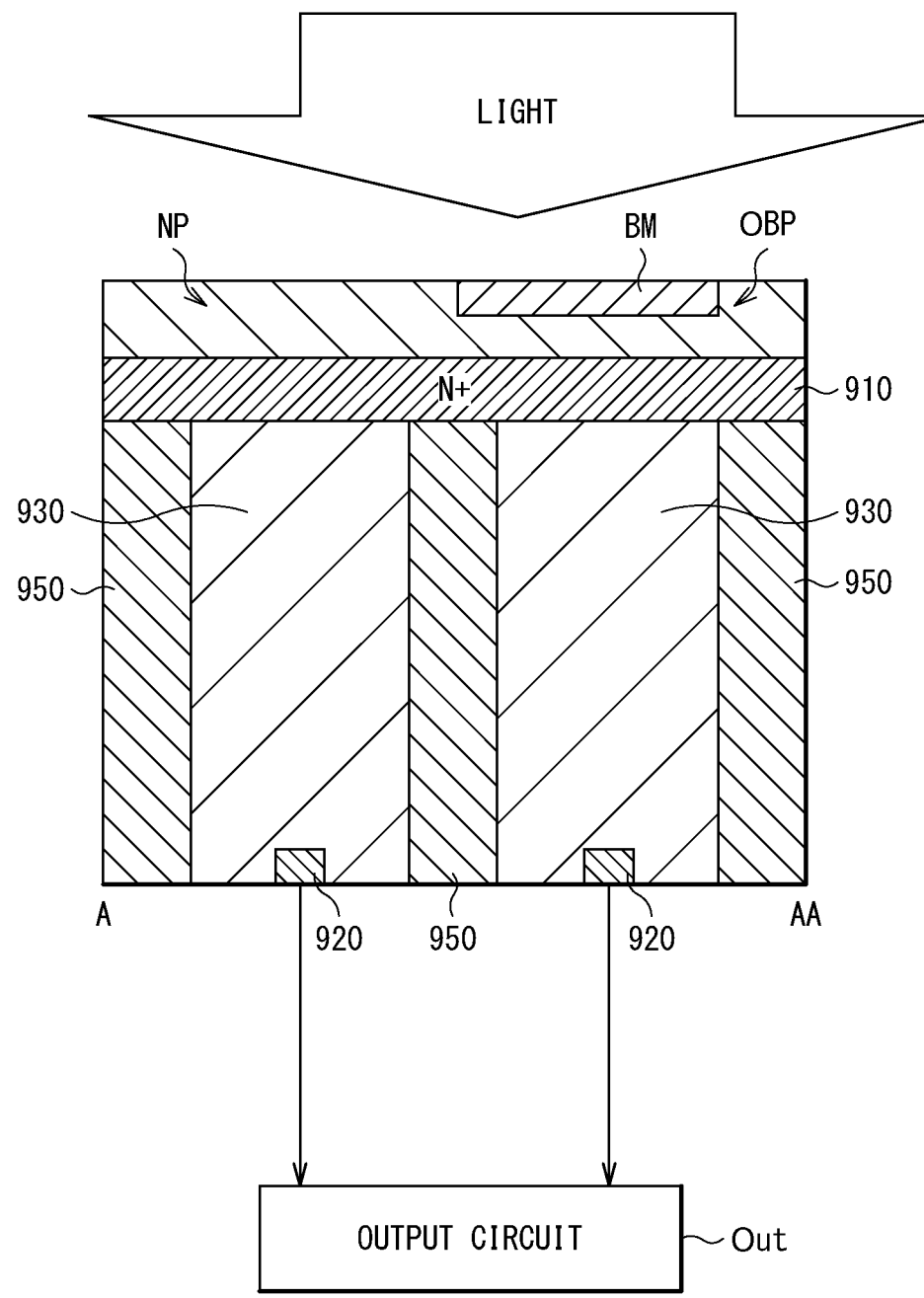

FIG. 142 is a vertical cross-sectional view of a cross-sectional configuration taken along an A-AA cutting plane of FIG. 141.

Figure 143:
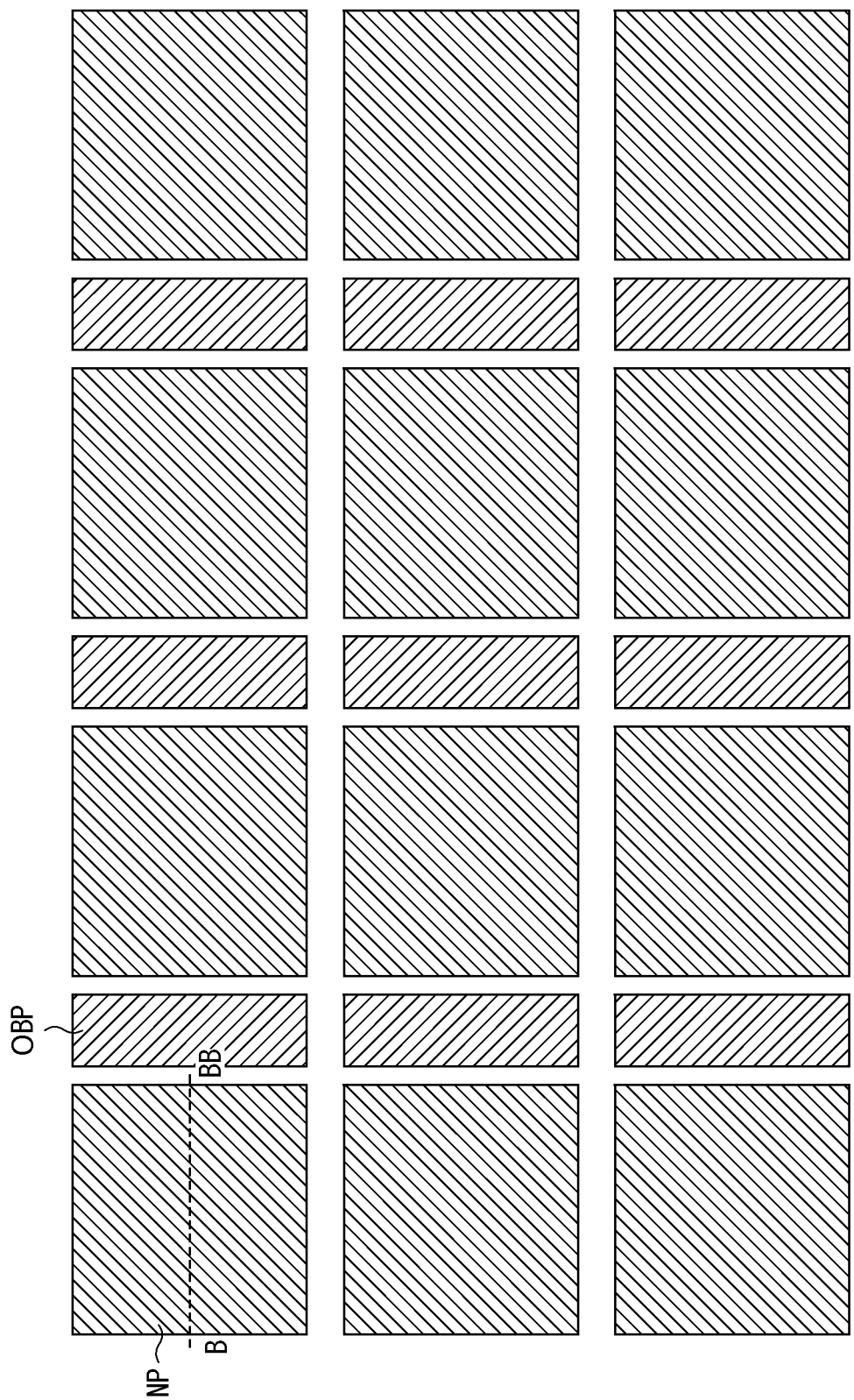

FIG. 143 is a schematic plan view describing a second variation of the planar disposition of the normal pixel and the reference pixel.

Figure 144:
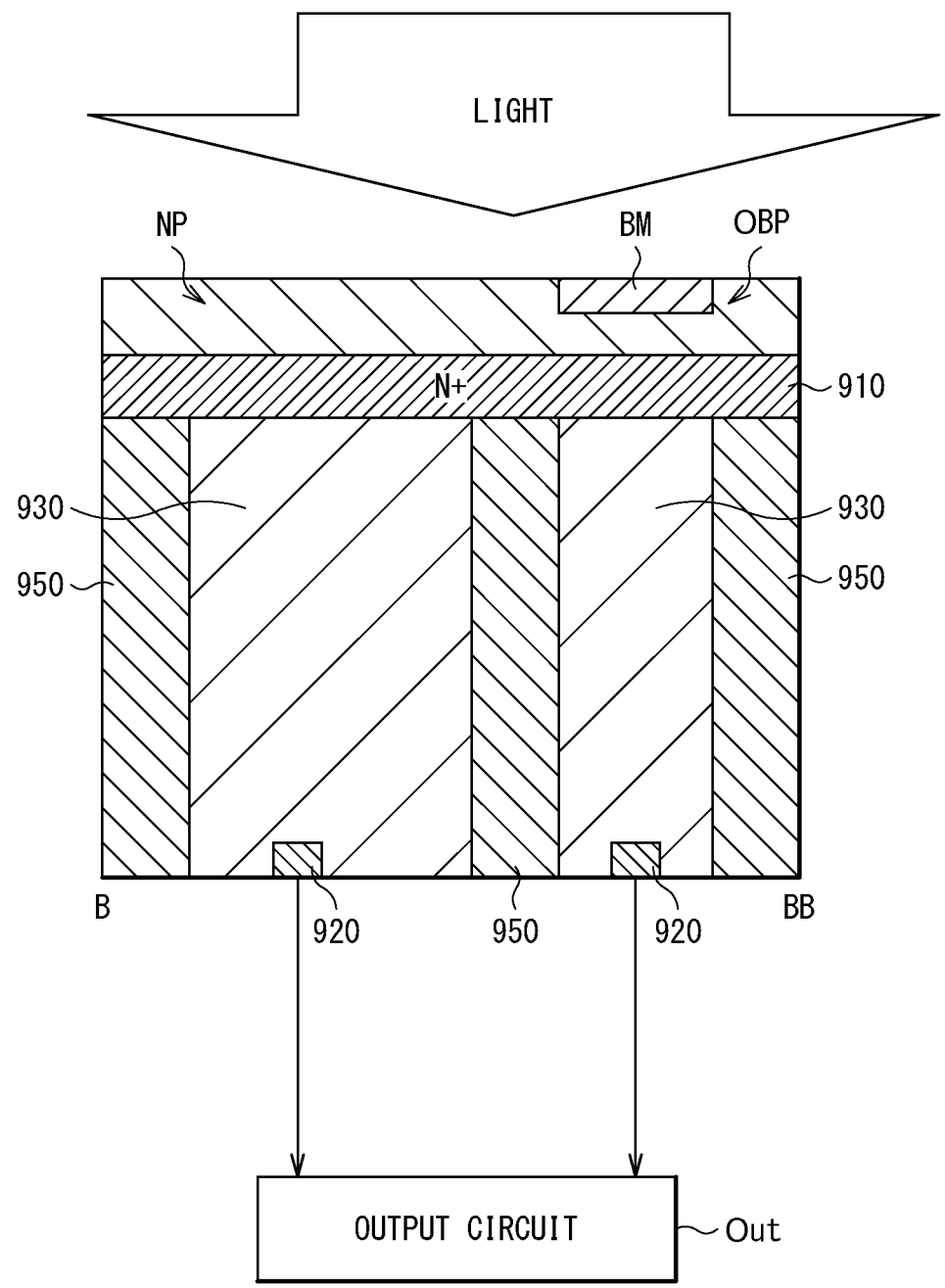

FIG. 144 is a vertical cross-sectional view of a cross-sectional configuration taken along a B-BB cutting plane of FIG. 143.

Figure 145:
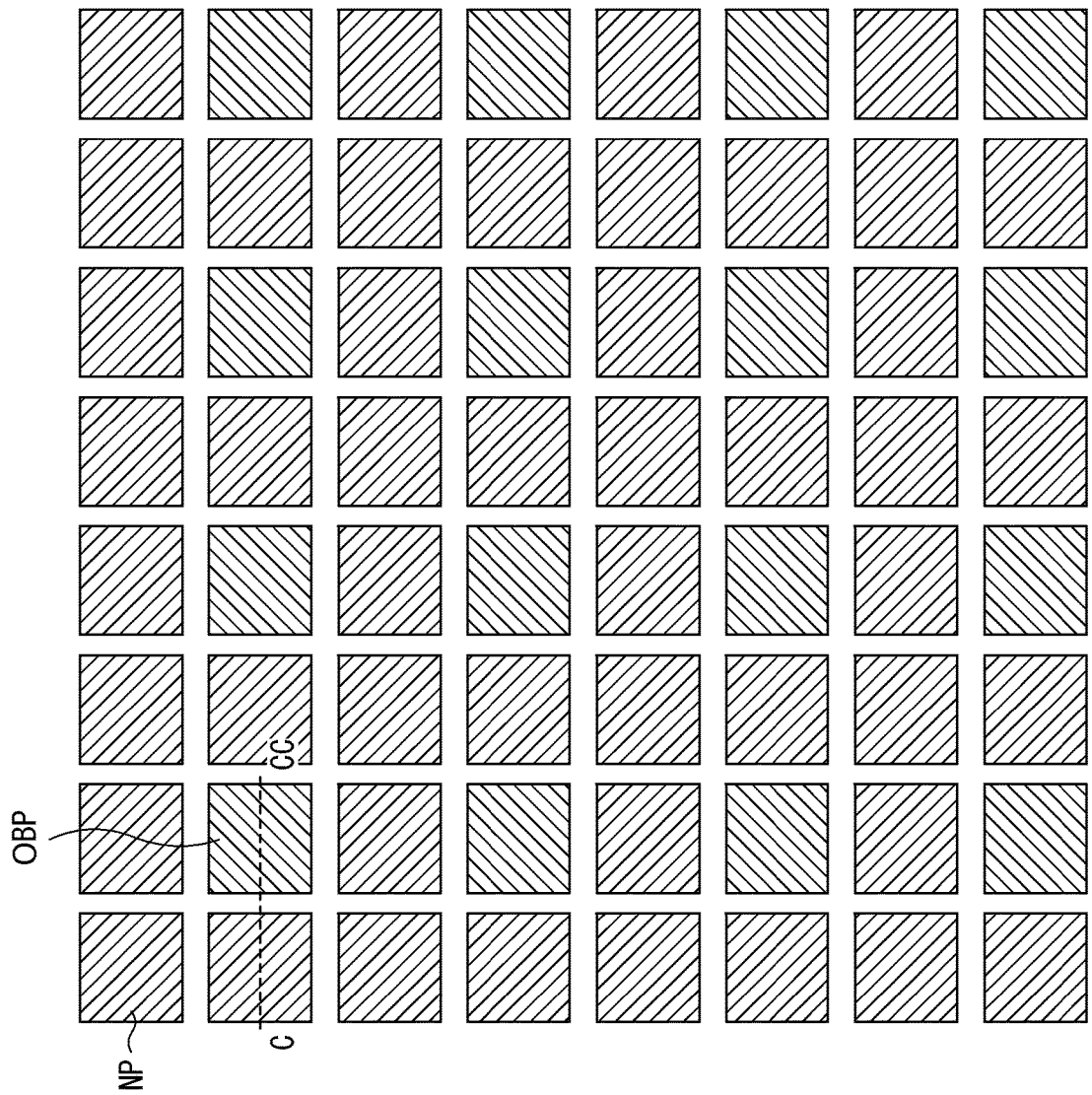

FIG. 145 is a schematic plan view describing a third variation of the planar disposition of the normal pixel and the reference pixel.

Figure 146:
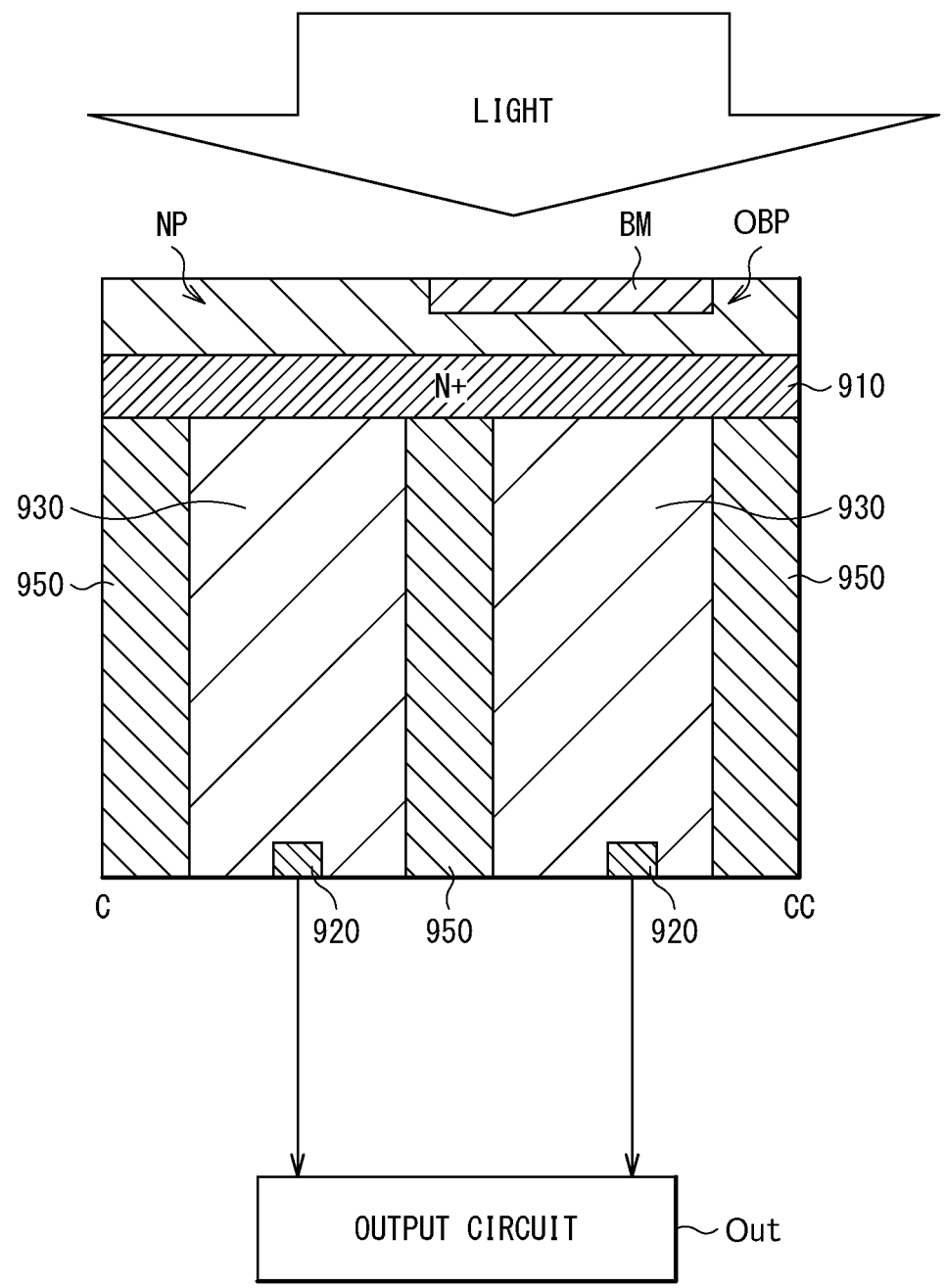

FIG. 146 is a vertical cross-sectional view of a cross-sectional configuration taken along a C-CC cutting plane of FIG. 145.

Figure 147:
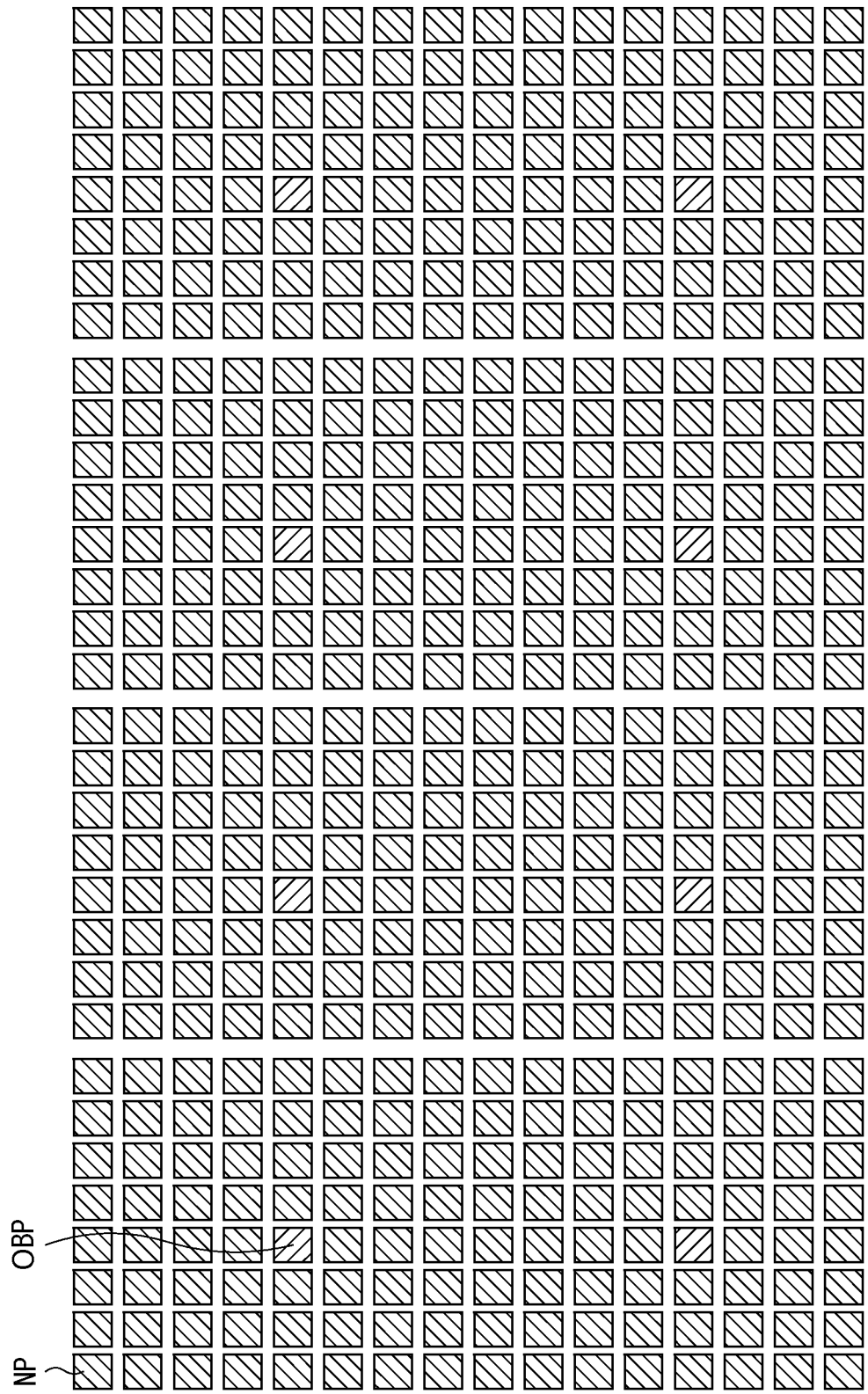

FIG. 147 is a schematic plan view describing a fourth variation of the planar disposition of the normal pixel and the reference pixel.

Figure 148:
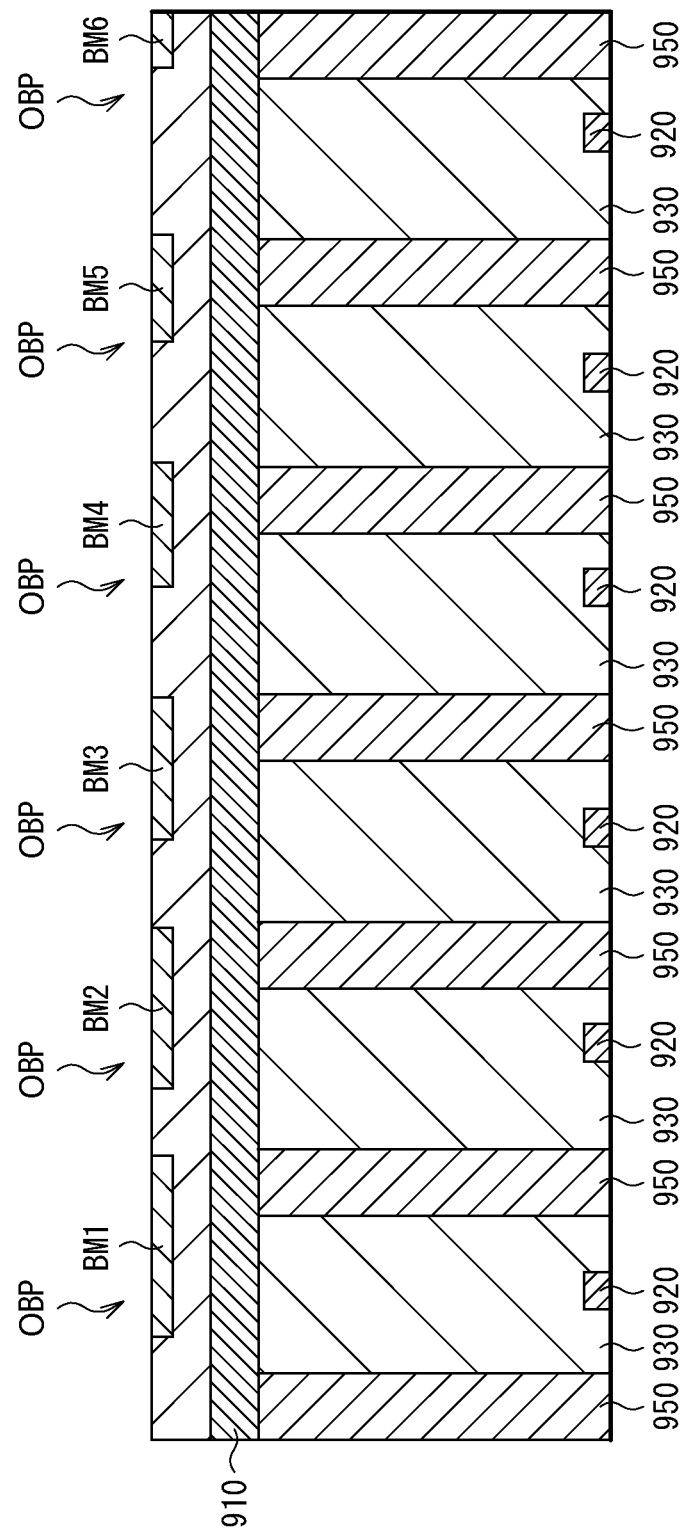

FIG. 148 is a vertical cross-sectional view of a fifth variation of a cross-sectional configuration of the normal pixel and the reference pixel.

Figure 149:
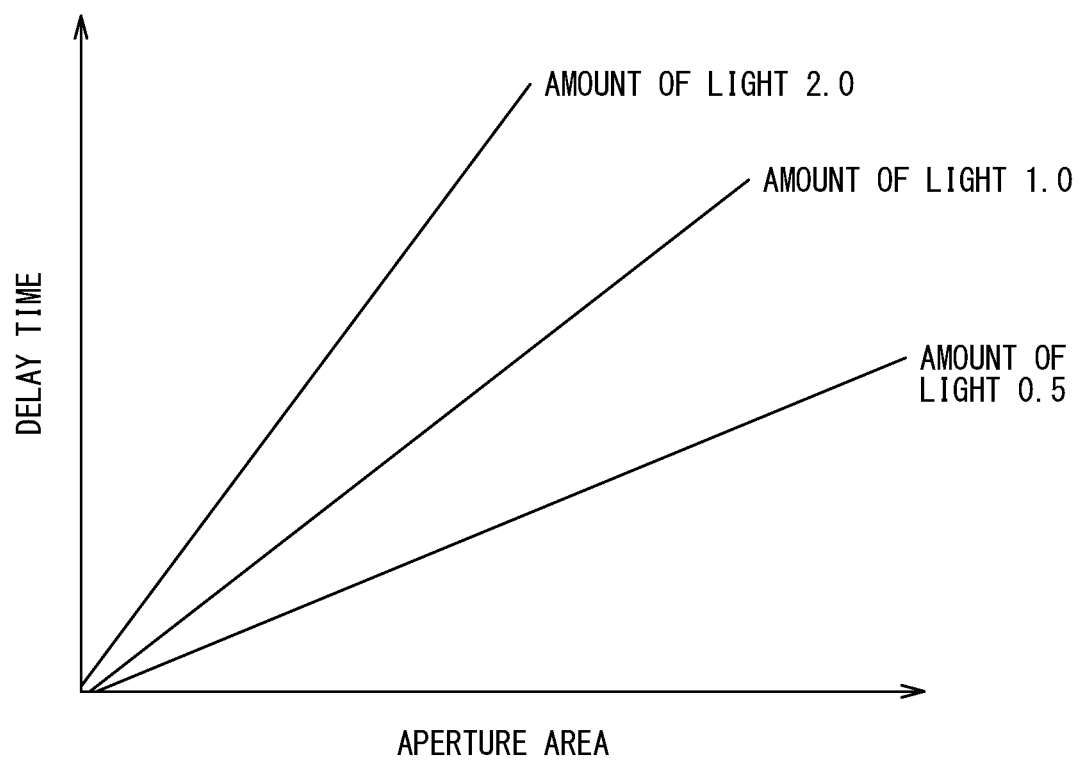

FIG. 149 is a graphical chart illustrating a relationship between aperture area of the reference pixel and delay time of a rising forward current.

Figure 150:
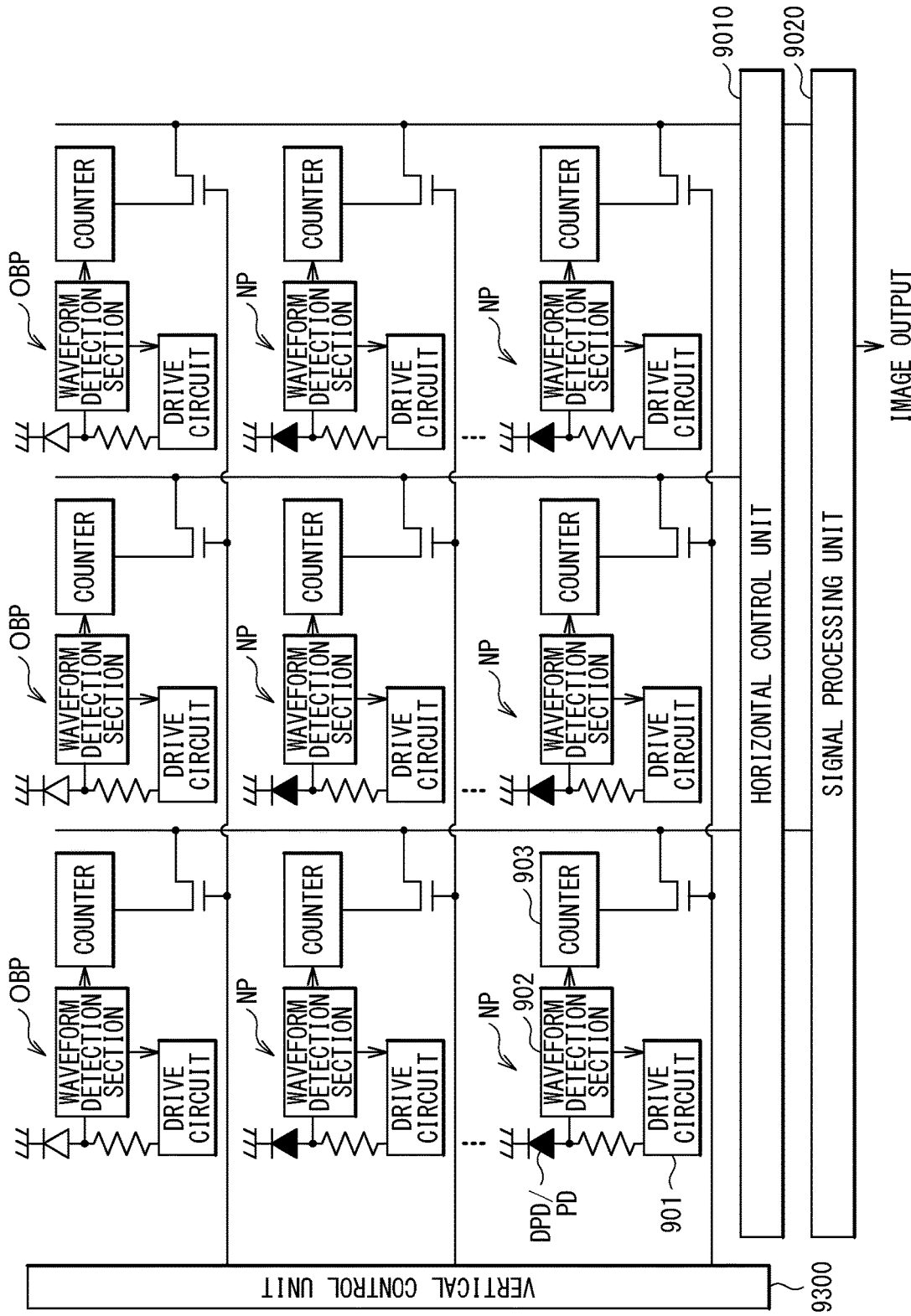

FIG. 150 is a block diagram illustrating a first circuit configuration in which the photodetector according to the embodiment is a pixel array.

Figure 151:
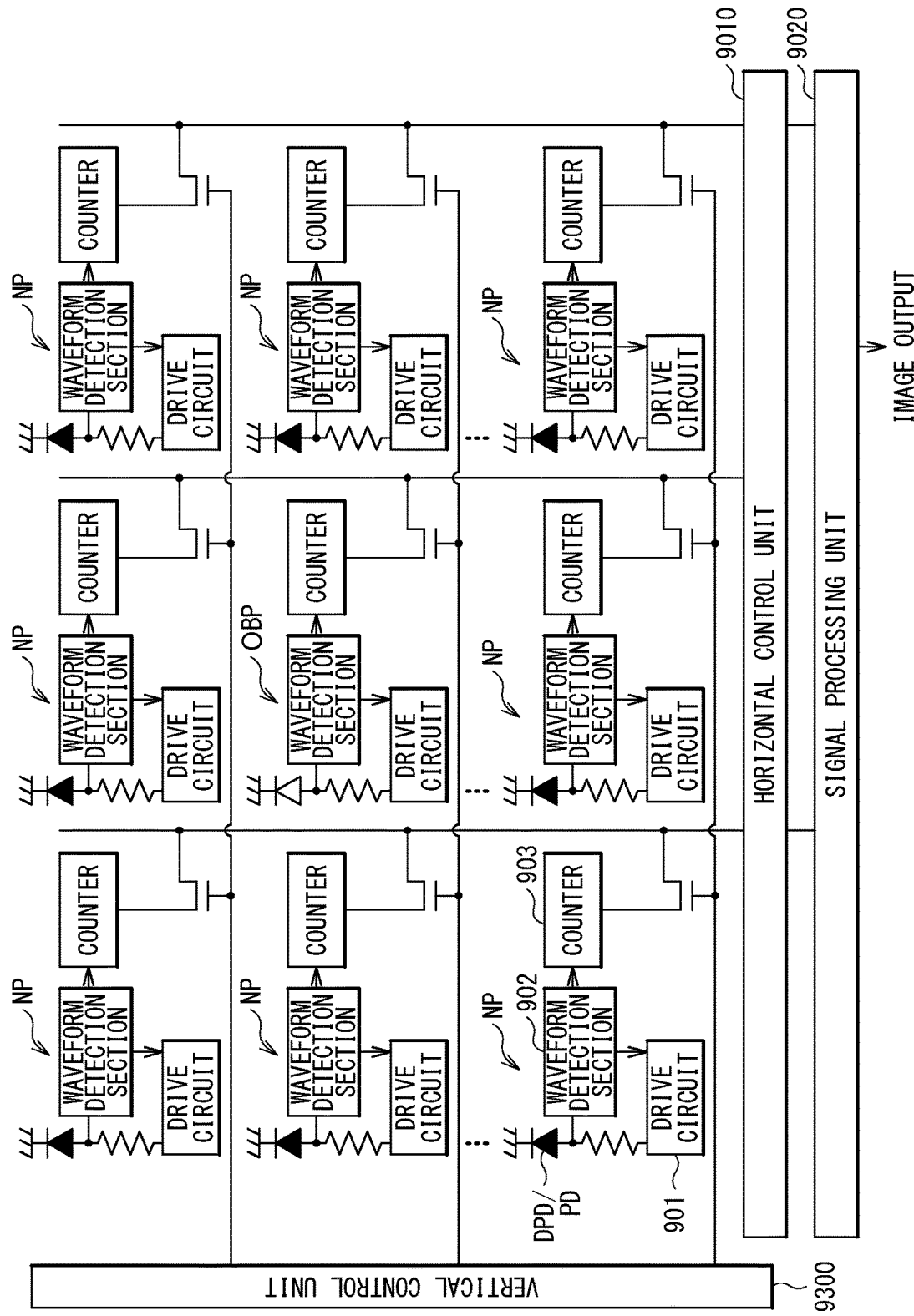

FIG. 151 is a block diagram illustrating a second circuit configuration in which the photodetector according to the embodiment is a pixel array.

Figure 152:
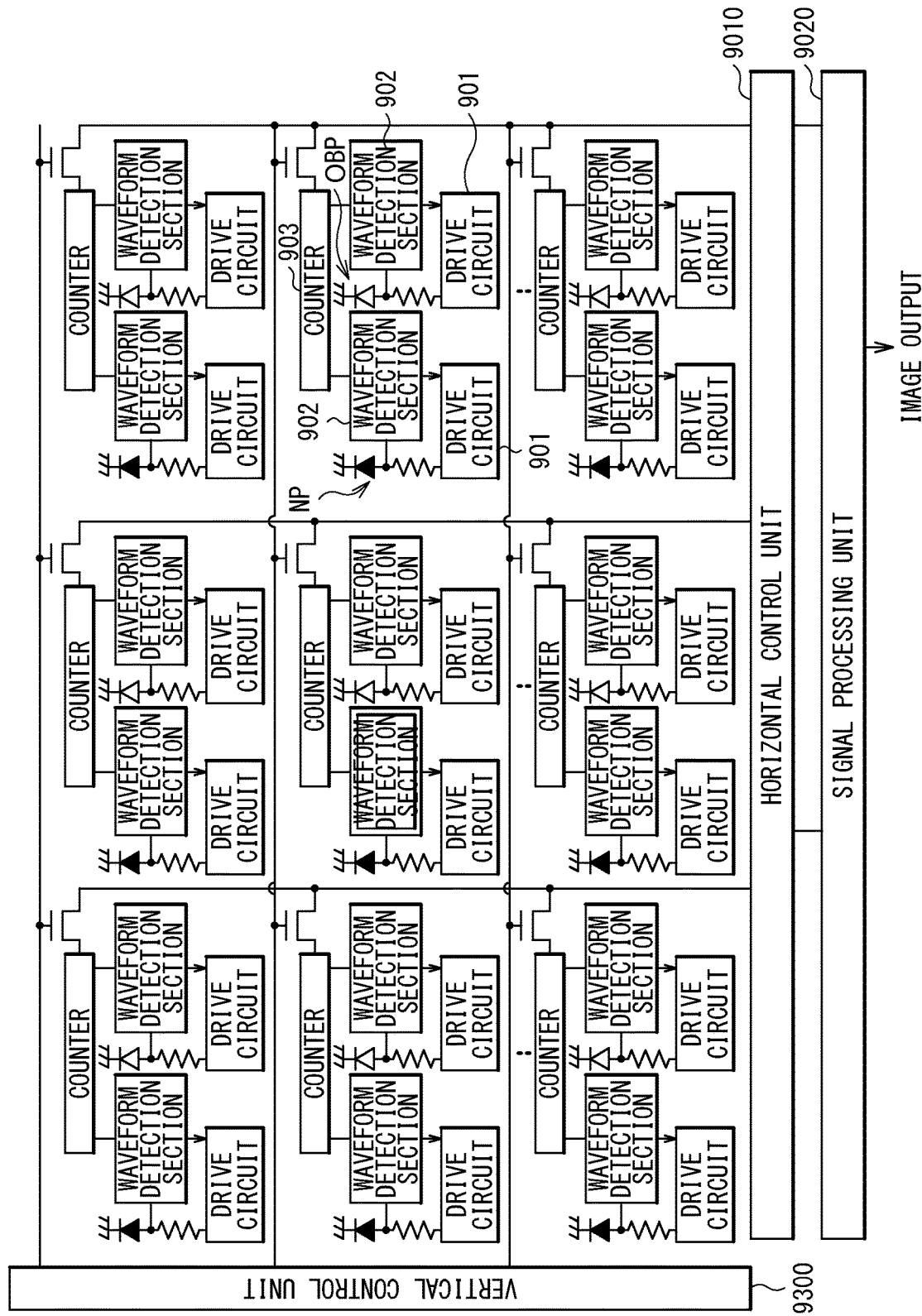

FIG. 152 is a block diagram illustrating a third circuit configuration in which the photodetector according to the embodiment is a pixel array.

Figure 153:
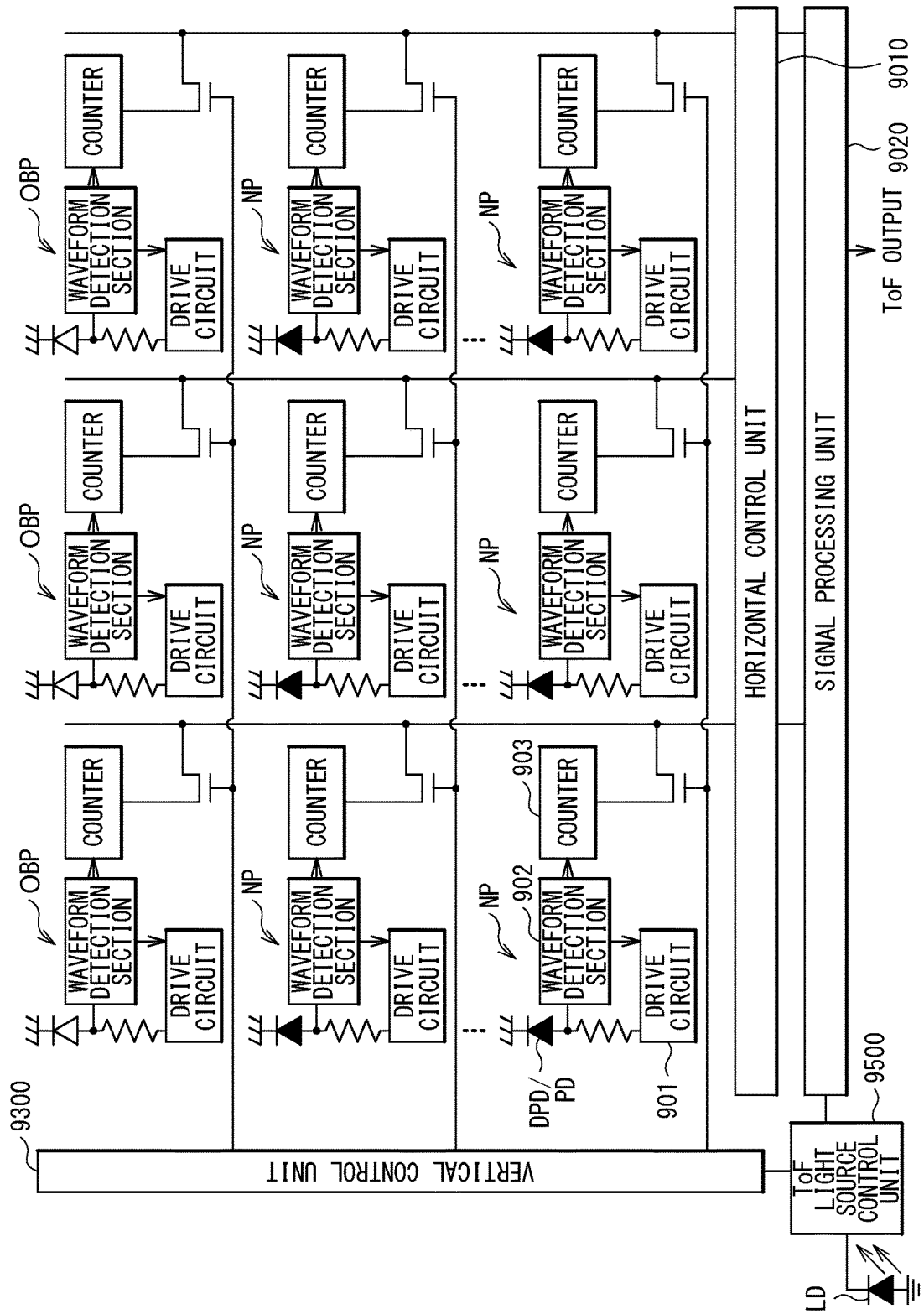

FIG. 153 is a block diagram illustrating a fourth circuit configuration in which the photodetector according to the embodiment is a pixel array.

Figure 154:
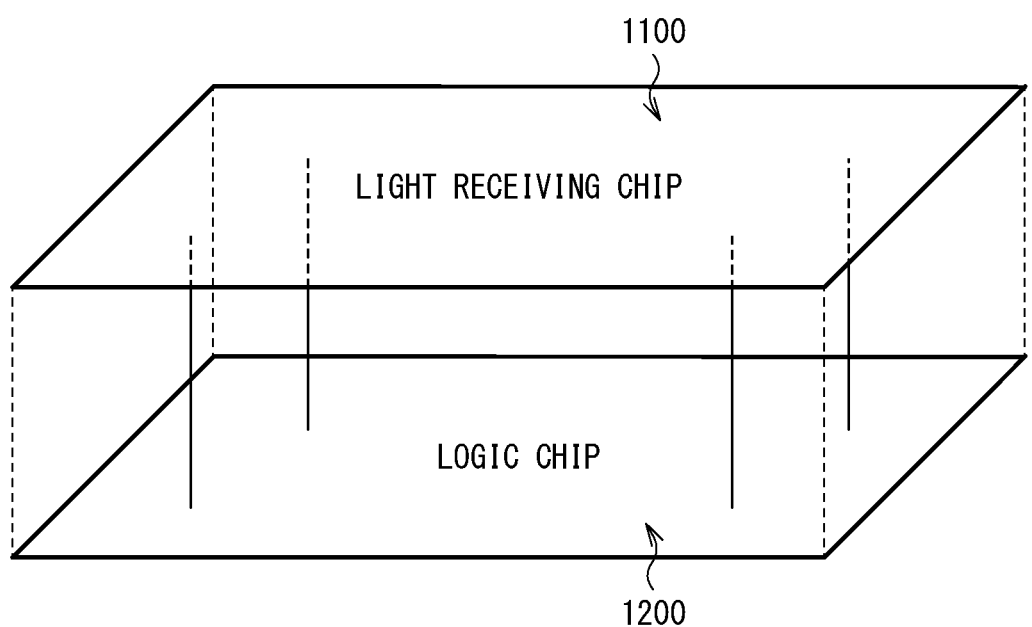

FIG. 154 is a schematic perspective view of an example of a stacked structure of the photodetector.

Figure 155:
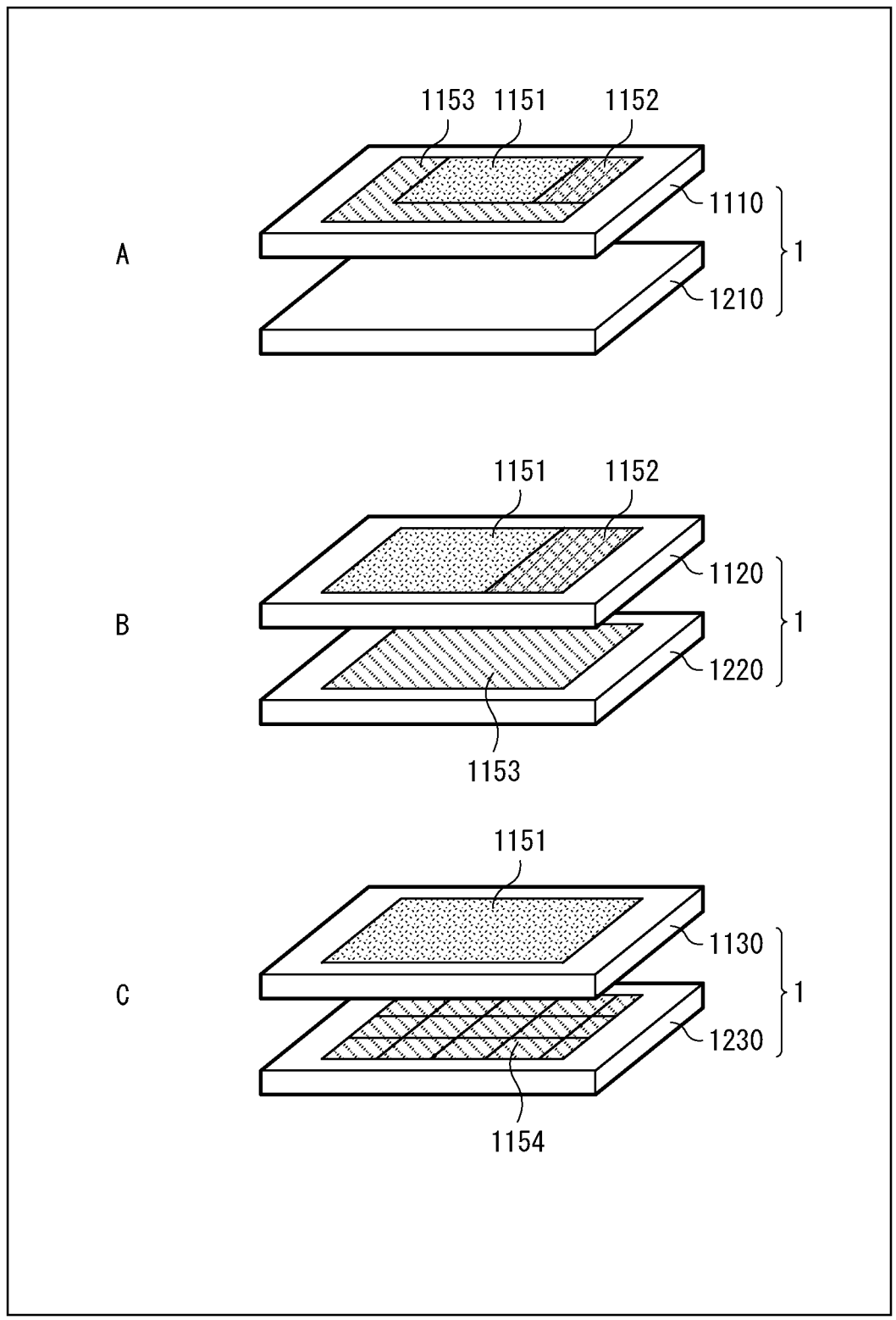

FIG. 155 is a perspective view of a substrate configuration of a solid-state imaging element to which the photodetector is applied.

Figure 156:
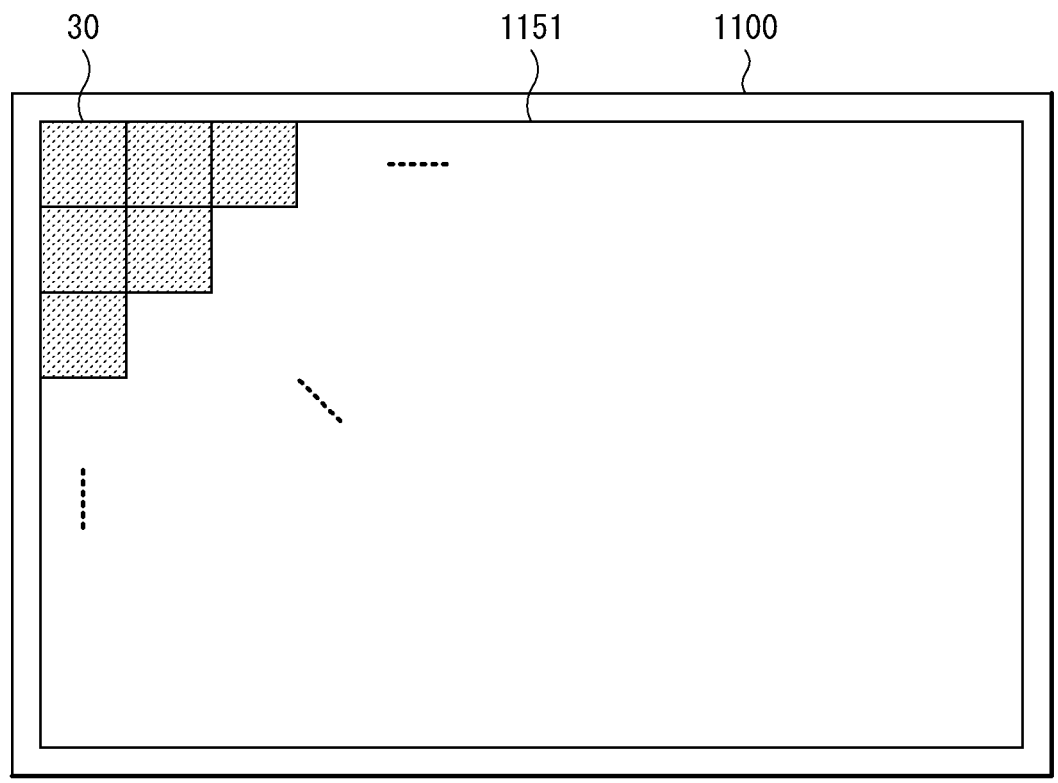

FIG. 156 is a plan view of a planar configuration of a light receiving chip of the photodetector.

Figure 157:
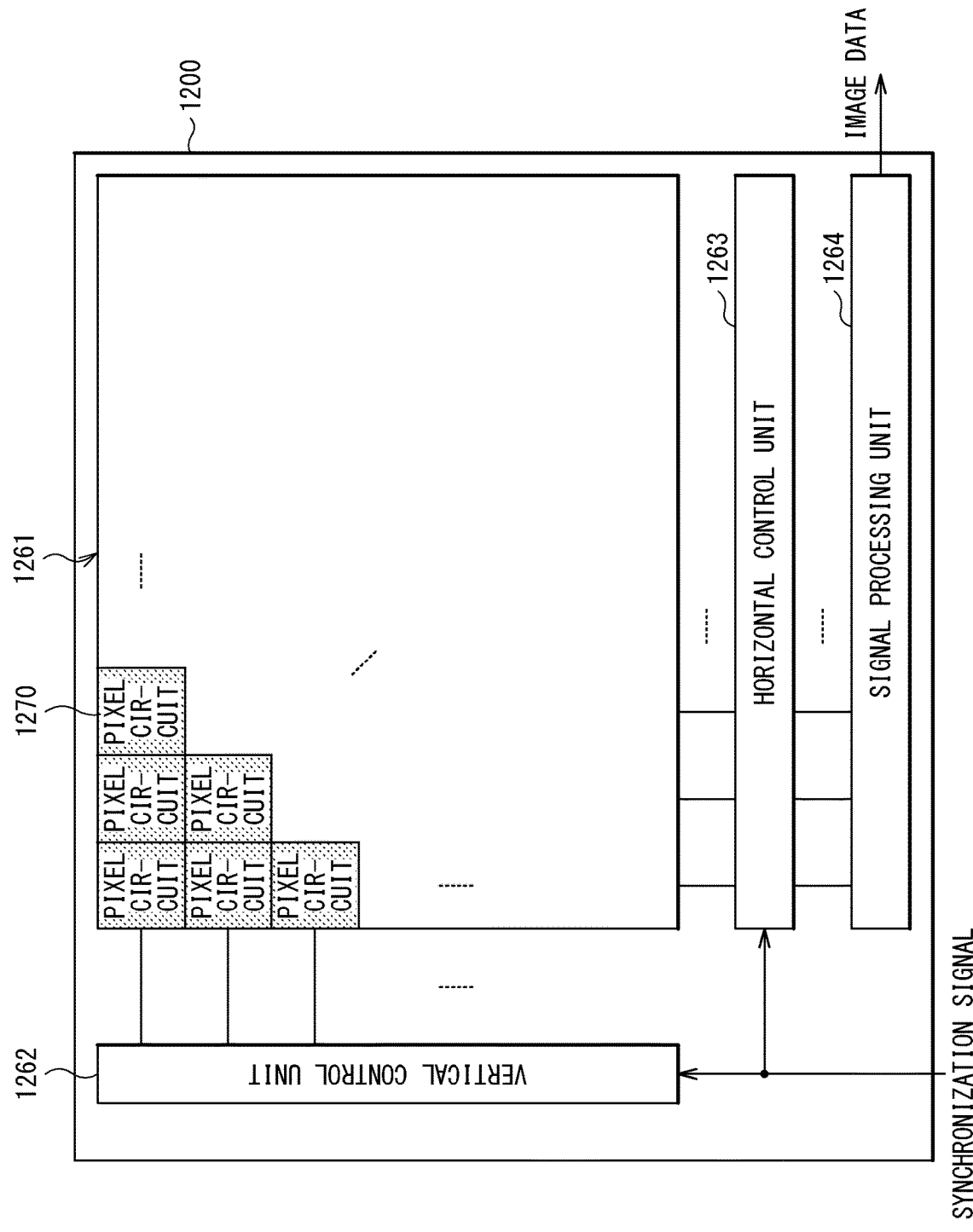

FIG. 157 is a plan view of a planar configuration of a logic chip of the photodetector.

Figure 158:
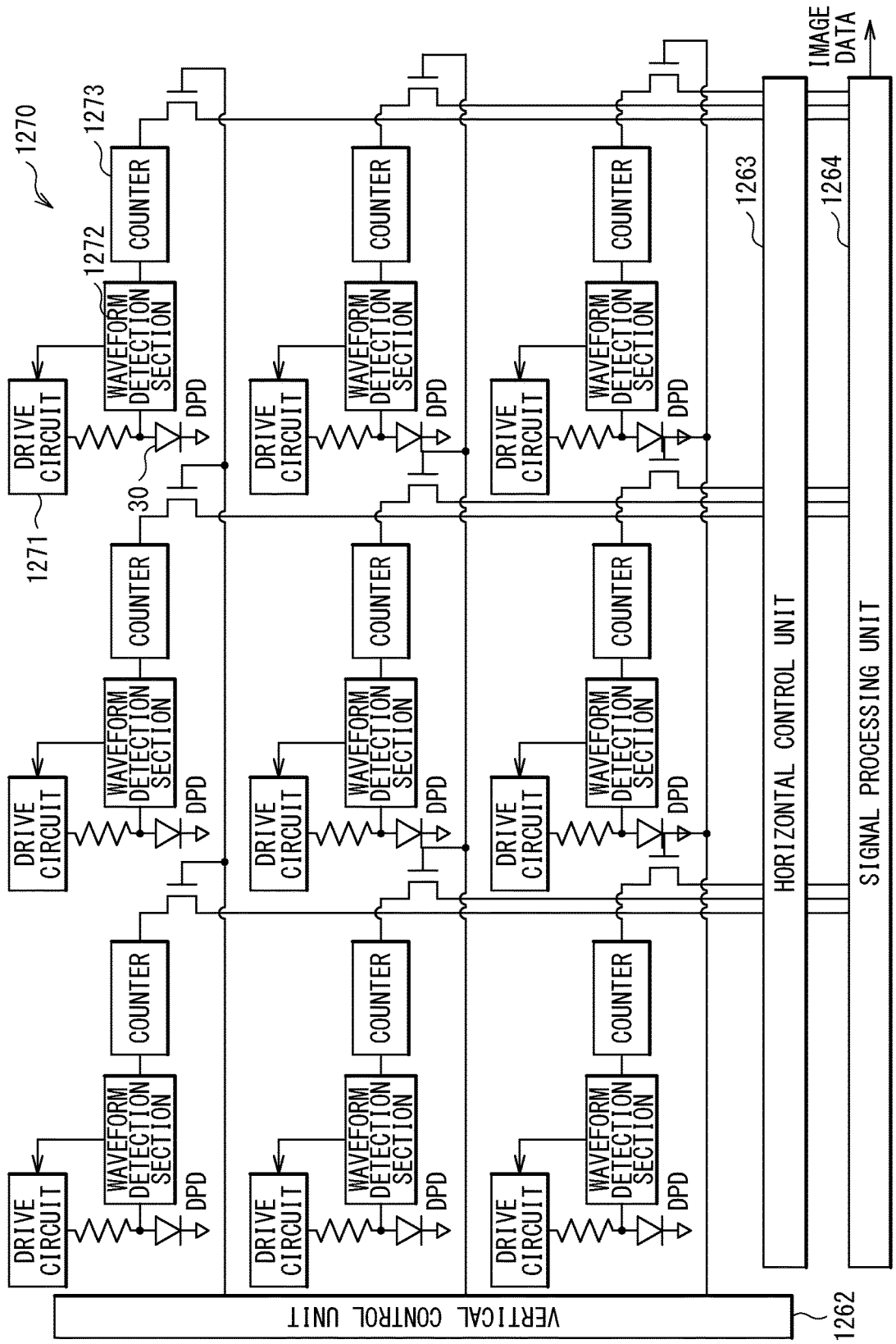

FIG. 158 is a block diagram illustrating a circuit configuration of the photodetector.

Figure 159:
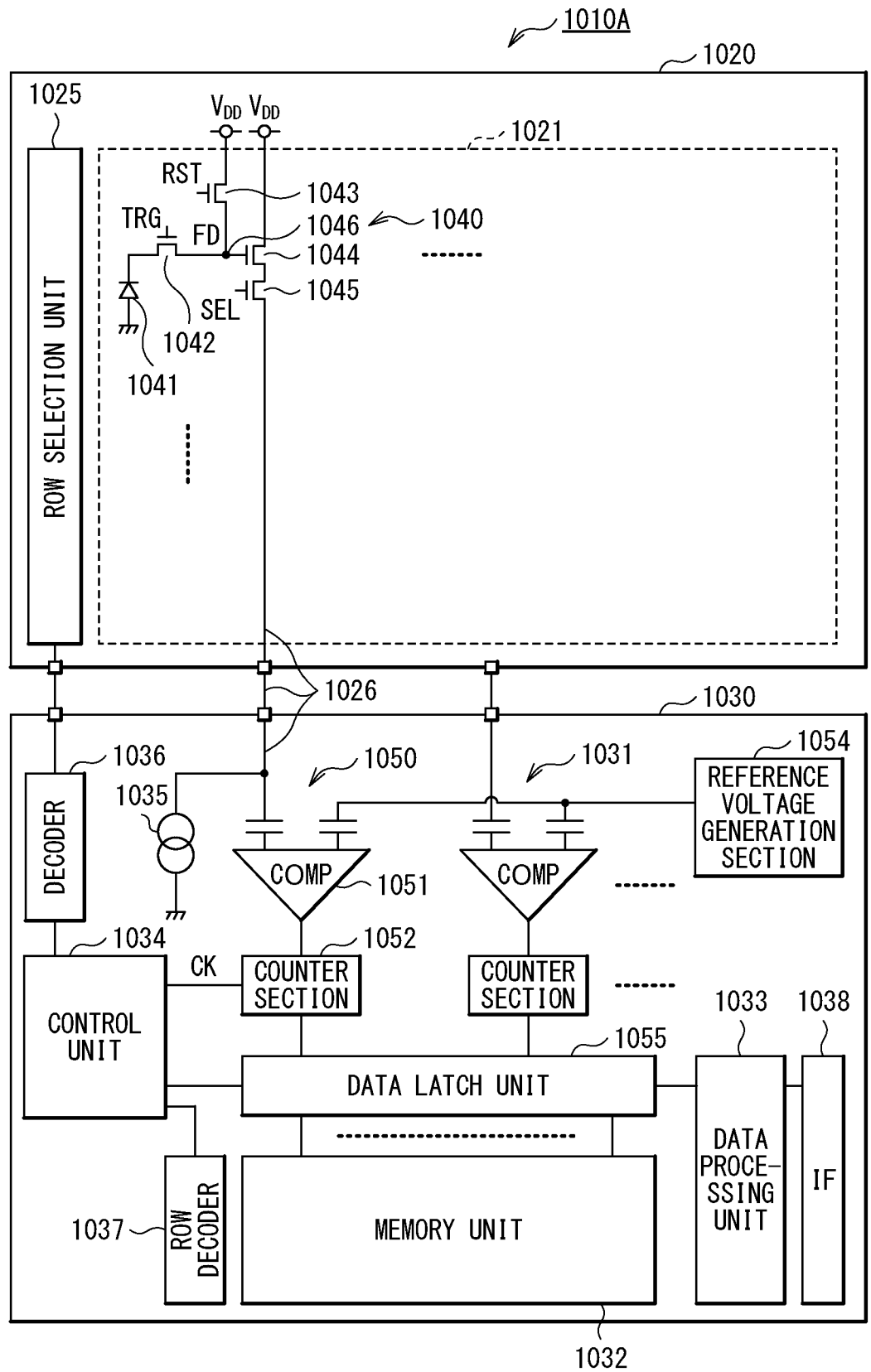

FIG. 159 is a block diagram illustrating a configuration of a solid-state imaging device to which the photodetector is applied.

Figure 160A:
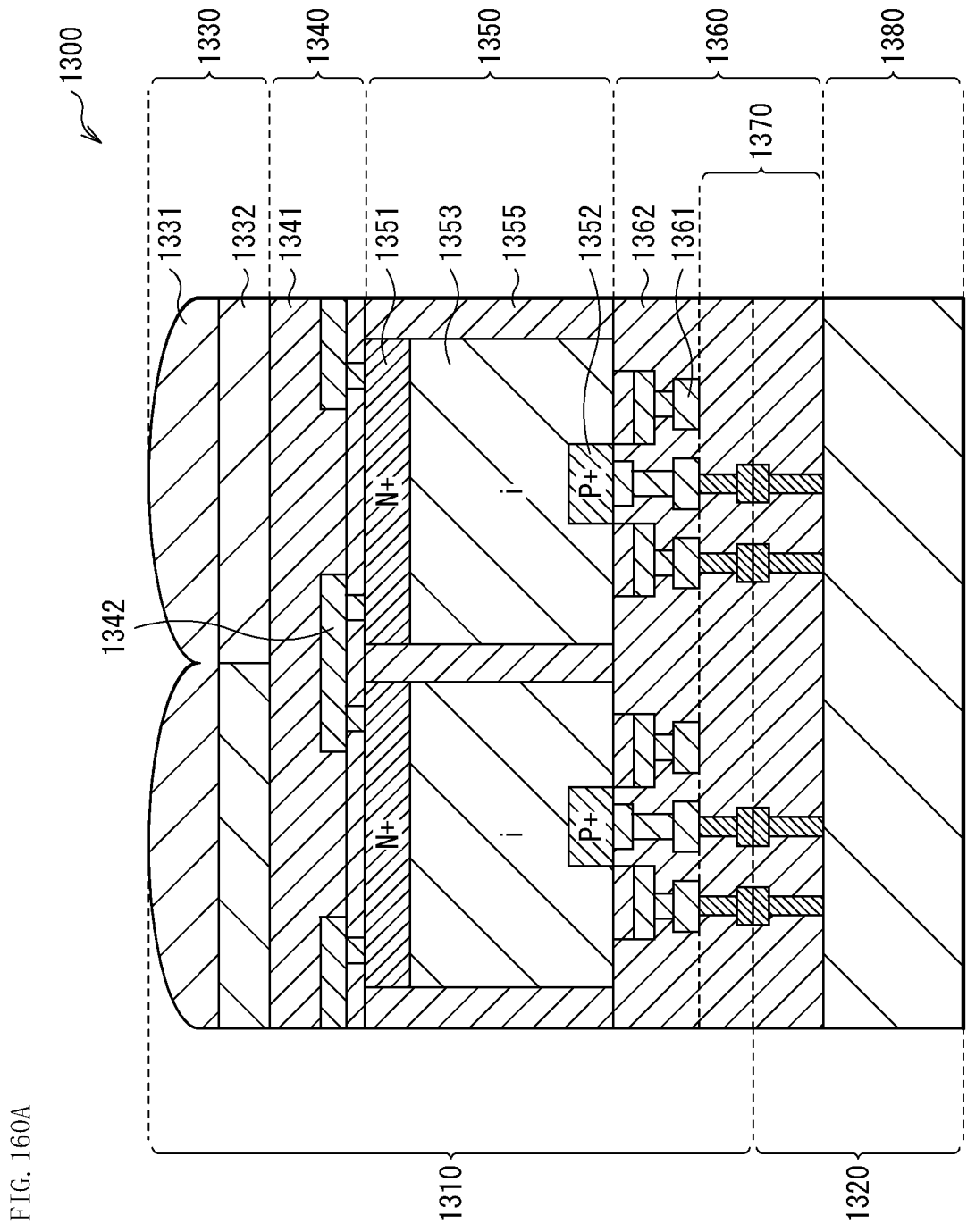

FIG. 160A is a vertical cross-sectional view of a cross-sectional configuration example of an effective pixel of the solid-state imaging device to which the photodetector is applied.

Figure 160B:
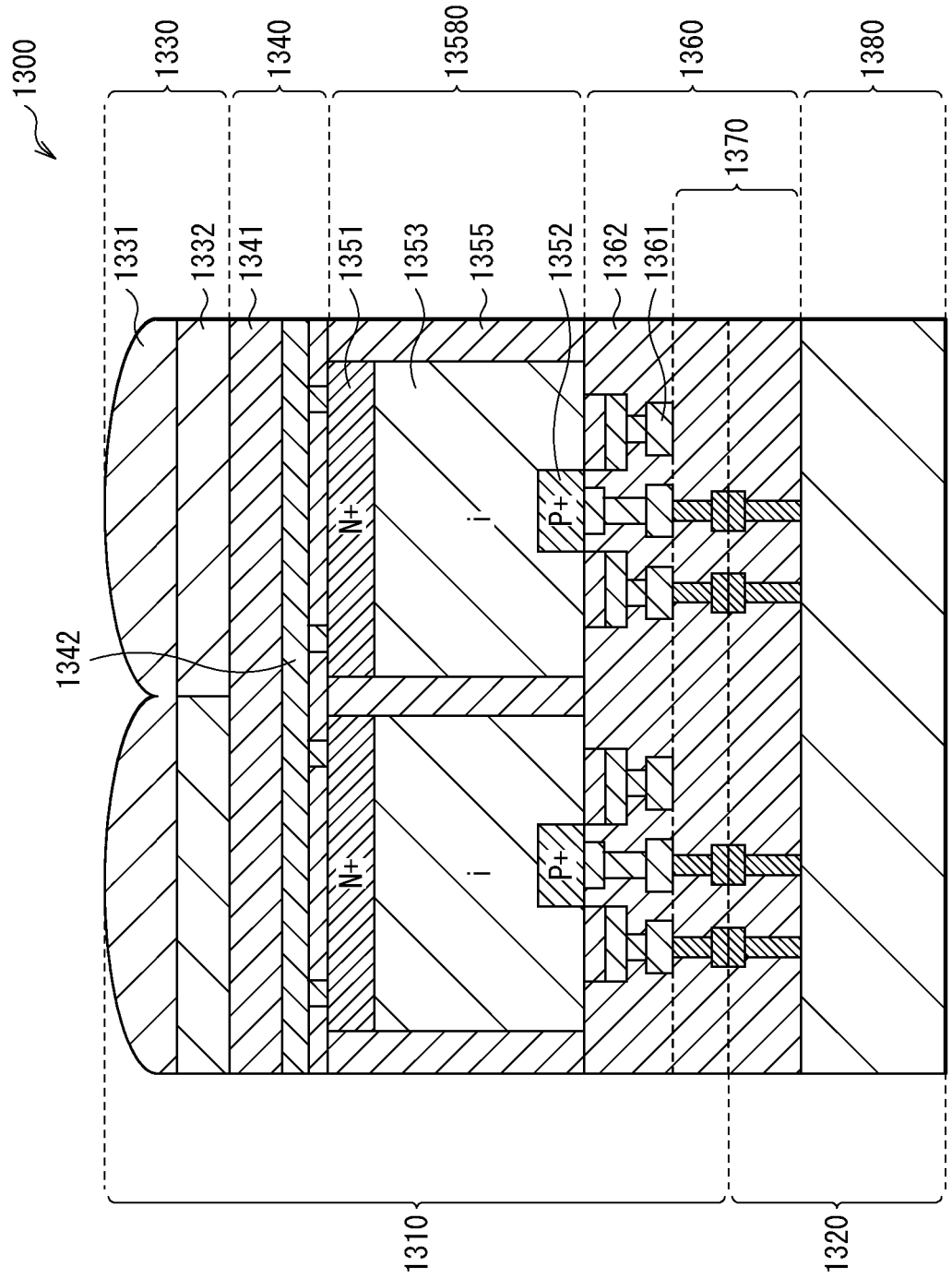

FIG. 160B is a vertical cross-sectional view of a cross-sectional configuration example of a shielding pixel of the solid-state imaging device to which the photodetector is applied.

Figure 161:
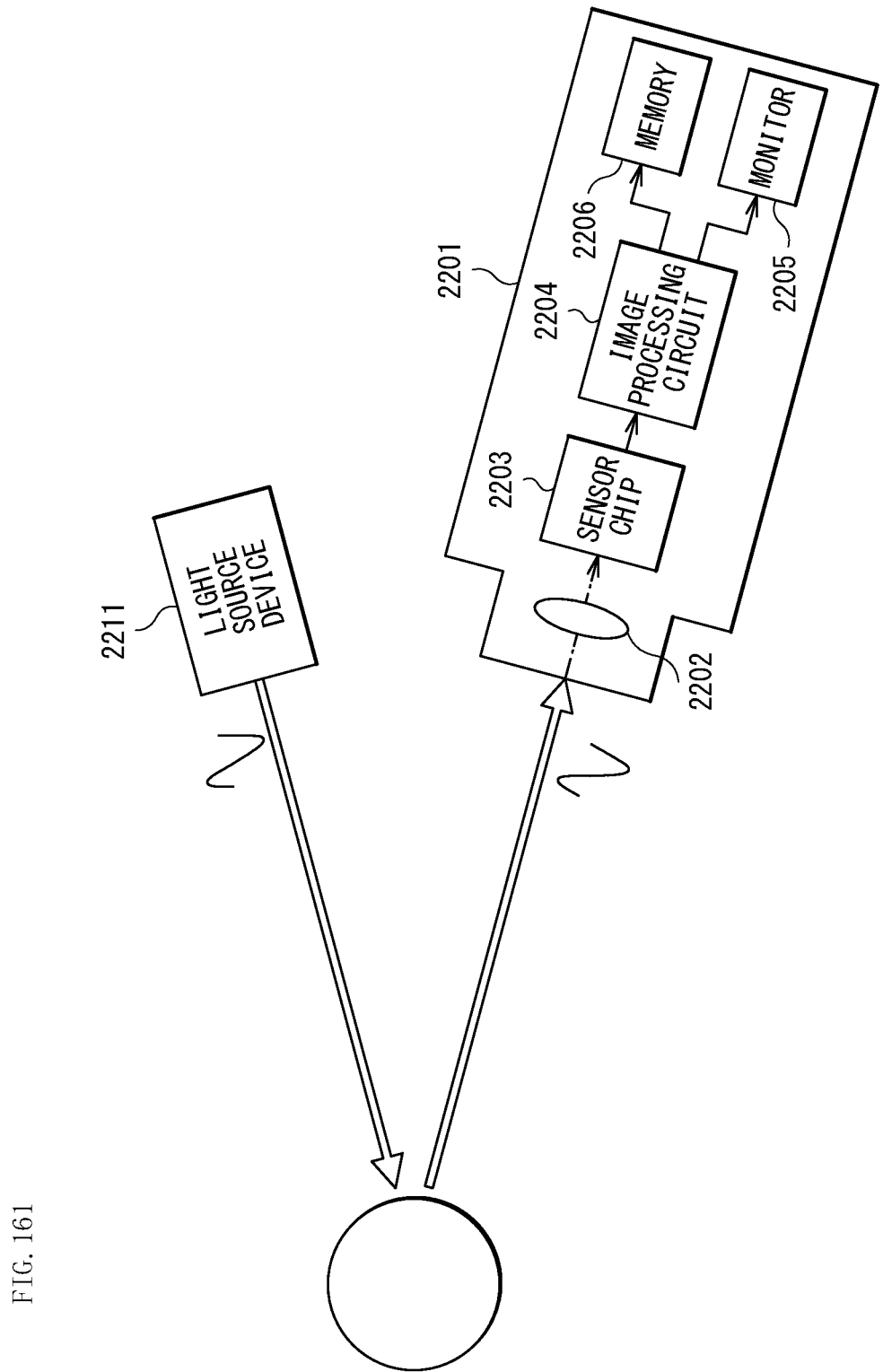

FIG. 161 is a block diagram illustrating a configuration example of a distance image sensor that is an electronic apparatus using a sensor chip in which a photodetector is used.

Figure 162:
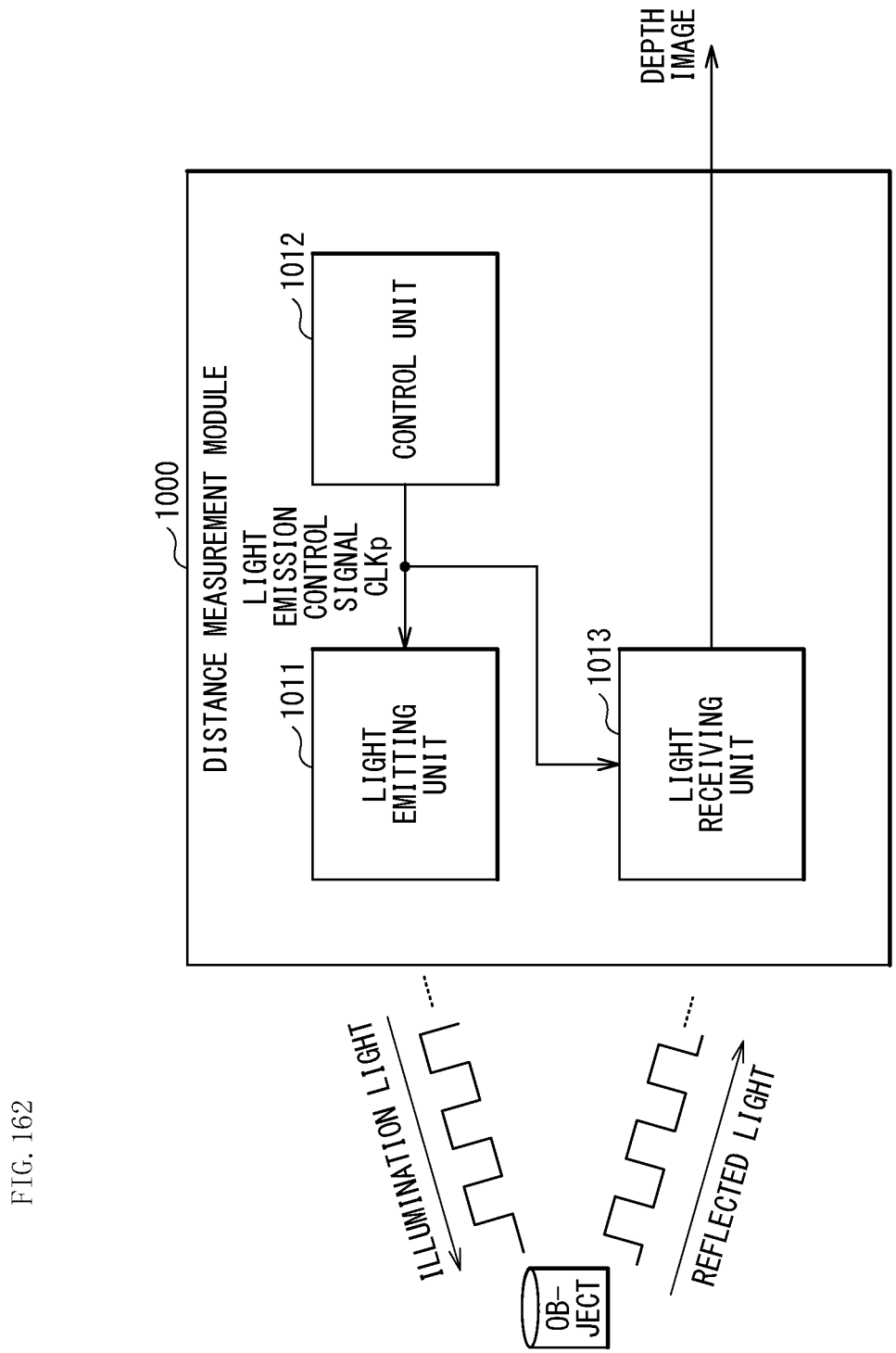

FIG. 162 is a block diagram illustrating a configuration example of a distance measurement module that outputs distance measurement information by using the photodetector.

Figure 163A:
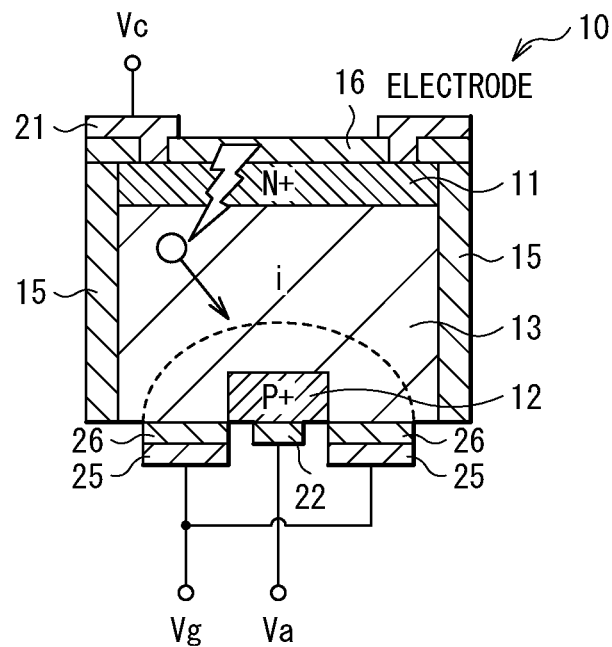

FIG. 163A is a vertical cross-sectional view of a configuration of the photodetector in a case where an electron is used as a signal carrier.

Figure 163B:
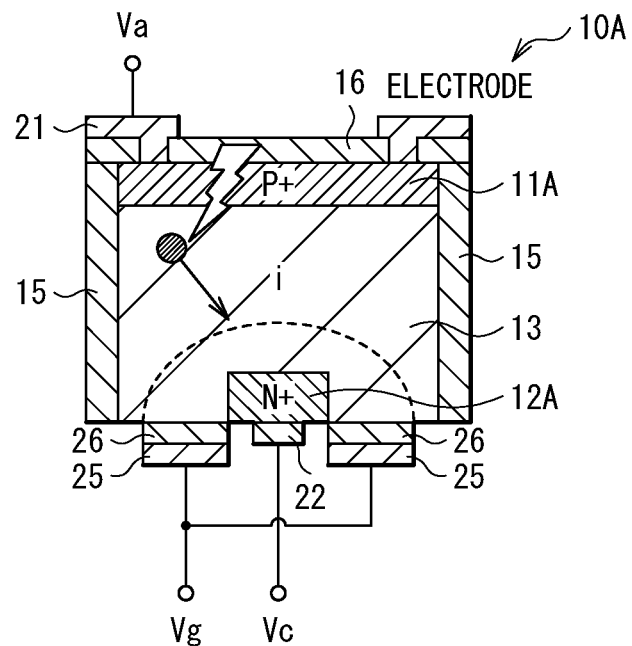

FIG. 163B is a vertical cross-sectional view of a configuration of the photodetector in a case where a hole is used as a signal carrier.

MODES FOR CARRYING OUT THE INVENTION

The following describes embodiments of the present disclosure in detail with reference to the drawings. The embodiments described below are specific examples of the present disclosure. The technology according to the present disclosure should not be limited to the following modes. In addition, the disposition, dimensions, dimensional ratios, and the like of the respective components according to the present disclosure are not limited to the modes illustrated in the drawings.

It is to be noted that description is given in the following order.

0. Principles of Photodetector
1. First Embodiment
2. Second Embodiment
3. Third Embodiment
4. Fourth Embodiment
5. Fifth Embodiment
6. Sixth Embodiment
7. Seventh Embodiment
8. Application Examples
9. Appendix

0. Principles of Photodetector

Figure 1:
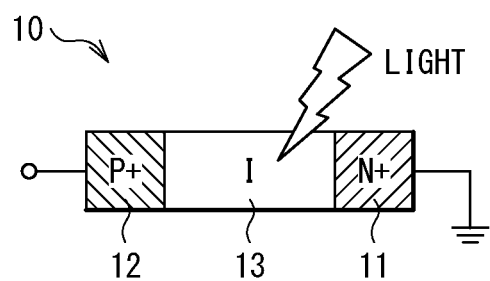
FIG. 1 is an explanatory diagram schematically illustrating a basic configuration of a photodetector according to an embodiment of the present disclosure.
Figure 2:
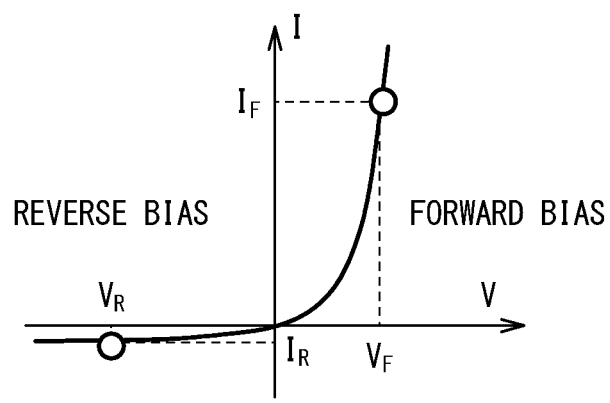
FIG. 2 is a schematic graphical chart illustrating a current-voltage characteristic of the photodetector.
Figure 3:
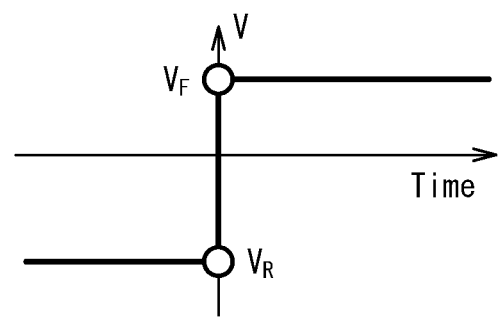
FIG. 3 is a graphical chart illustrating a polarity change in bias voltage to be applied to the photodetector.
Figure 4:
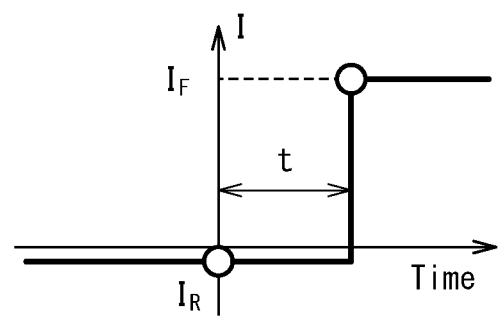
FIG. 4 is a graphical chart illustrating delay of a current flowing from the photodetector in accordance with the polarity change in the bias voltage.

First, the principles of the photodetection of a photodetector according to an embodiment of the present disclosure are described with reference to FIGS. 1 to 4. FIG. 1 is an explanatory diagram schematically illustrating a basic configuration of a photodetector 10 according to the present embodiment. FIG. 2 is a schematic graphical chart illustrating the current-voltage characteristics of the photodetector 10. FIG. 3 is a graphical chart illustrating a polarity change in bias voltage to be applied to the photodetector 10. FIG. 4 is a graphical chart illustrating delay of a current flowing from the photodetector 10 in accordance with a polarity change in bias voltage.

It is to be noted that the longitudinal direction or the up/down direction indicates the thickness direction of a substrate or a layer in this specification. In addition, the lateral direction or the left/right direction indicates one in-plane direction (e.g., the cutting direction of a substrate or a layer in a cross-sectional view) of the substrate or the layer.

As illustrated in FIG. 1, a photodetector 10 according to the present embodiment includes a first region 11, a second region 12, and a third region 13 provided between the first region 11 and the second region 12.

The first region 11 is, for example, a semiconductor region of a first electrical conduction type (e.g., an N type) electrically coupled to the ground or the like. The second region 12 is a semiconductor region of a second electrical conduction type (e.g., a P type) electrically coupled to an electrode that is able to control application voltage. The third region 13 is a semiconductor region of a third electrical conduction type (e.g., an I type) that is provided between the first region 11 and the second region 12. The third region 13 absorbs incident light.

In other words, the photodetector 10 is a so-called PIN diode. As illustrated in FIG. 2, the polarity of bias to be applied considerably changes the voltage-current characteristics. Specifically, almost no current flows between the first region 11 and the second region 12 in spite of bias voltage to be applied because the bias is reverse bias with negative voltage applied to the second region 12. In contrast, a current rapidly flows between the first region 11 and the second region 12 with an increase in bias voltage to be applied because the bias is forward bias in a forward bias state in which positive voltage is applied to the second region 12.

Here, as illustrated in FIGS. 3 and 4, in a case where the polarity of bias to be applied to the photodetector 10 is changed from reverse bias to forward bias, there is delay of time t before a current flowing from the photodetector 10 increases from a current IR (corresponding to bias voltage VR) to a current IF (corresponding to bias voltage VF). In this case, the delay time t of a change from the current IR to the current IF changes in accordance with the intensity of light that is absorbed in the third region 13 of the photodetector 10. This allows the photodetector 10 to estimate the intensity of incident light by measuring the delay time of a current increase in a case where the polarity of bias to be applied is changed. The photodetector 10 like this is also referred to, for example, as DPD (Dynamic PhotoDiode) sensor.

Subsequently, the relationship between the intensity of light entering the photodetector 10 and the delay time of an increase in currents for a change in bias voltage is described more specifically with reference to FIGS. 5A to 5C. Each of FIGS. 5A to 5C is a schematic graphical chart illustrating an example of the relationship between the light entering the photodetector 10 and the delay time of a current increase for a change in the bias voltage.

Figure 5A:
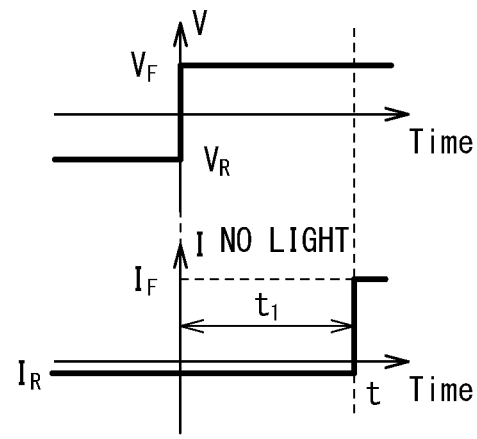
FIG. 5A is a schematic graphical chart illustrating an example of a relationship between light entering the photodetector and delay time of a current increase for a change in the bias voltage.
Figure 5B:
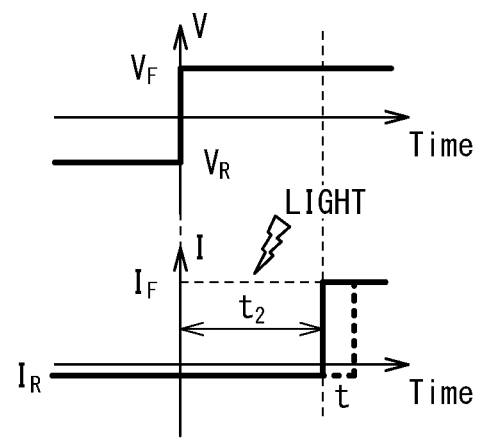
FIG. 5B is a schematic graphical chart illustrating an example of the relationship between the light entering the photodetector and the delay time of a current increase for a change in the bias voltage.
Figure 5C:
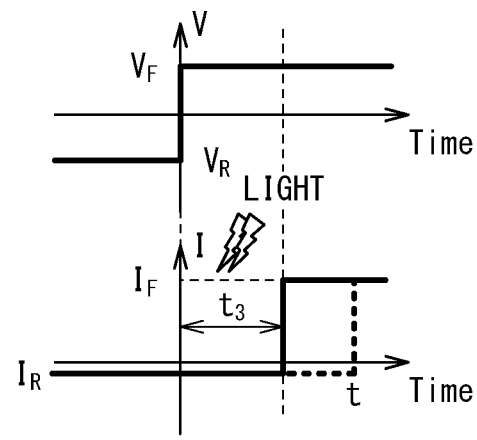
FIG. 5C is a schematic graphical chart illustrating an example of the relationship between the light entering the photodetector and the delay time of a current increase for a change in the bias voltage.

As illustrated in FIG. 5A, in a case where no light is incident, it is assumed that the delay time of a current increase for a polarity change in bias voltage is $t_1$ in the photodetector 10. In the photodetector 10 like this, incident light causes the delay time of a current increase for a polarity change in bias voltage to be $t_2$ shorter than $t_1$ as illustrated in FIG. 5B. Further, in the photodetector 10, more intense incident light than that of FIG. 5B causes the delay time of a current increase for a polarity change in bias voltage to be $t_3$ still shorter than $t_3$ as illustrated in FIG. 5C. This allows the photodetector 10 like this to calculate the amount of incident light by measuring the time elapsed from a polarity change in bias voltage to a current increase.

Figure 6:
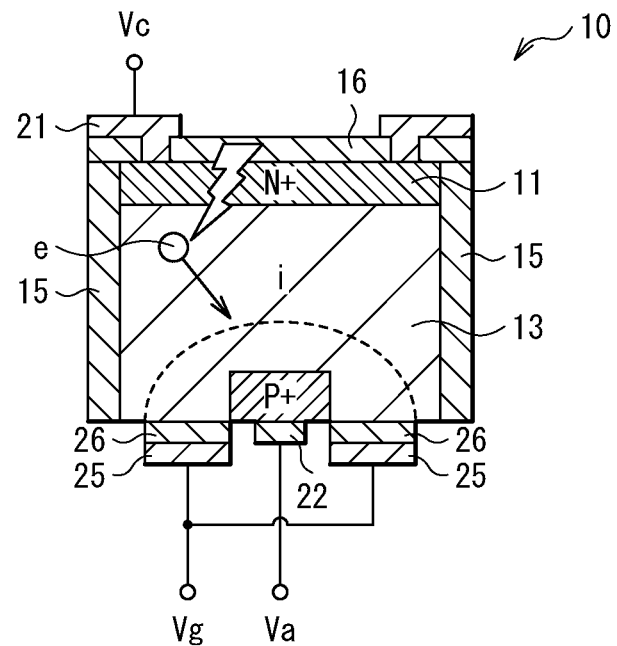
FIG. 6 is a vertical cross-sectional view of a more specific configuration of the photodetector.
Figure 7:
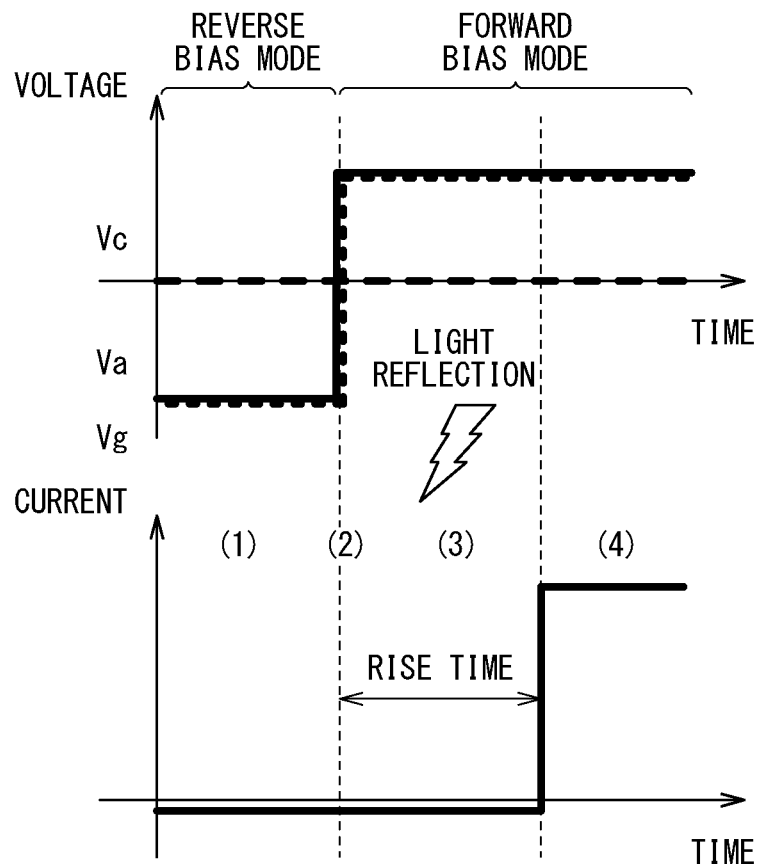
FIG. 7 is a graphical chart illustrating a change in currents for a change in the bias voltage.

Further, the principles that delay time elapsed before a current increase changes in accordance with the amount of incident light in the photodetector 10 are described in more detail with reference to FIGS. 6 to 9D. FIG. 6 is a vertical cross-sectional view of a more specific configuration of the photodetector 10. FIG. 7 is a graphical chart illustrating a change in currents for a change in bias voltage. FIGS. 8A to 8D are vertical cross-sectional views of the movement of an electron and a hole of the photodetector 10 at the respective timings of (1) to (4) in FIG. 7. FIGS. 9A to 9D are graphical charts illustrating energy band structures of the photodetector 10 in the A-AA cutting plane at the respective timings of (1) to (4) in FIG. 7.

As illustrated in FIG. 6, the photodetector 10 includes, for example, the first region 11, the second region 12, the third region 13, a first electrode 21, a first surface insulating layer 16, a pixel separation layer 15, a second electrode 22, a control gate 25, and a gate insulating film 26.

The first region 11 is a region (e.g., an N+ layer) of the first electrical conduction type that is provided on a first surface side of a semiconductor substrate such as silicon (Si). The second region 12 is a region (e.g., a P+ layer) of the second electrical conduction type that is provided on a second surface side of a semiconductor substrate such as silicon (Si) opposite to the first surface. The third region 13 is a region (e.g., an i layer) of the third electrical conduction type that is provided between the first region 11 and the second region 12 of a semiconductor substrate such as silicon (Si).

The first electrode 21 is provided above the first surface of the semiconductor substrate with the first surface insulating layer 16 interposed in between. The first electrode 21 is electrically coupled to the first region 11 through a via or the like that extends through the first surface insulating layer 16. The first electrode 21 functions, for example, as a cathode electrode.

The pixel separation layer 15 is provided by penetrating the semiconductor substrate in the thickness direction by an insulator. The pixel separation layer 15 is provided, for example, to electrically isolate a plurality of respective pixels provided in the in-plane direction of the semiconductor substrate from each other.

The second electrode 22 is provided on the second surface of the semiconductor substrate. The second electrode 22 is electrically coupled to the second region 12. The second electrode 22 functions, for example, as an anode electrode.

The control gate 25 is a gate electrode provided above the second surface of the semiconductor substrate with the gate insulating film 26 interposed in between. The control gate 25 is provided to control the height of a potential barrier PB in the third region 13 by applying voltage. The potential barrier PB is described below.

The first electrode 21, the second electrode 22, and the control gate 25 may be each provided by using, for example, metal such as aluminum (Al), copper (Cu), tungsten (W), titanium (Ti), or tantalum (Ta), polysilicon (poly-Si), or other electrically conductive materials. The first surface insulating layer 16, the pixel separation layer 15, and the gate insulating film 26 may be each provided by using an insulator such as silicon oxide ($SiO_x$), silicon nitride ($SiN_x$), silicon oxynitride (SiON), or a so-called low-k material.

Here, as illustrated in FIG. 7, voltage to be applied to the first electrode 21 is represented by Vc, voltage to be applied to the second electrode 22 is represented by Va, and voltage to be applied to the control gate 25 is represented by Vg. In such a case, the photodetector 10 may be controlled in a reverse bias mode, for example, by controlling the voltage Vc of the first electrode 21 at 0 V and controlling the voltage Va of the second electrode 22 and the voltage Vg of the control gate 25 at −1 V. In addition, the photodetector 10 may be controlled in a forward bias mode, for example, by controlling the voltage Vc of the first electrode 21 at 0 V and controlling the voltage Va of the second electrode 22 and the voltage Vg of the control gate 25 at +1 V.

Figure 8A:
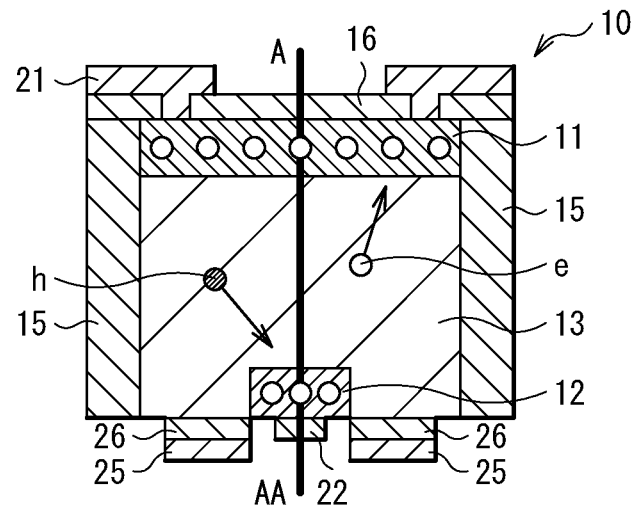
FIG. 8A is a vertical cross-sectional view of movement of an electron and a hole of the photodetector at a timing of (1) in FIG. 7.
Figure 9A:
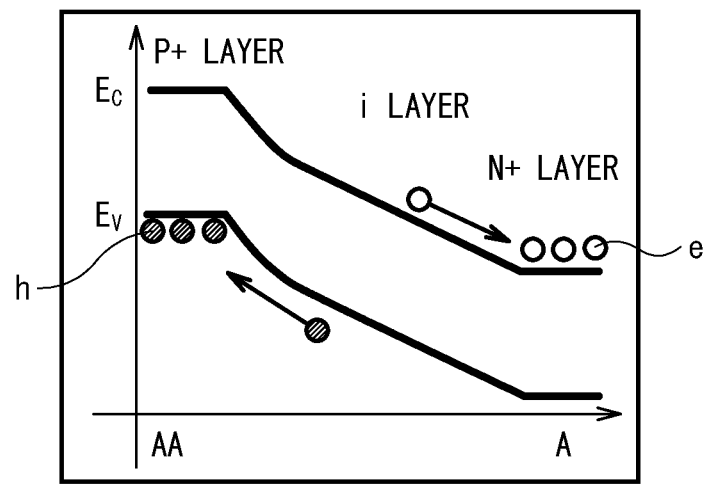
FIG. 9A is a graphical chart illustrating an energy band structure of the photodetector in an A-AA cutting plane at each of the timings of (1) in FIG. 7.

Here, in the state (1) of the reverse bias mode, an electron e in the third region 13 is discharged to the first region 11 and a hole h in the third region 13 is discharged to the second region 12 as illustrated in FIG. 8A. Thus, the energy band structure of the photodetector 10 in this case is a structure in which the second region 12 side is high and the first region 11 side is low as illustrated in FIG. 9A. This depletes the third region 13.

Figure 8B:
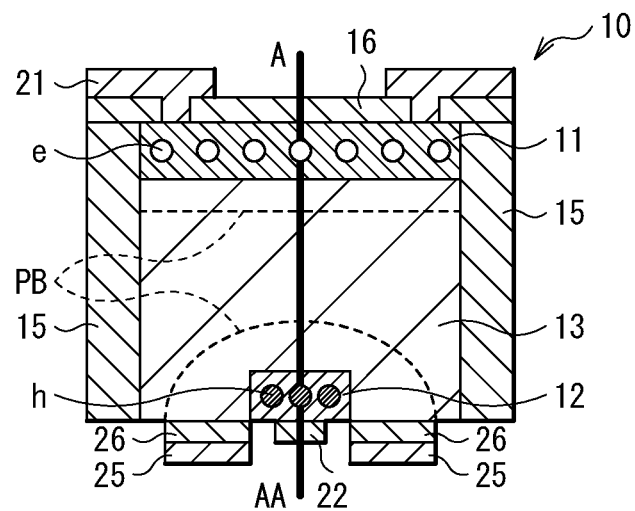
FIG. 8B is a vertical cross-sectional view of movement of an electron and a hole of the photodetector at a timing of (2) in FIG. 7.
Figure 9B:
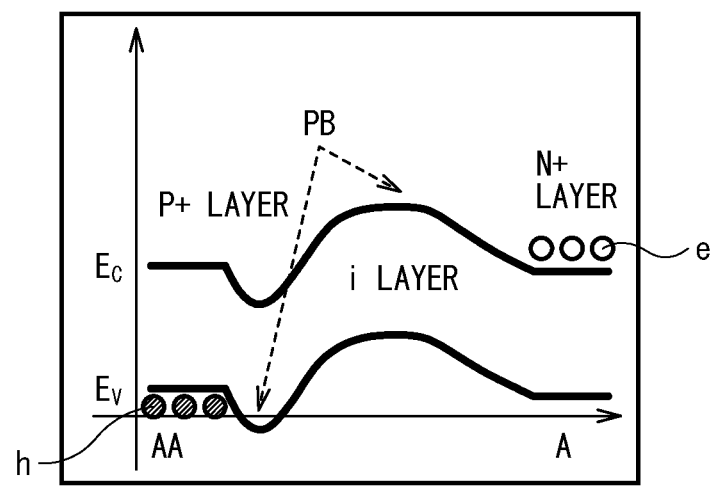
FIG. 9B is a graphical chart illustrating an energy band structure of the photodetector in the A-AA cutting plane at each of the timings of (2) in FIG. 7.

Next, in the state (2) in which the polarity of voltage is changed from the reverse bias mode to the forward bias mode, the potential barriers PB are generated in the region adjacent to the first region 11 and the second region 12 as illustrated in FIG. 8B. In other words, the energy band structure of the photodetector 10 in this case is a structure in which the photodetector 10 includes the potential barriers PB that are recessed or protrude between the first region 11 and the second region 12 as illustrated in FIG. 9B. This prevents the electrons e and the holes h from flowing in the third region 13 and almost no current flows in the photodetector 10.

Figure 8C:
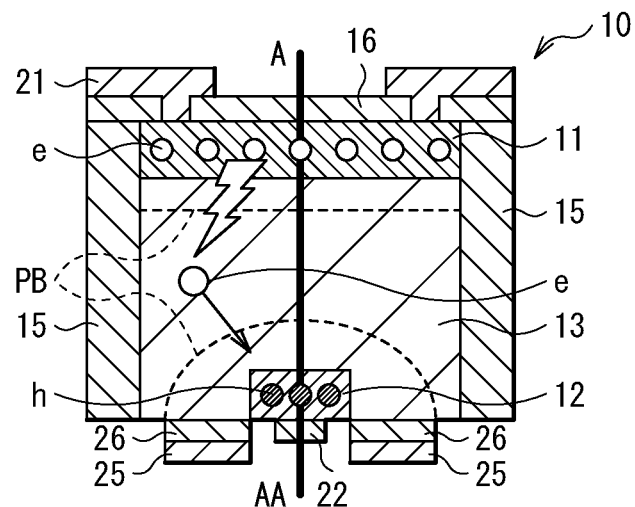
FIG. 8C is a vertical cross-sectional view of movement of an electron and a hole of the photodetector at a timing of (3) in FIG. 7.
Figure 9C:
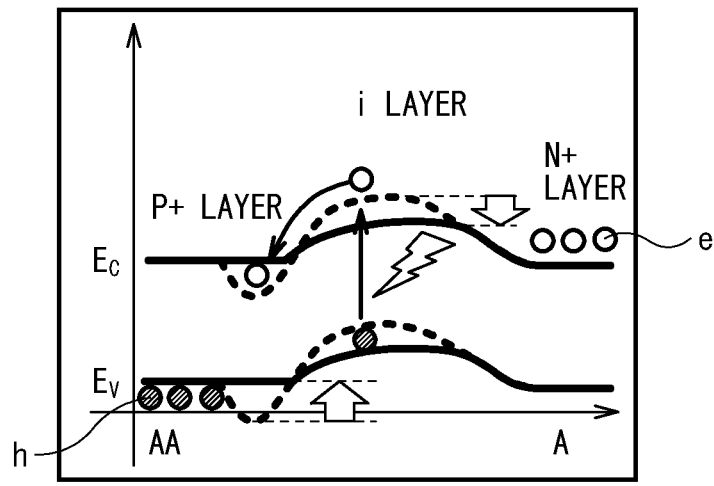
FIG. 9C is a graphical chart illustrating an energy band structure of the photodetector in the A-AA cutting plane at each of the timings of (3) in FIG. 7.

Subsequently, in the state (3) in which the photodetector 10 is irradiated with light in the forward bias mode, the electrons e and the holes h resulting from the photoelectric conversion of incident light are generated in the depleted third region 13 as illustrated in FIG. 8C. In this case, in the energy band structure of the photodetector 10, the electrons e and the holes h resulting from the photoelectric conversion of incident light decrease the height of the potential barriers PB as illustrated in FIG. 9C. This causes the electrons e to gradually flow from the first region 11 or causes the holes h to gradually flow from the second region 12. The flowing electrons e and holes h therefore further decrease the height of the potential barriers PB.

Figure 8D:
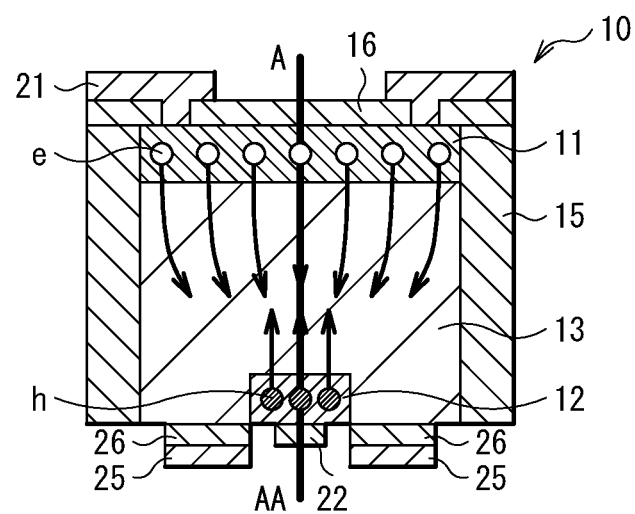
FIG. 8D is a vertical cross-sectional view of movement of an electron and a hole of the photodetector at a timing of (4) in FIG. 7.
Figure 9D:
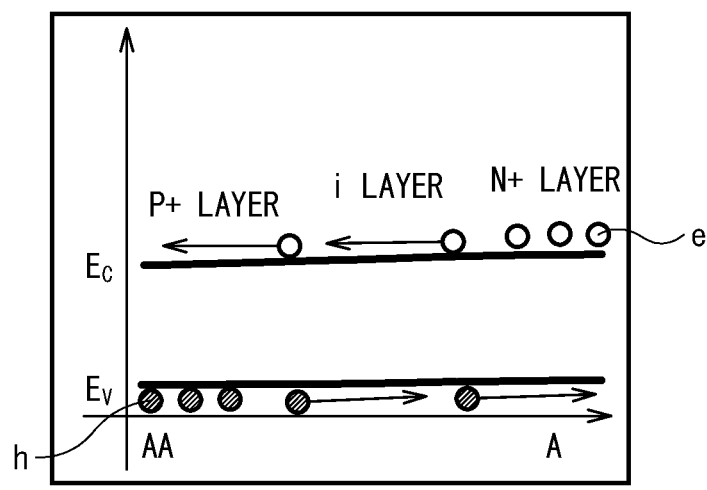
FIG. 9D is a graphical chart illustrating an energy band structure of the photodetector in the A-AA cutting plane at each of the timings of (4) in FIG. 7.

As a result, in the state (4) of the forward bias mode, the potential barriers PB disappear that have been generated in the region adjacent to the first region 11 and the second region 12 as illustrated in FIG. 8D. This causes a current having the forward direction to flow in the photodetector 10. In other words, the energy band structure of the photodetector 10 in this case is a substantially flat structure in which the recessed or protruding potential barrier PB disappears that has been present between the first region 11 and the second region 12 as illustrated in FIG. 9D.

The speed at which the potential barriers PB disappear in a case where the polarity of bias to be applied changes from reverse bias to forward bias is thus different in the photodetector 10 in accordance with the amount of incident light. This allows the photodetector 10 to measure the amount of incident light by measuring the time elapsed before the potential barriers PB disappear with the time elapsed before a current having the forward direction begins to flow.

The following describes a more specific structure of the photodetector 10 whose principles have been described above in each of the first to seventh embodiments. It is to be noted that a pixel in the following description corresponds to a specific example of a "photoelectric conversion section" according to the present disclosure.

1. First Embodiment (Basic Structure)

Figure 10:
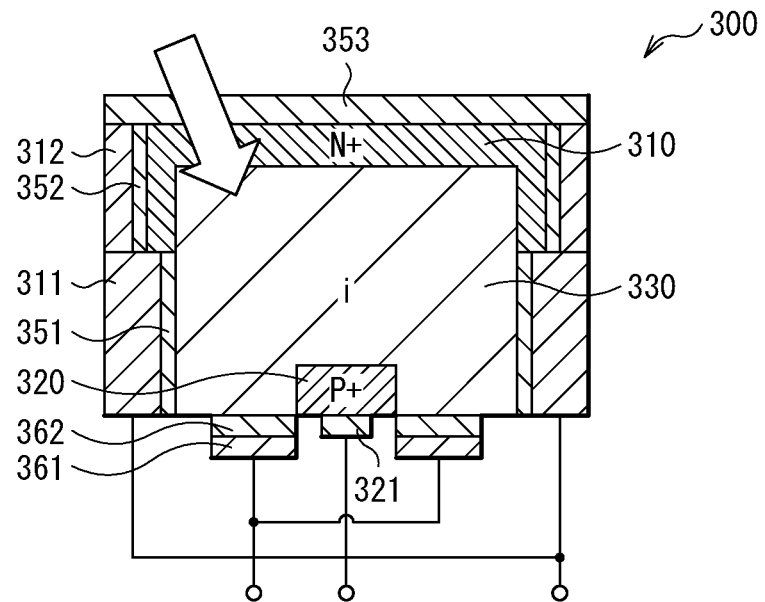
FIG. 10 is a vertical cross-sectional view of a basic structure of a photodetector according to an embodiment of the present disclosure.

First, a basic structure of the photodetector according to the first embodiment of the present disclosure is described with reference to FIGS. 10 and 11. FIG. 10 is a vertical cross-sectional view of a basic structure of a photodetector 300 according to the present embodiment and FIG. 11 is a plan view of the basic structure of the photodetector 300 according to the present embodiment from the first surface side.

Figure 11:
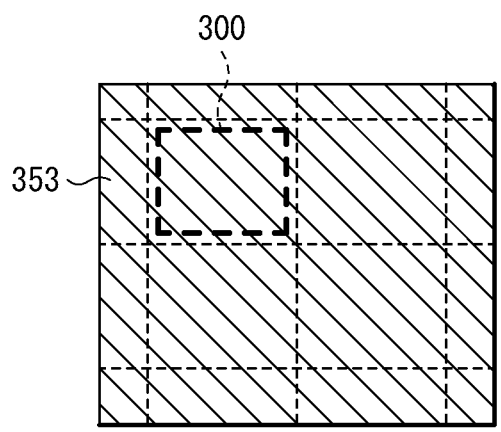
FIG. 11 is a plan view of a basic structure of the photodetector according to the embodiment from a first surface side.

As illustrated in FIG. 11, the photodetector 300 includes, for example, a first region 310, a second region 320, a third region 330, a first electrode 311, an upper first electrode 312, a pixel separation layer 351, an upper pixel separation layer 352, a first surface insulating layer 353, a second electrode 321, a control gate 361, and a gate insulating film 362.

The first region 310 is a region (e.g., an N+ layer) of the first electrical conduction type that is provided on a first surface side of a semiconductor substrate such as silicon (Si). The first region 310 is provided to a region along the first surface of the semiconductor substrate and the upper pixel separation layer 352 provided on a side surface of the upper first electrode 312 (that is described in detail below) extending from the first surface of the semiconductor substrate in the thickness direction of the semiconductor substrate.

The second region 320 is a region (e.g., a P+ layer) of the second electrical conduction type that is provided on a second surface side of a semiconductor substrate such as silicon (Si) opposite to the first surface.

The third region 330 is a region (e.g., an i layer) of the third electrical conduction type that is provided between the first region 310 and the second region 320 of a semiconductor substrate such as silicon (Si).

The first electrode 311 is provided on the boundary between the respective pixels to extend from the second surface of the semiconductor substrate in the thickness direction of the semiconductor substrate. The first electrode 311 abuts the upper first electrode 312 on the bottom surface. The upper first electrode 312 is less than the first electrode 311 in width. The upper first electrode 312 is less than the first electrode 311 in width and is provided to extend from the bottom surface of the first electrode 311 to the second surface of the semiconductor substrate in the thickness direction of the semiconductor substrate.

Here, the width of the first electrode 311 is greater than the width of the upper first electrode 312. A portion of the bottom surface of the first electrode 311 that abuts the upper first electrode 312 is not thus covered with the upper first electrode 312. This allows the first electrode 311 to be electrically coupled to the first region 310 on a portion of the bottom surface of the first electrode 311. The first region 310 is provided along a side surface of the upper first electrode 312. The first electrode 311 and the upper first electrode 312 each function, for example, as a cathode electrode. The first electrode 311 and the upper first electrode 312 are electrically coupled to the wiring layer from the second surface side of the semiconductor substrate.

The first electrode 311 and the upper first electrode 312 may be formed, for example, by filling a first opening and a second opening with electrically conductive materials. The first opening extends through the semiconductor substrate from the second surface to the first surface in the thickness direction. The second opening has a greater opening width than that of the first opening. The second opening is made by digging the semiconductor substrate halfway in the thickness direction. In other words, the upper first electrode 312 may be formed by filling the first opening with an electrically conductive material and the first electrode 311 may be formed by filling the second opening with an electrically conductive material.

The pixel separation layer 351 is provided on a side surface of the first electrode 311 and the upper pixel separation layer 352 is provided on a side surface of the upper first electrode 312. With respect to the first electrode 311 and the upper first electrode 312, this allows the pixel separation layer 351 and the upper pixel separation layer 352 to expose the stepped upper surfaces of the first electrode 311 and the upper first electrode 312 for the first region 310. This allows the pixel separation layer 351 and the upper pixel separation layer 352 to electrically couple the first electrode 311 to the first region 310 while electrically isolating the photodetectors 300 from each other. The photodetectors 300 are provided to be adjacent in the in-plane direction of the semiconductor substrate.

The first surface insulating layer 353 is provided on the first surface of the semiconductor substrate. The first surface insulating layer 353 is able to protect, for example, the semiconductor substrate including the first region 310 from the surroundings.

As illustrated in FIG. 11, the first electrode 311, the upper first electrode 312, and wiring lines electrically coupled to these electrodes are not thus formed on the first surface side of the semiconductor substrate of the photodetector 300, but the first surface insulating layer 353 is formed over the whole of the surface. This allows the photodetector 300 to increase the aperture ratio of the first surface that is a light incidence surface.

The second electrode 321 is provided on the second surface of the semiconductor substrate opposite to the first surface. The second electrode 321 is electrically coupled to the second region 320. The second electrode 321 functions, for example, as an anode electrode. The second electrode 321 is electrically coupled to the wiring layer from the second surface side of the semiconductor substrate.

The control gate 361 is a gate electrode provided above the second surface of the semiconductor substrate with the gate insulating film 362 interposed in between. The control gate 361 is provided to control a potential barrier in the third region 330 by voltage application.

The first electrode 311, the upper first electrode 312, the second electrode 321, and the control gate 361 may be each provided by using, for example, metal such as aluminum (Al), copper (Cu), tungsten (W), titanium (Ti), or tantalum (Ta), polysilicon (poly-Si), or other electrically conductive materials. The pixel separation layer 351, the upper pixel separation layer 352, the first surface insulating layer 353, and the gate insulating film 362 may be each provided by using an insulator such as silicon oxide ($SiO_x$), silicon nitride ($SiN_x$), silicon oxynitride (SiON), or a so-called low-k material.

The photodetector 300 according to the present embodiment is provided as a back-illuminated (i.e., the first surface) CMOS (Complementary MOS) image sensor. This makes it possible to increase the aperture ratio of the back surface side that is a light incidence surface. Specifically, the use of the first electrode 311 allows the photodetector 300 to electrically couple a cathode electrode to the first region 310 from the second surface side of the semiconductor substrate. The first electrode 311 extends from the second surface of the semiconductor substrate in the thickness direction of the semiconductor substrate. This allows the photodetector 300 to increase the aperture ratio of the back surface (i.e., the first surface) that is a light incidence surface by providing a variety of electrodes and wiring lines electrically coupled to the first region 310 and the second region 320 to the front surface (i.e., the second surface) of the semiconductor substrate opposite to the light incidence surface.

In addition, the photodetector 300 according to the present embodiment has the first region 310 and the second region 320 disposed in the thickness direction of the semiconductor substrate. It is thus possible to further decrease the occupied area. This allows the photodetector 300 to miniaturize pixels more efficiently. Further, the pixel separation layer 351 and the upper pixel separation layer 352 extending in the thickness direction of the semiconductor substrate allow the photodetector 300 according to the present embodiment to suppress the crosstalk between pixels. It is therefore possible to further reduce noise.

Variations

Subsequently, variations of the structure of the photodetector 300 according to the present embodiment are described with reference to FIGS. 12A to 27.

First Variation

Figure 12A:
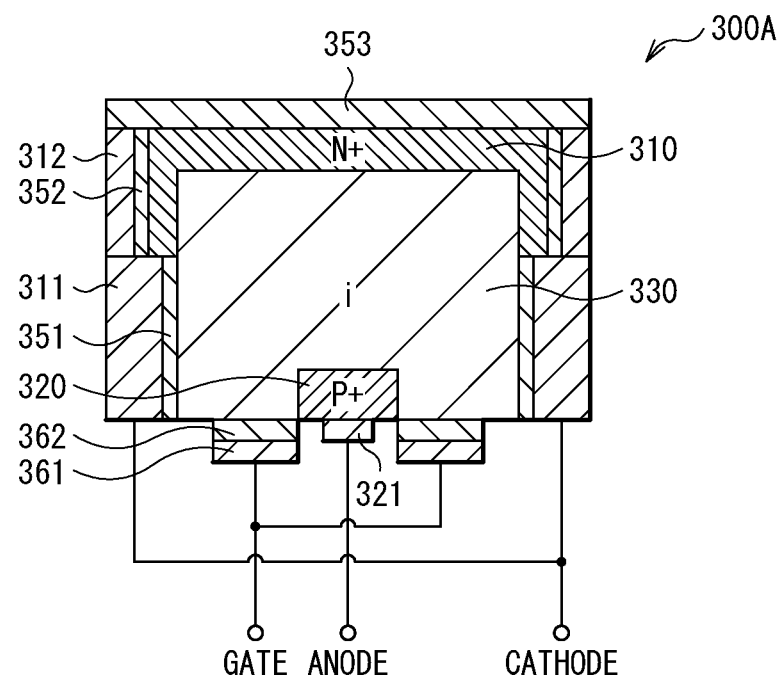
FIG. 12A is a vertical cross-sectional view of a structure of a photodetector according to a first variation.
Figure 12B:
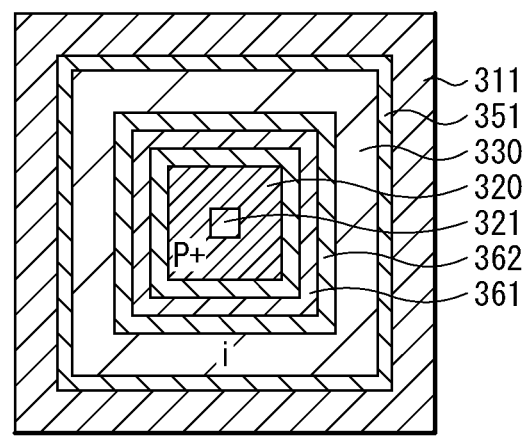
FIG. 12B is a plan view of the structure of the photodetector according to the first variation from a second surface side.

FIG. 12A is a vertical cross-sectional view of a structure of the photodetector 300 according to a first variation. FIG. 12B is a plan view of the structure of the photodetector 300 according to the first variation from the second surface side.

As illustrated in FIGS. 12A and 12B, the first electrode 311 is provided to surround the whole of the periphery of a rectangular region corresponding to a pixel and the pixel separation layer 351 is provided along the inside of the rectangular shape of the first electrode 311. The second region 320 may be provided in the shape of an island, for example, substantially in the middle of a region defined by the first electrode 311 and the pixel separation layer 351. In addition, the control gate 361 and the gate insulating film 362 may be each provided, for example, to surround the periphery of the second region 320 in the in-plane direction of the semiconductor substrate.

According to the first variation, the photodetector 300A has the first region 310 and the second region 320 disposed in the thickness direction of the semiconductor substrate, thereby making it possible to further decrease the occupied area. In addition, providing the pixel separation layer 351 inside the rectangular shape of the first electrode 311 allows the photodetector 300A to suppress the crosstalk between the pixels.

Second Variation

Figure 13:
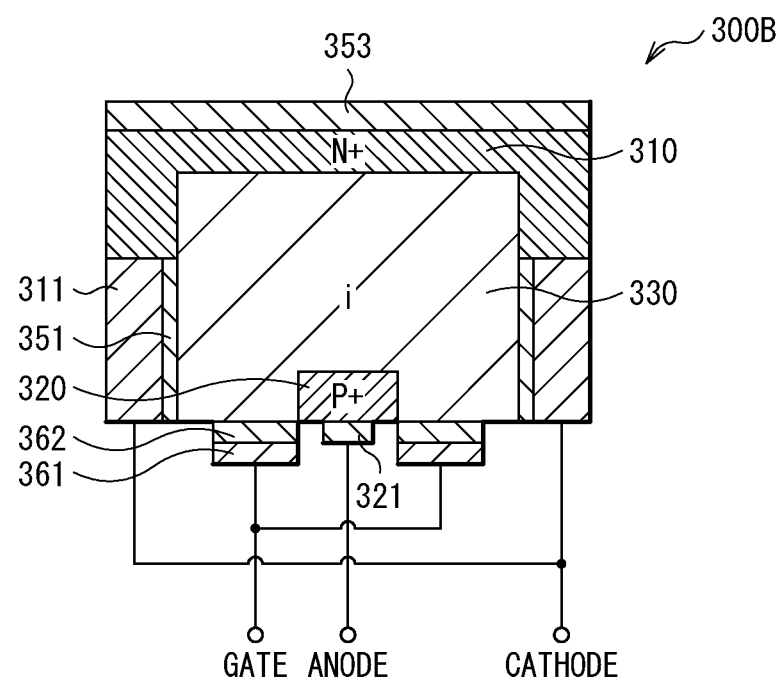
FIG. 13 is a vertical cross-sectional view of a structure of a photodetector according to a second variation.

FIG. 13 is a vertical cross-sectional view of a structure of a photodetector 300B according to a second variation.

As illustrated in FIG. 13, the photodetector 300B does not have to be provided with the upper first electrode 312 and the upper pixel separation layer 352. In such a case, the first electrode 311 is provided to extend from the second surface of the semiconductor substrate in the thickness direction of the semiconductor substrate and it is possible to electrically couple the first electrode 311 to the first region 310 on the bottom surface. Even such a configuration allows the photodetector 300B to suppress the crosstalk between the adjacent pixels by the pixel separation layer 351.

According to the second variation, the photodetector 300B is not provided with the upper first electrode 312 and the upper pixel separation layer 352. This makes it possible to further reduce the number of manufacturing steps. In addition, it is possible to eliminate an interface that may be a source of generating a dark current by eliminating the interface between the upper pixel separation layer 352 and the first region 310 or the third region 330 from the photodetector 300B. This makes it possible to reduce dark-time noise.

Third Variation

Figure 14A:
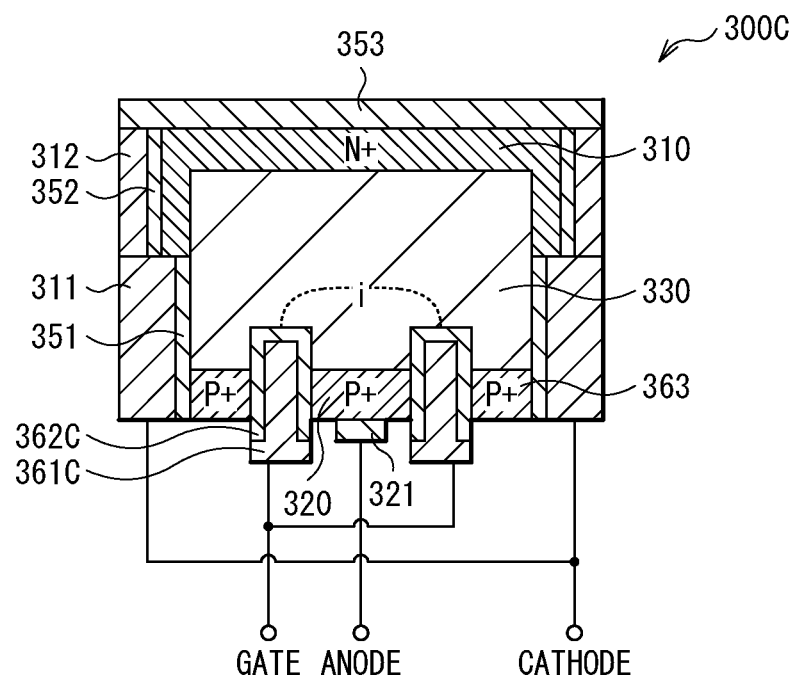
FIG. 14A is a vertical cross-sectional view of a structure of a photodetector according to a third variation.
Figure 14B:
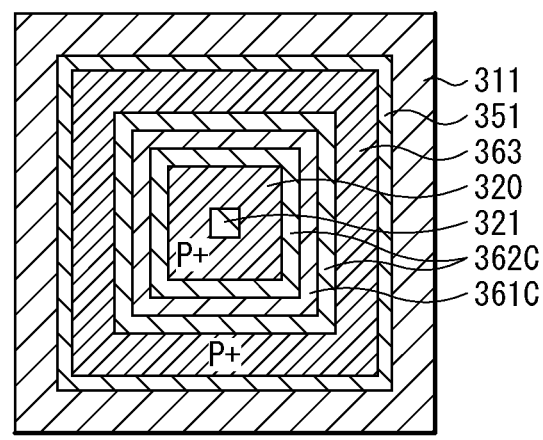
FIG. 14B is a plan view of the structure of the photodetector according to the third variation from a second surface side.

FIG. 14A is a vertical cross-sectional view of a structure of a photodetector 300C according to a third variation. FIG. 14B is a plan view of the structure of the photodetector 300C according to the third variation from the second surface side.

As illustrated in FIG. 14A, a control gate 361C may be provided to have a vertical gate structure. Specifically, the control gate 361C may be provided to extend from the second surface side of the semiconductor substrate in the thickness direction of the semiconductor substrate. In addition, a side surface and the bottom surface of the control gate 361C buried in the semiconductor substrate may be provided with a gate insulating film 362C. There may be provided an impurity region 363 of the second electrical conduction type (e.g., the P type) around the control gate 361C. In such a case, as illustrated in FIG. 14B, the control gate 361C is provided to surround the periphery of the second region 320 in the in-plane direction of the semiconductor substrate. The impurity region 363 of the second electrical conduction type (e.g., the P type) is further provided to surround the periphery of the control gate 361C.

According to the third variation, the photodetector 300C makes it possible to further increase the controllability of a potential barrier generated in the region adjacent to the second region 320. It is thus possible to further increase the detection characteristics of incident light.

Fourth Variation

Figure 15:
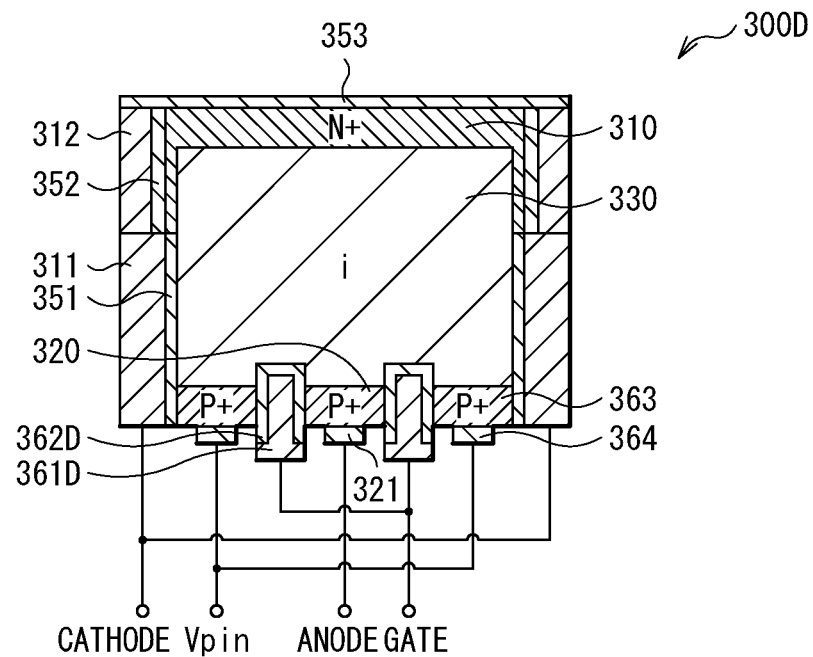
FIG. 15 is a vertical cross-sectional view of a structure of a photodetector according to a fourth variation.

FIG. 15 is a vertical cross-sectional view of a structure of a photodetector 300D according to a fourth variation.

As illustrated in FIG. 15, a control gate 361D may be provided to have a vertical gate structure. In addition, an electrode 364 may be electrically coupled to the impurity region 363. The application voltage Vpin allows the electrode 364 to control the potential of the impurity region 363.

According to the fourth variation, the photodetector 300D makes it possible to further strengthen the pinning effects of the second region 320 by controlling the application voltage Vpin to the impurity region 363 as negative voltage. The photodetector 300D thus makes it possible to further increase the detection characteristics of incident light.

Fifth Variation

Figure 16:
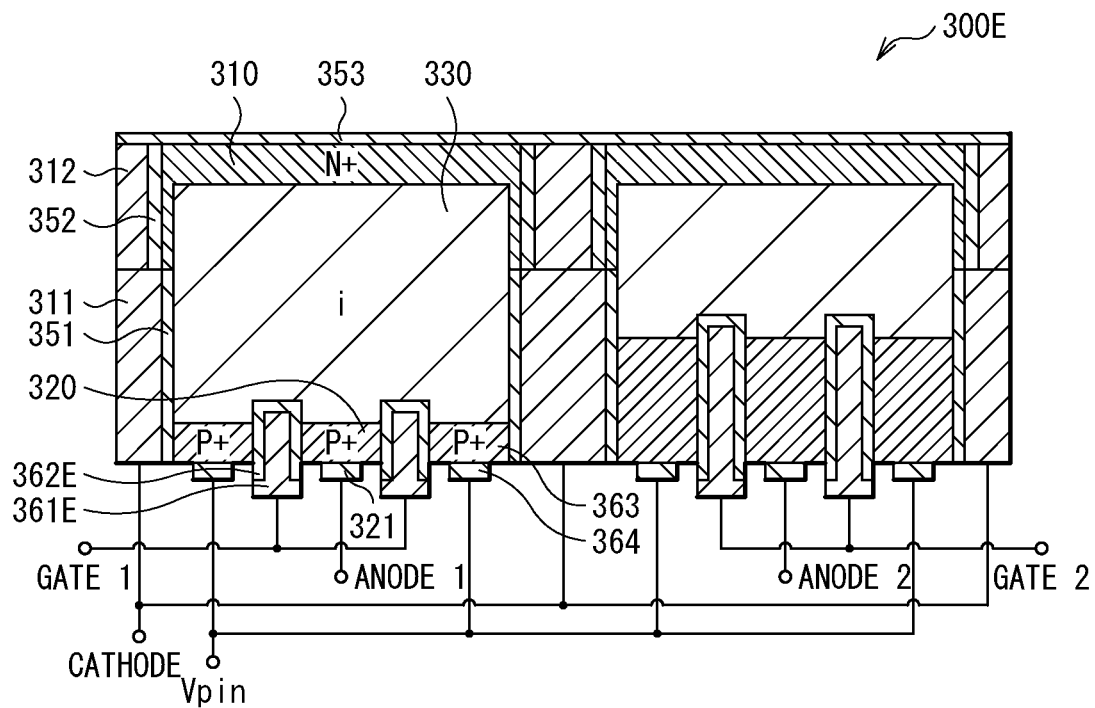
FIG. 16 is a vertical cross-sectional view of a structure of a photodetector according to a fifth variation.

FIG. 16 is a vertical cross-sectional view of a structure of a photodetector 300E according to a fifth variation.

As illustrated in FIG. 16, the second regions 320, control gates 361E, gate insulating films 362E, and the impurity regions 363 may be different between the respective pixels in formation depth in the thickness direction of the semiconductor substrate. This allows the photodetector 300E to include the third regions 330 that are different in thickness between pixels. Each of the third regions 330 absorbs incident light. This allows the third regions 330 to absorb the respective pieces of light of wavelength bands that are different between pixels.

According to the fifth variation, the photodetector 300E is able to detect the respective pieces of light of wavelength bands that are different between pixels. It is thus possible to perform more complicated sensing.

Sixth Variation

Figure 17A:
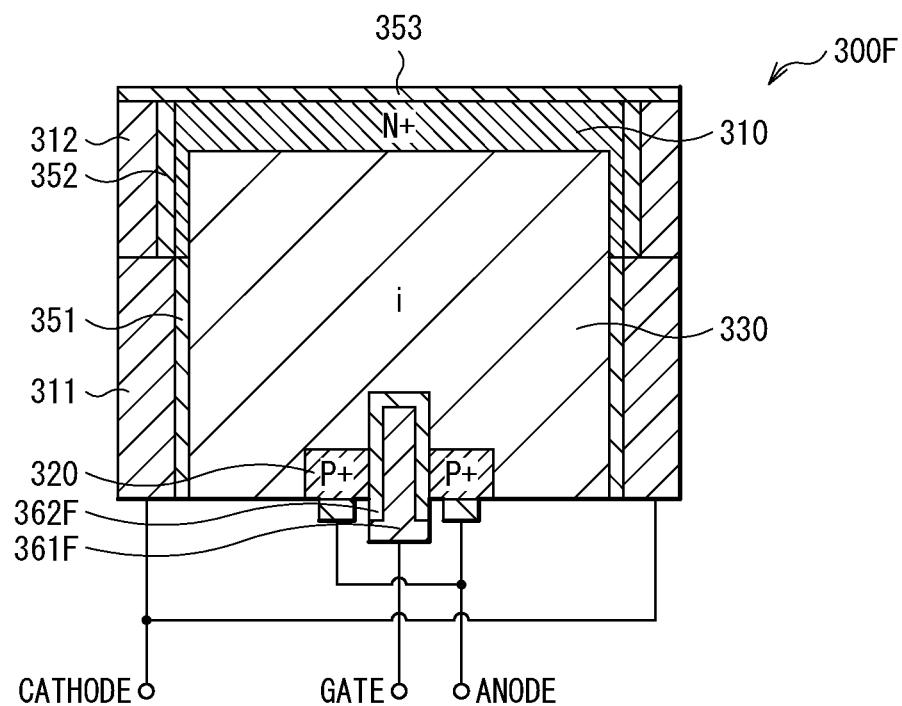
FIG. 17A is a vertical cross-sectional view of a structure of a photodetector according to a sixth variation.
Figure 17B:
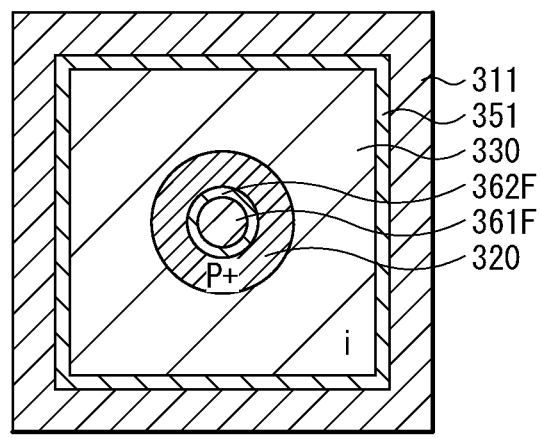
FIG. 17B is a plan view of the structure of the photodetector according to the sixth variation from a second surface side.

FIG. 17A is a vertical cross-sectional view of a structure of a photodetector 300F according to a sixth variation. FIG. 17B is a plan view of the structure of the photodetector 300F according to the sixth variation from the second surface side.

As illustrated in FIG. 17A, a control gate 361F may be provided to have a vertical gate structure. The control gate 361F may be provided to penetrate the second region 320 and buried in the semiconductor substrate with a gate insulating film 362F interposed in between. In addition, as illustrated in FIG. 17B, the second region 320 may be provided in the shape of a circle substantially in the middle of the region defined by the first electrode 311 and the pixel separation layer 351 in the in-plane direction of the semiconductor substrate. The control gate 361F may be provided to penetrate the second region 320 in the center.

According to the sixth variation, the photodetector 300F makes it possible to further increase the controllability of a potential barrier generated in the region adjacent to the second region 320. It is thus possible to further increase the detection characteristics of incident light.

Seventh Variation

Figure 18:
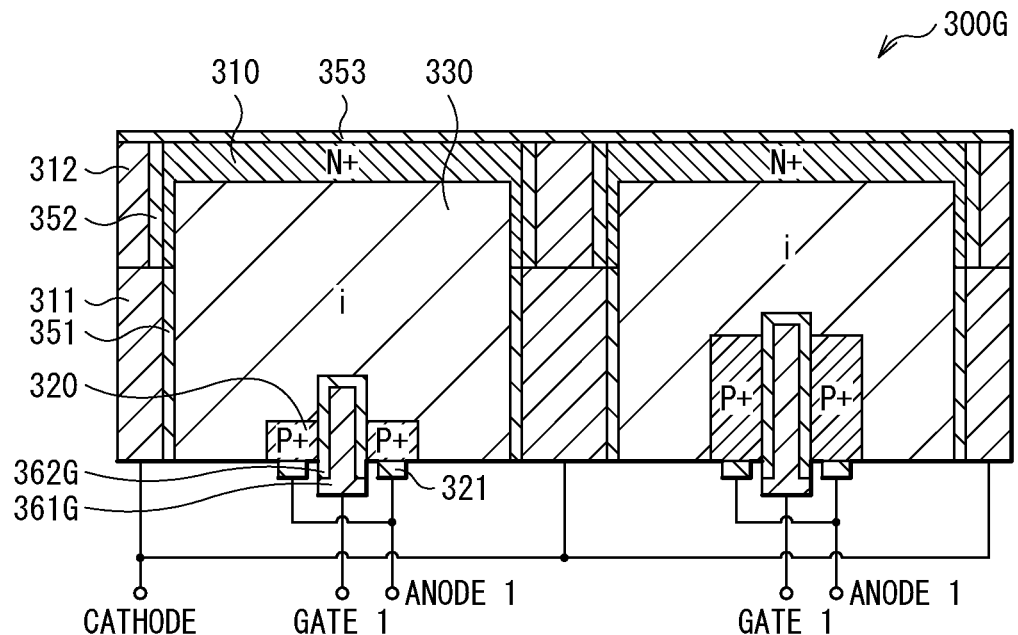
FIG. 18 is a vertical cross-sectional view of a structure of a photodetector according to a seventh variation.

FIG. 18 is a vertical cross-sectional view of a structure of a photodetector 300G according to a seventh variation.

As illustrated in FIG. 18, a control gate 361G may be provided to have a vertical gate structure. The control gate 361G may be provided to penetrate the second region 320 and buried in the semiconductor substrate with a gate insulating film 362G interposed in between. In addition, the second regions 320, control gates 361G, and gate insulating films 362G may be different between the respective pixels in formation depth in the thickness direction of the semiconductor substrate. This allows the photodetector 300G to include the third regions 330 that are different in thickness between pixels. Each of the third regions 330 absorbs incident light. This allows the third regions 330 to absorb the respective pieces of light of wavelength bands that are different between pixels.

According to the seventh variation, the photodetector 300G is able to detect the respective pieces of light of wavelength bands that are different between pixels. It is thus possible to perform more complicated sensing.

Eighth Variation

Figure 19:
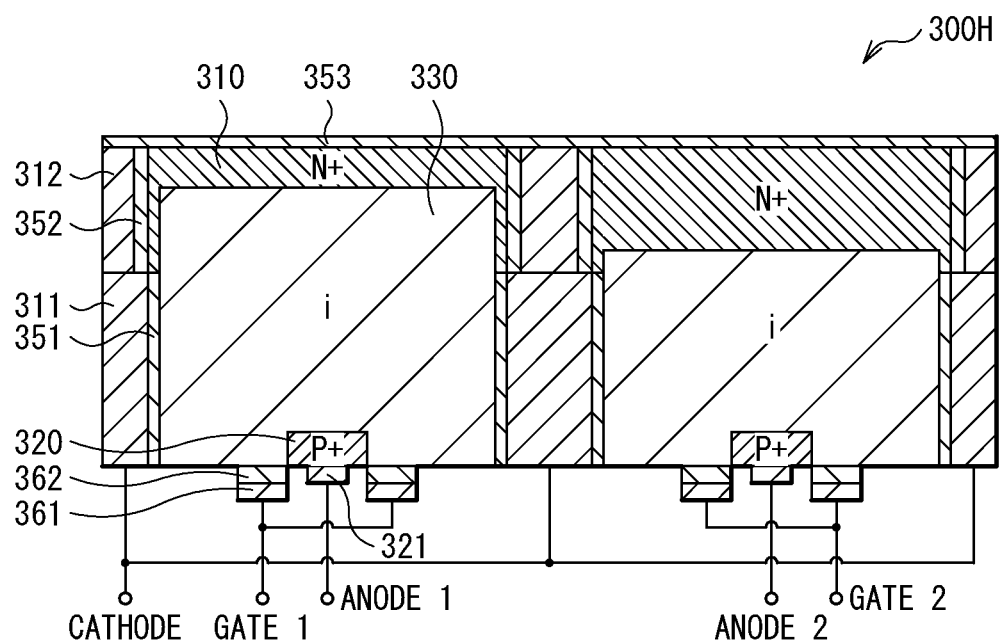
FIG. 19 is a vertical cross-sectional view of a structure of a photodetector according to an eighth variation.

FIG. 19 is a vertical cross-sectional view of a structure of a photodetector 300H according to an eighth variation.

As illustrated in FIG. 19, the first regions 310 may be different between the respective pixels in formation depth in the thickness direction of the semiconductor substrate. This allows the photodetector 300H to include the third regions 330 that are different in thickness between pixels. Each of the third regions 330 absorbs incident light. This allows the third regions 330 to absorb the respective pieces of light of wavelength bands that are different between pixels.

According to the eighth variation, the photodetector 300H is able to detect the respective pieces of light of wavelength bands that are different between pixels. It is thus possible to perform more complicated sensing.

Ninth Variation

Figure 20:
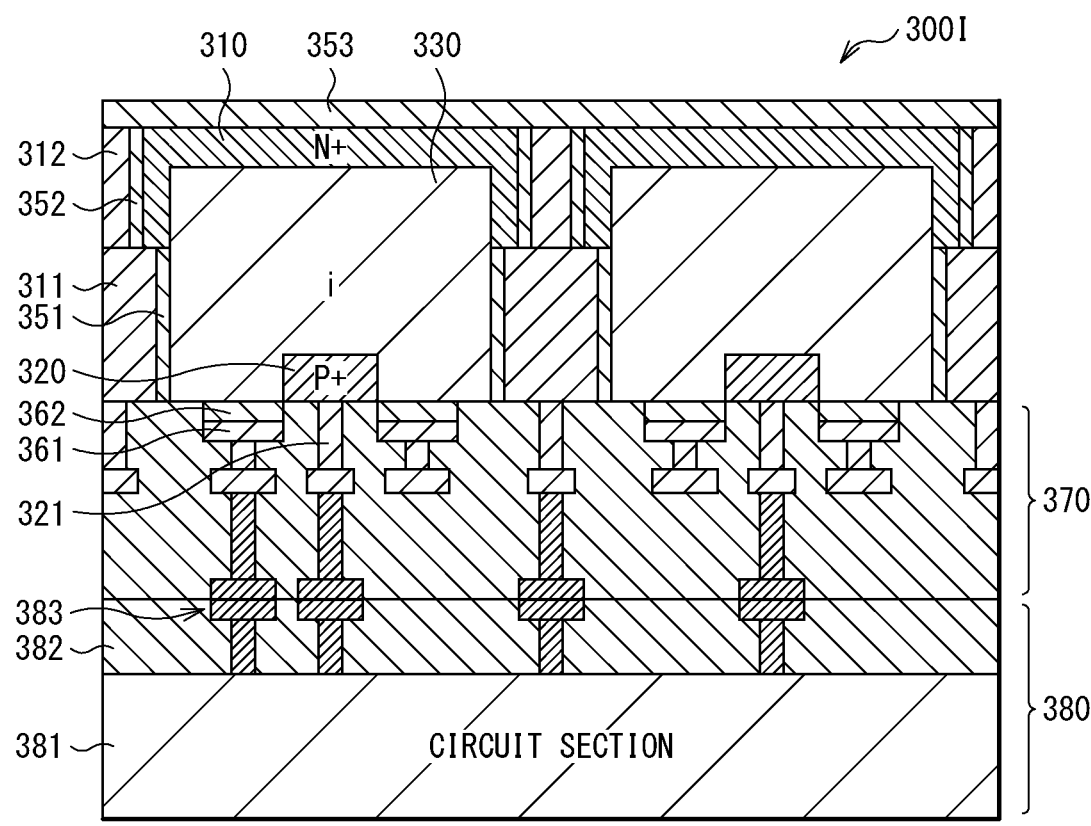
FIG. 20 is a vertical cross-sectional view of a structure of a photodetector according to a ninth variation.

FIG. 20 is a vertical cross-sectional view of a structure of a photodetector 300I according to a ninth variation.

As illustrated in FIG. 20, the second surface (i.e., the front surface opposite to the back surface) of the photodetector 300I may be further provided with a multilayer wiring layer 370 bonded to a circuit board 380 including a circuit section 381. The multilayer wiring layer 370 includes a wiring line and a via. The multilayer wiring layer 370 electrically couples the wiring line and the via and an electrode exposed from an insulating layer 382 of the circuit board 380 by using an electrode junction structure 383 (that is also referred to as CuCu junction structure).

According to the ninth variation, the photodetector 300I allows the circuit board 380 to be stacked in the thickness direction of the semiconductor substrate. This makes it possible to further decrease the chip area. The circuit board 380 includes the circuit section 381.

Tenth Variation

Figure 21A:
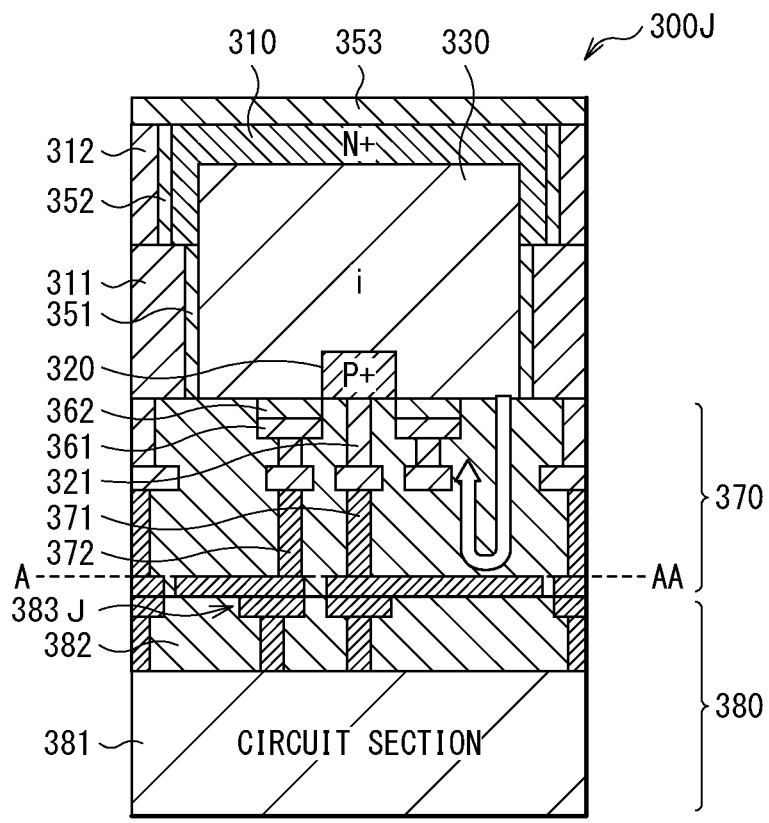
FIG. 21A is a vertical cross-sectional view of a structure of a photodetector according to a tenth variation.
Figure 21B:
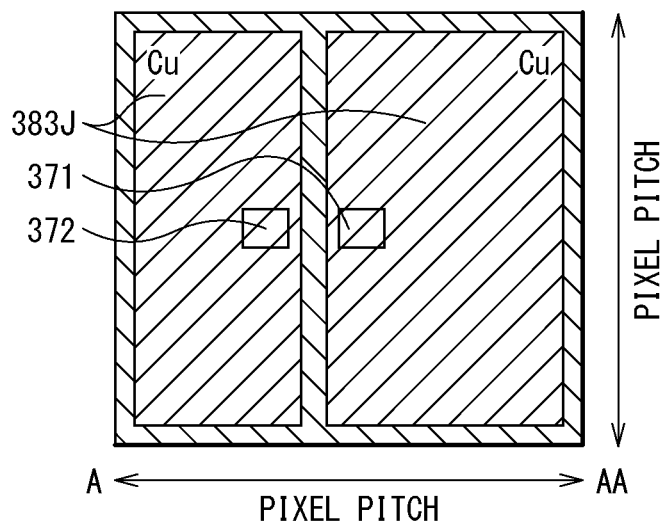
FIG. 21B is a plan view taken along an A-AA cutting plane of FIG. 21A.

FIG. 21A is a vertical cross-sectional view of a structure of a photodetector 300J according to a tenth variation. FIG. 21B is a plan view taken along an A-AA cutting plane of FIG. 21A.

As illustrated in FIG. 21A, the second surface (i.e., the front surface opposite to the back surface) of the photodetector 300J may be further provided with a multilayer wiring layer 370 bonded to a circuit board 380 including a circuit section 381.

Here, there may be provided an electrode junction structure 383J (that is also referred to as CuCu junction structure) over the whole of the pixel region defined by the first electrode 311 and the pixel separation layer 351. The electrode junction structure 383J electrically couples the wiring line and the via of the multilayer wiring layer 370 and the electrode exposed from the insulating layer 382 of the circuit board 380. This allows the electrode junction structure 383J to increase the photoelectric conversion efficiency of the third region 330 by reflecting the light passing through the third region 330 and entering the multilayer wiring layer 370 side. Specifically, as illustrated in FIG. 21B, the electrode junction structure 383J may be provided over the whole of a pixel while the electrodes or the wiring lines are divided to keep vias 371 and 372 electrically isolated from each other. The vias 371 and 372 are coupled to different electrodes.

According to the tenth variation, the photodetector 300J allows the third region 330 to have higher photoelectric conversion efficiency. It is thus possible to increase the detection sensitivity of incident light.

Eleventh Variation

Figure 22A:
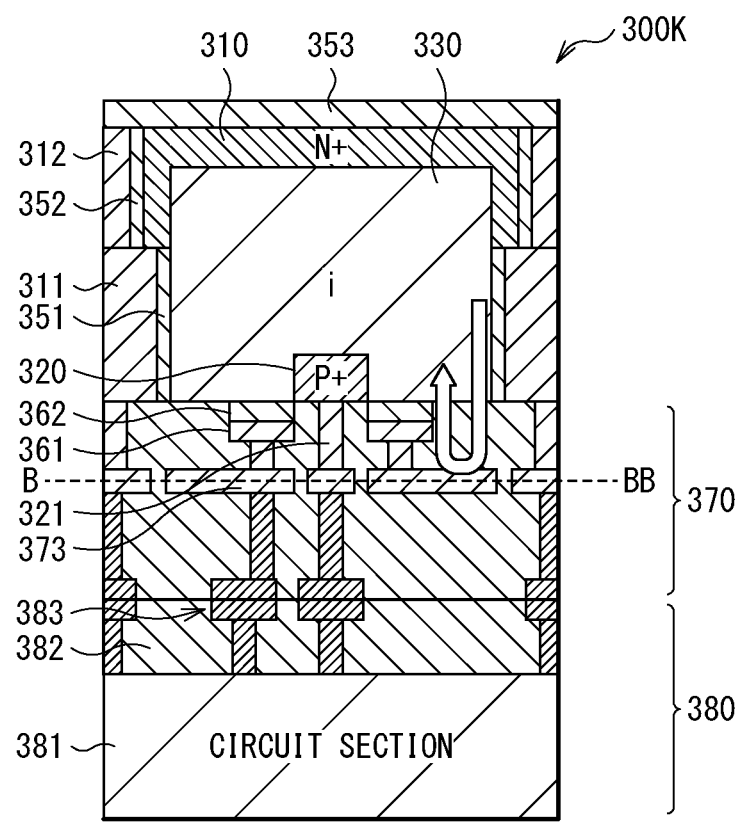
FIG. 22A is a vertical cross-sectional view of a structure of a photodetector according to an eleventh variation.
Figure 22B:
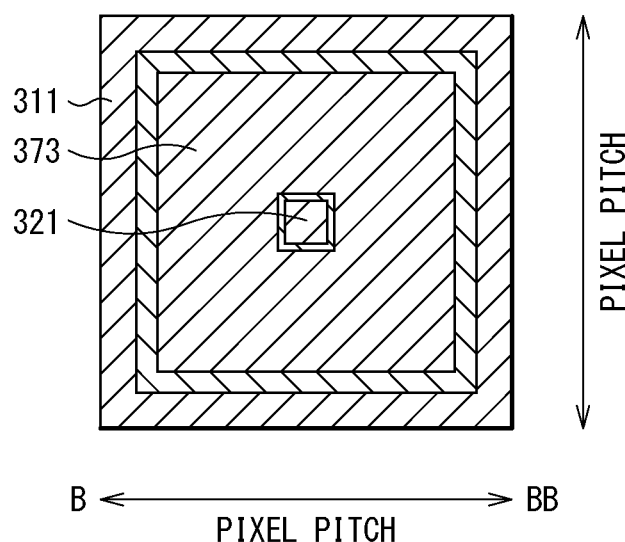
FIG. 22B is a plan view taken along a B-BB cutting plane of FIG. 22A.

FIG. 22A is a vertical cross-sectional view of a structure of a photodetector 300K according to an eleventh variation. FIG. 22B is a plan view taken along a B-BB cutting plane of FIG. 22A.

As illustrated in FIG. 22A, the second surface (i.e., the front surface opposite to the back surface) of the photodetector 300K may be further provided with a multilayer wiring layer 370 bonded to a circuit board 380 including a circuit section 381.

Here, there may be provided a wiring line 373 over the whole of the pixel region defined by the first electrode 311 and the pixel separation layer 351. The wiring line 373 is included in the multilayer wiring layer 370. This allows the wiring line 373 to increase the photoelectric conversion efficiency of the third region 330 by reflecting the light passing through the third region 330 and entering the multilayer wiring layer 370 side. Specifically, as illustrated in FIG. 22B, the wiring line 373 electrically coupled to the control gate 361 may be provided over the whole of a pixel to surround the periphery of the second electrode 321.

According to the eleventh variation, the photodetector 300K allows the third region 330 to have higher photoelectric conversion efficiency. It is thus possible to increase the detection sensitivity of incident light.

Twelfth Variation

Figure 23:
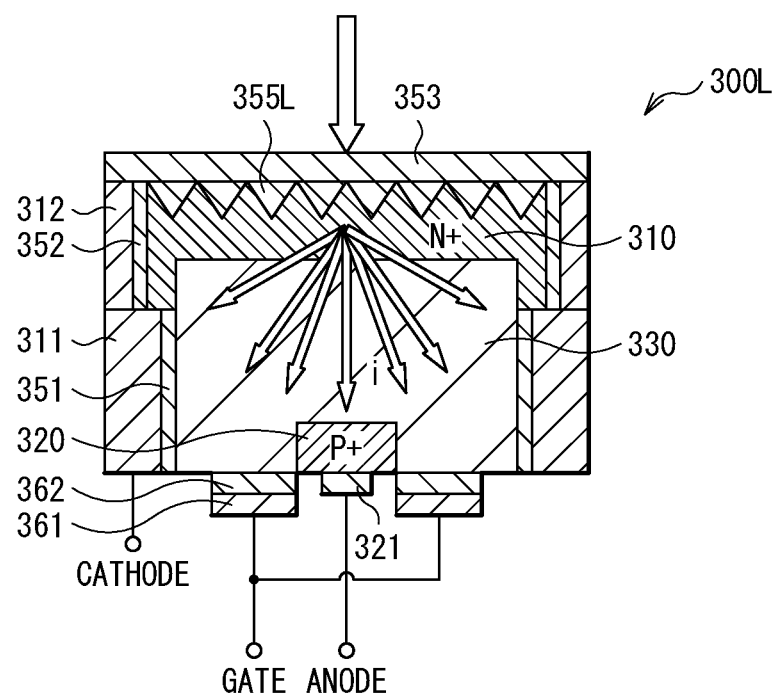
FIG. 23 is a vertical cross-sectional view of a structure of a photodetector according to a twelfth variation.

FIG. 23 is a vertical cross-sectional view of a structure of a photodetector 300L according to a twelfth variation.

As illustrated in FIG. 23, the first surface (i.e., the back surface that is an incidence surface of light) of the photodetector 300L may be further provided with a scattering structure 355L. The scattering structure 355L is an uneven structure provided in a repetition period lower than or equal to the wavelength of incident light. Examples of the scattering structure 355L include a moth-eye structure or the like. Scattering light entering the photodetector 300L allows the scattering structure 355L to reduce the possibility that the incident light passes through the third region 330. It is to be noted that the scattering structure 355L may be formed by processing the first surface of the semiconductor substrate or formed by stacking an uneven structure body on the first surface of the semiconductor substrate.

According to the twelfth variation, the photodetector 300L makes it possible to increase the photoelectric conversion efficiency of the third region 330 by scattering incident light. The photodetector 300L thus makes it possible to increase the detection sensitivity of incident light.

Thirteenth Variation

Figure 24A:
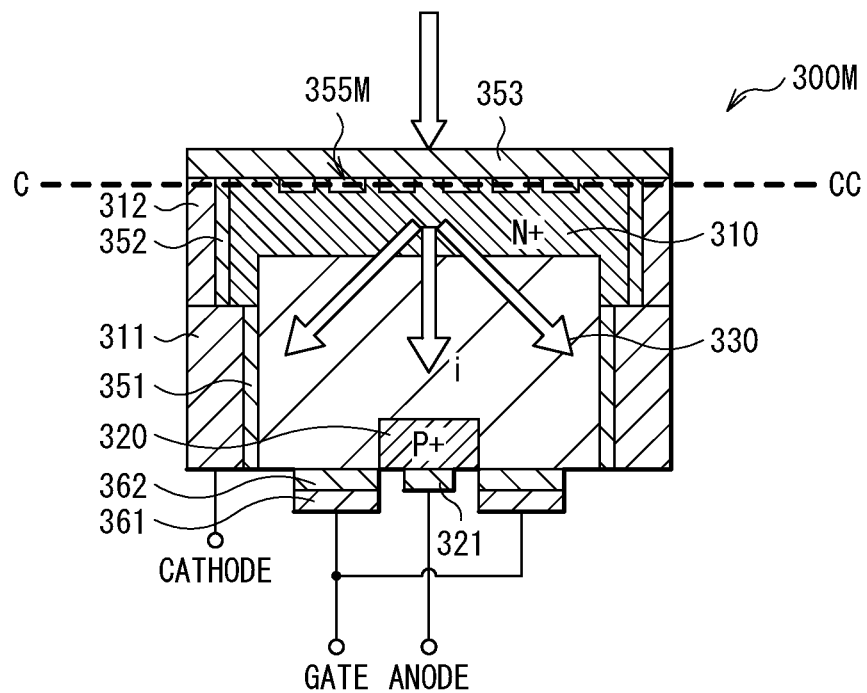
FIG. 24A is a vertical cross-sectional view of a structure of a photodetector according to a thirteenth variation.
Figure 24B:
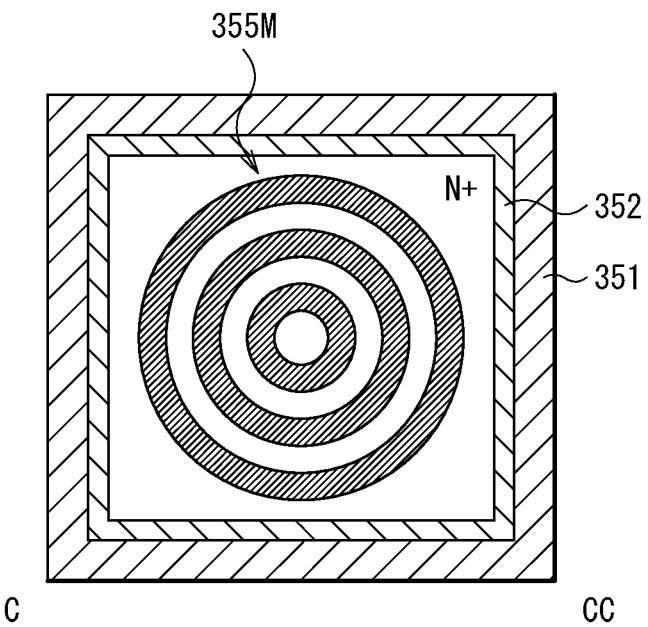
FIG. 24B is a plan view taken along a C-CC cutting plane of FIG. 24A.

FIG. 24A is a vertical cross-sectional view of a structure of a photodetector 300M according to a thirteenth variation. FIG. 24B is a plan view taken along a C-CC cutting plane of FIG. 24A.

As illustrated in FIG. 24A, the first surface (i.e., the back surface that is an incidence surface of light) of the photodetector 300M may be further provided with a diffraction lattice structure 355M. For example, as illustrated in FIG. 24B, the diffraction lattice structure 355M may have a structure in which a plurality of recesses and a plurality of protrusions are formed at intervals corresponding to the wavelength of incident light in the shape of concentric circles. The diffraction lattice structure 355M causes light entering the photodetector 300M to branch into a plurality of paths, thereby making it possible to condense the incident light at a predetermined position in a pixel.

According to the thirteenth variation, the photodetector 300M makes it possible to increase the photoelectric conversion efficiency of the third region 330 by condensing incident light at a predetermined position. The photodetector 300M thus makes it possible to increase the detection sensitivity of incident light.

Fourteenth Variation

Figure 25:
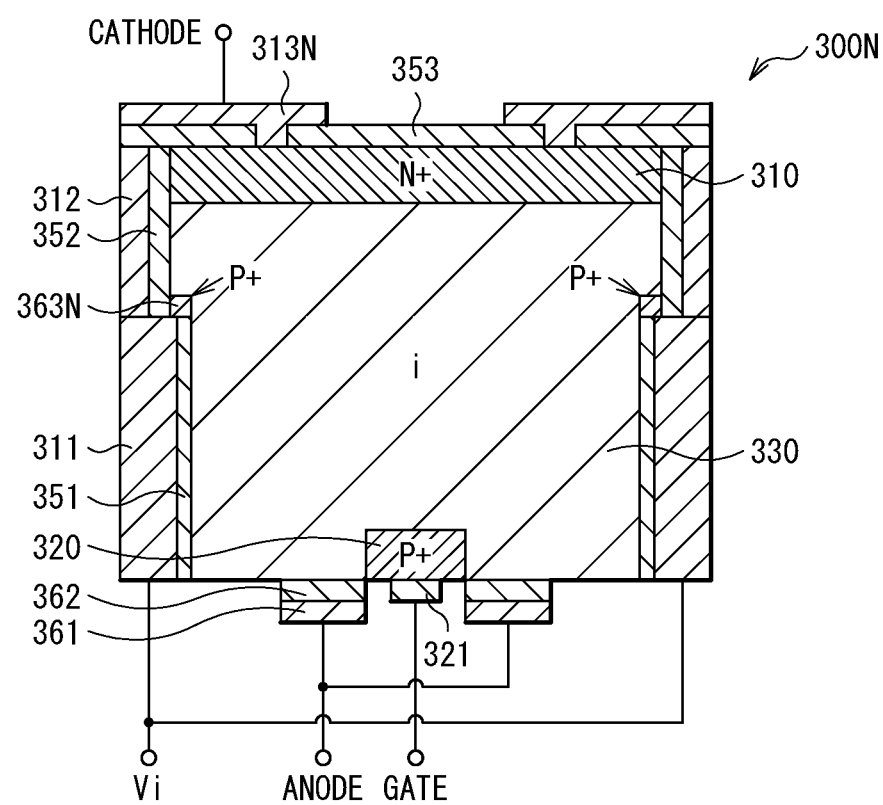
FIG. 25 is a vertical cross-sectional view of a structure of a photodetector according to a fourteenth variation.

FIG. 25 is a vertical cross-sectional view of a structure of a photodetector 300N according to a fourteenth variation.

As illustrated in FIG. 25, in the photodetector 300N, the first region 310 is electrically coupled to a first surface electrode 313N provided above the first surface of the semiconductor substrate with the first surface insulating layer 353 interposed in between. The first surface electrode 313N functions as a cathode electrode. The first surface electrode 313N may be provided by using, for example, metal such as aluminum (Al), copper (Cu), tungsten (W), titanium (Ti), or tantalum (Ta), polysilicon (poly-Si), or other electrically conductive materials.

In contrast, the first electrode 311 is not electrically coupled to the first region 310, but is electrically coupled to a second electrical conduction type region 363N of the second electrical conduction type that is provided inside the third region 330. This allows the first electrode 311 to control the potential of the third region 330 through the second electrical conduction type region 363N. This allows the first electrode 311 to function as an electrode that controls a potential barrier generated in the third region 330.

According to the fourteenth variation, the photodetector 300N makes it possible to further increase the controllability of a potential barrier generated in the third region 330. It is thus possible to further increase the detection characteristics of incident light.

Fifteenth Variation

Figure 26:
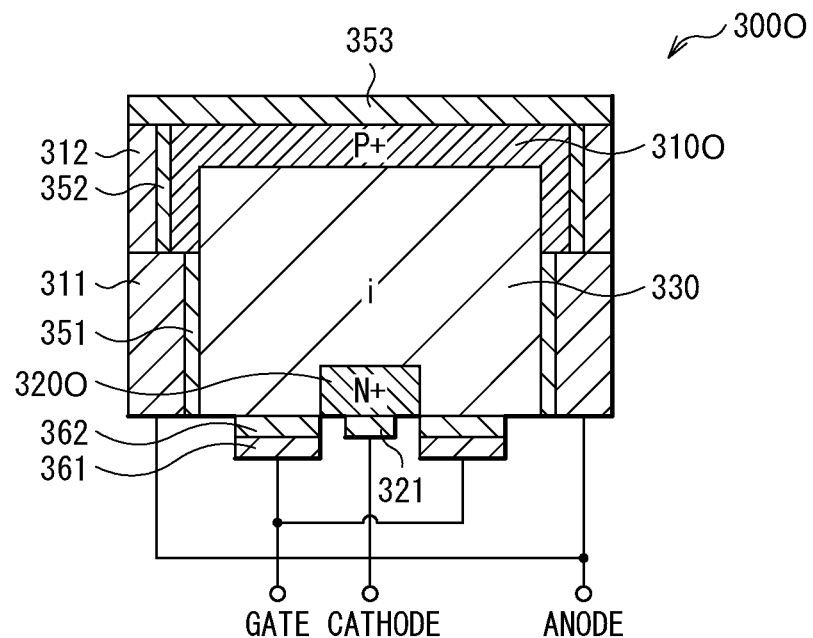
FIG. 26 is a vertical cross-sectional view of a structure of a photodetector according to a fifteenth variation.

FIG. 26 is a vertical cross-sectional view of a structure of a photodetector 300O according to a fifteenth variation.

As illustrated in FIG. 26, the photodetector 300O is provided with a first region 310O of the second electrical conduction type (e.g., the P type) on the first surface side of the semiconductor substrate and a second region 320O of the first electrical conduction type (e.g., the N type) on the second surface side opposite to the first surface. In such a case, the first electrode 311 electrically coupled to the first region 310O functions as an anode electrode and the second electrode 321 electrically coupled to the second region 320O functions as a cathode electrode. Even such a configuration allows the photodetector 300O to detect incident light for each of the pixels.

According to the fifteenth variation, the photodetector 300O allows the polarity of an electrically conductive region to be exchanged. This makes it possible to increase the freedom of structure design.

The variations of the structure of the photodetector 300 according to the present embodiment have been described above.

Figure 27:
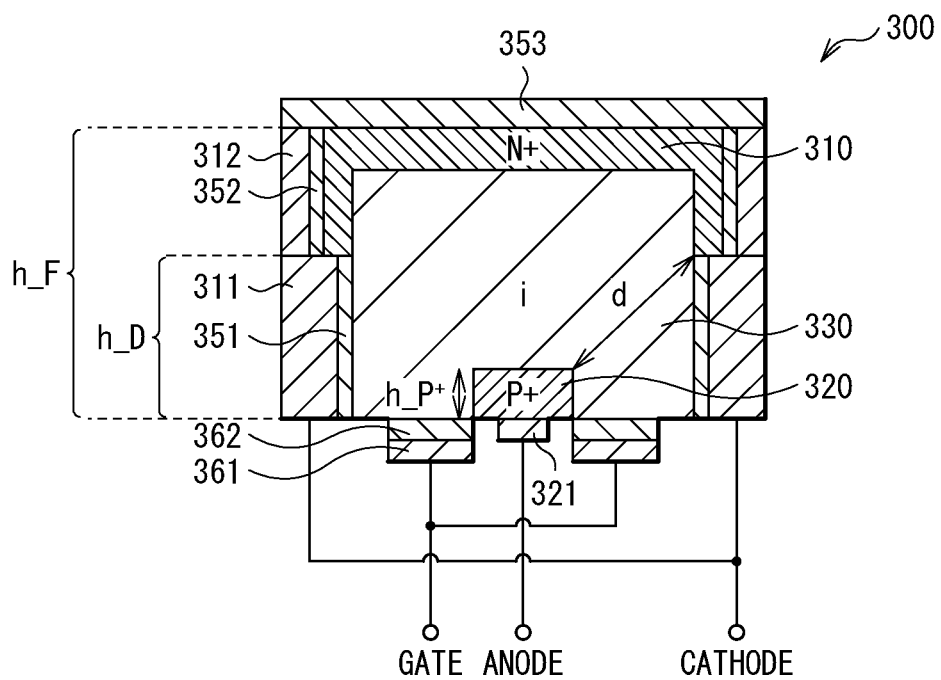
FIG. 27 is a vertical cross-sectional view describing formation depth of a second region and a first electrode.

It is, however, desirable that the distance between the first region 310 and the second region 320 be secured to suppress the DCR (Dark Count Rate) of the photodetector 300. In other words, the formation depth of the second region 320 and the formation depth of the first electrode 311 in the thickness direction of the semiconductor substrate have a desirable relationship. Here, the relationship is described with reference to FIG. 27. FIG. 27 is a vertical cross-sectional view describing the formation depth of the second region 320 and the first electrode 311.

As illustrated in FIG. 27, the formation depth of the second region 320 from the second surface of the semiconductor substrate is represented as $h\_P^+$, the formation depth of the first electrode 311 from the second surface of the semiconductor substrate to the bottom surface is represented as $h\_D$, and the formation depth (i.e., the distance from the second surface of the semiconductor substrate to the first surface) of the upper first electrode 312 from the second surface of the semiconductor substrate to the bottom surface is represented as $h\_F$. To secure the distance between the first region 310 and the second region 320, it is desirable that $h\_D$ have the following relationship with $h\_P^+$ and $h\_F$.

$$h\_P^+ < h\_D < h\_F$$

In a case where the formation depth $h\_P^+$ of the second region 320 and the formation depth $h\_D$ of the first electrode 311 have the relationship described above, the photodetector 300 is able to suppress the DCR (Dark Count Rate). It is to be noted that, in a case where the formation depth $h\_D$ of the first electrode 311 is excessively large, the process accuracy of the manufacturing steps may decrease and the manufacturing yield may lower. It is thus desirable that the formation depth $h\_D$ of the first electrode 311 be set to be larger within a range in which it is possible to maintain desired process accuracy.

(Operation Example)

Figure 28:
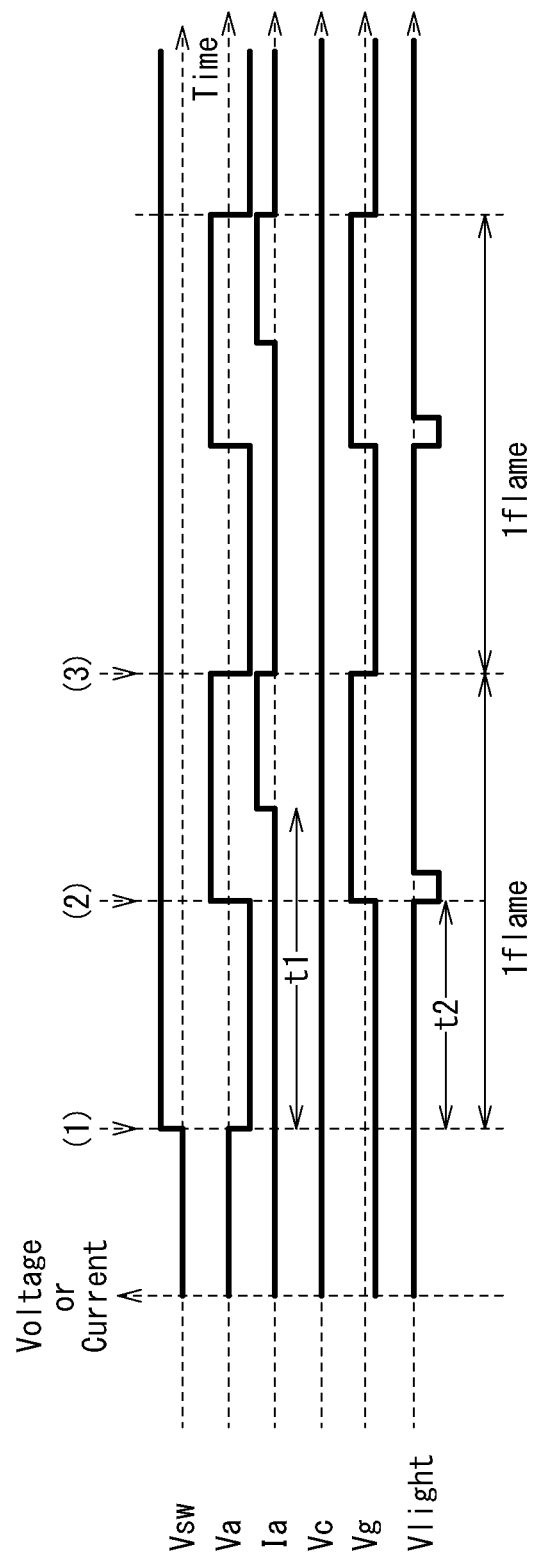
FIG. 28 is a timing chart diagram illustrating an example of a ToF sensor operation of the photodetector according to the embodiment.
Figure 29:
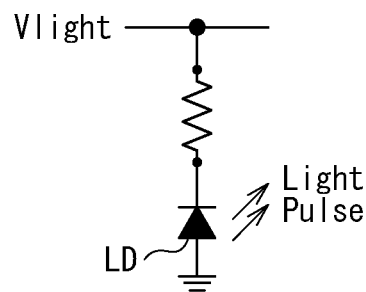
FIG. 29 is an explanatory diagram describing a light source used for the ToF sensor.
Figure 30A:
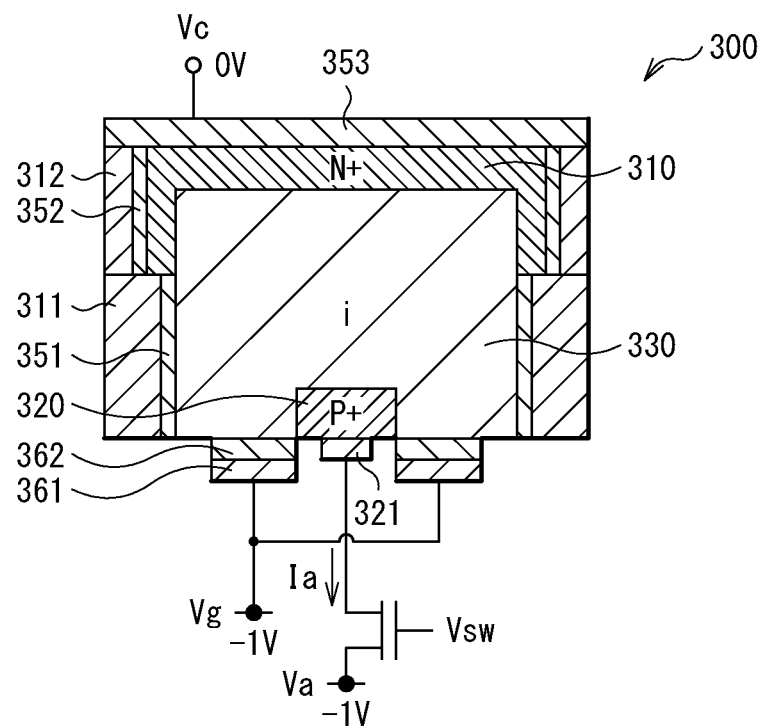
FIG. 30A is a vertical cross-sectional view describing a state of the photodetector at a timing of (1) in FIG. 28.
Figure 30B:
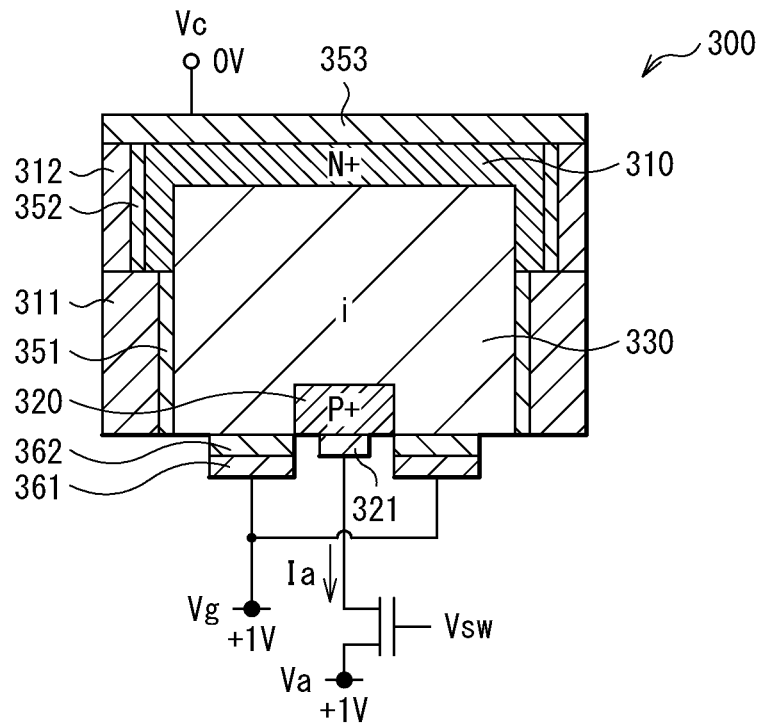
FIG. 30B is a vertical cross-sectional view describing a state of the photodetector at a timing of (2) in FIG. 28.
Figure 30C:
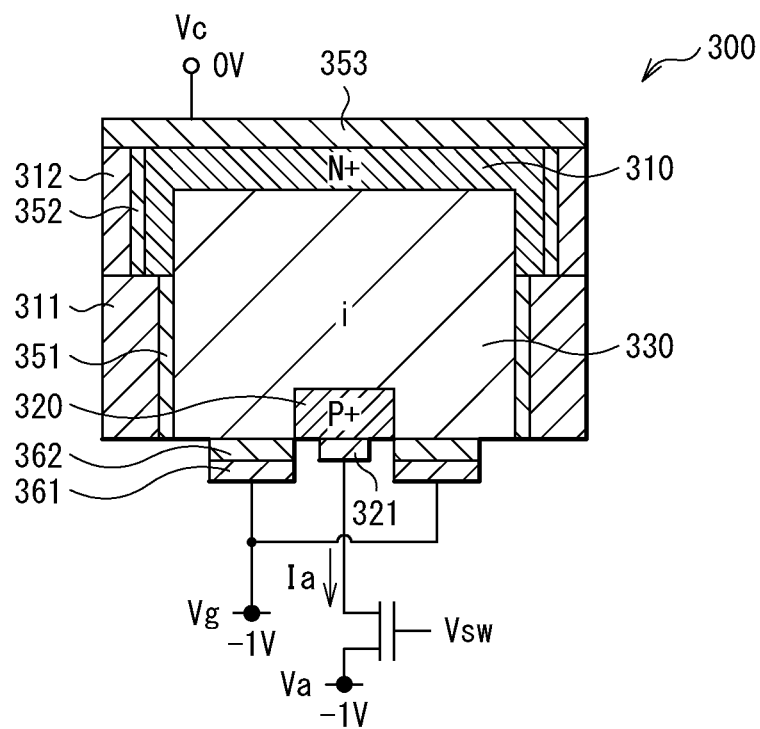
FIG. 30C is a vertical cross-sectional view describing a state of the photodetector at a timing of (3) in FIG. 28.

Next, an operation example of the photodetector 300 according to the present embodiment serving as a ToF (Time of Flight) sensor is described with reference to FIGS. 28 to 30C. FIG. 28 is a timing chart diagram illustrating an example of a ToF sensor operation of the photodetector 300 according to the present embodiment. FIG. 29 is an explanatory diagram describing a light source used for the ToF sensor. FIG. 30A is a vertical cross-sectional view describing the state of the photodetector 300 at a timing of (1) in FIG. 28. FIG. 30B is a vertical cross-sectional view describing the state of the photodetector 300 at a timing of (2) in FIG. 28. FIG. 30C is a vertical cross-sectional view describing the state of the photodetector 300 at a timing of (3) in FIG. 28.

As illustrated in FIGS. 28 and 30A, first, positive voltage is applied to voltage $V_{SW}$ to be applied to the gate of a switch transistor at a timing of (1) in FIG. 28 to turn on the switch transistor. Subsequently, it is assumed that the voltage Va to be applied to the second electrode 321 is negative voltage (e.g., −1 V). In this case, the voltage Vc to be applied to the first electrode 311 is 0 V. Reverse bias is thus applied between the first region 310 and the second region 320 of the photodetector 300. It is to be noted that the voltage Vg to be applied to the control gate 361 is set to negative voltage (e.g., −1 V).

Here, as illustrated in FIGS. 28, 29, and 30B, pulsed negative voltage $V_{light}$ is applied to a light source LD such as a laser diode or LED (Light Emitting Diode) at a timing of (2) in FIG. 28 to irradiate a target with the pulsed light. At the same time, positive voltage (e.g., +1 V) is applied as the voltage Va to be applied to the second electrode 321 to apply forward bias between the first region 310 and the second region 320 of the photodetector 300. In addition, the voltage Vg to be applied to the control gate 361 is set to positive voltage (e.g., +1 V).

After that, the pulsed light reflected on the target enters the photodetector 300 and a current value outputted from the second electrode 321 increases with delay from a timing of (2). This allows the photodetector 300 to calculate the distance to the target by calculating the difference between the light emission timing $t_2$ of the light source LD and the delay time $t_1$ of the detection of light.

Further, as illustrated in FIGS. 28 and 30C, as the voltage Va to be applied to the second electrode 321 at a timing of (3) in FIG. 28, negative voltage (e.g., −1 V) is applied. This applies reverse bias between the first region 310 and the second region 320 of the photodetector 300. The state of the photodetector 300 is thus reset. It is to be noted that the voltage Vg to be applied to the control gate 361 may be similarly set to negative voltage (e.g., −1 V).

Repeating the operation described above as one frame allows the photodetector 300 to detect the distance to a target for each of frames.

Modification Examples

Subsequently, first and second modification examples of the structure of the photodetector 300 according to the present embodiment are described with reference to FIGS. 31A to 34.

First Modification Example

Figure 31A:
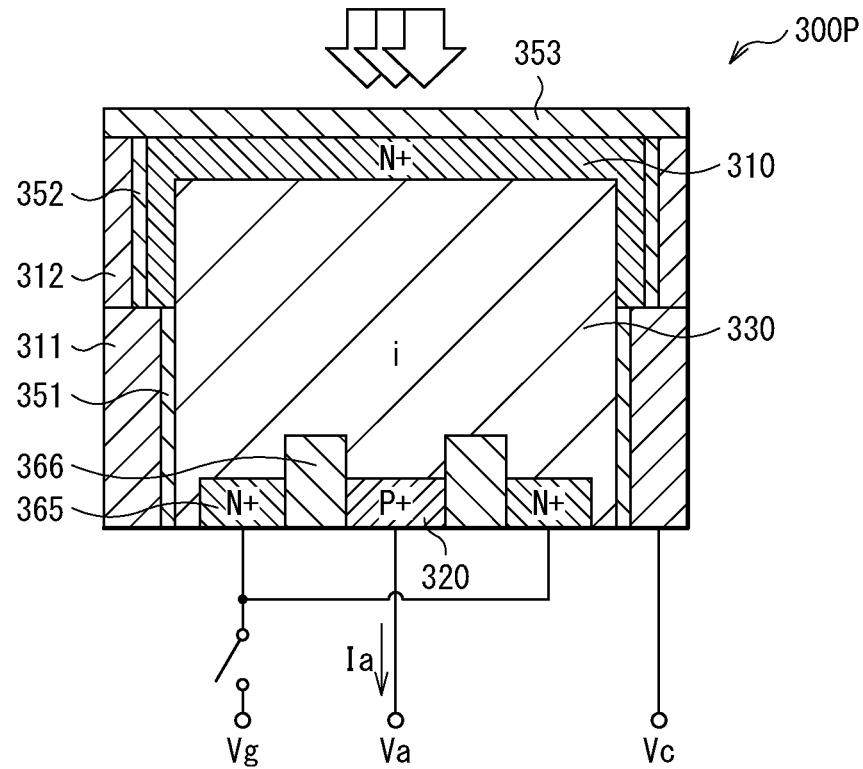
FIG. 31A is a vertical cross-sectional view of a structure of a photodetector according to a first modification example.
Figure 31B:
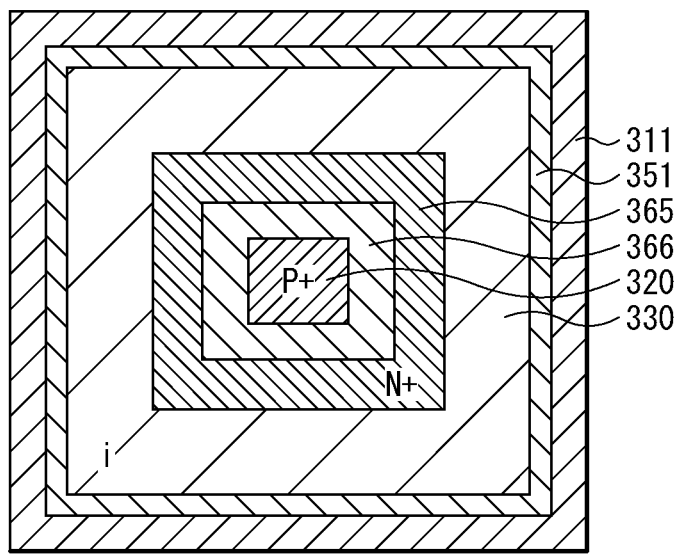
FIG. 31B is a plan view of the structure of the photodetector according to the first modification example from a second surface side.
Figure 32:
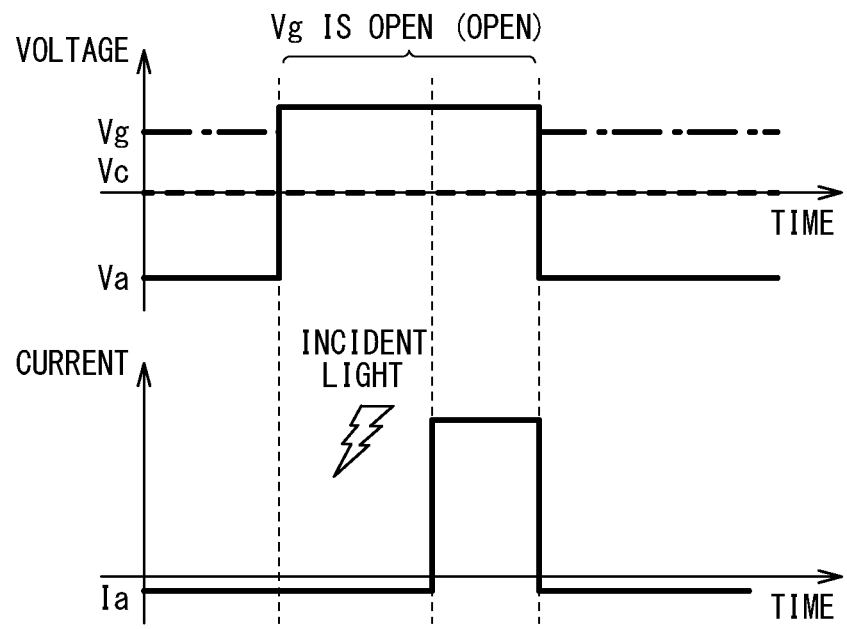
FIG. 32 is a timing chart diagram illustrating an example of drive voltage in the photodetector according to the first modification example.

FIG. 31A is a vertical cross-sectional view of a structure of a photodetector 300P according to the first modification example. FIG. 31B is a plan view of a structure of a photodetector 300P according to the first modification example from the second surface side. FIG. 32 is a timing chart diagram illustrating an example of drive voltage in the photodetector 300P according to the first modification example.

As illustrated in FIG. 31A, the photodetector 300P is provided with a potential control region 365 on the second surface side of the semiconductor substrate in place of the control gate 361 and the gate insulating film 362. The photodetector 300P makes it possible to control a potential barrier generated in the region adjacent to the second region 320 by applying voltage to the potential control region 365.

The potential control region 365 is a region (e.g., an N+ layer) of the first electrical conduction type. The potential control region 365 is provided to surround the periphery of the second region 320 with an insulating layer 366 interposed in between. In other words, as illustrated in FIG. 31B, the second surface side of the semiconductor substrate is provided with the second region 320 in the shape of an island substantially in the middle of the region defined by the first electrode 311 and the pixel separation layer 351. Further, the insulating layer 366 is provided to surround the periphery of the second region 320 and the potential control region 365 is provided to surround the periphery of the insulating layer 366.

Even in such a configuration, as illustrated in FIG. 32, the control over the voltage Vg to be applied to the potential control region 365 as with the control gate 361 allows the photodetector 300P to detect incident light.

Second Modification Example

Figure 33A:
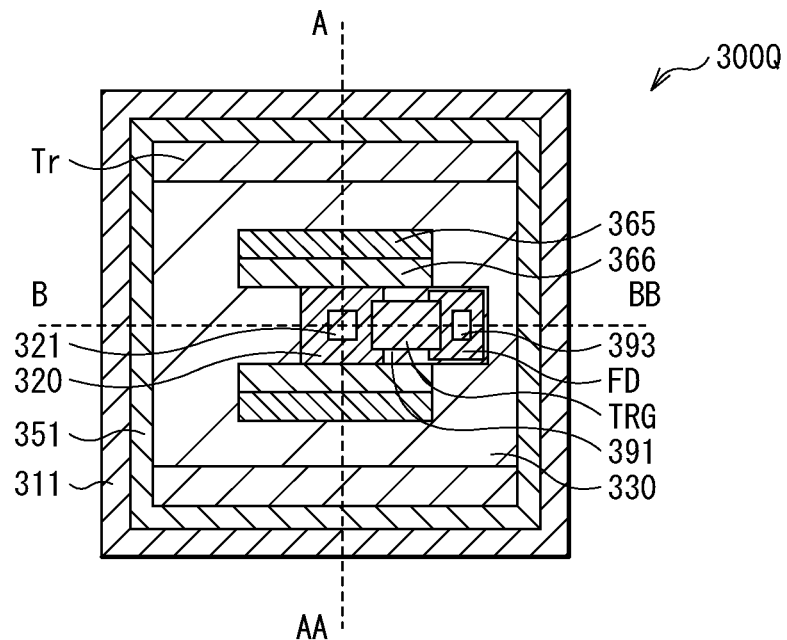
FIG. 33A is a plan view of a structure of a photodetector according to a second modification example from a second surface side.
Figure 33B:
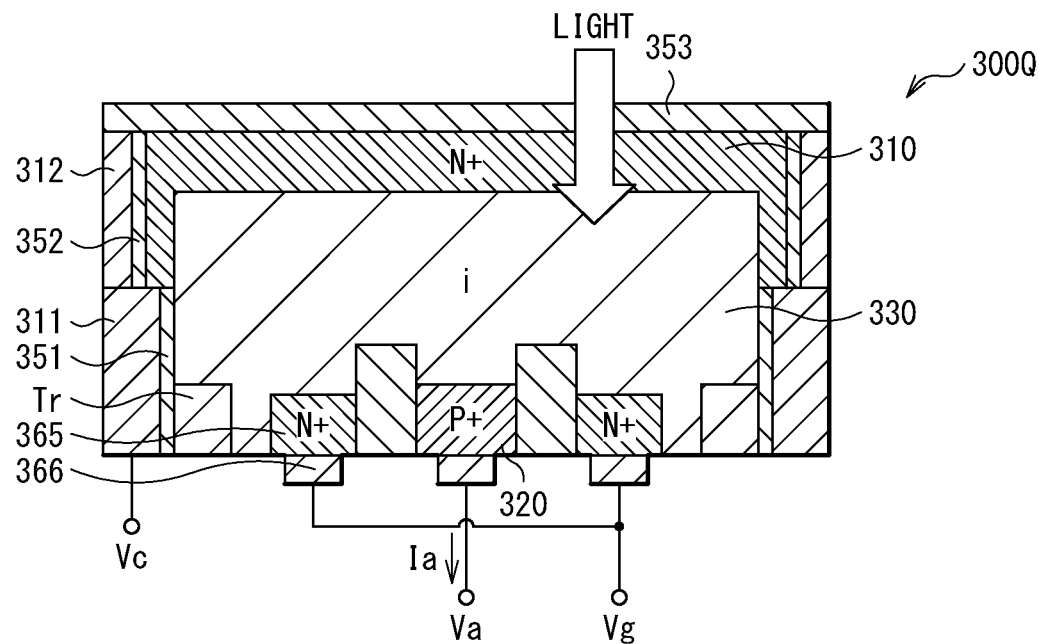
FIG. 33B is a vertical cross-sectional view of a structure of the photodetector in an A-AA cutting plane of FIG. 33A.
Figure 33C:
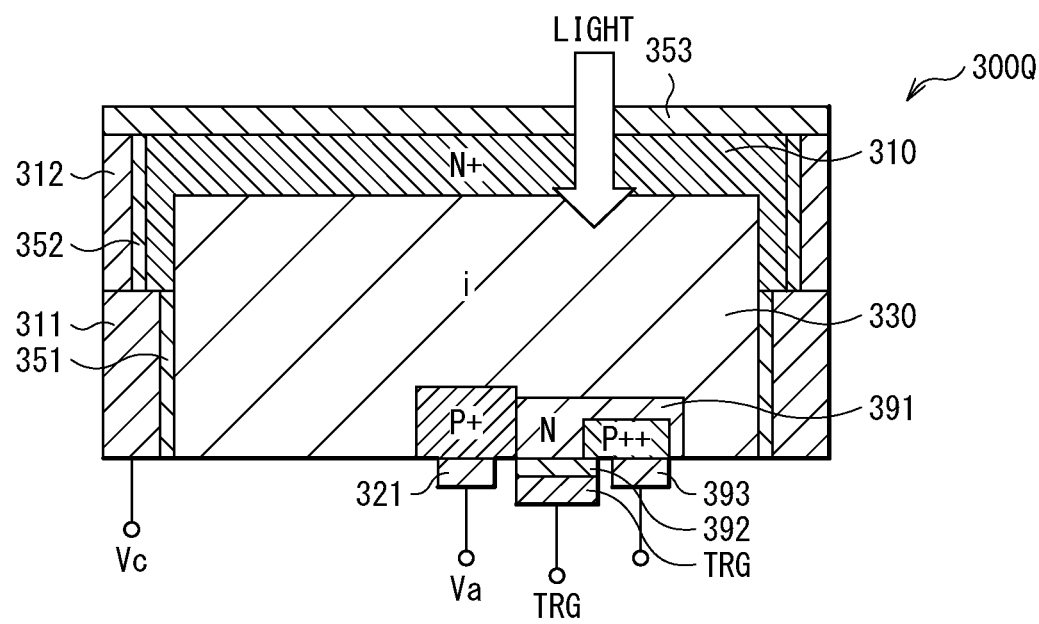
FIG. 33C is a vertical cross-sectional view of a structure of the photodetector in a B-BB cutting plane of FIG. 33A.

FIG. 33A is a plan view of a structure of a photodetector 300Q according to the second modification example from the second surface side. FIG. 33B is a vertical cross-sectional view of a structure of the photodetector 300Q in an A-AA cutting plane of FIG. 33A. FIG. 33C is a vertical cross-sectional view of a structure of the photodetector 300Q in a B-BB cutting plane of FIG. 33A.

As illustrated in FIGS. 33A to 33C, the photodetector 300Q according to the second modification example is different from the photodetector 300P according to the first modification example in that the photodetector 300Q according to the second modification example further includes a transfer gate and a floating diffusion and is also able to function as a general photodiode (PD).

Specifically, as illustrated in FIGS. 33A and 33B, the photodetector 300Q includes the first region 310, the third region 330, the second region 320, the insulating layer 366, the potential control region 365, and an electrode 367 that applies voltage to the potential control region 365 as with the photodetector 300P according to the first modification example. This allows the photodetector 300Q to function as a DPD sensor in a first direction (the longitudinal direction in FIG. 33A) of a plane of the semiconductor substrate.

In addition, as illustrated in FIGS. 33A and 33C, the photodetector 300Q includes the first region 310, the third region 330, the second region 320, a first electrical conduction type region 391, a transfer gate TRG, a floating diffusion FD of the second electrical conduction type, and an extraction electrode 393. This allows the photodetector 300Q to function as normal PD in a second direction (the lateral direction in FIG. 33A) orthogonal to the first direction of a plane of the semiconductor substrate.

Specifically, voltage is applied to the transfer gate TRG provided above the second surface of the semiconductor substrate with a gate insulating film 392 interposed in between, thereby making it possible to transfer electric charge from the second region 320 to the floating diffusion FD through the first electrical conduction type region 391. The electric charge transferred to the floating diffusion FD is extracted, for example, from the extraction electrode 393 to the pixel circuit or the like.

It is to be noted that a pixel transistor included in the pixel circuit may be provided, for example, in a pixel transistor region Tr provided to be adjacent to the pixel separation layer 351. For example, the pixel transistor region Tr may be provided with at least any one or more of a reset transistor, an amplifier transistor, a selection transistor, or a switch transistor included in the pixel circuit. The respective transistors provided in the pixel transistor region Tr may be electrically insulated from each other, for example, by an insulating layer provided by digging the semiconductor substrate.

Figure 34:
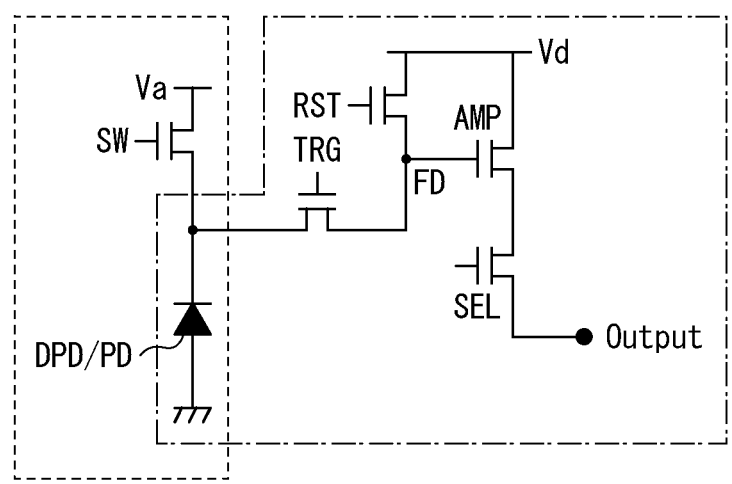
FIG. 34 is a circuit diagram illustrating an example of an equivalent circuit of a pixel circuit included in a photodetector that functions as a DPD sensor and PD.

The photodetector 300Q according to the second modification example may include, for example, a pixel circuit whose equivalent circuit is illustrated in FIG. 34. FIG. 34 is a circuit diagram illustrating an example of an equivalent circuit of a pixel circuit included in the photodetector 300Q that functions as a DPD sensor and PD. It is to be noted that DPD/PD indicates a photoelectric conversion section having a PIN diode structure in which the first region 310, the third region 330, and the second region 320 described above are stacked.

As illustrated in FIG. 34, as the pixel circuit on the DPD sensor side, a photoelectric conversion section DPD is electrically coupled to a power supply Va through a switch transistor SW. In addition, as the pixel circuit on the PD side, a photoelectric conversion section PD is electrically coupled to the floating diffusion FD through a transfer transistor TRG.

Further, a power supply Vd is coupled to the floating diffusion FD further through a reset transistor RST. In addition, the gate of an amplifier transistor AMP is coupled to the floating diffusion FD. The drain of the amplifier transistor AMP is coupled to the power supply Vd and the source of the amplifier transistor AMP is coupled to the external output Output through the selection transistor SEL. It is to be noted that the power supply Va on the DPD sensor side and the power supply Vd on the PD side may be different power supplies from each other or may be the same power supply. The photodetector 300Q according to the second modification example includes such pixel circuits. This allows the photodetector 300Q according to the second modification example to function as both a DPD sensor and PD.

2. Second Embodiment (Basic Structure)

Next, a basic structure of a photodetector according to a second embodiment of the present disclosure is described with reference to FIGS. 35 to 38.

Figure 35:
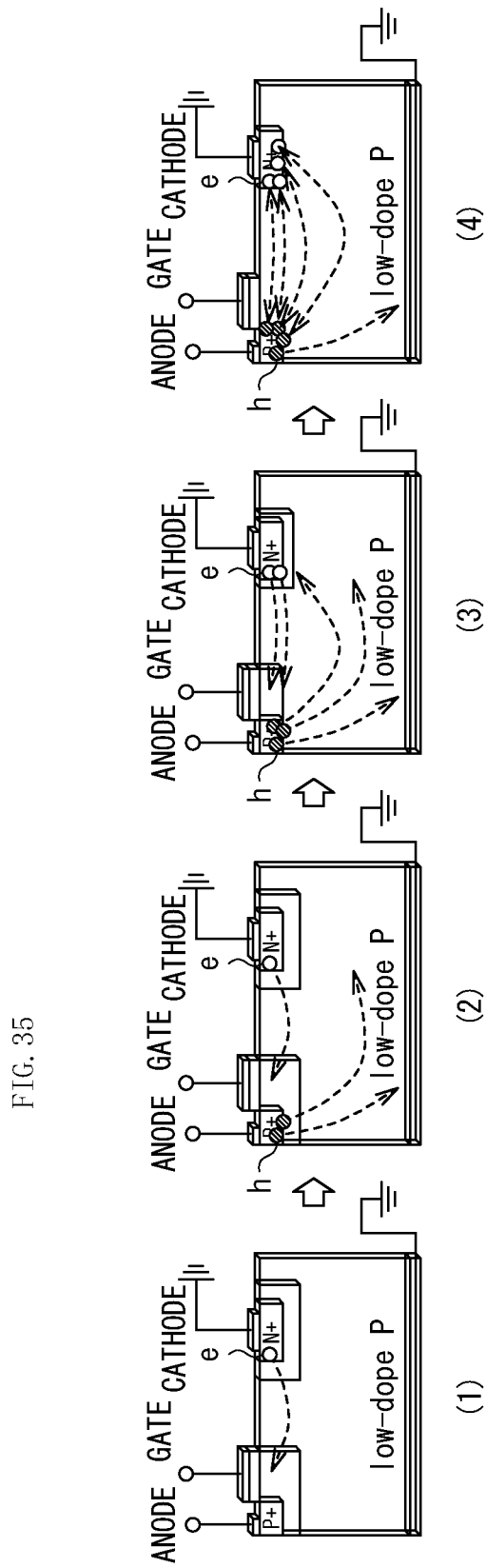
FIG. 35 is a schematic diagram chronologically illustrating movement of electric charge after inverting bias to be applied to the photodetector from reverse bias to forward bias.
Figure 36:
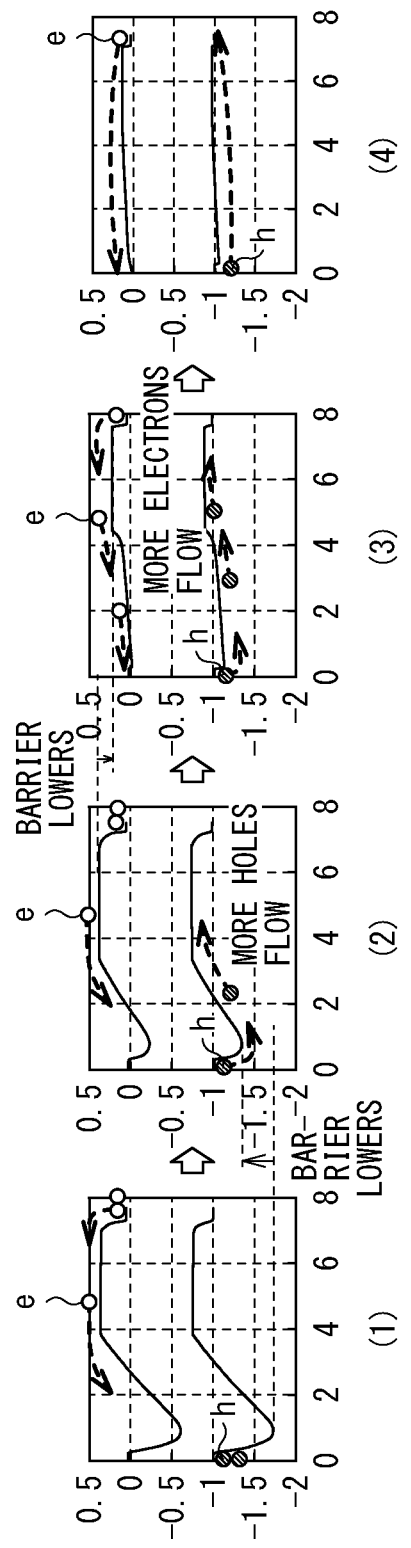
FIG. 36 is a graphical chart chronologically illustrating a change in a band structure after inverting bias to be applied to a detector from reverse bias to forward bias.

First, the basic characteristics of the photodetector according to the present embodiment are described with reference to FIGS. 35 and 36. The photodetector according to the present embodiment is a so-called DPD sensor that detects incident light by measuring delay time elapsed before a forward current flows in a case where bias to be applied is inverted from reverse bias to forward bias. FIG. 35 is a schematic diagram chronologically illustrating the movement of electric charge after inverting bias to be applied to the photodetector from reverse bias to forward bias. FIG. 36 is a graphical chart chronologically illustrating a change in a band structure after inverting the bias to be applied to the photodetector from reverse bias to forward bias.

In a case where bias to be applied to the photodetector is inverted from reverse bias to forward bias as illustrated in (1) of each of FIGS. 35 and 36, the photodetector first has the electrons e flowing from the cathode electrode (the first electrode) toward a fall (that is also referred to as dip) of the band structure around the P+ layer (the second region).

This lowers a potential barrier (decreases the size of the dip) around the P+ layer (the second region) as illustrated in (2) of each of FIGS. 35 and 36. The more holes h thus flow from the P+ layer (the second region).

Further, as illustrated in (3) of each of FIGS. 35 and 36, the holes h flowing from the P+ layer (the second region) lower a potential barrier around the N+ layer (the first region). This further increases the electrons e flowing from the N+ layer (the first region) to the periphery of the P+ layer (the second region). After that, the more holes h flow from the P+ layer (the second region) and the more electrons e flow from the N+ layer (the first region). This lowers both potential barriers around the N+ layer (the first region) and the P+ layer (the second region).

After that, as illustrated in (4) of each of FIGS. 35 and 36, the potential barriers disappear between the P+ layer (the second region) and the N+ layer (the first region). The photodetector enters a steady state in which a forward current flows between the cathode electrode (the first electrode) and the anode electrode (the second electrode).

The intensity of incident light varies the time from the inversion from reverse bias to forward bias to the steady state brought about by the behavior described above in the photodetector according to the present embodiment. This is because electrons resulting from the photoelectric conversion of incident light accelerates the electrons e flowing from the cathode electrode (the first electrode) to the dip around the P+ layer (the second region). This allows the photodetector according to the present embodiment to detect incident light by measuring delay time elapsed before a forward current flows in a case where application bias is inverted from reverse bias to forward bias.

Figure 37:
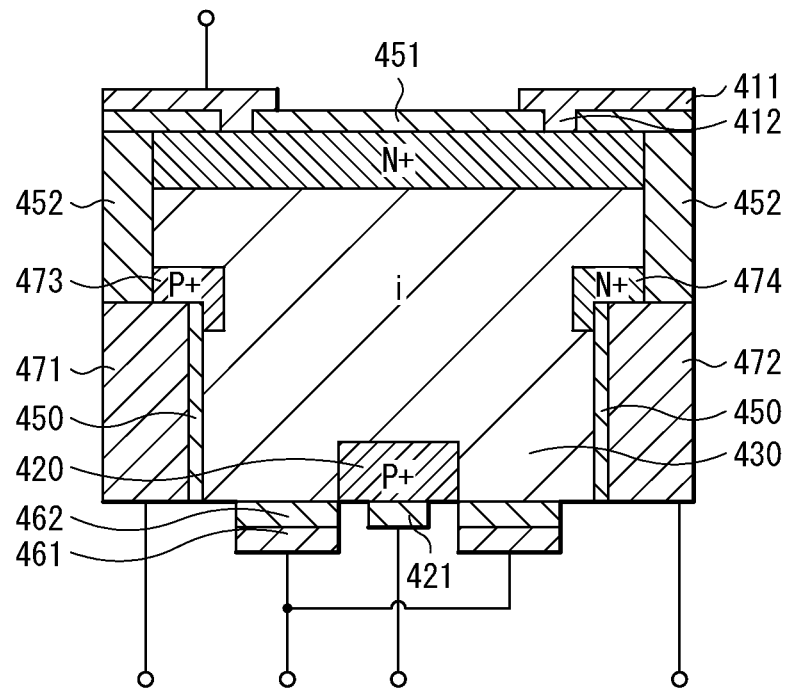
FIG. 37 is a vertical cross-sectional view of a basic structure of a photodetector according to a second embodiment of the present disclosure.
Figure 38:
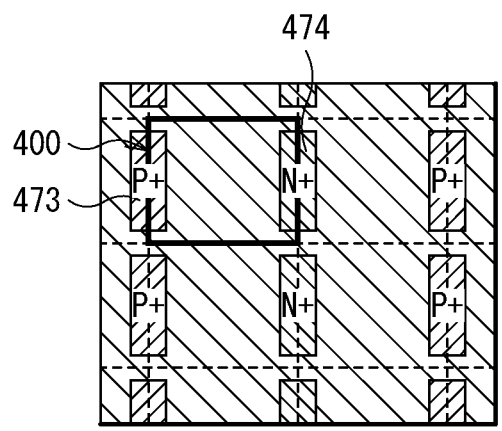
FIG. 38 is a perspective plan view of the basic structure of the photodetector according to the embodiment from a first surface side.

Subsequently, a basic structure of the photodetector according to the second embodiment of the present disclosure is described with reference to FIGS. 37 and 38. FIG. 37 is a vertical cross-sectional view of a basic structure of a photodetector 400 according to the present embodiment and FIG. 38 is a perspective plan view of the basic structure of the photodetector 400 according to the present embodiment from the first surface side.

As illustrated in FIG. 37, the photodetector 400 includes, for example, a first region 410, a second region 420, a third region 430, a first electrode 411, a via 412, a first surface insulating layer 451, a pixel separation layer 450, a through insulating layer 452, a third electrode 471, a potential control region 473, a fourth electrode 472, a reset region 474, a second electrode 421, a control gate 461, and a gate insulating film 462.

The first region 410 is a region (e.g., an N+ layer) of the first electrical conduction type that is provided on a first surface side of a semiconductor substrate such as silicon (Si). The second region 420 is a region (e.g., a P+ layer) of the second electrical conduction type that is provided on a second surface side of a semiconductor substrate such as silicon (Si) opposite to the first surface. The third region 430 is a region (e.g., an i layer) of the third electrical conduction type that is provided between the first region 410 and the second region 420 of a semiconductor substrate such as silicon (Si).

The first electrode 411 is provided above the first surface of the semiconductor substrate with the first surface insulating layer 451 interposed in between. The first electrode 411 is electrically coupled to the first region 410 through the via 412 or the like that extends through the first surface insulating layer 451. The first electrode 411 functions, for example, as a cathode electrode. The first electrode 411 is provided, for example, across the through insulating layer 452 provided on the boundary between pixels. The first electrode 411 is electrically coupled to the first region 410 of each of the pixels through the via 412 provided for each pixel. In other words, the first electrode 411 is a common electrode that supplies a common potential to the first regions 410 of the respective pixels.

The third electrode 471 and the fourth electrode 472 are each provided on the boundary between the respective pixels to extend from the second surface of the semiconductor substrate in the thickness direction of the semiconductor substrate. The third electrode 471 and the fourth electrode 472 each abut the through insulating layer 452 on the bottom surface. The through insulating layer 452 is less than the third electrode 471 and the fourth electrode 472 in width. The third electrode 471 and the fourth electrode 472 may be provided along the boundary of the pixel region to be opposed to each other. The through insulating layer 452 is less than the third electrode 471 and the fourth electrode 472 in width and is provided to extend from the bottom surfaces of the third electrode 471 and the fourth electrode 472 to the second surface of the semiconductor substrate in the thickness direction of the semiconductor substrate.

The pixel separation layer 450 is provided on the respective side surfaces of the third electrode 471 and the fourth electrode 472. This allows the pixel separation layer 450 to electrically isolate the photodetectors 400 of the respective pixels from each other along with the through insulating layer 452. The through insulating layer 452 is provided on each of the third electrode 471 and the fourth electrode 472. The respective pixels are provided to be adjacent in the in-plane direction of the semiconductor substrate.

Here, the width of the third electrode 471 and the fourth electrode 472 is greater than the width of the through insulating layer 452. Portions of the bottom surfaces of the third electrode 471 and the fourth electrode 472 that each abut the through insulating layer 452 are not each covered with the through insulating layer 452, but are exposed on the third region 430 side. This allows the third electrode 471 to be electrically coupled to the potential control region 473 on a portion of the bottom surface exposed on the third region 430 side. The potential control region 473 is provided inside the third region 430. In addition, it is possible to electrically couple the fourth electrode 472 to the reset region 474 on a portion of the bottom surface exposed on the third region 430 side. The reset region 474 is provided inside the third region 430.

The potential control region 473 is a region of the second electrical conduction type. The potential control region 473 is provided to be electrically coupled to the third electrode 471. The application of negative voltage from the third electrode 471 allows the potential control region 473 to control the potential of the third region 430. This allows the third electrode 471 and the potential control region 473 to control the size of a potential barrier generated in the third region 430.

The reset region 474 is a region of the first electrical conduction type. The reset region 474 is provided to be electrically coupled to the fourth electrode 472. The application of positive voltage from the fourth electrode 472 allows the reset region 474 to discharge the electric charge remaining inside the third region 430. This allows the fourth electrode 472 and the reset region 474 to more certainly discharge the electric charge remaining inside the third region 430, for example, in a case where the photodetector 400 finishes detecting incident light and suppress an afterimage generated in the photodetector 400.

The potential control region 473 and the reset region 474 may be provided to have the planar disposition illustrated in FIG. 38. For example, the potential control region 473 may be provided along one side of a rectangular pixel region and the reset region 474 may be provided along the other opposed side of the rectangular pixel region.

The second electrode 421 is provided on the second surface of the semiconductor substrate opposite to the first surface. The second electrode 421 is electrically coupled to the second region 420. The second electrode 421 functions, for example, as an anode electrode. The second electrode 421 is electrically coupled to the wiring layer from the second surface side of the semiconductor substrate.

The control gate 461 is a gate electrode provided above the second surface of the semiconductor substrate with the gate insulating film 462 interposed in between. The control gate 461 is provided to control a potential barrier in the third region 430 by voltage application.

The first electrode 411, the second electrode 421, the third electrode 471, the fourth electrode 472, the via 412, and the control gate 461 may be each provided by using, for example, metal such as aluminum (Al), copper (Cu), tungsten (W), titanium (Ti), or tantalum (Ta), polysilicon (poly-Si), or other electrically conductive materials. The pixel separation layer 450, the through insulating layer 452, the first surface insulating layer 451, and the gate insulating film 462 may be each provided by using an insulator such as silicon oxide ($SiO_x$), silicon nitride ($SiN_x$), silicon oxynitride (SiON), or a so-called low-k material.

The photodetector 400 according to the present embodiment is provided as a back-illuminated (i.e., the first surface) CMOS (Complementary MOS) image sensor. This makes it possible to decrease wiring lines on the back surface side that is a light incidence surface and increase the aperture ratio of the back surface side. Specifically, it is possible to provide the photodetector 400 with the third electrode 471 and the fourth electrode 472 extending from the second surface of the semiconductor substrate in the thickness direction of the semiconductor substrate. The third electrode 471 controls the potential of the third region 430. The fourth electrode 472 discharges electric charge from the third region 430. Even in a case where the photodetector 400 is provided with the third electrode 471 that controls the potential of the third region 430 and the fourth electrode 472 that discharges electric charge from the third region 430, the photodetector 400 is thus able to decrease wiring lines provided on the back surface side that is a light incidence surface and prevent the pixel area from increasing.

Variations

Next, variations of the structure of the photodetector 400 according to the present embodiment are described with reference to FIGS. 39 to 43B.

First Variation

Figure 39:
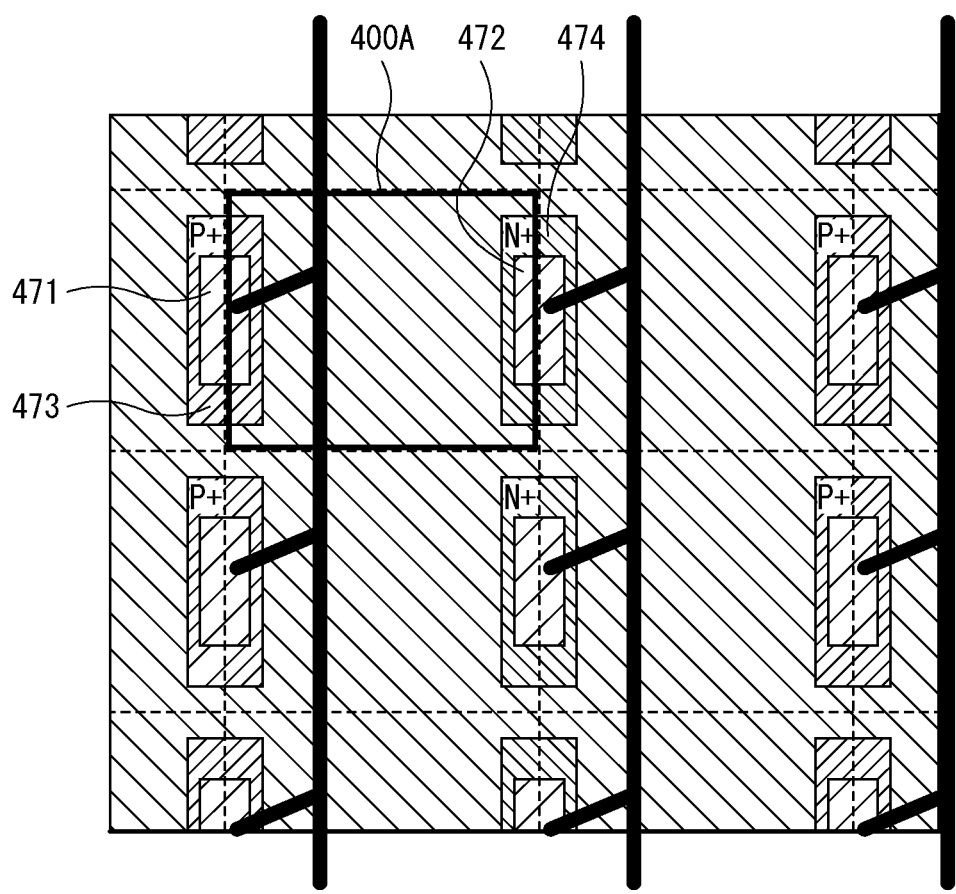
FIG. 39 is a plan view from a second surface side that describes a configuration of a photodetector according to a first variation.

FIG. 39 is a plan view from the second surface side that describes a configuration of a photodetector 400A according to a first variation. FIG. 39 illustrates only a component of interest among the components of the photodetector 400A.

As illustrated in FIG. 39, the third electrode 471 and the potential control region 473 may be each provided along one side of a rectangular pixel region and the fourth electrode 472 and the reset region 474 may be each provided along the other opposed side of the rectangular pixel region.

The third electrode 471 and the fourth electrode 472 may be provided independently for each of the pixels. The third electrodes 471 of the respective pixels may be electrically coupled to each other by a wiring line that extends in the extending direction of the third electrode 471 and is provided on the second surface side. Similarly, the fourth electrodes 472 of the respective pixels may be electrically coupled to each other by a wiring line that extends in the extending direction of the fourth electrode 472 and is provided on the second surface side. The wiring line that electrically couples the third electrodes 471 of the respective pixels and the wiring line that electrically couples the fourth electrodes 472 of the respective pixels may be provided to extend in the same direction without intersecting with each other.

According to the first variation, the photodetector 400A is able to electrically couple the third electrodes 471 or the fourth electrodes 472 of the respective pixels with a simpler wiring structure. This allows the photodetector 400A to further simplify the manufacturing steps.

Second Variation

Figure 40:
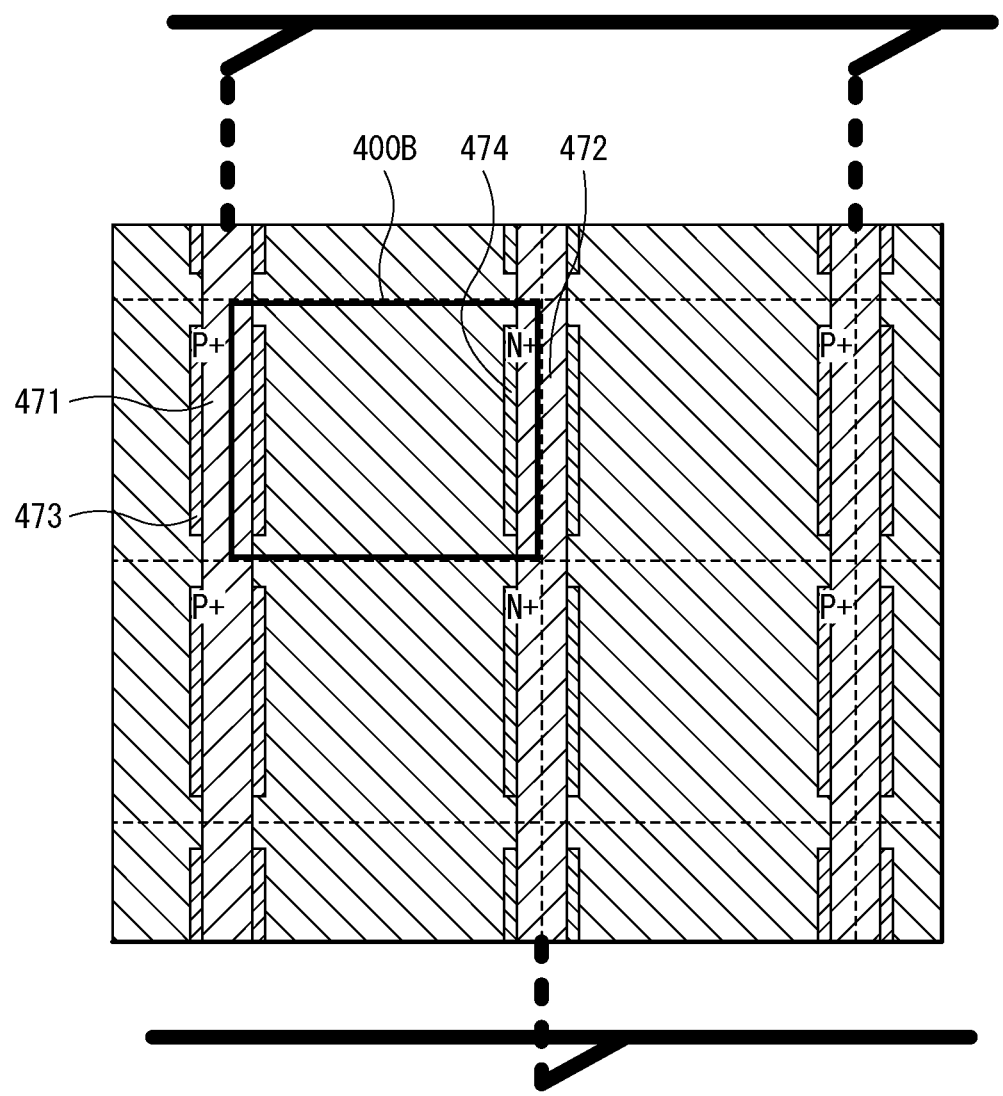
FIG. 40 is a plan view from a second surface side that describes a configuration of a photodetector according to a second variation.

FIG. 40 is a plan view from the second surface side that describes a configuration of a photodetector 400B according to a second variation. FIG. 40 illustrates only a component of interest among the components of the photodetector 400B.

As illustrated in FIG. 40, the third electrode 471 and the potential control region 473 may be each provided along one side of a rectangular pixel region and the fourth electrode 472 and the reset region 474 may be each provided along the other opposed side of the rectangular pixel region.

The third electrode 471 and the fourth electrode 472 may be provided to be continuous between the pixels. Specifically, the third electrode 471 may be provided to extend in the extending direction of the potential control region 473 and electrically coupled to the potential control region 473 of each of the pixels. In addition, the third electrodes 471 may be electrically coupled to each other by a wiring line provided at an end of the pixel array in the direction orthogonal to the extending direction of the third electrodes 471. Similarly, the fourth electrode 472 may be provided to extend in the extending direction of the reset region 474 and electrically coupled to the reset region 474 of each of the pixels. In addition, the fourth electrodes 472 may be electrically coupled to each other by a wiring line provided at an end of the pixel array in the direction orthogonal to the extending direction of the fourth electrodes 472.

According to the second variation, the photodetector 400B is able to electrically couple the third electrodes 471 or the fourth electrodes 472 of the respective pixels with a wiring structure that decreases the inter-wiring capacitance. This allows the photodetector 400B to decrease the noise caused by the inter-wiring capacitance.

Third Variation

Figure 41:
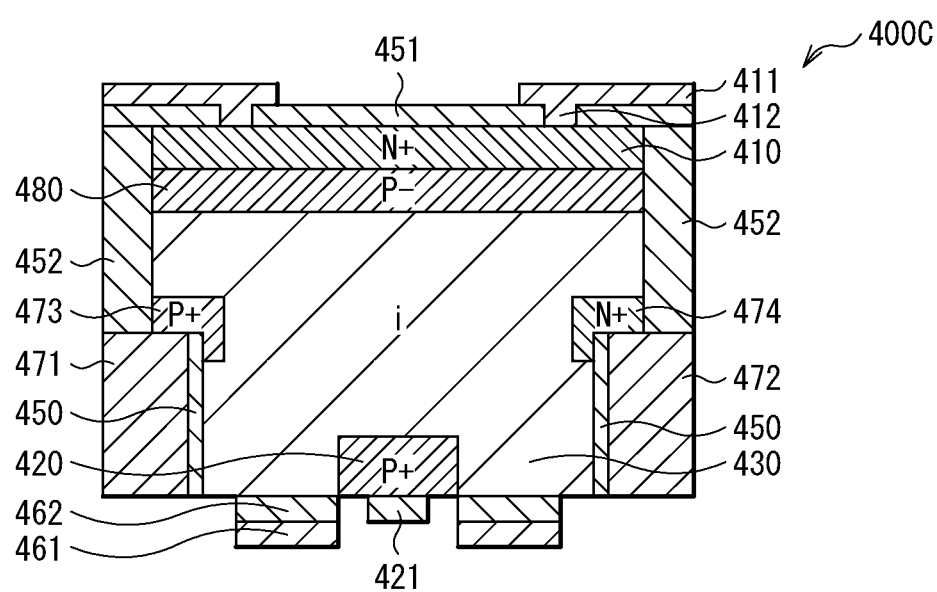
FIG. 41 is a vertical cross-sectional view of a structure of a photodetector according to a third variation.

FIG. 41 is a vertical cross-sectional view of a structure of a photodetector 400C according to a third variation.

As illustrated in FIG. 41, there may be provided a fifth region 480 of the second electrical conduction type inside the semiconductor substrate deeper than the first region 410. Specifically, the fifth region 480 is a region (e.g., a P− layer) of the second electrical conduction type that is provided inside the semiconductor substrate deeper than the first region 410 and is less than the second region 420 or the potential control region 473 in impurity concentration. The fifth region 480 is able to reduce the DCR (Dark Count Rate) and reduce dark-time noise by suppressing electrons flowing from the first region 410.

It is to be noted that the fifth region 480 also suppresses the discharge of the electric charge remaining inside the third region 430 from the first region 410 in a case where the photodetector 400B finishes detecting incident light. The photodetector 400C, however, separately includes the reset region 474 and the fourth electrode 472 that are each able to discharge the electric charge remaining inside the third region 430 to the outside. This makes it possible to avoid the influence brought about by a decrease in electron dischargeability caused by providing the fifth region 480.

According to the third variation, the photodetector 400C is able to reduce the DCR (Dark Count Rate) and reduce dark-time noise without decreasing electron dischargeability from the third region 430.

Fourth Variation

Figure 42:
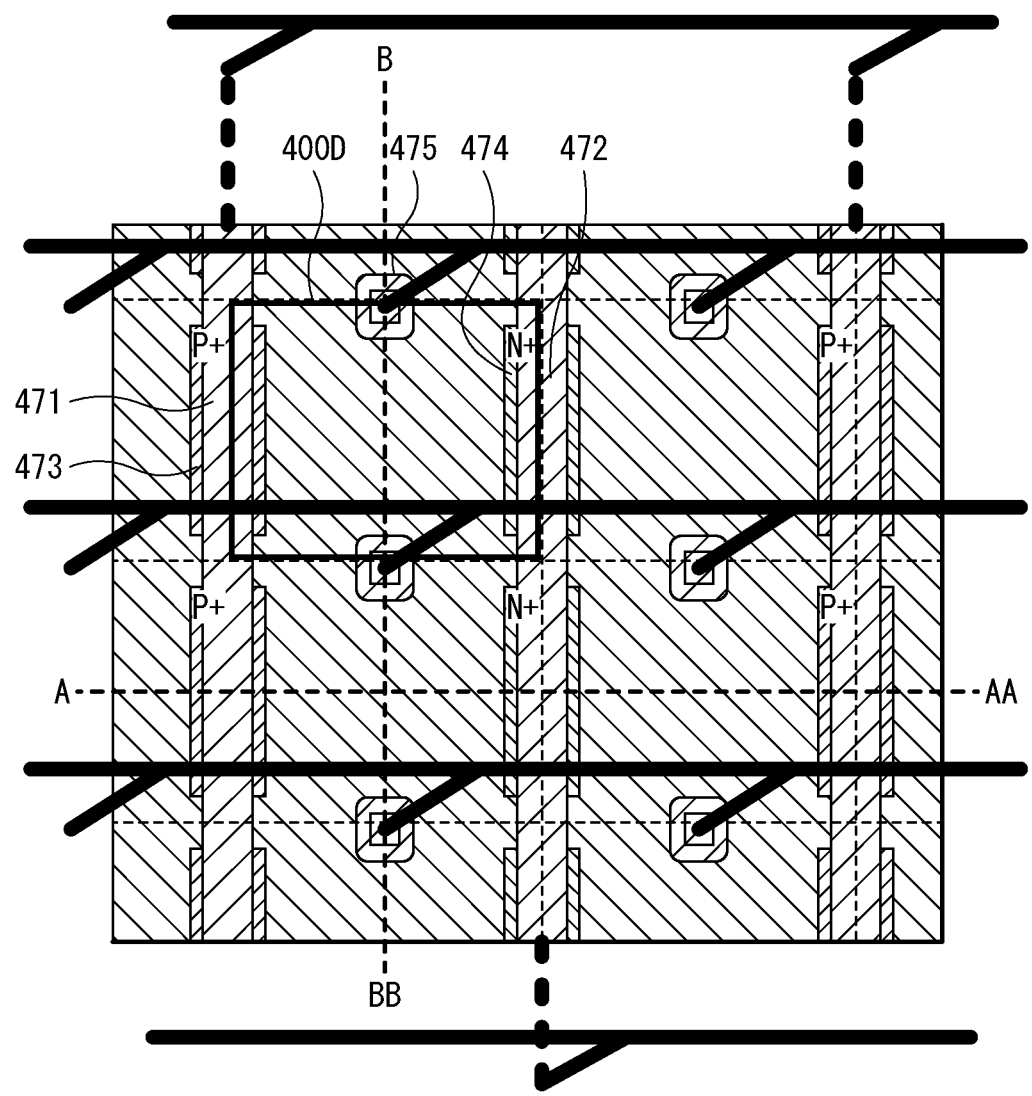
FIG. 42 is a plan view from a second surface side that describes a configuration of a photodetector according to a fourth variation.
Figure 43A:
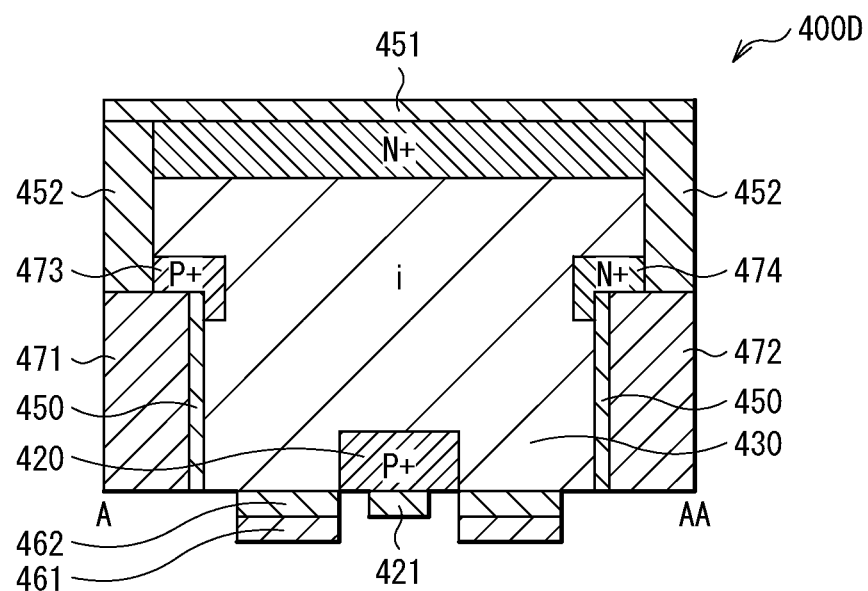
FIG. 43A is a vertical cross-sectional view of a configuration of the photodetector in an A-AA cutting plane of FIG. 42.
Figure 43B:
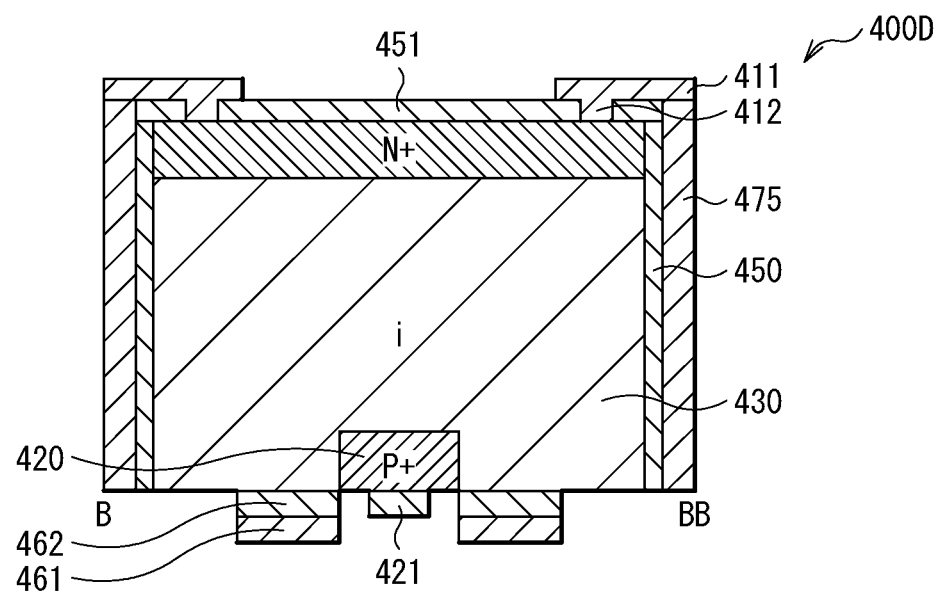
FIG. 43B is a vertical cross-sectional view of a configuration of the photodetector in a B-BB cutting plane of FIG. 42.

FIG. 42 is a plan view from the second surface side that describes a configuration of a photodetector 400D according to a fourth variation. FIG. 42 illustrates only a component of interest among the components of the photodetector 400D. FIG. 43A is a vertical cross-sectional view of a configuration of the photodetector 400D in an A-AA cutting plane of FIG. 42. FIG. 43B is a vertical cross-sectional view of a configuration of the photodetector 400D in a B-BB cutting plane of FIG. 42.

As illustrated in FIG. 42, the photodetector 400D according to the fourth variation is different from the photodetector 400B according to the second variation in that there is provided a through electrode 475.

Specifically, as illustrated in FIG. 43A, in an A-AA cutting plane, the photodetector 400D has substantially the same configuration as the configuration of the photodetector 400 according to the basic structure described with reference to FIG. 37. In contrast, as illustrated in FIGS. 42 and 43B, a side of a rectangular pixel region on which the third electrode 471, the potential control region 473, the fourth electrode 472, and the reset region 474 are not provided is provided with the through electrode 475. The through electrode 475 is provided inside the pixel separation layer 450 to penetrate the semiconductor substrate from the second surface to the first surface. The through electrode 475 is electrically coupled to the first electrode 411 provided on the first surface side of the semiconductor substrate. According to this, the through electrode 475 makes it possible to form, on the second surface side of the semiconductor substrate, a wiring line that electrically couples the first electrodes 411 of the respective pixels to each other. The through electrode 475 may be provided by using, for example, metal such as aluminum (Al), copper (Cu), tungsten (W), titanium (Ti), or tantalum (Ta), polysilicon (poly-Si), or other electrically conductive materials.

Further, the wiring line that is electrically coupled to the through electrode 475 and electrically couples the first electrodes 411 of the respective pixels may be provided to extend in the direction orthogonal to the extending direction of the third electrode 471 and the fourth electrode 472 in a plane of the semiconductor substrate. The third electrode 471 and the fourth electrode 472 are provided inside the semiconductor substrate. This makes it possible to dispose the wiring line electrically coupled to the through electrode 475 without interfering with the third electrode 471 and the fourth electrode 472.

According to the fourth variation, the photodetector 400D is able to decrease wiring lines formed on the first surface side that is a light incidence surface. This makes it possible to increase the aperture ratio of the incidence surface of light.

3. Third Embodiment (Basic Structure)

Next, a basic structure of a photodetector according to a third embodiment of the present disclosure is described with reference to FIGS. 44 to 46.

First, the basic characteristics of the photodetector according to the present embodiment are described with reference to FIGS. 44 and 45. The photodetector according to the present embodiment is a so-called DPD sensor that detects incident light by measuring delay time elapsed before a forward current flows in a case where bias to be applied is inverted from reverse bias to forward bias. FIG. 44 is a schematic diagram chronologically illustrating the movement of electric charge after inverting bias to be applied to the photodetector from reverse bias to forward bias. FIG. 45 is a graphical chart chronologically illustrating a change in an energy band structure after inverting the bias to be applied to the photodetector from the reverse bias to the forward bias.

Figure 44:
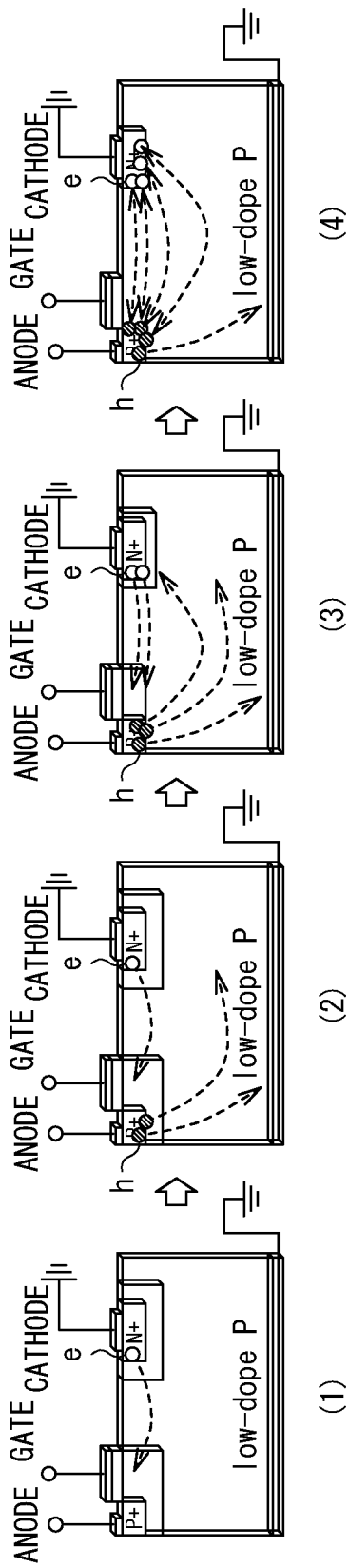
FIG. 44 is a schematic diagram chronologically illustrating movement of electric charge after inverting bias to be applied to the photodetector from reverse bias to forward bias.
Figure 45:
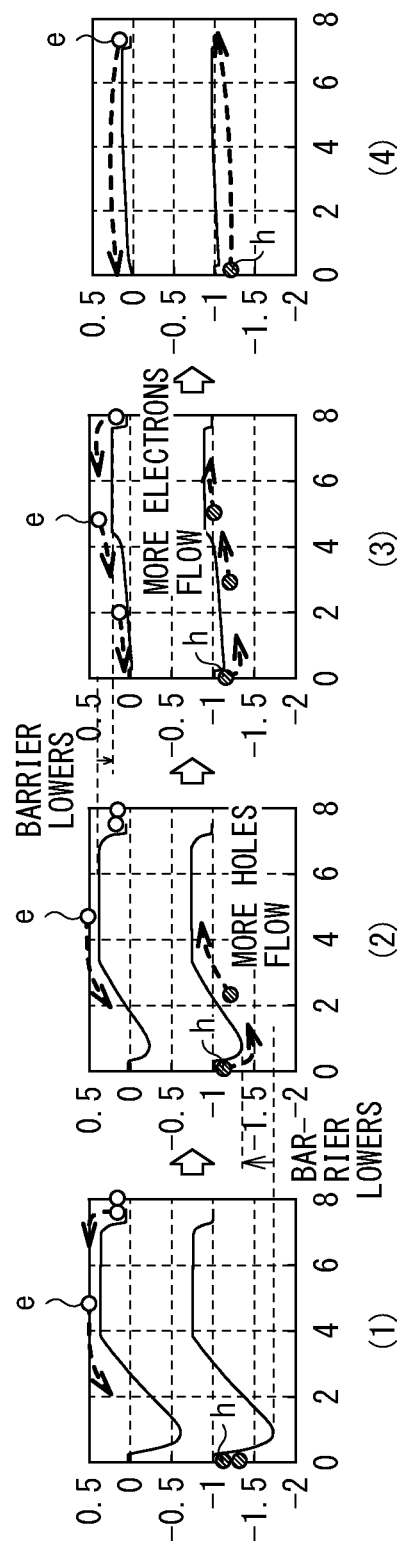
FIG. 45 is a graphical chart chronologically illustrating a change in an energy band structure after inverting the bias to be applied to the photodetector from the reverse bias to the forward bias.

In a case where bias to be applied to the photodetector is inverted from reverse bias to forward bias as illustrated in (1) of each of FIGS. 44 and 45, the photodetector first has the electrons e flowing from the cathode electrode (the first electrode) toward a fall (that is also referred to as dip) of the energy band structure around the P+ layer (the second region).

This lowers a potential barrier (decreases the depth of the dip) around the P+ layer (the second region) as illustrated in (2) of each of FIGS. 44 and 45. The more holes h thus flow from the P+ layer (the second region).

Further, as illustrated in (3) of each of FIGS. 44 and 45, the holes h flowing from the P+ layer (the second region) lower a potential barrier around the N+ layer (the first region). This further increases the electrons e flowing from the N+ layer (the first region) to the periphery of the P+ layer (the second region). After that, the more holes h flow from the P+ layer (the second region) and the more electrons e flow from the N+ layer (the first region). This lowers both potential barriers around the N+ layer (the first region) and the P+ layer (the second region).

After that, as illustrated in (4) of each of FIGS. 44 and 45, the potential barriers disappear between the P+ layer (the second region) and the N+ layer (the first region). The photodetector enters a steady state in which a forward current flows between the cathode electrode (the first electrode) and the anode electrode (the second electrode).

The intensity of incident light varies the time from the inversion from reverse bias to forward bias to the steady state brought about by the behavior described above in the photodetector according to the present embodiment. This is because electrons resulting from the photoelectric conversion of incident light accelerates the electrons e flowing from the cathode electrode (the first electrode) to the dip around the P+ layer (the second region). This allows the photodetector according to the present embodiment to detect incident light by measuring delay time elapsed before a forward current flows in a case where application bias is inverted from reverse bias to forward bias.

Subsequently, a basic structure of the photodetector according to the third embodiment of the present disclosure is described with reference to FIG. 46. FIG. 46 is a vertical cross-sectional view of a basic structure of a photodetector 500 according to the present embodiment.

Figure 46:
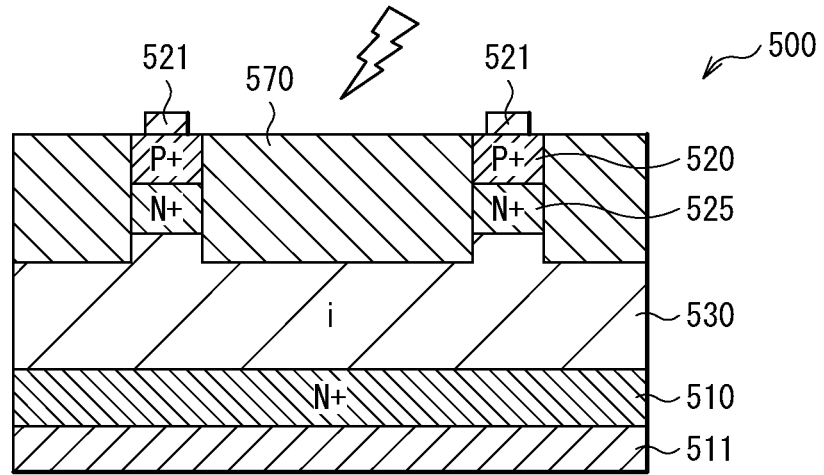
FIG. 46 is a vertical cross-sectional view of a basic structure of a photodetector according to a third embodiment of the present disclosure.

As illustrated in FIG. 46, the photodetector 500 includes a first region 510, a second region 520, a third region 530, a first electrode 511, a second electrode 521, a fourth region 525, and an insulating layer 570.

The first region 510 is a region (e.g., an N+ layer) of the first electrical conduction type that is provided on a first surface side of a semiconductor substrate such as silicon (Si). The first region 510 may be provided, for example, over the whole of the semiconductor substrate on the first surface side.

The second region 520 is a region (e.g., a P+ layer) of the second electrical conduction type that is provided on a second surface side of a semiconductor substrate such as silicon (Si) opposite to the first surface. The second region 520 may be provided, for example, on the second surface side of the semiconductor substrate in the shape of an island.

The third region 530 is a region (e.g., an i layer) of the third electrical conduction type that is provided between the first region 510 and the second region 520 of a semiconductor substrate such as silicon (Si).

The first electrode 511 is provided on the first surface of the semiconductor substrate. The first electrode 511 is electrically coupled to the first region 510. The first electrode 511 functions, for example, as a cathode electrode. For example, the first electrode 511 may be a common electrode that is provided over a plurality of pixels on the first surface of the semiconductor substrate and supplies a common potential to the first regions 510 of the respective pixels.

The second electrode 521 is provided on the second surface of the semiconductor substrate opposite to the first surface. The second electrode 521 is electrically coupled to the second region 520. The second electrode 521 functions, for example, as an anode electrode.

The first electrode 511 and the second electrode 521 may be each provided by using, for example, metal such as aluminum (Al), copper (Cu), tungsten (W), titanium (Ti), or tantalum (Ta), polysilicon (poly-Si), or other electrically conductive materials.

The fourth region 525 is a region (e.g., an N layer) of the first electrical conduction type that is provided in contact with the second region 520 in the depth direction of the semiconductor substrate. Specifically, the fourth region 525 may be a region of the first electrical conduction type that is provided inside the semiconductor substrate immediately below the second region 520 and is lower than the first region 510 in impurity concentration.

The insulating layer 570 surrounds the second region 520 in the in-plane direction of the semiconductor substrate. The insulating layer 570 is provided to reach a region deeper than the second region 520 in the thickness direction of the semiconductor substrate. For example, the insulating layer 570 may be provided over the whole of the second surface of the semiconductor substrate including the periphery of the second region 520 or provided in only the region around the second region 520 provided in the shape of an island. The insulating layer 570 may be provided by using an insulator such as silicon oxide ($SiO_x$), silicon nitride ($SiN_x$), silicon oxynitride (SiON), or a so-called low-k material.

The photodetector 500 according to the present embodiment is usable, for example, for a photon count application to measure the number of incident photons. Here, to appropriately measure the number of incident photons, it is ideal that the photodetector 500 transition from the state illustrated in (1) to the state illustrated in (2) by one electron (i.e., one photon) in the state transition described with reference to each of FIGS. 44 and 45. For this end, it is important that the photodetector 500 decreases the capacitance of a potential barrier generated adjacent to the second region 520 to further increase the modulation power (i.e., the degree of influence) per electron for the potential barrier.

The photodetector 500 according to the present embodiment is able to further decrease the magnitude of capacitance generated in the second region 520 by forming the island-shaped second region 520 having small area and limit a region in which capacitance is generated to the region below the second region 520 by surrounding the periphery of the second region 520 with the insulating layer 570. In addition, the photodetector 500 is provided with the fourth region 525 of the first electrical conduction type below the second region 520 of the second electrical conduction type. This makes it possible to generate a potential barrier by a built-in potential. This causes the photodetector 500 to have a potential barrier by a built-in potential and causes the capacitance of a potential barrier generated in the region adjacent to the second region 520 to be smaller. This allows the photodetector 500 to operate with a smaller number electrons.

Variations

Subsequently, variations of the structure of the photodetector 500 according to the present embodiment are described with reference to FIGS. 47 to 53B.

First Variation

Figure 47:
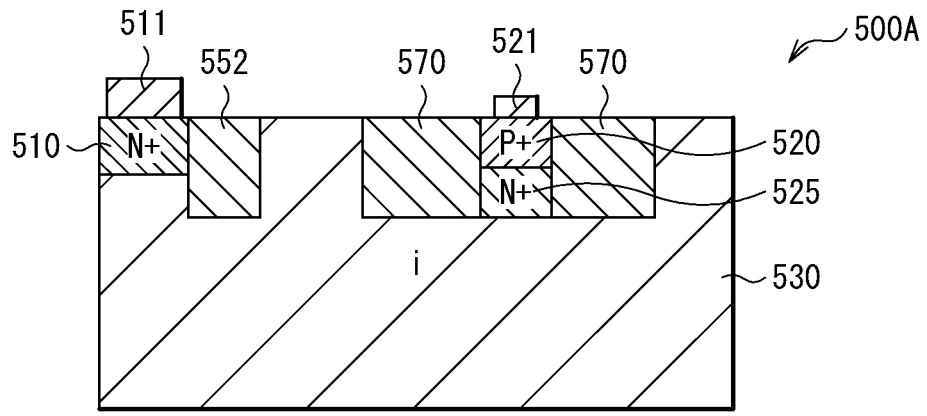
FIG. 47 is a vertical cross-sectional view of a structure of a photodetector according to a first variation.

FIG. 47 is a vertical cross-sectional view of a structure of a photodetector 500A according to a first variation.

As illustrated in FIG. 47, the first region 510 and the first electrode 511 may be provided on the second surface side (i.e., the surface side provided with the second region 520 and the second electrode 521) of the semiconductor substrate. In such a case, there may be further provided an in-plane separation layer 552 between the first region 510 and the second region 520 provided on the same surface side in addition to the insulating layer 570 surrounding the periphery of the second region 520. The in-plane separation layer 552 is provided by using, for example, an insulator such as silicon oxide ($SiO_x$), silicon nitride ($SiN_x$), silicon oxynitride (SiON), or a so-called low-k material. The in-plane separation layer 552 may be formed to reach a region that is greater than the first region 510 and the second region 520 in formation depth.

According to the first variation, the photodetector 500A is provided with the first region 510, the first electrode 511, the second region 520, and the second electrode 521 on the same surface side of the semiconductor substrate. This makes it possible to further simplify the manufacturing steps. The photodetector 500A thus allows the processing difficulty of manufacturing steps to be decreased.

Second Variation

Figure 48:
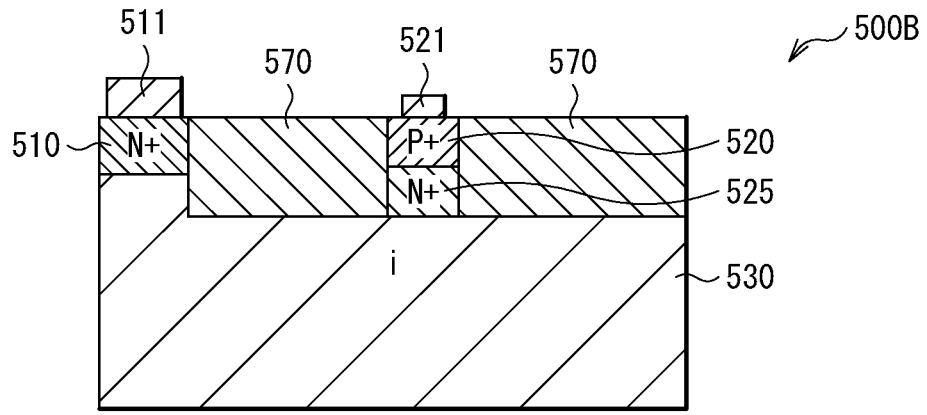
FIG. 48 is a vertical cross-sectional view of a structure of a photodetector according to a second variation.

FIG. 48 is a vertical cross-sectional view of a structure of a photodetector 500B according to a second variation.

As illustrated in FIG. 48, the photodetector 500B is different from the photodetector 500A according to the first variation in that the insulating layer 570 is provided over the whole of the second surface of the semiconductor substrate. Specifically, the region of the second surface of the semiconductor substrate other than the region provided with the first region 510 and the second region 520 may be provided with the insulating layer 570.

According to the second variation, the photodetector 500B makes it possible to increase the collection efficiency of electric charge by the first region 510 and the second region 520.

Third Variation

Figure 49:
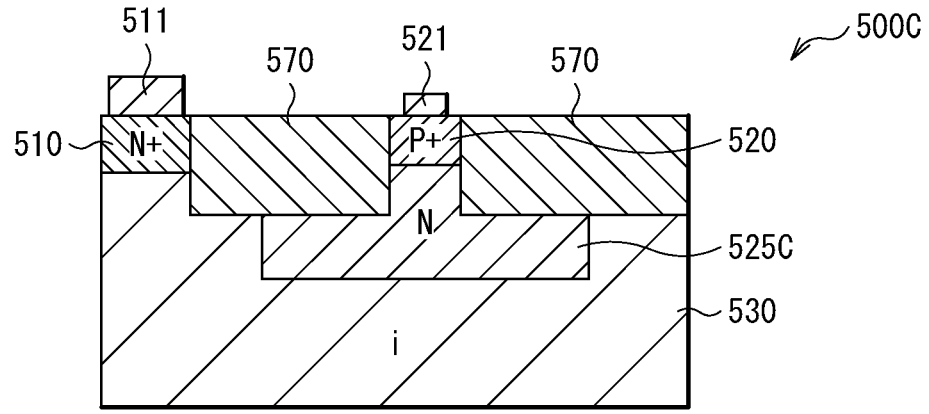
FIG. 49 is a vertical cross-sectional view of a structure of a photodetector according to a third variation.

FIG. 49 is a vertical cross-sectional view of a structure of a photodetector 500C according to a third variation.

As illustrated in FIG. 49, the photodetector 500C is different from the photodetector 500B according to the second variation in that a fourth region 525C is provided to extend over the semiconductor substrate below the insulating layer 570. Specifically, the fourth region 525C may be provided to reach a region that is greater than the insulating layer 570 in formation depth. The fourth region 525C may be provided to extend inside the semiconductor substrate below the insulating layer 570.

According to the third variation, the photodetector 500C makes it possible to increase the collection efficiency of electric charge by the first region 510 and the second region 520.

Fourth Variation

Figure 50:
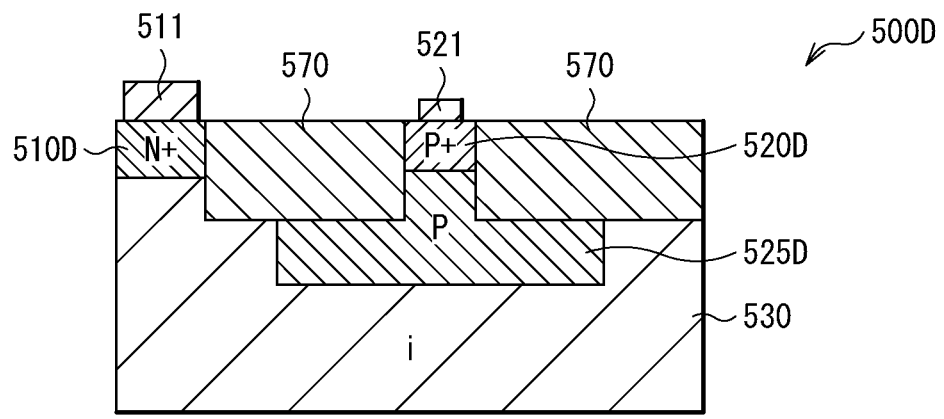
FIG. 50 is a vertical cross-sectional view of a structure of a photodetector according to a fourth variation.

FIG. 50 is a vertical cross-sectional view of a structure of a photodetector 500D according to a fourth variation.

As illustrated in FIG. 50, the photodetector 500D is different from the photodetector 500C according to the third variation in that the polarity of the electrical conduction type of each of the regions is exchanged. Specifically, a first region 510D is a region (e.g., a P+ layer) of the second electrical conduction type. The first region 510D is provided on the second surface side of the semiconductor substrate to be isolated from the second region 520D. The second region 520D is a region (e.g., an N+ layer) of the first electrical conduction type. The second region 520D is provided on the second surface side of the semiconductor substrate in the shape of an island. A fourth region 525D is a region (e.g., a P layer) of the second electrical conduction type. The fourth region 525D is provided in contact with the second region 520D in the depth direction of the semiconductor substrate. For example, the fourth region 525D may be provided to extend below the insulating layer 570 inside the semiconductor substrate immediately below the second region 520D.

The first electrode 511 is provided on the second surface of the semiconductor substrate. The first electrode 511 is electrically coupled to the first region 510D. The first electrode 511 functions, for example, as a cathode electrode. The second electrode 521 is provided on the second surface of the semiconductor substrate. The second electrode 521 is electrically coupled to the second region 520D. The second electrode 521 functions, for example, as an anode electrode. The insulating layer 570 surrounds the second region 520D in the in-plane direction of the semiconductor substrate. The insulating layer 570 is provided to reach a region deeper than the second region 520D in the thickness direction of the semiconductor substrate.

According to the fourth variation, the photodetector 500D is operable with a trigger of the movement of not electrons, but holes in a case where bias to be applied is inverted from reverse bias to forward bias.

Fifth Variation

Figure 51:
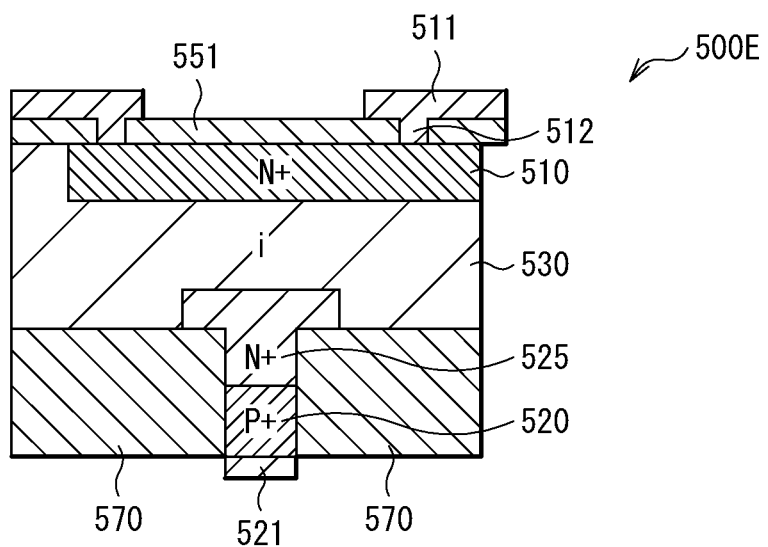
FIG. 51 is a vertical cross-sectional view of a structure of a photodetector according to a fifth variation.

FIG. 51 is a vertical cross-sectional view of a structure of a photodetector 500E according to a fifth variation.

As illustrated in FIG. 51, the photodetector 500E is different from the photodetector 500C according to the third variation in that the first region 510 is provided on the first surface side of the semiconductor substrate.

Specifically, the first region 510 is a region (e.g., an N+ layer) of the first electrical conduction type. The first region 510 is provided over the whole of the first surface side of the semiconductor substrate. The second region 520 is a region (e.g., a P+ layer) of the second electrical conduction type. The second region 520 is provided on the second surface side of the semiconductor substrate opposite to the first surface in the shape of an island. The fourth region 525 is a region (e.g., an N layer) of the first electrical conduction type. The fourth region 525 is also provided in contact with the second region 520 in the depth direction of the semiconductor substrate to extend below the insulating layer 570.

The first electrode 511 is provided above the first surface of the semiconductor substrate with the first surface insulating layer 551 interposed in between. The first electrode 511 is electrically coupled to the first region 510 through the via 512 or the like that extends through the first surface insulating layer 551. The second electrode 521 is provided on the second surface of the semiconductor substrate opposite to the first surface. The second electrode 521 is electrically coupled to the second region 520. The insulating layer 570 surrounds the second region 520 in the in-plane direction of the semiconductor substrate. The insulating layer 570 is provided to reach a region deeper than the second region 520 in the thickness direction of the semiconductor substrate.

According to the fifth variation, the photodetector 500E has a back-illuminated (i.e., the first surface) structure. It is therefore possible to increase the proportion (i.e., the quantum efficiency) of the amount of generated electric charge to incident light.

Sixth Variation

Figure 52:
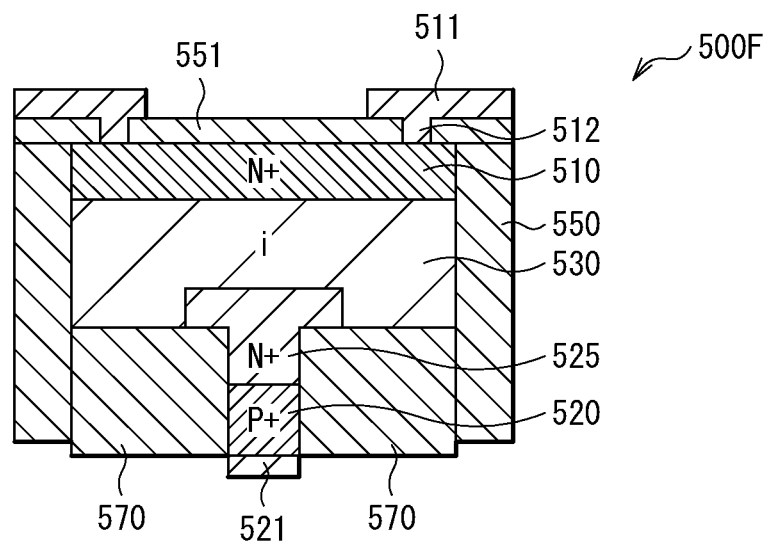
FIG. 52 is a vertical cross-sectional view of a structure of a photodetector according to a sixth variation.

FIG. 52 is a vertical cross-sectional view of a structure of a photodetector 500F according to a sixth variation.

As illustrated in FIG. 52, the photodetector 500F is different from the photodetector 500E according to the fifth variation in that there is further provided a pixel separation layer 550 between pixels.

Specifically, the pixel separation layer 550 is provided to penetrate the semiconductor substrate in the thickness direction to surround the pixel region. The pixel separation layer 550 electrically isolates adjacent pixels, thereby making it possible to suppress the crosstalk between the adjacent pixels. The pixel separation layer 550 may be provided by using, for example, an insulator such as silicon oxide ($SiO_x$), silicon nitride ($SiN_x$), silicon oxynitride (SiON), or a so-called low-k material.

According to the sixth variation, the photodetector 500F has a higher physical or electrical separation property between adjacent pixels. It is thus possible to suppress the crosstalk between the pixels.

Subsequently, variations of the disposition and shape of the pixel separation layer 550, the insulating layer 570, the second region 520, and the second electrode 521 on the second surface of the semiconductor substrate of the photodetector 500F according to the sixth variation are described with reference to FIGS. 53A and 53B. Each of FIGS. 53A and 53B is a plan view from the second surface side that describes a variation of the disposition and shape of the pixel separation layer 550, the insulating layer 570, the second region 520, and the second electrode 521.

Figure 53A:
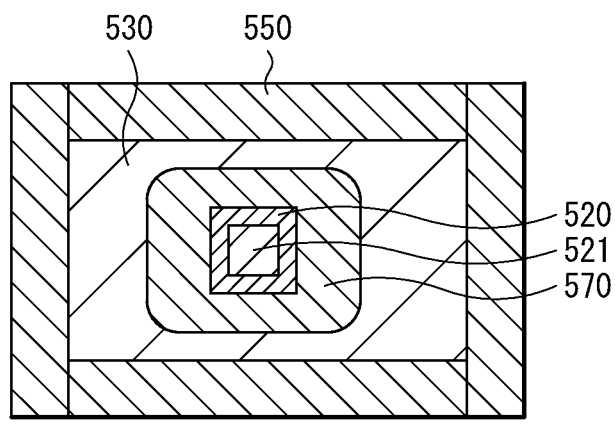
FIG. 53A is a plan view from the second surface side that describes a variation of disposition and shape of the pixel separation layer, the insulating layer, the second region, and the second electrode.

For example, as illustrated in FIG. 53A, the second region 520 and the second electrode 521 may be provided in the shape of a rectangle substantially in the middle of a pixel region. The pixel region is defined by the pixel separation layer 550 in the shape of a rectangle. The insulating layer 570 may surround the periphery of the second region 520 and the second electrode 521 in the shape of a rounded rectangle. It is to be noted that the centroids of the pixel separation layer 550, the insulating layer 570, the second region 520, and the second electrode 521 may coincide with each other or may be different from each other.

Figure 53B:
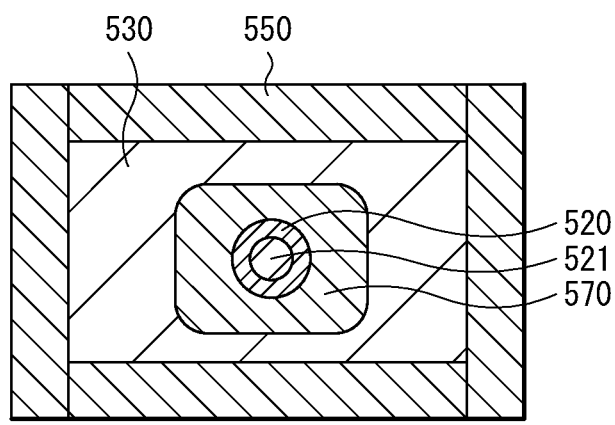
FIG. 53B is a plan view from the second surface side that describes a variation of the disposition and shape of the pixel separation layer, the insulating layer, the second region, and the second electrode.

For example, as illustrated in FIG. 53B, the second region 520 and the second electrode 521 may be provided in the shape of a circle or an oval substantially in the middle of a pixel region. The pixel region is defined by the pixel separation layer 550 in the shape of a rectangle. The insulating layer 570 may surround the periphery of the second region 520 and the second electrode 521 in the shape of a rounded rectangle. It is to be noted that the centroids of the pixel separation layer 550, the insulating layer 570, the second region 520, and the second electrode 521 may coincide with each other or may be different from each other.

The planar shape illustrated in FIG. 53B eliminates the concentration of an electric field on the second region 520 and the second electrode 521 and makes it possible to stabilize the electric field. It is thus possible to reduce the capacitance of a potential barrier generated in the region adjacent to the second region 520. In addition, such a planar shape allows the second region 520 and the second electrode 521 to be more easily miniaturized.

4. Fourth Embodiment (Basic Structure)

Figure 54:
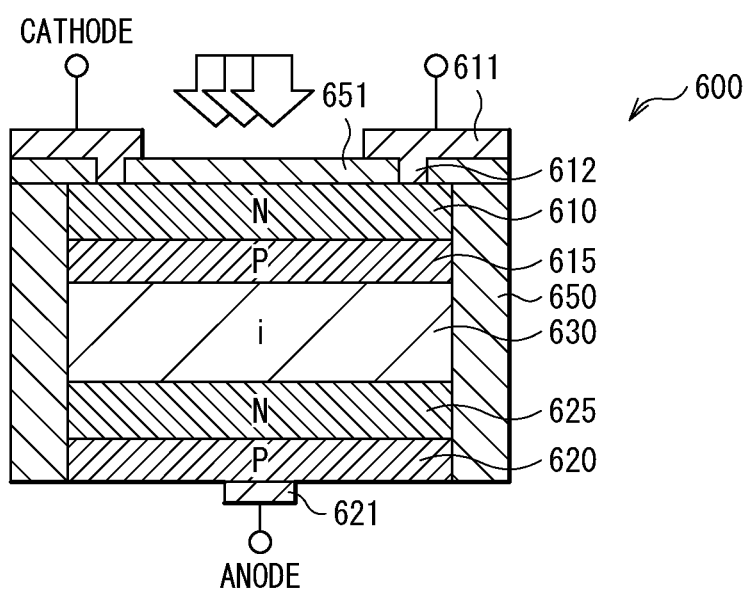
FIG. 54 is a vertical cross-sectional view of a basic structure of a photodetector according to a fourth embodiment of the present disclosure.
Figure 55A:
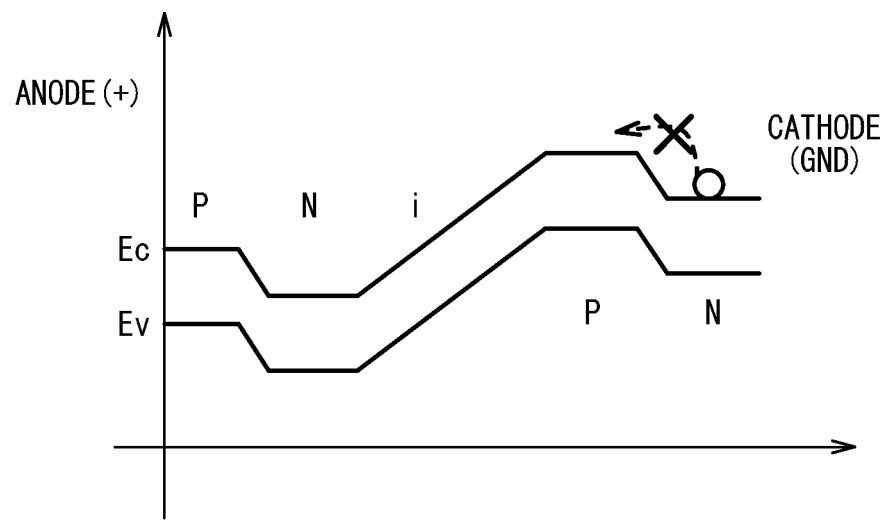
FIG. 55A is a graphical chart illustrating an energy band structure of the photodetector according to the embodiment.
Figure 55B:
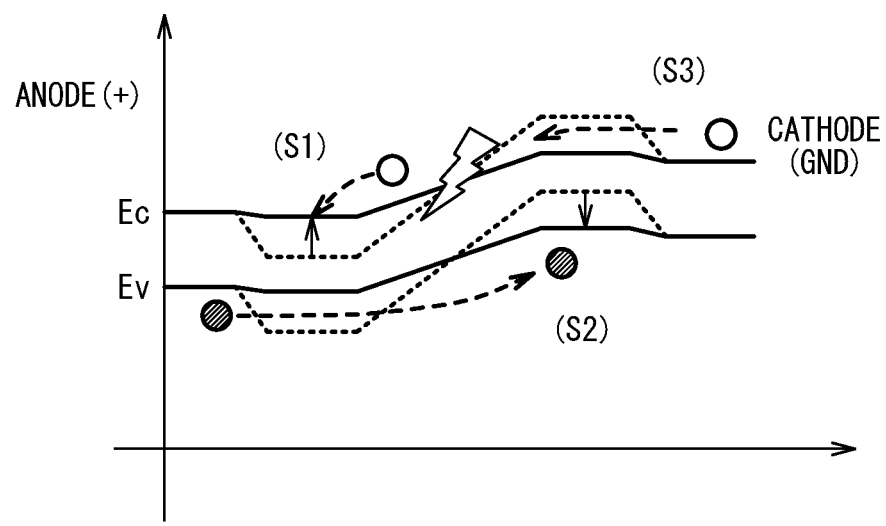
FIG. 55B is a graphical chart illustrating the energy band structure of the photodetector according to the embodiment.

Next, a basic structure of a photodetector according to a fourth embodiment of the present disclosure is described with reference to FIGS. 54 to 55B. FIG. 54 is a vertical cross-sectional view of a basic structure of a photodetector 600 according to the present embodiment. Each of FIGS. 55A and 55B is a graphical chart illustrating the energy band structure of the photodetector 600 according to the embodiment.

As illustrated in FIG. 54, the photodetector 600 includes, for example, a first region 610, a second region 620, a third region 630, a fourth region 625, a fifth region 615, a first electrode 611, a via 612, a first surface insulating layer 651, a pixel separation layer 650, and a second electrode 621.

The first region 610 is a region (e.g., an N+ layer) of the first electrical conduction type that is provided on a first surface side of a semiconductor substrate such as silicon (Si). The second region 620 is a region (e.g., a P+ layer) of the second electrical conduction type that is provided on a second surface side of a semiconductor substrate such as silicon (Si) opposite to the first surface. The fourth region 625 is a region (e.g., an N+ layer) of the first electrical conduction type that is provided in contact with the second region 620 inside the semiconductor substrate deeper than the second region 620. The fifth region 615 is a region (e.g., a P+ layer) of the second electrical conduction type that is provided in contact with the first region 610 inside the semiconductor substrate deeper than the first region 610. The third region 630 is a region (e.g., an i layer) of the third electrical conduction type that is provided between the fourth region 625 and the fifth region 615 of the semiconductor substrate.

In other words, the photodetector 600 is a PN/i/PN diode formed by using the first region 610, the second region 620, the third region 630, the fourth region 625, and the fifth region 615.

The first electrode 611 is provided above the first surface of the semiconductor substrate with the first surface insulating layer 651 interposed in between. The first electrode 611 is electrically coupled to the first region 610 through the via 612 or the like that extends through the first surface insulating layer 651. The first electrode 611 functions, for example, as a cathode electrode. The first electrode 611 extends, for example, across the pixel separation layer 650 provided along the boundary between pixels. The first electrode 611 is electrically coupled to the first region 610 of each of the pixels through the via 612 provided for each pixel. In other words, the first electrode 611 is a common electrode that supplies a common potential to the first regions 610 of the respective pixels.

The pixel separation layer 650 is provided to penetrate the semiconductor substrate in the thickness direction and electrically isolates a plurality of pixels provided in the in-plane direction of the semiconductor substrate from each other. The pixel separation layer 650 may be provided in a lattice along the boundary between the respective pixels arranged, for example, in a matrix in the in-plane direction of the semiconductor substrate.

The second electrode 621 is provided on the second surface of the semiconductor substrate opposite to the first surface. The second electrode 621 is electrically coupled to the second region 620. The second electrode 621 functions, for example, as an anode electrode.

The first electrode 611, the via 612, and the second electrode 621 may be each provided by using, for example, metal such as aluminum (Al), copper (Cu), tungsten (W), titanium (Ti), or tantalum (Ta), polysilicon (poly-Si), or other electrically conductive materials. The first surface insulating layer 651 and the pixel separation layer 650 may be each provided by using an insulator such as silicon oxide ($SiO_x$), silicon nitride ($SiN_x$), silicon oxynitride (SiON), or a so-called low-k material.

For example, a photodetector according to a comparative example including a PIN diode may have a forward current generated even if a photon does not arrive immediately after application bias is inverted from reverse bias to forward bias. This is because, depending on the height of a potential barrier generated on the cathode electrode side in a case where application bias is inverted from reverse bias to forward bias, a diffusion current easily flows from the cathode electrode over the potential barrier. This causes the energy band structure on the anode electrode side to have a shallower fall (that is also referred to as dip). The photodetector according to the comparative example may have a forward current generated even if a photon does not arrive.

The photodetector 600 according to the present embodiment includes a PN/i/PN diode. This allows the photodetector 600 to steadily form a potential barrier of an energy band on the first electrode 611 side by using a built-in potential by a PN junction of the first region 610 and the fifth region 615 as illustrated in FIG. 55A. The first electrode 611 is a cathode electrode. This allows the photodetector 600 to suppress the movement of electrons by a diffusion current. It is therefore possible to suppress the generation of a forward current in a case where there is no incident photon. This allows the photodetector 600 according to the present embodiment to suppress the occurrence of aliasing.

It is possible to bring the photodetector 600 like this into operation, for example, as follows.

Specifically, as illustrated in FIG. 55B, a photon entering the photodetector 600 first generates a photoelectron. The generated photoelectron fills a dip of an energy band structure to make the dip of the energy band structure shallower (S1). This causes a hole current to flow from the second electrode 621 serving as an anode electrode to the first electrode 611 serving as a cathode electrode. A potential barrier of an energy band disappears that has been formed on the first electrode 611 side by a built-in potential (S2). This allows a forward current to flow from the first electrode 611 serving as a cathode electrode to the second electrode 621 serving as an anode electrode (S3).

Variations

Subsequently, variations of the structure of the photodetector 600 according to the present embodiment are described with reference to FIGS. 56A to 69.

First Variation

Figure 56A:
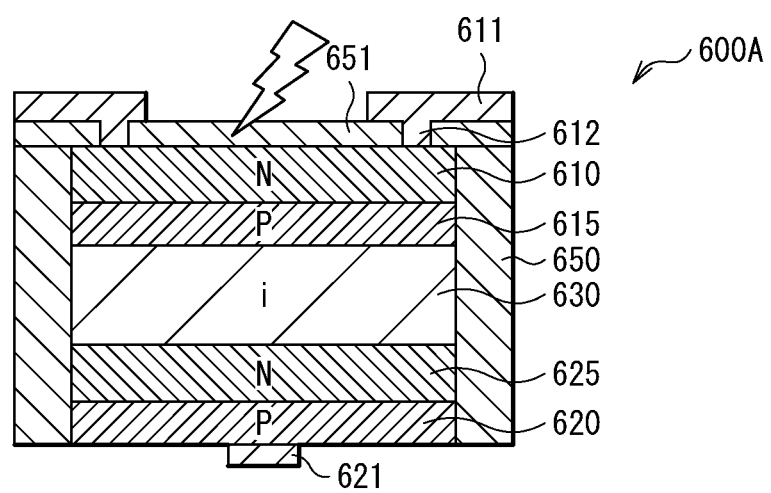
FIG. 56A is a vertical cross-sectional view of a structure of a photodetector according to a first variation.
Figure 56B:
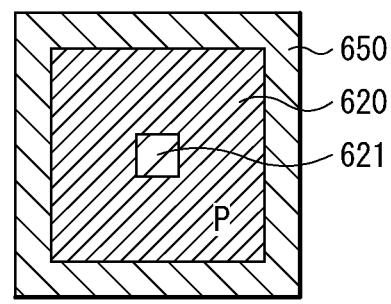
FIG. 56B is a plan view of the structure of the photodetector according to the first variation from a second surface side.

FIG. 56A is a vertical cross-sectional view of a structure of a photodetector 600A according to a first variation. FIG. 56B is a plan view of the structure of the photodetector 600A according to the first variation from the second surface side.

As illustrated in FIGS. 56A and 56B, the second region 620 may be provided, for example, substantially over the whole of the region defined by the pixel separation layer 650. Similarly, the first region 610, the fourth region 625, and the fifth region 615 may be each provided substantially over the whole of the region defined by the pixel separation layer 650 (not illustrated). In contrast, the second electrode 621 may be provided in the shape of an island, for example, substantially in the middle of a region defined by the pixel separation layer 650.

According to the first variation, the photodetector 600A has the first region 610, the second region 620, the fourth region 625, and the fifth region 615 disposed in the thickness direction of the semiconductor substrate, thereby making it possible to further decrease the occupied area. In addition, providing the pixel separation layer 650 to the whole of the periphery of a pixel allows the photodetector 600A to suppress the crosstalk between the pixels.

Second Variation

Figure 57A:
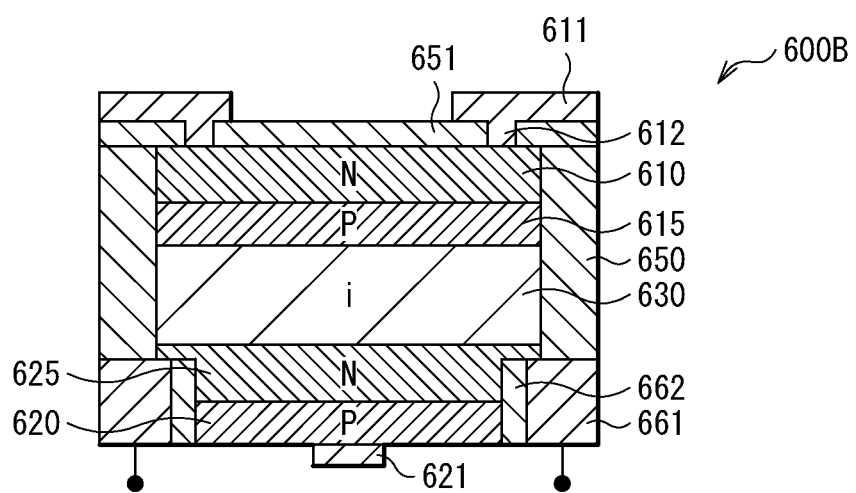
FIG. 57A is a vertical cross-sectional view of a structure of a photodetector according to a second variation.
Figure 57B:
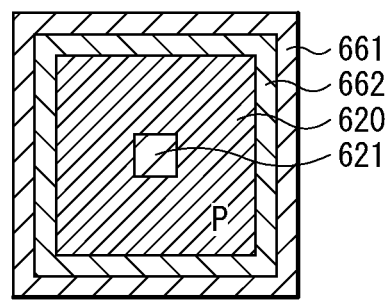
FIG. 57B is a plan view of a structure of a photodetector according to a second variation from a second surface side.

FIG. 57A is a vertical cross-sectional view of a structure of a photodetector 600B according to a second variation. FIG. 57B is a plan view of the structure of the photodetector 600B according to the second variation from the second surface side.

As illustrated in FIGS. 57A and 57B, there may be provided a control electrode 661 in the pixel separation layer 650 on the second surface side of the semiconductor substrate. The control electrode 661 is able to control the potential of the fourth region 625. The control electrode 661 is able to control the depth of a dip of an energy band structure formed on the second electrode 621 side and the amount of electric charge necessary to fill the dip by controlling the potential of the fourth region 625.

Specifically, the control electrode 661 may be provided to extend from the second surface side of the semiconductor substrate in the thickness direction of the semiconductor substrate. The control electrode 661 may be electrically coupled to the fourth region 625. For example, the control electrode 661 may include a side wall insulating layer 662 on a side surface. The control electrode 661 may be greater than the pixel separation layer 650 in width and be provided to extend to the fourth region 625 to be electrically coupled to the fourth region 625. The control electrode 661 may be provided by using, for example, metal such as aluminum (Al), copper (Cu), tungsten (W), titanium (Ti), or tantalum (Ta), polysilicon (poly-Si), or other electrically conductive materials. The side wall insulating layer 662 may be provided by using an insulator such as silicon oxide ($SiO_x$), silicon nitride ($SiN_x$), silicon oxynitride (SiON), or a so-called low-k material.

According to the second variation, the photodetector 600B allows the detection characteristics of incident light to be controlled with higher accuracy.

Third Variation

Figure 58A:
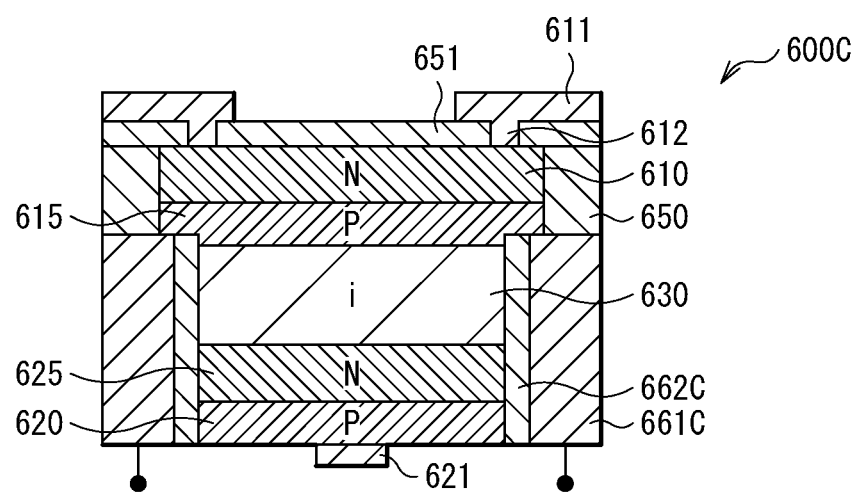
FIG. 58A is a vertical cross-sectional view of a structure of a photodetector according to a third variation.
Figure 58B:
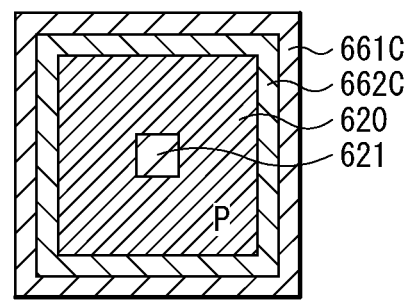
FIG. 58B is a plan view of the structure of the photodetector according to the third variation from a second surface side.

FIG. 58A is a vertical cross-sectional view of a structure of a photodetector 600C according to a third variation. FIG. 58B is a plan view of the structure of the photodetector 600C according to the third variation from the second surface side.

As illustrated in FIGS. 58A and 58B, there may be provided a control electrode 661C in the pixel separation layer 650 on the second surface side of the semiconductor substrate. The control electrode 661C is able to control the potential of the fifth region 615. The control electrode 661C is able to control the height of a potential barrier of an energy band structure formed on the first electrode 611 side by controlling the potential of the fifth region 615.

Specifically, the control electrode 661C may be provided to extend from the second surface side of the semiconductor substrate in the thickness direction of the semiconductor substrate. The control electrode 661C may be electrically coupled to the fifth region 615. For example, the control electrode 661C may include a side wall insulating layer 662C on a side surface. The control electrode 661C may be greater than the pixel separation layer 650 in width and be provided to extend to the fifth region 615 to be electrically coupled to the fifth region 615. The control electrode 661C may be provided by using, for example, metal such as aluminum (Al), copper (Cu), tungsten (W), titanium (Ti), or tantalum (Ta), polysilicon (poly-Si), or other electrically conductive materials. The side wall insulating layer 662C may be provided by using an insulator such as silicon oxide ($SiO_x$), silicon nitride ($SiN_x$), silicon oxynitride (SiON), or a so-called low-k material.

According to the third variation, the photodetector 600C allows the detection characteristics of incident light to be controlled with higher accuracy.

Fourth Variation

Figure 59A:
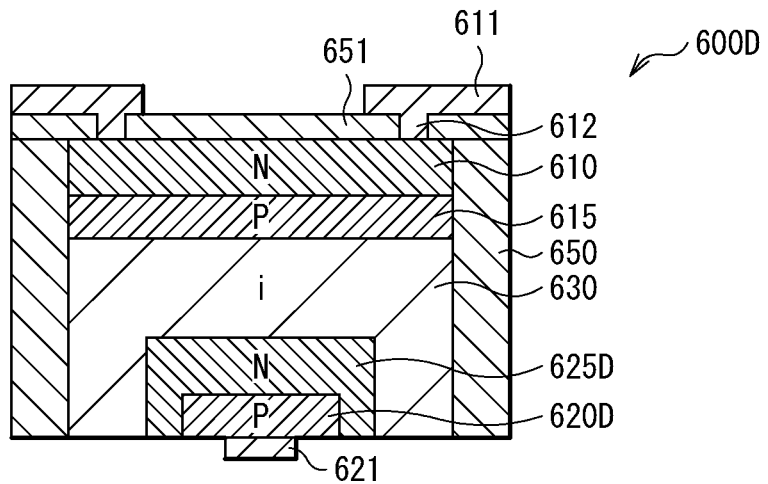
FIG. 59A is a vertical cross-sectional view of a structure of a photodetector according to a fourth variation.
Figure 59B:
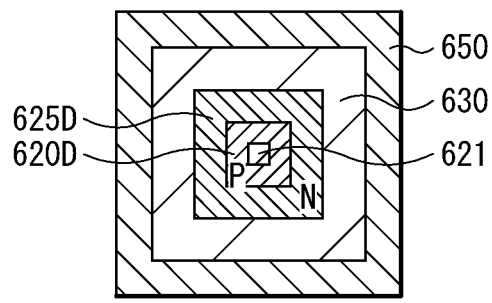
FIG. 59B is a plan view of the structure of the photodetector according to the fourth variation from a second surface side.

FIG. 59A is a vertical cross-sectional view of a structure of a photodetector 600D according to a fourth variation. FIG. 59B is a plan view of the structure of the photodetector 600D according to the fourth variation from the second surface side.

As illustrated in FIGS. 59A and 59B, a second region 620D may be provided to be smaller in volume than the first region 610 by being provided in the shape of an island on the second surface side of the semiconductor substrate. In addition, a fourth region 625D may be provided to cover the side surfaces and the bottom surface of the second region 620D. In other words, the photodetector 600D may be provided to cause the area of a PN junction of the second region 620D and the fourth region 625D on the second electrode 621 side to be smaller than the area of a PN junction of the first region 610 and the fifth region 615 on the first electrode 611 side.

This allows the photodetector 600D to control the amount of electric charge necessary to fill a dip of an energy band structure formed on the second electrode 621 side by decreasing capacitance generated in the region adjacent to the second region 620D on the second electrode 621 side. This allows the photodetector 600D to operate with a smaller number of photoelectrons.

According to the fourth variation, the photodetector 600D is able to further increase the detection characteristics of incident light.

Fifth Variation

Figure 60:
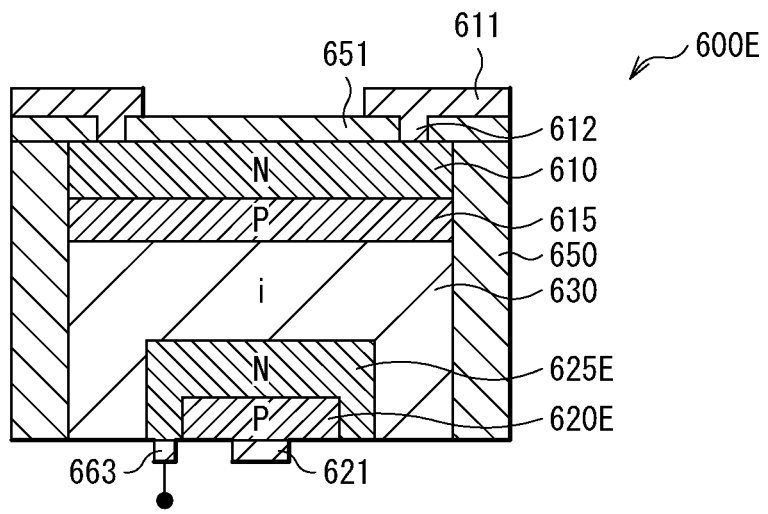
FIG. 60 is a vertical cross-sectional view of a structure of a photodetector according to a fifth variation.

FIG. 60 is a vertical cross-sectional view of a structure of a photodetector 600E according to a fifth variation.

As illustrated in FIG. 60, the photodetector 600E is different from the photodetector 600D according to the fourth variation in that a control electrode 663 is further electrically coupled to a fourth region 625E. For example, the control electrode 663 may be provided on the second surface of the semiconductor substrate and electrically coupled to the fourth region 625E. The control electrode 663 is able to control the depth of a dip of an energy band structure formed on the second electrode 621 side and the amount of electric charge necessary to fill the dip by controlling the potential of the fourth region 625E. The control electrode 663 may be provided by using metal such as aluminum (Al), copper (Cu), tungsten (W), titanium (Ti), or tantalum (Ta), polysilicon (poly-Si), or other electrically conductive materials.

According to the fifth variation, the photodetector 600E allows the detection characteristics of incident light to be controlled with higher accuracy.

Sixth Variation

Figure 61A:
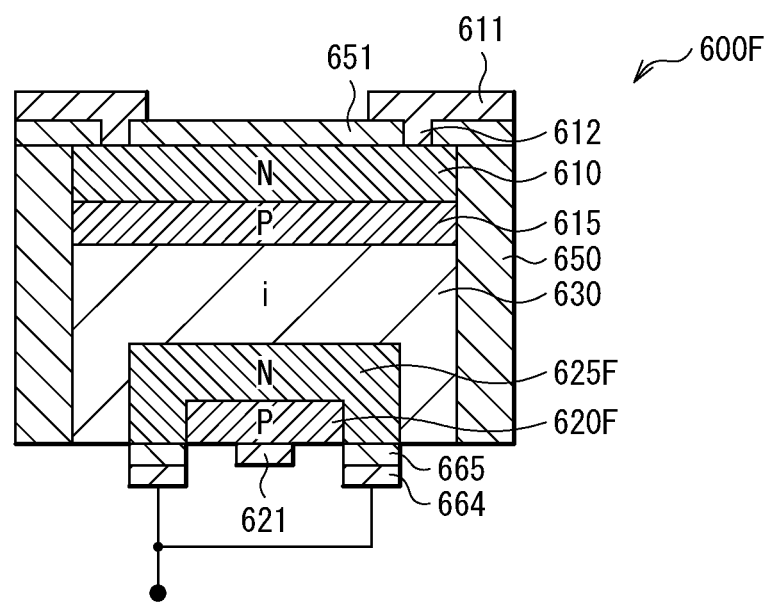
FIG. 61A is a vertical cross-sectional view of a structure of a photodetector according to a sixth variation.
Figure 61B:
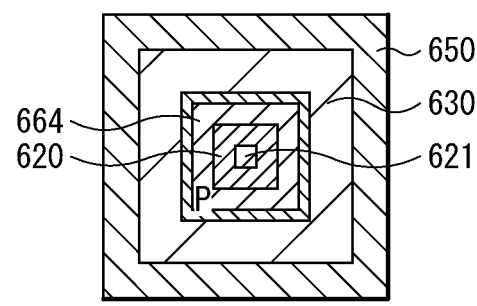
FIG. 61B is a plan view of the structure of the photodetector according to the sixth variation from a second surface side.

FIG. 61A is a vertical cross-sectional view of a structure of a photodetector 600F according to a sixth variation. FIG. 61B is a plan view of the structure of the photodetector 600F according to the sixth variation from the second surface side.

As illustrated in FIGS. 61A and 61B, the photodetector 600F is different from the photodetector 600D according to the fourth variation in that there is further provided a control gate 664 on a fourth region 625F. The control gate 664 may be provided above the fourth region 625F with a gate insulating film 665 interposed in between to have a planar shape that surrounds the periphery of a second region 620F. The control gate 664 is able to control the depth of a dip of an energy band structure formed on the second electrode 621 side and the amount of electric charge necessary to fill the dip by applying voltage to control the potential of the fourth region 625F.

The control gate 664 may be provided by using, for example, metal such as aluminum (Al), copper (Cu), tungsten (W), titanium (Ti), or tantalum (Ta), polysilicon (poly-Si), or other electrically conductive materials. The gate insulating film 665 may be provided by using an insulator such as silicon oxide ($SiO_x$), silicon nitride ($SiN_x$), silicon oxynitride (SiON), or a so-called low-k material.

According to the sixth variation, the photodetector 600F allows the detection characteristics of incident light to be controlled with higher accuracy.

Seventh Variation

Figure 62A:
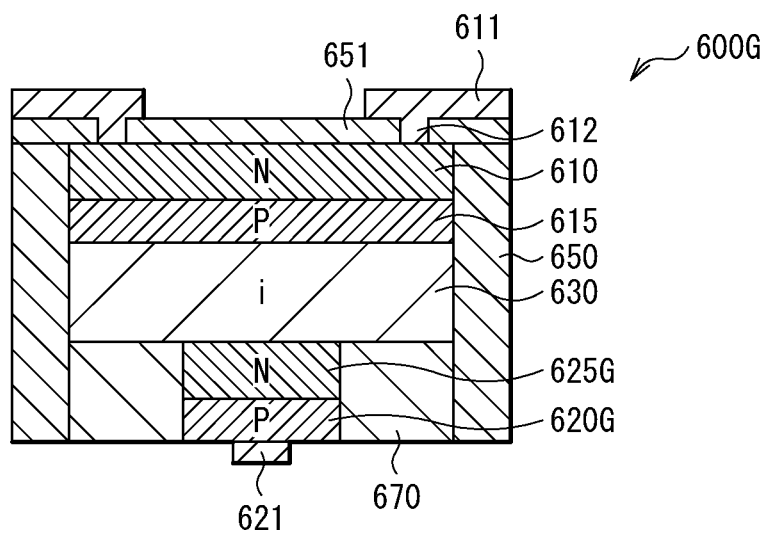
FIG. 62A is a vertical cross-sectional view of a structure of a photodetector according to a seventh variation.
Figure 62B:
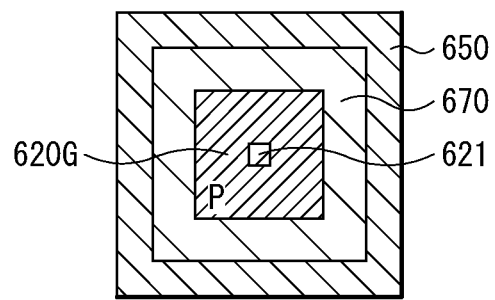
FIG. 62B is a plan view of the structure of the photodetector according to the seventh variation from a second surface side.

FIG. 62A is a vertical cross-sectional view of a structure of a photodetector 600G according to a seventh variation. FIG. 62B is a plan view of the structure of the photodetector 600G according to the seventh variation from the second surface side.

As illustrated in FIGS. 62A and 62B, the photodetector 600G may be further provided with an insulating layer 670 that surrounds a second region 620G and a fourth region 625G in the in-plane direction of the semiconductor substrate.

Specifically, the second region 620G and the fourth region 625G may be each provided in the shape of an island substantially in the middle of the pixel region defined by the pixel separation layer 650. The insulating layer 670 may be provided to surround the periphery of the second region 620G and the fourth region 625G. The insulating layer 670 surrounds the second region 620G and the fourth region 625G in the in-plane direction of the semiconductor substrate. The insulating layer 670 is provided to reach a region deeper than the second region 620G in the thickness direction of the semiconductor substrate. The insulating layer 670 may be provided by using an insulator such as silicon oxide ($SiO_x$), silicon nitride ($SiN_x$), silicon oxynitride (SiON), or a so-called low-k material.

The island-shaped second region 620G having small area allows the insulating layer 670 to further decrease the magnitude of capacitance generated in the second region 620G. In addition, the insulating layer 670 surrounds the periphery of the second region 620G. This makes it possible to limit the region in which capacitance is generated in the second region 620G to the semiconductor substrate on the inner side of the second region 620G. This allows the insulating layer 670 to control the amount of electric charge necessary to fill a dip of an energy band structure formed on the second electrode 621 side by decreasing capacitance generated in the second region 620G. This allows the photodetector 600G to operate with a smaller number of photoelectrons.

According to the seventh variation, the photodetector 600G is able to further increase the detection characteristics of incident light.

Eighth Variation

Figure 63A:
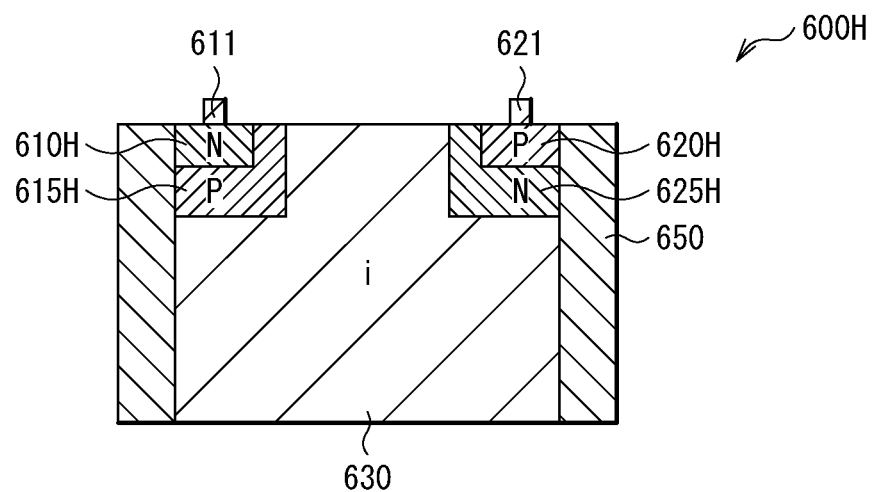
FIG. 63A is a vertical cross-sectional view of a structure of a photodetector according to an eighth variation.
Figure 63B:
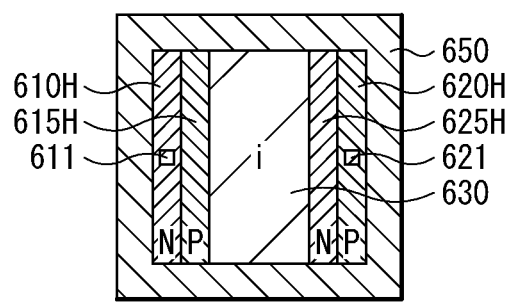
FIG. 63B is a plan view of the structure of the photodetector according to the eighth variation from a first surface side.

FIG. 63A is a vertical cross-sectional view of a structure of a photodetector 600H according to an eighth variation. FIG. 63B is a plan view of the structure of the photodetector 600H according to the eighth variation from the first surface side.

As illustrated in FIGS. 63A and 63B, the photodetector 600H is different from the photodetector 600A according to the first variation in that a PN/i/PN diode is formed in the in-plane direction of the semiconductor substrate instead of the thickness direction of the semiconductor substrate. In addition, in the photodetector 600H, the first electrode 611 and the second electrode 621 are each provided on the first surface of the semiconductor substrate.

Specifically, there is provided a first region 610H in a partial region on the first surface side of the semiconductor substrate along one of the sides of the pixel separation layer 650 that defines a rectangular pixel region. A fifth region 615H is provided in the region opposite to the pixel separation layer 650 with the first region 610H interposed in between to cover the side surfaces and the bottom surface of the first region 610H. There is provided a second region 620H in a partial region on the first surface side of the semiconductor substrate along the other opposed side of the pixel separation layer 650 that defines a rectangular pixel region. A fourth region 625H is provided in the region opposite to the pixel separation layer 650 with the second region 620H interposed in between to cover the side surfaces and the bottom surface of the second region 620H. The third region 630 is provided in a region between the fifth region 615H and the fourth region 625H. The first electrode 611 is provided on the first region 610H exposed from the first surface of the semiconductor substrate and the second electrode 621 is provided on the second region 620H exposed from the first surface of the semiconductor substrate.

According to the eighth variation, it is possible to form the first electrode 611 and the second electrode 621 of the photodetector 600G on the same surface of the semiconductor substrate. This makes it possible to form the electrodes more easily.

Ninth Variation

Figure 64A:
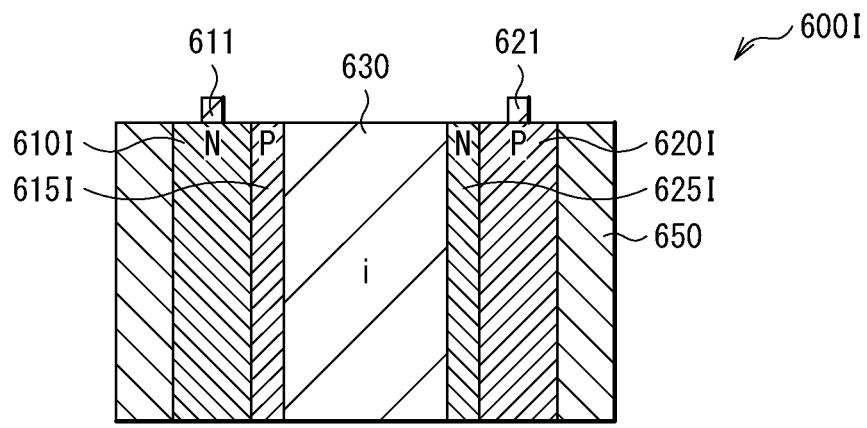
FIG. 64A is a vertical cross-sectional view of a structure of a photodetector according to a ninth variation.
Figure 64B:
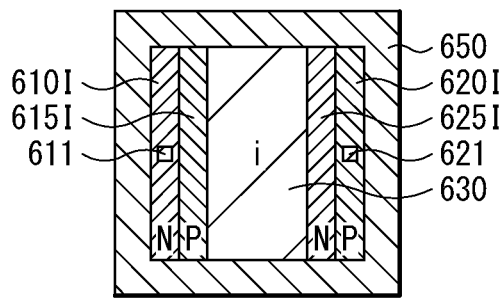
FIG. 64B is a plan view of the structure of the photodetector according to the ninth variation from a first surface side.

FIG. 64A is a vertical cross-sectional view of a structure of a photodetector 600I according to a ninth variation. FIG. 64B is a plan view of the structure of the photodetector 600I according to the ninth variation from the first surface side.

As illustrated in FIGS. 64A and 64B, the photodetector 600I is different from the photodetector 600H according to the eighth variation in that a first region 610I, a fifth region 615I, a fourth region 625I, and a second region 620I are provided to extend from the first surface of the semiconductor substrate to the second surface opposite to the first surface. This allows the first region 610I and the second region 620I to suppress the induction of electric charge at the interface between the pixel separation layer 650 and the third region 630 owing to the pinning effects by covering the interface.

According to the ninth variation, the photodetector 600I is able to suppress the induction of electric charge at the interface between the semiconductor substrate and the pixel separation layer 650. This makes it possible to further reduce noise.

Tenth Variation

Figure 65:
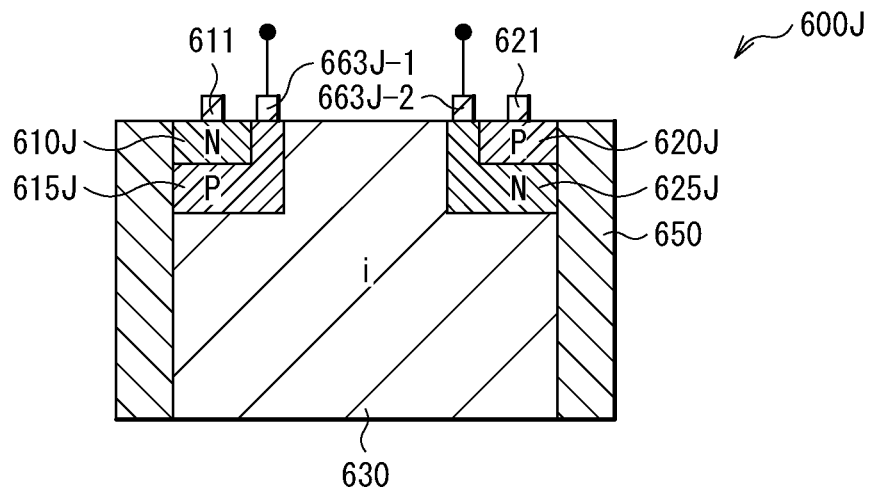
FIG. 65 is a vertical cross-sectional view of a structure of a photodetector according to a tenth variation.

FIG. 65 is a vertical cross-sectional view of a structure of a photodetector 600J according to a tenth variation.

As illustrated in FIG. 65, the photodetector 600J is different from the photodetector 600H according to the eighth variation in that a first control electrode 663J-1 is further electrically coupled to a fifth region 615J and a second control electrode 663J-2 is further electrically coupled to a fourth region 625J.

Specifically, the fifth region 615J may be provided to cover the side surfaces and the bottom surface of a first region 610J and the first control electrode 663J-1 may be provided to on the fifth region 615J exposed from the first surface of the semiconductor substrate. In addition, the fourth region 625J may be provided to cover the side surfaces and the bottom surface of a second region 620J and the second control electrode 663J-2 may be provided to on the fourth region 625J exposed from the first surface of the semiconductor substrate. The first control electrode 663J-1 and the second control electrode 663J-2 may be each provided by using, for example, metal such as aluminum (Al), copper (Cu), tungsten (W), titanium (Ti), or tantalum (Ta), polysilicon (poly-Si), or other electrically conductive materials.

The first control electrode 663J-1 is able to control the height of a potential barrier formed on the first electrode 611 side by controlling the potential of the fifth region 615J. In addition, the second control electrode 663J-2 is able to control the depth of a dip of an energy band structure formed on the second electrode 621 side and the amount of electric charge necessary to fill the dip by controlling the potential of the fourth region 625J.

According to the tenth variation, the photodetector 600J allows the detection characteristics of incident light to be controlled with higher accuracy.

Eleventh Variation

Figure 66A:
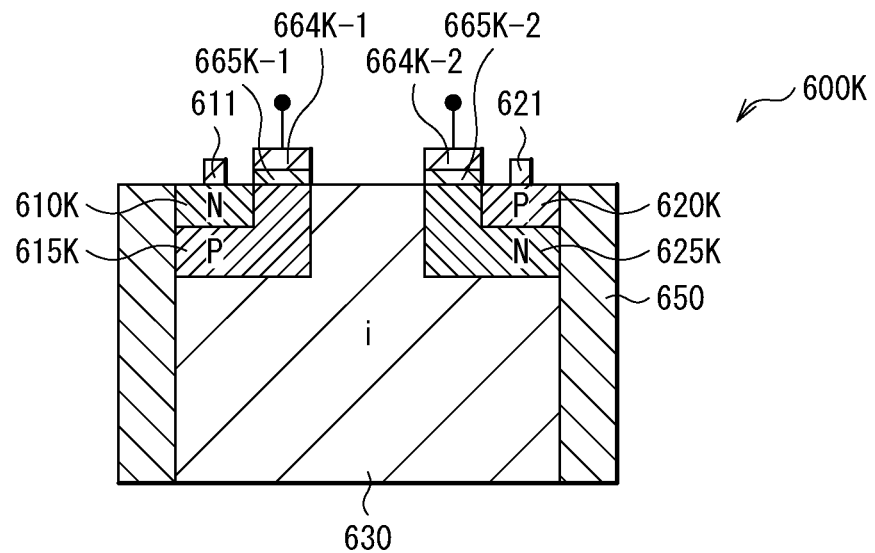
FIG. 66A is a vertical cross-sectional view of a structure of a photodetector according to an eleventh variation.
Figure 66B:
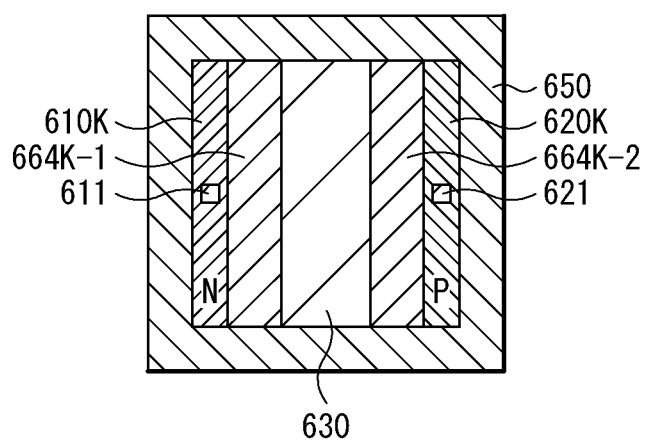
FIG. 66B is a plan view of the structure of the photodetector according to the eleventh variation from a first surface side.

FIG. 66A is a vertical cross-sectional view of a structure of a photodetector 600K according to an eleventh variation. FIG. 66B is a plan view of the structure of the photodetector 600K according to the eleventh variation from the first surface side.

As illustrated in FIGS. 66A and 66B, the photodetector 600K is different from the photodetector 600H according to the eighth variation in that the photodetector 600K is further provided with a first control gate 664K-1 on a fifth region 615K and the photodetector 600K is further provided with a second control gate 664K-2 on a fourth region 625K.

Specifically, the first control gate 664K-1 may be provided above the fifth region 615K with a gate insulating film 665K-1 interposed in between. The fifth region 615K is provided to cover the side surfaces and the bottom surface of a first region 610K. The second control gate 664K-2 may be provided above the fourth region 625K with a gate insulating film 665K-2 interposed in between. The fourth region 625K is provided to cover the side surfaces and the bottom surface of a second region 620K.

The first control gate 664K-1 and the second control gate 664K-2 may be each provided by using, for example, metal such as aluminum (Al), copper (Cu), tungsten (W), titanium (Ti), or tantalum (Ta), polysilicon (poly-Si), or other electrically conductive materials. The gate insulating films 665K-1 and 665K-2 may be each provided by using an insulator such as silicon oxide ($SiO_x$), silicon nitride ($SiN_x$), silicon oxynitride (SiON), or a so-called low-k material.

The first control gate 664K-1 is able to control the height of a potential barrier formed on the first electrode 611 side by applying voltage to control the potential of the fifth region 615K. In addition, the second control gate 664K-2 is able to control the depth of a dip of an energy band structure formed on the second electrode 621 side and the amount of electric charge necessary to fill the dip by applying voltage to control the potential of the fourth region 625K.

According to the eleventh variation, the photodetector 600K allows the detection characteristics of incident light to be controlled with higher accuracy.

Twelfth Variation

Figure 67:
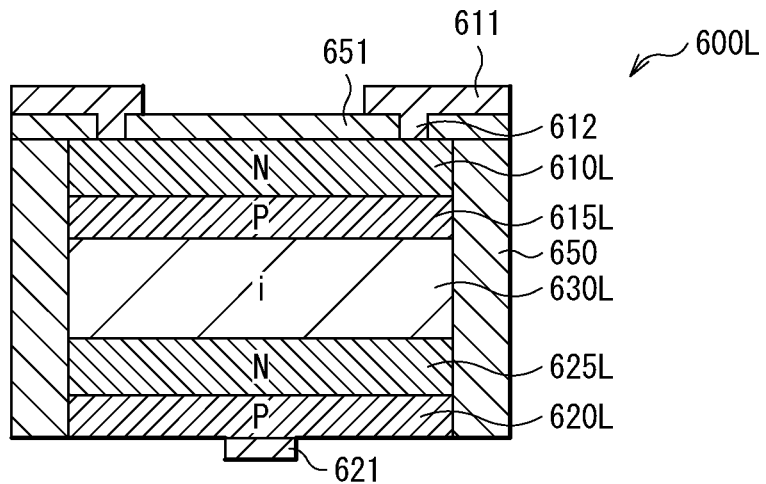
FIG. 67 is a vertical cross-sectional view of a structure of a photodetector according to a twelfth variation.

FIG. 67 is a vertical cross-sectional view of a structure of a photodetector 600L according to a twelfth variation.

As illustrated in FIG. 67, the photodetector 600L is different from the photodetector 600A according to the first variation in that a semiconductor substrate including a first region 610L, a fifth region 615L, a third region 630L, a fourth region 625L, and a second region 620L is formed by using a semiconductor other than silicon.

For example, the semiconductor substrate including the first region 610L, the fifth region 615L, the third region 630L, the fourth region 625L, and the second region 620L may be formed by using silicon germanium (SiGe), a III-V group compound semiconductor, or the like.

According to the twelfth variation, the photodetector 600L is able to control the wavelength band of detectable light. It is to be noted that it is also possible to combine the twelfth variation with any of the first to eleventh variations described above and thirteenth and fourteenth variations described below.

Thirteenth Variation

Figure 68:
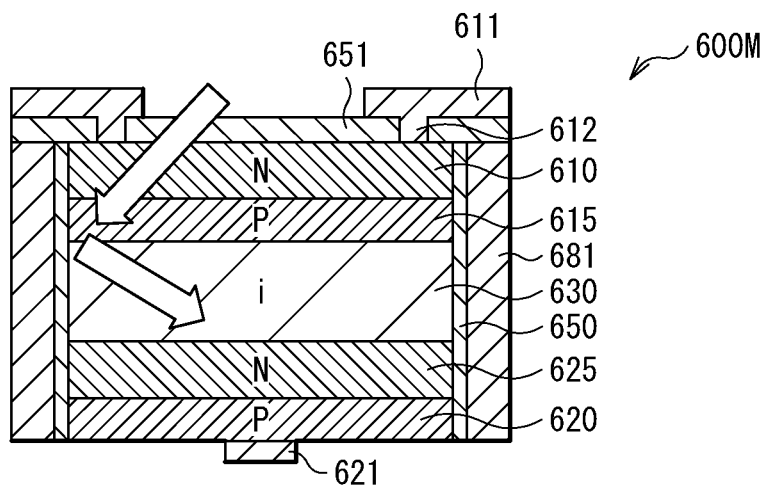
FIG. 68 is a vertical cross-sectional view of a structure of a photodetector according to a thirteenth variation.

FIG. 68 is a vertical cross-sectional view of a structure of a photodetector 600M according to a thirteenth variation.

As illustrated in FIG. 68, there may be further provided a metal layer 681 inside the pixel separation layer 650. The metal layer 681 has a light shielding property. This makes it possible to prevent light incident on the first surface of the semiconductor substrate from the oblique direction from entering adjacent the pixels. The metal layer 681 may be provided by using, for example, metal such as aluminum (Al), copper (Cu), tungsten (W), titanium (Ti), or tantalum (Ta) or alloy thereof.

According to the thirteenth variation, the metal layer 681 allows the photodetector 600M to prevent the entry of light between the pixels. It is thus possible to further suppress the crosstalk between the pixels. It is to be noted that it is also possible to combine the thirteenth variation with any of the first to twelfth variations described above and a fourteenth variation described below.

Fourteenth Variation

Figure 69:
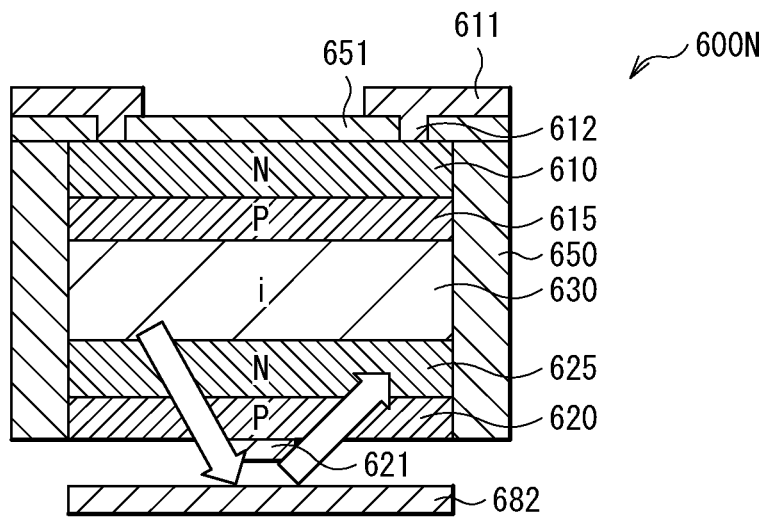
FIG. 69 is a vertical cross-sectional view of a structure of a photodetector according to a fourteenth variation.

FIG. 69 is a vertical cross-sectional view of a structure of a photodetector 600N according to the fourteenth variation.

As illustrated in FIG. 69, the photodetector 600N may further include a reflective layer 682 that is provided on the second surface side of the semiconductor substrate with an interlayer insulating film (not illustrated) interposed in between. Specifically, the reflective layer 682 is able to reflect light that passes through the third region 630 and enters the second surface side of the semiconductor substrate after entering the first surface of the semiconductor substrate. This allows the reflective layer 682 to confine the incident light in the semiconductor substrate including the third region 630. It is thus possible to increase the photoelectric conversion efficiency of the third region 630.

The reflective layer 682 may be provided over the whole of the pixel region defined by the pixel separation layer 650. The reflective layer 682 may be provided by using, for example, metal such as aluminum (Al), copper (Cu), tungsten (W), titanium (Ti), or tantalum (Ta) or alloy thereof.

According to the fourteenth variation, the photodetector 600N allows the third region 630 to have higher photoelectric conversion efficiency. It is thus possible to increase the detection sensitivity of incident light. It is to be noted that it is also possible to combine the fourteenth variation with any of the first to thirteenth variations described above.

5. Fifth Embodiment

Subsequently, a photodetector according to a fifth embodiment of the present disclosure is described with reference to FIGS. 70 to 108.

The photodetector according to the present embodiment is provided with a layer (e.g., a P layer) including a low concentration of second electrical conduction type impurities or a layer having negative fixed electric charge or electrostatic property at the interface between a semiconductor layer such as silicon and an insulator layer.

This allows the layer including second electrical conduction type impurities to recombine electrons at the interface level that are generated at the interface between the semiconductor layer and the insulator layer with holes in the layer. It is thus possible to suppress the occurrence of aliasing or dark currents by the electrons generated at the interface between the semiconductor layer and the insulator layer. In addition, the layer having negative fixed electric charge or electrostatic property makes it possible to form a hole accumulation layer (a hole accumulation layer) at the layer interface by the negative electric field. This makes it possible to suppress the generation of electric charge (electrons) at the interface between the semiconductor layer and the insulator layer. Further, the layer having negative fixed electric charge or electrostatic property allows the electric charge (the electrons) generated at the interface between the semiconductor layer and the insulator layer to disappear in the hole accumulation layer. This makes it possible to suppress the occurrence of aliasing or dark currents caused by the electrons generated at the interface between the semiconductor layer and the insulator layer.

The photodetector according to the present embodiment is provided with a layer (that is also referred to as pinning layer below) that absorbs electric charge generated at the interface as described above at the interface between semiconductor layer and the insulator layer. This makes it possible to further suppress the occurrence of aliasing or dark currents.

For the photodetector according to the present embodiment, the following describes, as first to twelfth structure examples, structure examples in each of which a layer including second electrical conduction type impurities is used as a pinning layer and describes, as thirteenth to eighteenth structure examples, structure examples in each of which a layer having negative fixed electric charge or electrostatic property is used as a pinning layer.

(First Structure Example)

Figure 70:
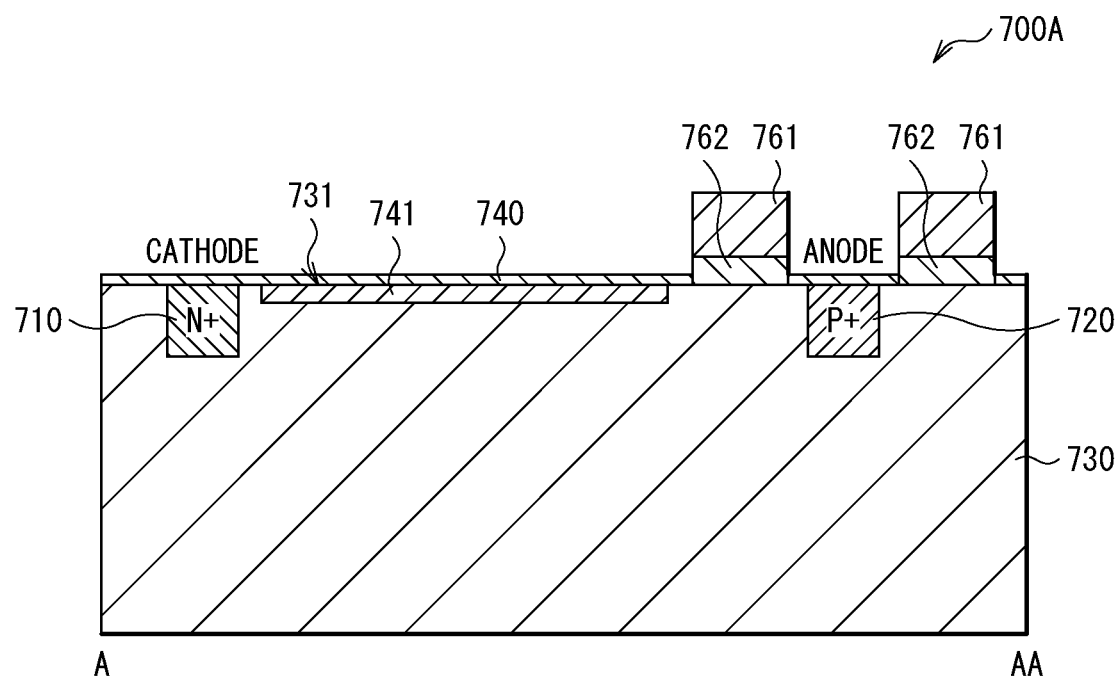
FIG. 70 is a vertical cross-sectional view of a structure of a photodetector according to a first structure example of a fifth embodiment.
Figure 71A:
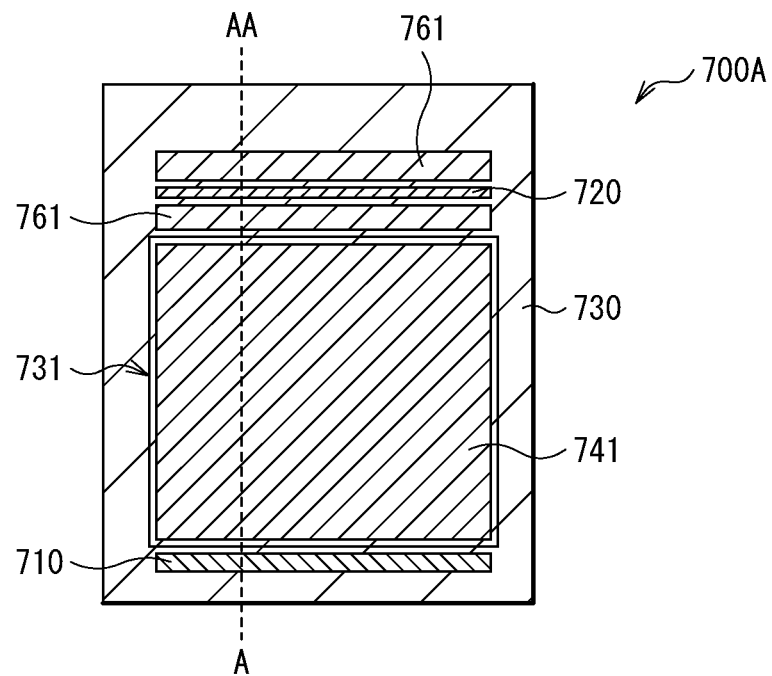
FIG. 71A is a top view of an example of a planar structure of the photodetector according to the first structure example.
Figure 71B:
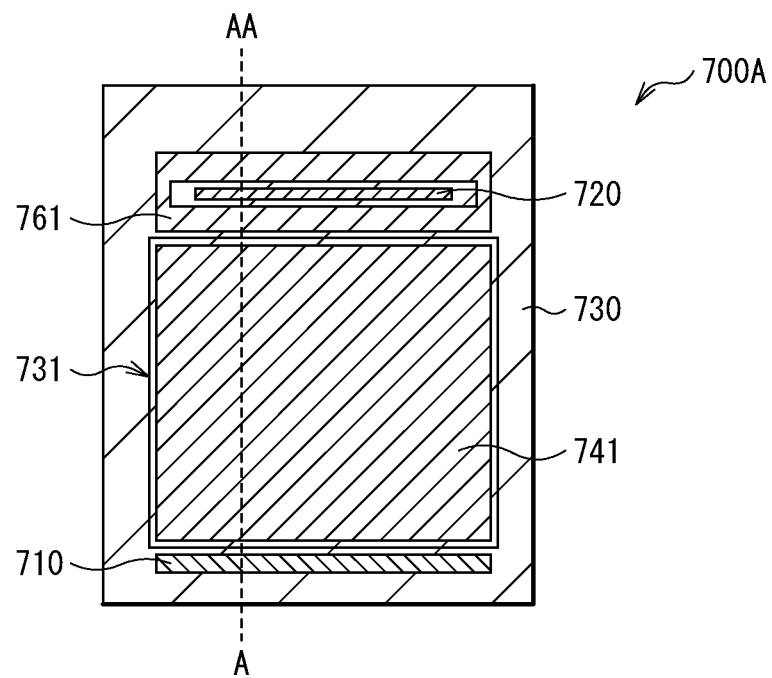
FIG. 71B is a top view of an example of the planar structure of the photodetector according to the first structure example.

FIG. 70 is a vertical cross-sectional view of a structure of a photodetector 700A according to a first structure example. Each of FIGS. 71A and 71B is a top view of an example of a planar structure of the photodetector 700A according to the first structure example. The cross-sectional structure of the photodetector 700A illustrated in FIG. 70 corresponds to the cross-sectional structure taken along an A-AA cutting plane of each of FIGS. 71A and 71B.

As illustrated in FIG. 70, the photodetector 700A includes, for example, a first region 710, a second region 720, a third region 730, a pinning layer 741, an insulating film 740, a control gate 761, and a gate insulating film 762.

The first region 710 is a region (e.g., an N+ layer) of the first electrical conduction type that is provided to a semiconductor substrate such as silicon (Si). The second region 720 is a region (e.g., a P+ layer) of the second electrical conduction type that is provided to a semiconductor substrate such as silicon (Si). The third region 730 is a region (e.g., an i layer) of the third electrical conduction type that is provided in a region of a semiconductor substrate such as silicon (Si) other than the first region 710 and the second region 720.

The control gate 761 is a gate electrode provided above the semiconductor substrate with the gate insulating film 762 interposed in between. The control gate 761 is provided to control a potential barrier in the third region 730 by voltage application. The control gate 761 may be provided by using, for example, metal such as aluminum (Al), copper (Cu), tungsten (W), titanium (Ti), or tantalum (Ta), polysilicon (poly-Si), or other electrically conductive materials. The gate insulating film 762 may be provided by using an insulator such as silicon oxide ($SiO_x$), silicon nitride ($SiN_x$), silicon oxynitride (SiON), or a so-called low-k material.

The control gate 761 is provided, for example, around the second region 720. For example, as illustrated in FIG. 71A, the control gates 761 may be provided on both sides of the second region 720 in the arrangement direction of the first region 710 and the second region 720. Alternatively, as illustrated in FIG. 71B, the control gate 761 may also be provided to surround the whole of the periphery of the second region 720.

Here, the region between the first region 710 and the control gate 761 in the arrangement direction of the first region 710 and the second region 720 serves as a light absorbing region 731 in the photodetector 700A. The photodetector 700A is able to detect light entering the light absorbing region 731.

For example, a first electrode (not illustrated) that functions as a cathode electrode is electrically coupled to the first region 710. In addition, for example, a second electrode (not illustrated) that functions as an anode electrode is electrically coupled to the second region 720.

The insulating film 740 is provided on the front surface of a semiconductor substrate such as silicon (Si). The insulating film 740 is provided by using, for example, an insulating material such as silicon oxide ($SiO_x$), silicon nitride ($SiN_x$), silicon oxynitride (SiON), or a so-called low-k material. The insulating film 740 may be, for example, a natural oxide film formed on the front surface of the silicon substrate. Alternatively, the insulating film 740 may be a protective layer separately provided on the front surface of the semiconductor substrate to protect the third region 730.

The pinning layer 741 is a region (e.g., a P layer) of the second electrical conduction type that is lower than the second region 720 in impurity concentration. The pinning layer 741 is provided at the interface between a semiconductor substrate such as silicon (Si) and the insulating film 740. It is to be noted that the distance between the pinning layer 741 and the first region 710 or the second region 720 may be set to offer a maximum electric field of less than 0.5 MeV/cm while the photodetector 700A is in operation. The pinning layer 741 may be provided, for example, at the interface between the semiconductor substrate of the light absorbing region 731 and the insulating film 740. The light absorbing region 731 is provided between the first region 710 and the control gate 761.

The pinning layer 741 is able to recombine electrons on the interface level that are generated at the interface between the semiconductor substrate and the insulating film 740 with holes in the pinning layer 741. This allows the pinning layer 741 to suppress the flow of the electrons generated at the interface between the semiconductor substrate and the insulating film 740 into the depletion layer of the third region 730 to cause aliasing or dark currents.

According to the first structure example, the photodetector 700A is able to suppress the occurrence of aliasing or dark currents.

(Second Structure Example)

Figure 72:
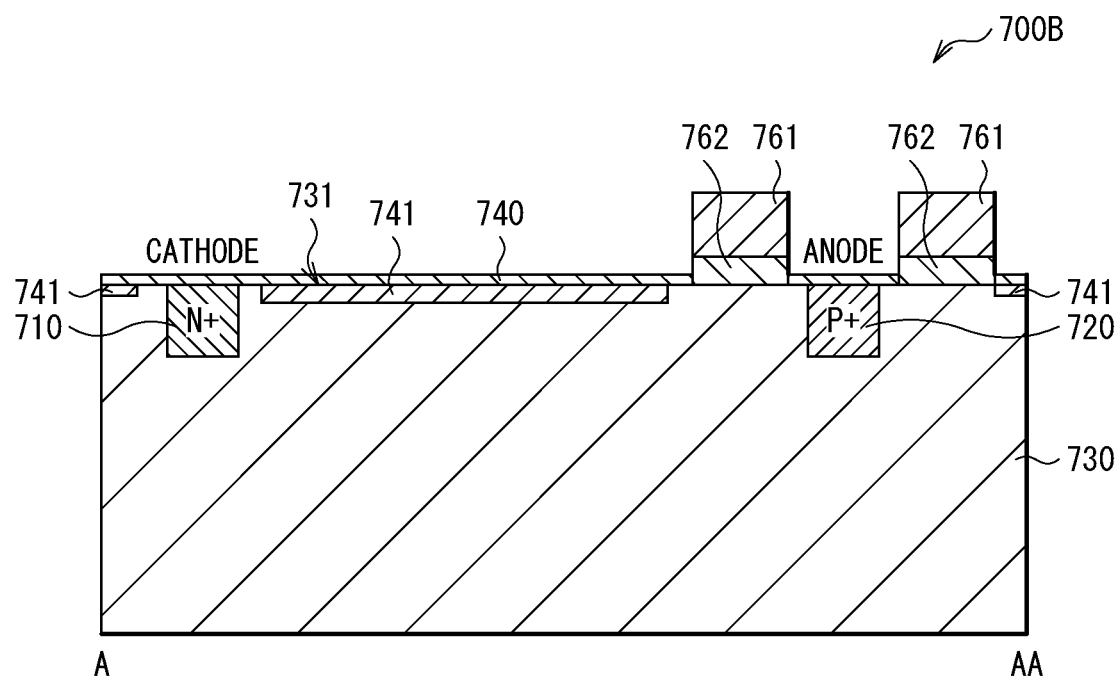
FIG. 72 is a vertical cross-sectional view of a structure of a photodetector according to a second structure example.
Figure 73A:
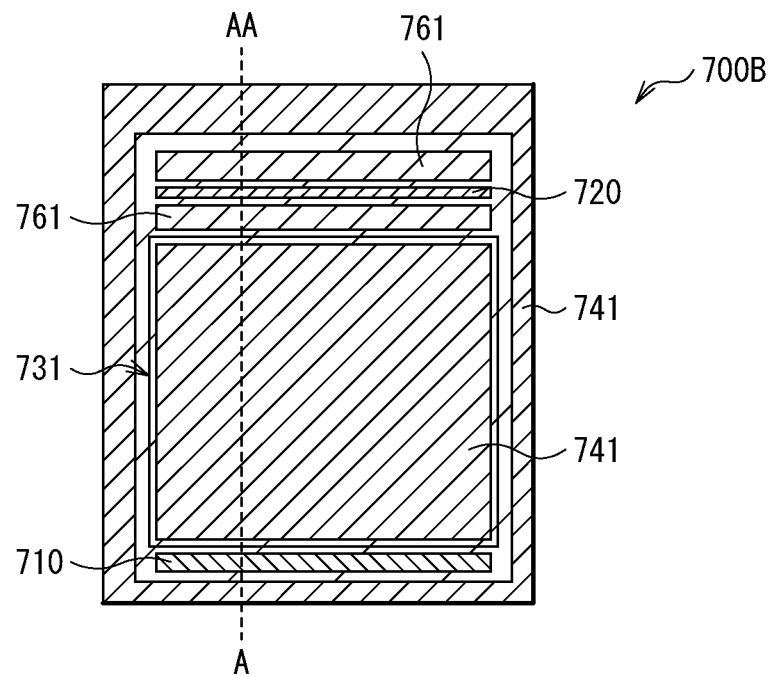
FIG. 73A is a top view of an example of a planar structure of the photodetector according to the second structure example.
Figure 73B:
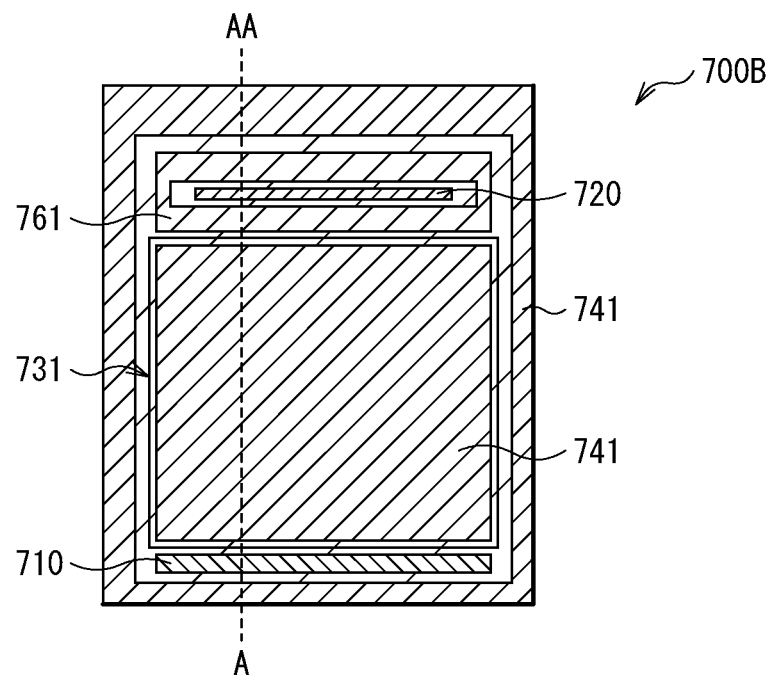
FIG. 73B is a top view of an example of the planar structure of the photodetector according to the second structure example.

FIG. 72 is a vertical cross-sectional view of a structure of a photodetector 700B according to a second structure example. Each of FIGS. 73A and 73B is a top view of an example of a planar structure of the photodetector 700B according to the second structure example. The cross-sectional structure of the photodetector 700B illustrated in FIG. 72 corresponds to the cross-sectional structure taken along an A-AA cutting plane of each of FIGS. 73A and 73B.

As illustrated in FIGS. 72, 73A, and 73B, the photodetector 700B is different from the photodetector 700A according to the first structure example in that the pinning layer 741 is provided over the whole of the semiconductor substrate in addition to the light absorbing region 731. Specifically, the pinning layer 741 may be provided to further surround the periphery of the region provided with the first region 710, the second region 720, and the control gate 761.

According to the second structure example, the photodetector 700B is able to further suppress the occurrence of aliasing or dark currents by the electrons generated at the interface between the semiconductor substrate and the insulating film 740.

(Third Structure Example)

Figure 74:
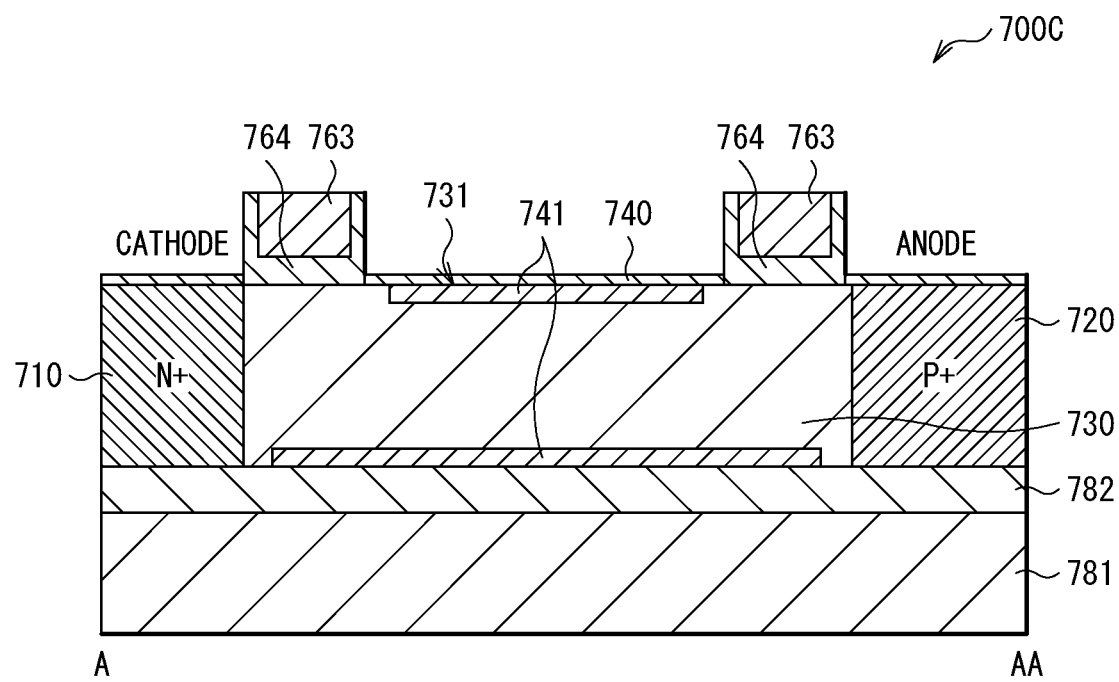
FIG. 74 is a vertical cross-sectional view of a structure of a photodetector according to a third structure example.

FIG. 74 is a vertical cross-sectional view of a structure of a photodetector 700C according to a third structure example. Each of FIGS. 75A, 75B, 77A, and 77B is a plan view of an example of a region in which the pinning layer 741 is formed on the front surface side of a semiconductor layer including the third region 730. Each of FIGS. 76A, 76B, 78A, and 78B is a plan view of an example of a region in which the pinning layer 741 is formed at the interface between a semiconductor layer including the third region 730 and the buried insulating film 782. It is to be noted that the cross-sectional structure of the photodetector 700C illustrated in FIG. 74 corresponds to the cross-sectional structure taken along an A-AA cutting plane of each of FIGS. 75A to 78B.

As illustrated in FIG. 74, the photodetector 700C includes, for example, the first region 710, the second region 720, the third region 730, the pinning layer 741, the insulating film 740, a control gate 763, a gate insulating film 764, a buried insulating film 782, and a support substrate 781.

The support substrate 781 is, for example, a semiconductor substrate such as a silicon (Si) substrate. The buried insulating film 782 is formed by using, for example, silicon oxide (SiOx) and provided on the support substrate 781. In addition, there is provided a semiconductor layer formed by using silicon (Si) or the like on the buried insulating film 782.

In other words, the semiconductor substrate in which the photodetector 700C is formed is a so-called SOI (Silicon On Insulator) substrate. The support substrate 781 corresponds to a support substrate of a SOI substrate, the buried insulating film 782 corresponds to a BOX (Buried OXide) layer of a SOI substrate, and the semiconductor layer on the buried insulating film 782 corresponds to an active layer of a SOI substrate.

The first region 710 is a region (e.g., an N+ layer) of the first electrical conduction type that is provided in the semiconductor layer on the buried insulating film 782. The second region 720 is a region (e.g., a P+ layer) of the second electrical conduction type that is provided in the semiconductor layer on the buried insulating film 782. The third region 730 is a region (e.g., an i layer) of the third electrical conduction type that is provided in the semiconductor layer between the first region 710 and the second region 720. The first region 710 and the second region 720 may be each provided to extend in the thickness direction of the semiconductor layer to reach the buried insulating film 782 from the front surface of the semiconductor layer.

For example, a first electrode (not illustrated) that functions as a cathode electrode is electrically coupled to the first region 710. In addition, for example, a second electrode (not illustrated) that functions as an anode electrode is electrically coupled to the second region 720.

The control gate 763 is provided to be buried in the gate insulating film 764 formed on the semiconductor layer. The control gate 763 may also be provided, for example, in a region adjacent to the first region 710 or the second region 720. The voltage application allows the control gate 763 to control a potential barrier in the third region 730.

The control gate 763 may be provided by using, for example, metal such as aluminum (Al), copper (Cu), tungsten (W), titanium (Ti), or tantalum (Ta), polysilicon (poly-Si), or other electrically conductive materials. The gate insulating film 764 may be provided by using an insulator such as silicon oxide (SiO$_x$), silicon nitride (SiN$_x$), silicon oxynitride (SiON), or a so-called low-k material.

For example, as illustrated in FIGS. 75A to 76B, the first region 710 and the second region 720 may be each provided to extend in one direction with respect to the in-plane direction of the semiconductor layer. The plurality of control gates 763 may be provided in the region between the first region 710 and the second region 720 to be adjacent to the first region 710 and the second region 720. In FIGS. 75A to 76B, the region between the plurality of provided control gates 763 in the arrangement direction of the first region 710 and the second region 720 serves as the light absorbing region 731 in the photodetector 700C.

In addition, as illustrated in FIGS. 77A to 78B, the first region 710 and the second region 720 may be each provided to extend in one direction with respect to the in-plane direction of the semiconductor layer. The control gate 763 may be provided in the region between the first region 710 and the second region 720 in the shape of an annular rectangle. Specifically, the control gate 763 may be provided in the shape of an annual rectangle including two respective sides adjacent to the first region 710 and the second region 720 and two sides joining the two sides to each other. In FIGS. 77A to 78B, the region inside the control gate 763 having an annular rectangular shape is the light absorbing region 731 in the photodetector 700C.

The insulating film 740 is provided on the front surface of the semiconductor layer including the third region 730. The insulating film 740 is provided by using, for example, an insulating material such as silicon oxide (SiO$_x$), silicon nitride (SiN$_x$), silicon oxynitride (SiON), or a so-called low-k material. The insulating film 740 may be, for example, a natural oxide film formed on the front surface of the semiconductor layer. Alternatively, the insulating film 740 may be a protective layer separately provided on the front surface of the semiconductor layer to protect the third region 730.

The pinning layer 741 is a region (e.g., a P layer) of the second electrical conduction type that is lower than the second region 720 in impurity concentration. The pinning layer 741 or the pinning layers 741 are provided at one or both of the interface between the semiconductor layer including the third region 730 and the insulating film 740 and the interface between the semiconductor layer including the third region 730 and the buried insulating film 782.

The pinning layer 741 is able to recombine electrons on the interface level that are generated at the interface between the semiconductor layer including the third region 730 and the insulating film 740 or the buried insulating film 782 with holes in the pinning layer 741. This allows the pinning layer 741 to suppress the flow of the electrons generated at the interface between the semiconductor layer and the insulating film 740 or the buried insulating film 782 into the depletion layer of the third region 730 to cause aliasing or dark currents.

Figure 75A:
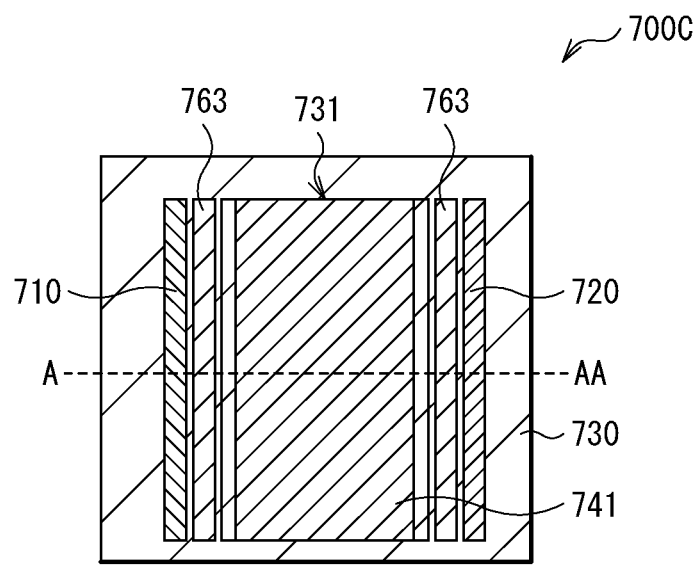
FIG. 75A is a plan view of an example of a region in which a pinning layer is formed on a front surface side of a semiconductor layer including a third region.
Figure 75B:
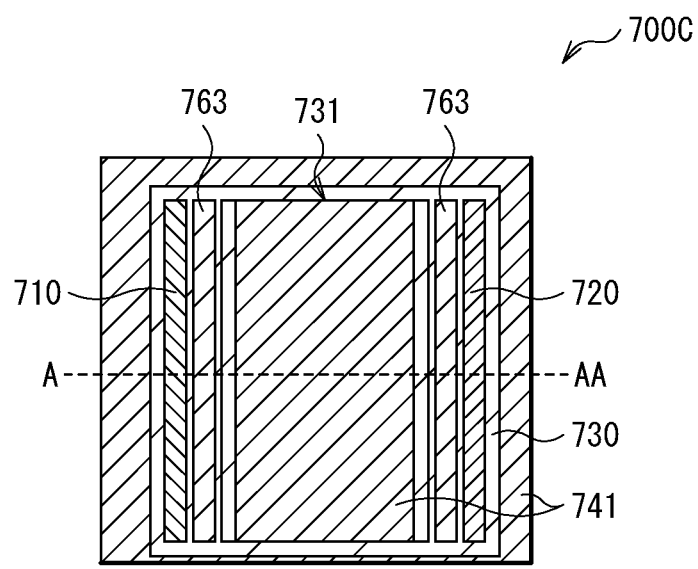
FIG. 75B is a plan view of an example of the region in which the pinning layer is formed on the front surface side of the semiconductor layer including the third region.
Figure 77A:
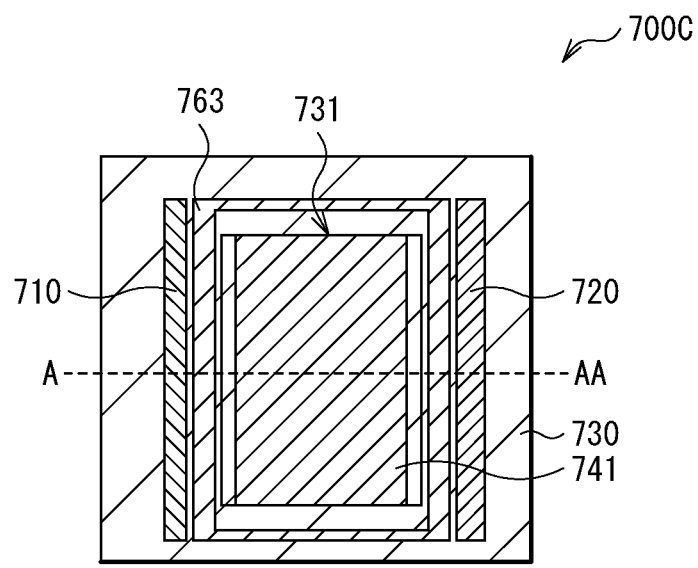
FIG. 77A is a plan view of an example of the region in which the pinning layer is formed on the front surface side of the semiconductor layer including the third region.
Figure 77B:
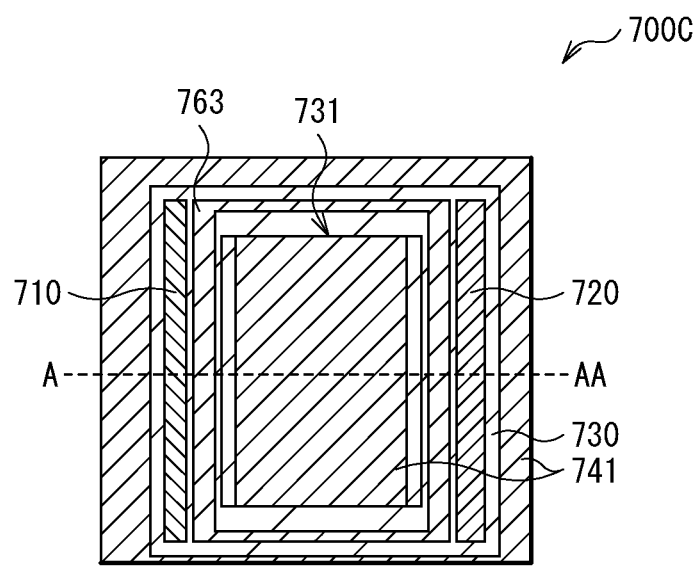
FIG. 77B is a plan view of an example of the region in which the pinning layer is formed on the front surface side of the semiconductor layer including the third region.

Here, as illustrated in FIGS. 75A and 77A, the pinning layer 741 provided at the interface between the semiconductor layer including the third region 730 and the insulating film 740 may be provided between the control gates 763 or provided to the light absorbing region 731 on the inner side. Alternatively, as illustrated in FIGS. 75B and 77B, the pinning layer 741 provided at the interface between the semiconductor layer including the third region 730 and the insulating film 740 may be provided over the whole of the semiconductor substrate in addition to the light absorbing region 731. Specifically, the pinning layer 741 may be provided to further surround the periphery of the region provided with the first region 710, the second region 720, and the control gate 763.

Figure 76A:
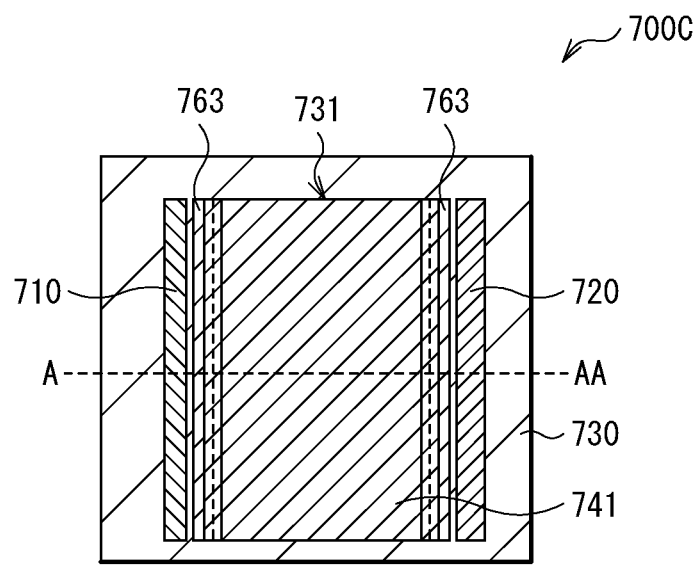
FIG. 76A is a plan view of an example of a region in which the pinning layer is formed at an interface between the semiconductor layer including the third region and a buried insulating film.
Figure 76B:
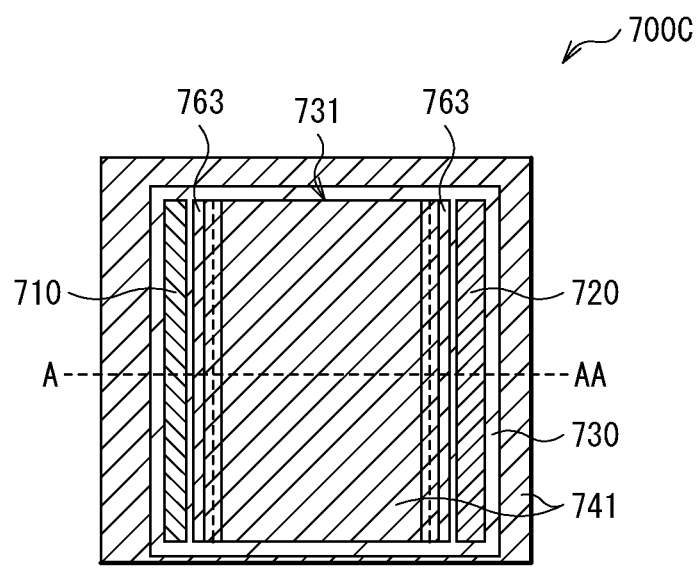
FIG. 76B is a plan view of an example of the region in which the pinning layer is formed at the interface between the semiconductor layer including the third region and the buried insulating film.
Figure 78A:
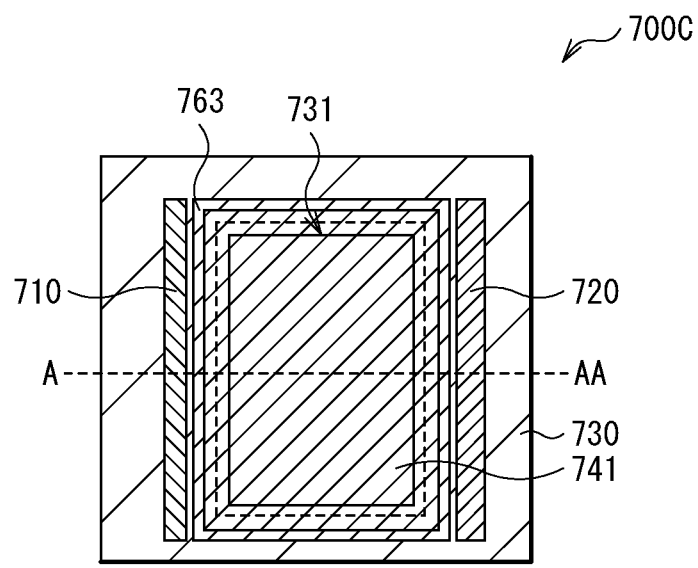
FIG. 78A is a plan view of an example of the region in which the pinning layer is formed at the interface between the semiconductor layer including the third region and the buried insulating film.
Figure 78B:
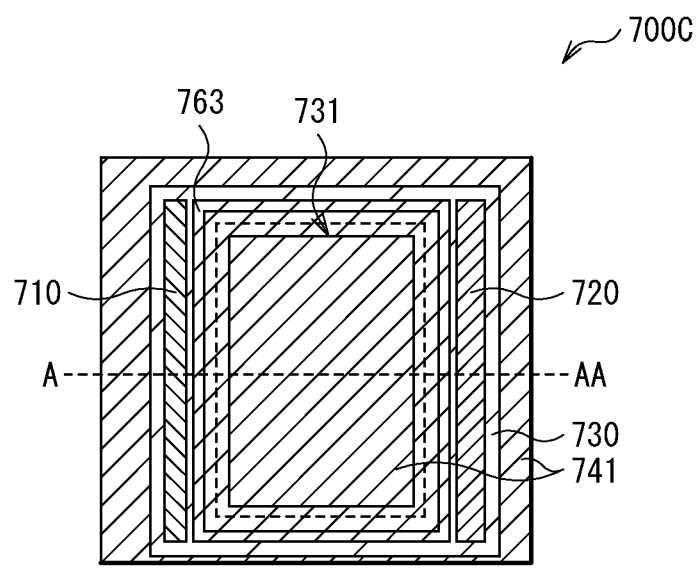
FIG. 78B is a plan view of an example of the region in which the pinning layer is formed at the interface between the semiconductor layer including the third region and the buried insulating film.

In contrast, as illustrated in FIGS. 76A and 78A, the pinning layer 741 provided at the interface between the semiconductor layer including the third region 730 and the buried insulating film 782 may be provided in the region between the first region 710 and the second region 720. Alternatively, as illustrated in FIGS. 76B and 78B, the pinning layer 741 provided at the interface between the semiconductor layer including the third region 730 and the buried insulating film 782 may be provided over the whole of the semiconductor substrate in addition to the light absorbing region 731. Specifically, the pinning layer 741 may be provided to further surround the periphery of the region provided with the first region 710 and the second region 720. In other words, the pinning layer 741 provided at the interface between the semiconductor layer including the third region 730 and the buried insulating film 782 may be provided to extend to the region below the control gate 763.

According to the third structure example, the photodetector 700C is able to suppress the occurrence of aliasing or dark currents even in a case where the substrate in which the photodetector 700C is formed is an SOI substrate.

(Fourth Structure Example)

Figure 79:
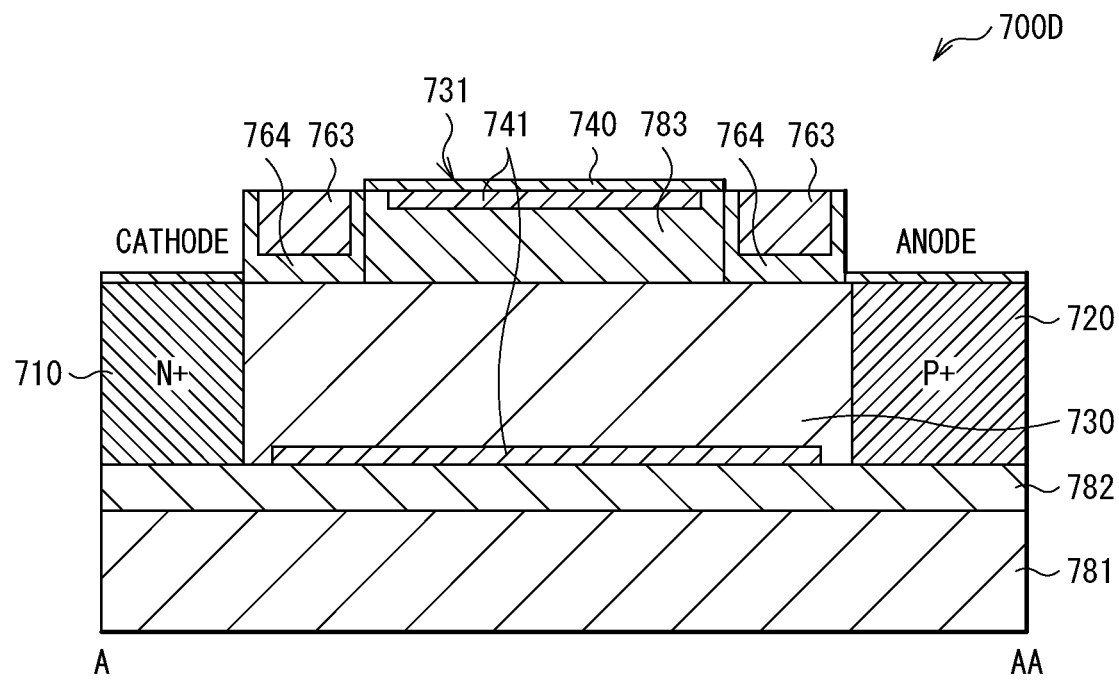
FIG. 79 is a vertical cross-sectional view of a structure of a photodetector according to a fourth structure example.

FIG. 79 is a vertical cross-sectional view of a structure of a photodetector 700D according to a fourth structure example. Each of FIGS. 80A, 80B, 82A, and 82B is a plan view of an example of a region in which the pinning layer 741 is formed on the front surface side of an electric charge generation layer 783. Each of FIGS. 81A, 81B, 83A, and 83B is a plan view of an example of a region in which the pinning layer 741 is formed at the interface between a semiconductor layer including the third region 730 and the buried insulating film 782. It is to be noted that the cross-sectional structure of the photodetector 700D illustrated in FIG. 79 corresponds to the cross-sectional structure taken along an A-AA cutting plane of each of FIGS. 80A to 83B.

As illustrated in FIG. 79, the photodetector 700D is different from the photodetector 700C according to the third structure example in that the electric charge generation layer 783 is provided on the semiconductor layer including the third region 730 and the pinning layer 741 is formed on the front surface of the electric charge generation layer 783.

The electric charge generation layer 783 is formed by using a semiconductor material and provided in the region between or the control gates 763 above the semiconductor layer or the region on the inner side. The electric charge generation layer 783 is able to generate electric charge by photoelectrically converting incident light. For example, the electric charge generation layer 783 may be formed by using one of germanium (Ge), gallium arsenide (GaAs), and silicon germanium (SiGe) or a mixture of these. Alternatively, the electric charge generation layer 783 may be formed by using silicon doped with a low concentration or a high concentration of electrically conductive impurities.

This allows the electric charge generation layer 783 to photoelectrically convert, for example, the light of the wavelength band that is not photoelectrically converted in the third region 730. In addition, the electric charge generation layer 783 makes it possible to increase the quantum efficiency of the photodetector 700D, for example, by photoelectrically converting incident light as with the third region 730.

As illustrated in FIGS. 80A to 81B, the plurality of control gates 763 may be provided in the region between the first region 710 and the second region 720 provided to extend in the same direction to be adjacent to the first region 710 and the second region 720. In FIGS. 80A to 81B, the region between the respective control gates 763 in the arrangement direction of the first region 710 and the second region 720 serves as the light absorbing region 731 in the photodetector 700D.

As illustrated in FIGS. 82A to 83B, the control gate 763 may be provided in the shape of an annular rectangle in the region between the first region 710 and the second region 720 provided to extend in the same direction. Specifically, the control gate 763 may be provided in the shape of an annual rectangle including two respective sides adjacent to the first region 710 and the second region 720 and two sides joining the two sides to each other. In FIGS. 82A to 83B, the region inside the control gate 763 having an annular rectangular shape is the light absorbing region 731 in the photodetector 700D.

The insulating film 740 is provided on the front surface of the electric charge generation layer 783. The insulating film 740 is provided by using, for example, an insulating material such as silicon oxide ($SiO_x$), silicon nitride ($SiN_x$), silicon oxynitride (SiON), or a so-called low-k material. The insulating film 740 may be, for example, a natural oxide film formed on the front surface of the electric charge generation layer 783. Alternatively, the insulating film 740 may be a protective layer separately provided to protect the electric charge generation layer 783.

The pinning layer 741 is a region (e.g., a P layer) of the second electrical conduction type that is lower than the second region 720 in impurity concentration. The pinning layer 741 or the pinning layers 741 are provided at one or both of the interface between the electric charge generation layer 783 and the insulating film 740 and the interface between the semiconductor layer including the third region 730 and the buried insulating film 782. The pinning layer 741 is able to suppress the flow of electric charge generated at the interface between the electric charge generation layer 783 and the insulating film 740 or the interface between the semiconductor layer including the third region 730 and the buried insulating film 782 into the depletion layer of the third region 730 to cause aliasing or dark currents.

Figure 80A:
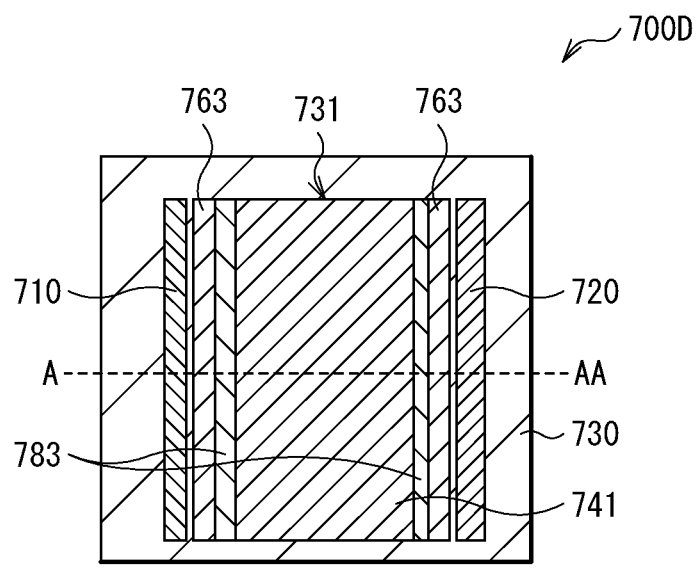
FIG. 80A is a plan view of an example of a region in which a pinning layer is formed on a front surface side of an electric charge generation layer.
Figure 80B:
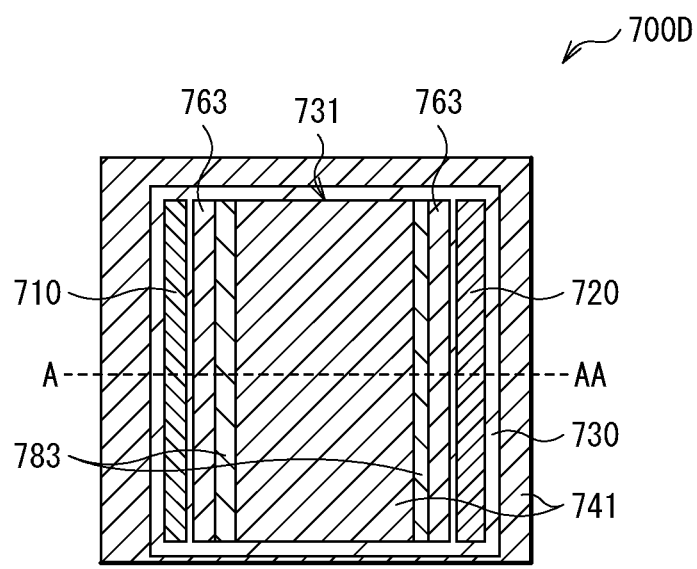
FIG. 80B is a plan view of an example of the region in which the pinning layer is formed on the front surface side of the electric charge generation layer.
Figure 82A:
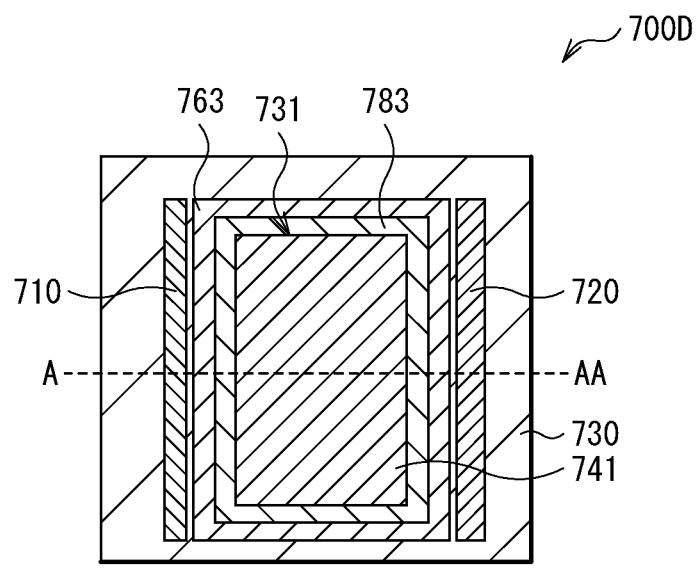
Figure 82B:
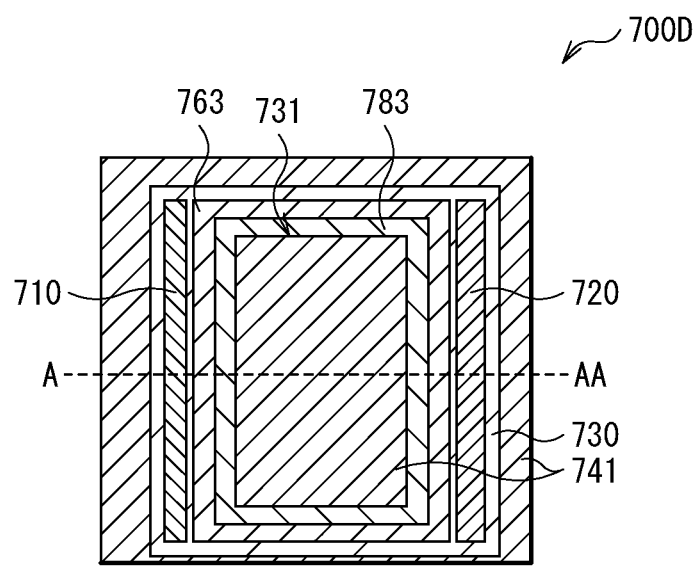

Here, as illustrated in FIGS. 80A and 82A, the pinning layer 741 provided at the interface between the electric charge generation layer 783 and the insulating film 740 may be provided between the control gates 763 or provided to the light absorbing region 731 on the inner side. Alternatively, as illustrated in FIGS. 80B and 82B, the pinning layer 741 provided at the interface between the electric charge generation layer 783 and the insulating film 740 may be provided over the whole of the semiconductor substrate in addition to the light absorbing region 731. Specifically, the pinning layer 741 may be provided to further surround the periphery of the region provided with the first region 710, the second region 720, and the control gate 763.

Figure 81A:
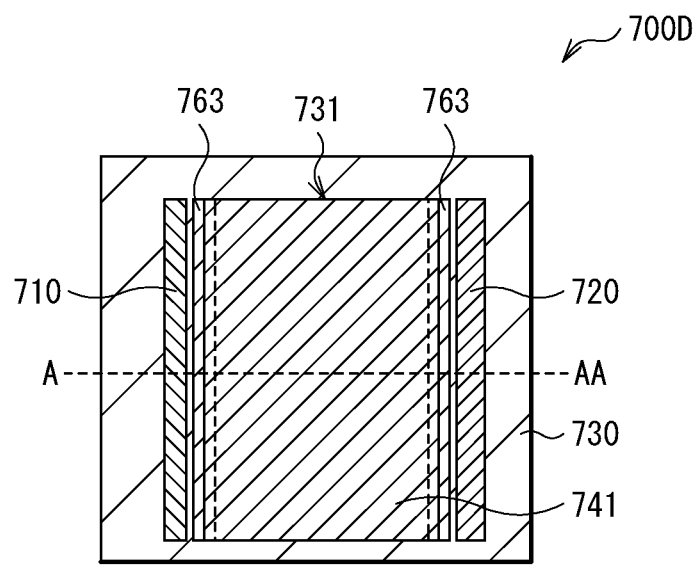
FIG. 81A is a plan view of an example of a region in which a pinning layer 741 is formed at the interface between the semiconductor layer including the third region and the buried insulating film.
Figure 83A:
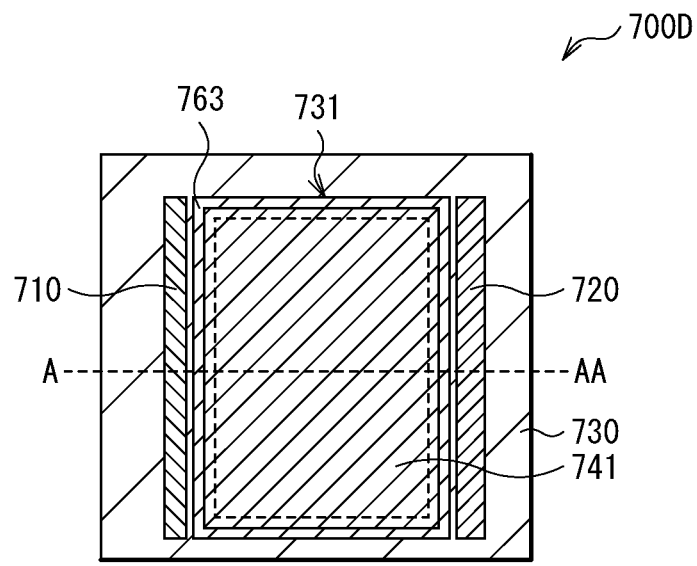

In contrast, as illustrated in FIGS. 81A and 83A, the pinning layer 741 provided at the interface between the semiconductor layer including the third region 730 and the buried insulating film 782 may be provided in the planar region between the first region 710 and the second region 720.

Figure 81B:
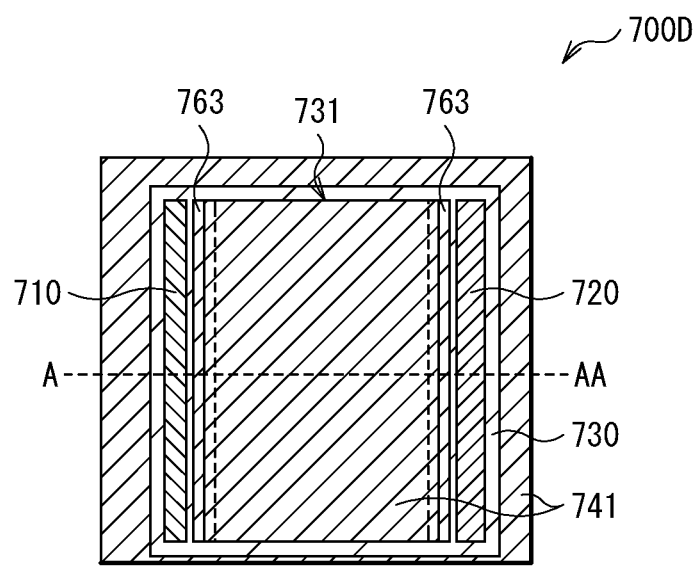
Figure 83B:
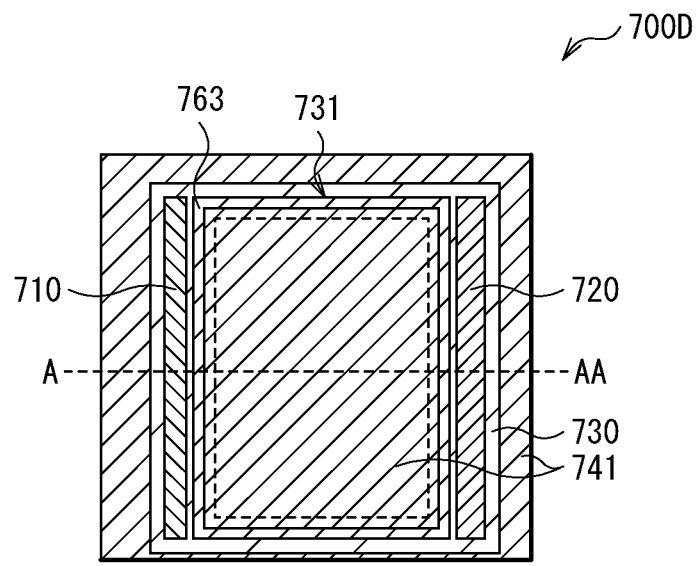

In addition, as illustrated in FIGS. 81B and 83B, the pinning layer 741 provided at the interface between the semiconductor layer including the third region 730 and the buried insulating film 782 may be provided over the whole of the semiconductor substrate in addition to the light absorbing region 731. Specifically, the pinning layer 741 may be provided to further surround the periphery of the region provided with the first region 710 and the second region 720. In other words, the pinning layer 741 provided at the interface between the semiconductor layer including the third region 730 and the buried insulating film 782 may be provided to extend to the region below the control gate 763.

According to the fourth structure example, the photodetector 700D allows the photoelectric conversion characteristics for incident light to increase.

(Fifth Structure Example)

Figure 84:
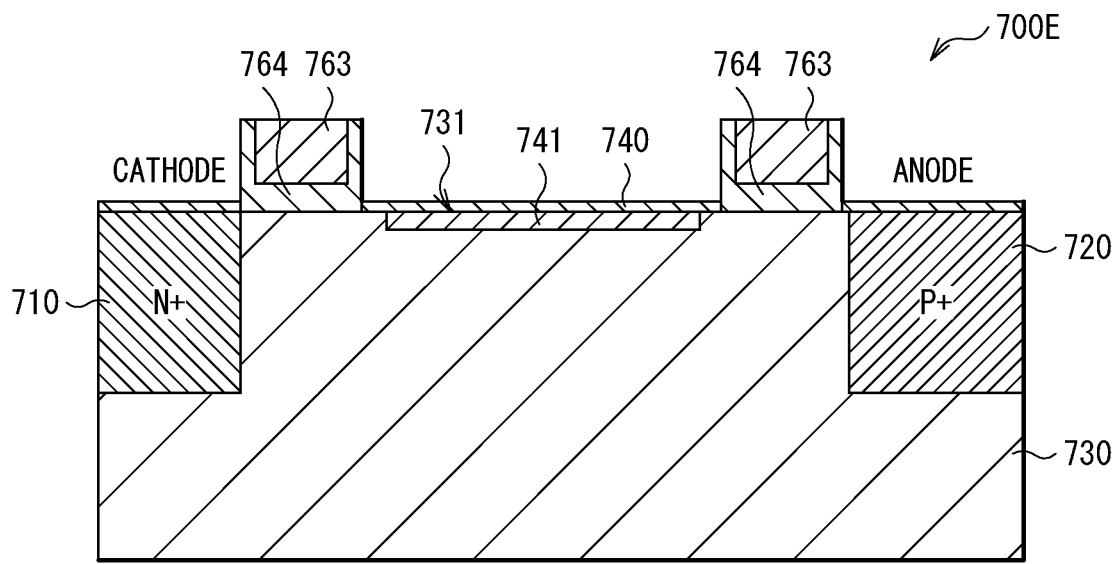

FIG. 84 is a vertical cross-sectional view of a structure of a photodetector 700E according to a fifth structure example.

As illustrated in FIG. 84, the photodetector 700E is different from the photodetector 700C according to the third structure example in that the substrate in which the photodetector 700E is formed is not a SOI substrate, but a semiconductor substrate such as a silicon substrate. In such a case, the pinning layer 741 may be provided at the interface between the semiconductor substrate including the third region 730 and the insulating film 740.

According to the fifth structure example, it is possible to reduce the manufacturing cost of the photodetector 700E by using a less expensive substrate.

(Sixth Structure Example)

Figure 85:
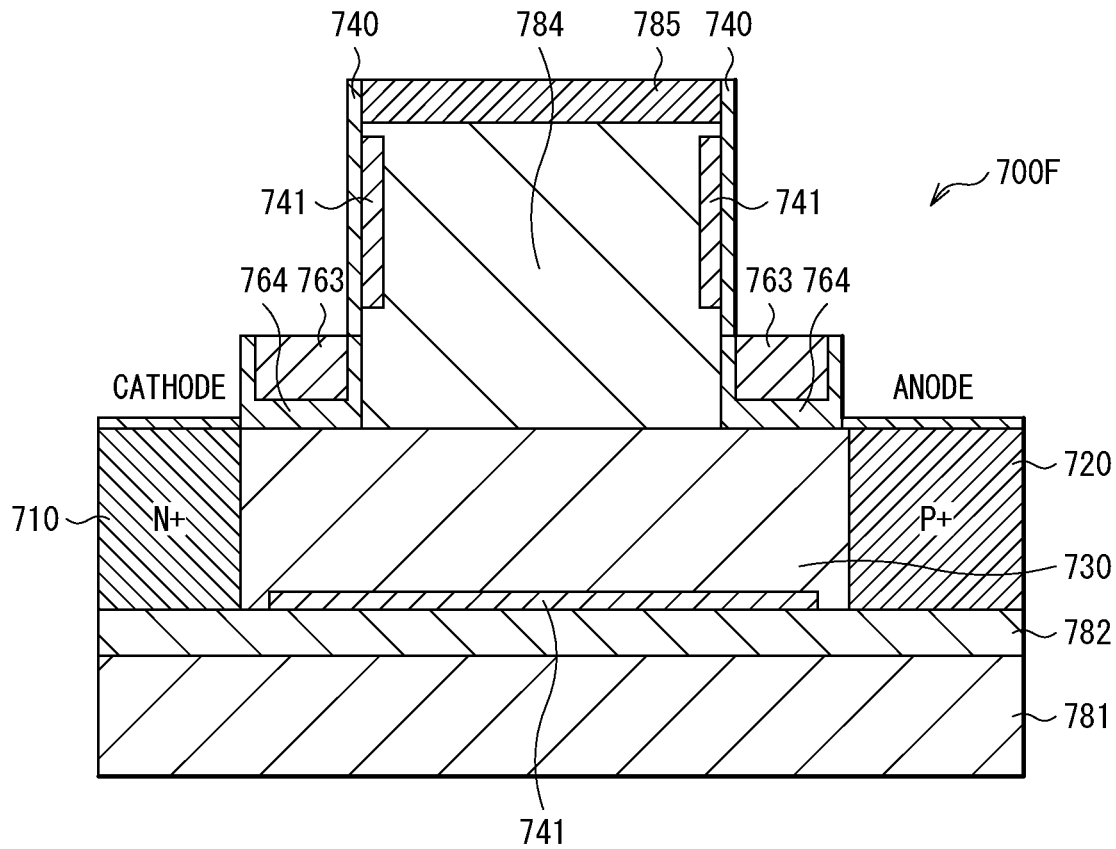

FIG. 85 is a vertical cross-sectional view of a structure of a photodetector 700F according to a sixth structure example.

As illustrated in FIG. 85, the photodetector 700F is different from the photodetector 700C according to the third structure example in that the monolithic structure 784 is provided on the semiconductor layer including the third region 730 and the pinning layer 741 is formed on the side surfaces of the monolithic structure 784.

The monolithic structure 784 is a structure formed by processing one semiconductor substrate. The monolithic structure 784 is provided between the control gates 763 on the semiconductor layer or provided in the region on the inner side. The monolithic structure 784 is a light absorbing layer that photoelectrically converts incident light. The monolithic structure 784 may include, for example, silicon (Si), germanium (Ge), silicon carbide (SiC), or the like. This allows the photodetector 700F to increase the photoelectric conversion characteristics for incident light.

Here, there may be provided a contact layer 785 on the surface of the monolithic structure 784 opposite to the stacked surface with the third region 730. The contact layer 785 is, for example, a region (e.g., a P+ layer) of the second electrical conduction type. The photodetector 700F is able to control the potential of the monolithic structure 784 by applying voltage to the monolithic structure 784 through the contact layer 785.

In addition, a side surface of the monolithic structure 784 is provided with the insulating film 740. The insulating film 740 is provided by using, for example, an insulating material such as silicon oxide ($SiO_x$), silicon nitride ($SiN_x$), silicon oxynitride (SiON), or a so-called low-k material. The insulating film 740 may be, for example, a natural oxide film formed on the side surfaces of the monolithic structure 784. Alternatively, the insulating film 740 may be a protective layer separately provided to protect the monolithic structure 784.

The pinning layer 741 is a region (e.g., a P layer) of the second electrical conduction type that is lower than the second region 720 in impurity concentration. The pinning layer 741 is provided at at least one or more of the interface between a side surface of the monolithic structure 784 and the insulating film 740 or the interface between the semiconductor layer including the third region 730 and the buried insulating film 782. The pinning layer 741 is able to suppress the flow of electric charge generated at the interface between a side surface of the monolithic structure 784 and the insulating film 740 or the interface between the semiconductor layer including the third region 730 and the buried insulating film 782 into the depletion layer of the third region 730 to cause aliasing or dark currents.

According to the sixth structure example, the photodetector 700F is able to suppress the occurrence of aliasing or dark currents even in a case where the monolithic structure 784 is provided.

(Seventh Structure Example)

Figure 86:
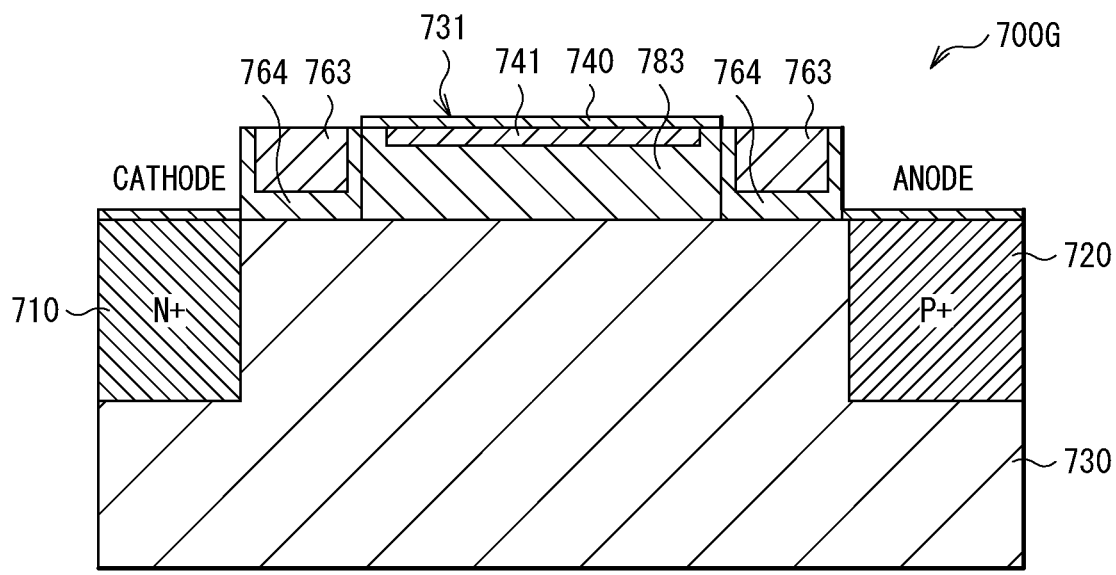

FIG. 86 is a vertical cross-sectional view of a structure of a photodetector 700G according to a seventh structure example.

As illustrated in FIG. 86, the photodetector 700G is different from the photodetector 700D according to the fourth structure example in that the substrate in which the photodetector 700G is formed is a semiconductor substrate such as a silicon substrate. In such a case, the pinning layer 741 may be provided at the interface between the semiconductor substrate including the third region 730 and the insulating film 740.

According to the seventh structure example, it is possible to reduce the manufacturing cost of the photodetector 700G by using a less expensive substrate.

(Eighth Structure Example)

Figure 87:
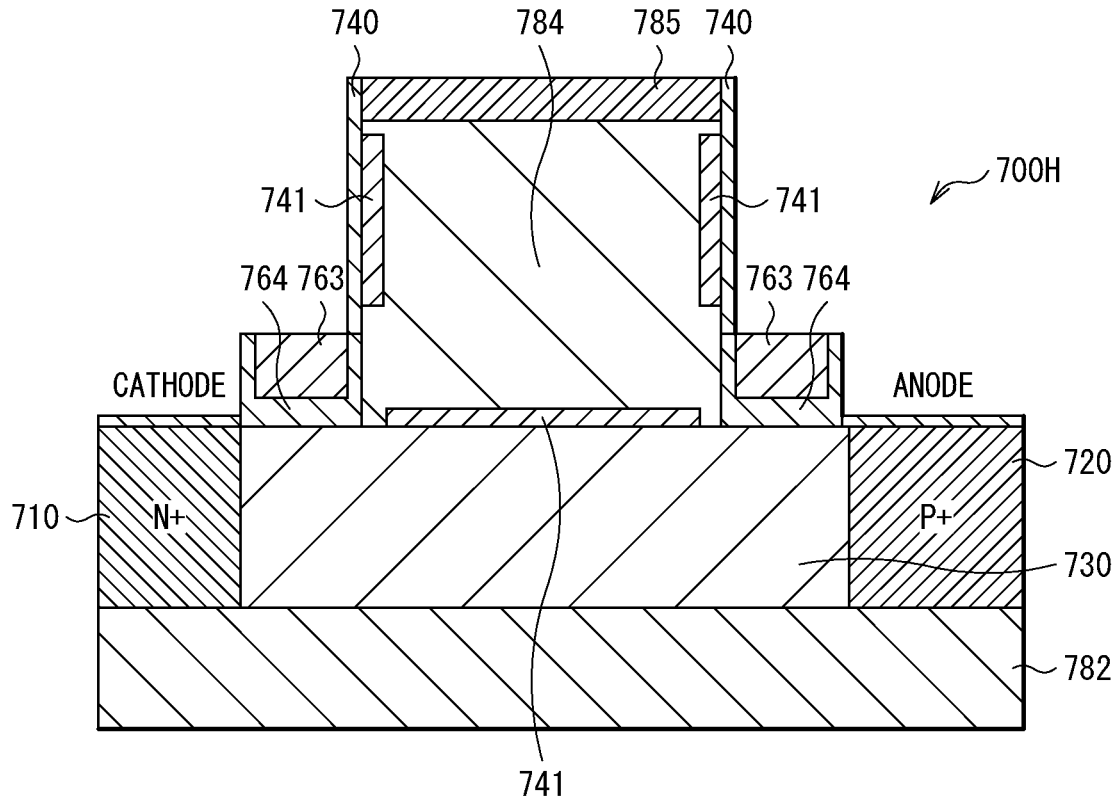

FIG. 87 is a vertical cross-sectional view of a structure of a photodetector 700H according to an eighth structure example.

As illustrated in FIG. 87, the photodetector 700H is different from the photodetector 700F according to the sixth structure example in that the substrate in which the photodetector 700H is formed is a SOI substrate that does not include the support substrate 781. In such a case, the pinning layer 741 may be provided at at least one or more of the interface between a side surface of the monolithic structure 784 and the insulating film 740 or the interface between the semiconductor layer including the third region 730 and the monolithic structure 784.

According to the eighth structure example, the photodetector 700H makes it possible to further downsize the chip by lowering the overall configuration.

(Ninth Structure Example)

Figure 88:
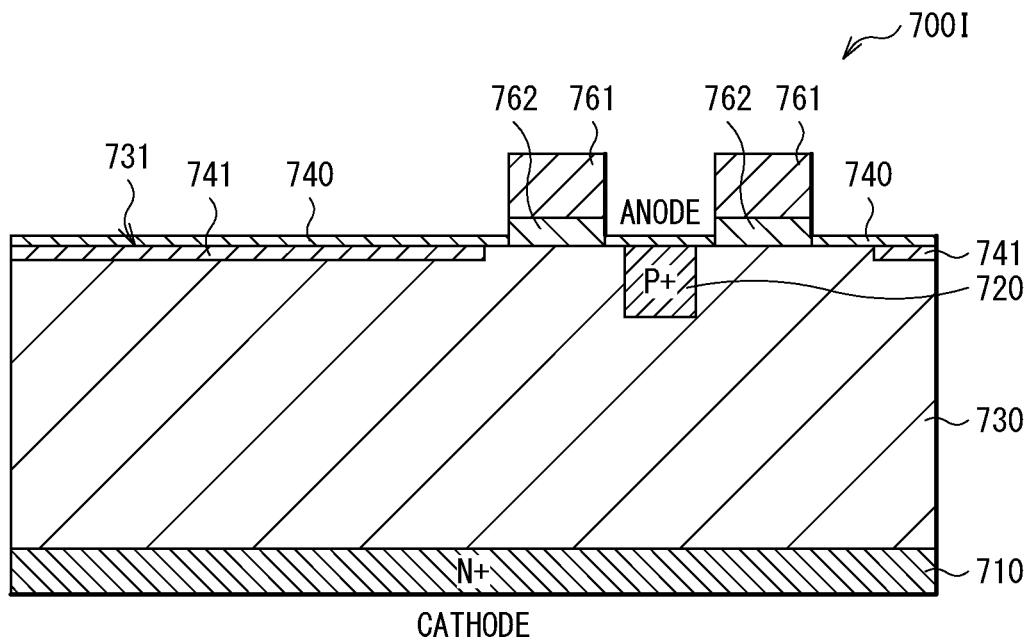

FIG. 88 is a vertical cross-sectional view of a structure of a photodetector 700I according to a ninth structure example.

As illustrated in FIG. 88, the photodetector 700I is different from the photodetector 700B according to the second structure example in that the first region 710 is provided on the surface of semiconductor substrate opposite to the surface provided with the second region 720. In other words, the photodetector 700I is different from the photodetector 700B according to the second structure example in that the first region 710, the third region 730, and the second region 720 are arranged in the thickness direction of the semiconductor substrate.

Specifically, the second region 720 is provided on the second surface side of the semiconductor substrate. In contrast, the first region 710 is provided on the first surface side of the semiconductor substrate opposite to the second surface provided with the second region 720. The third region 730 is a region (e.g., an i layer) of the third electrical conduction type. The third region 730 is provided between the first region 710 and the second region 720 of the semiconductor substrate.

Here, the insulating film 740 is provided on the second surface of the semiconductor substrate on which the second region 720 is provided. The pinning layer 741 may be thus provided at the interface between the second surface of the semiconductor substrate on which the second region 720 is provided and the insulating film 740.

According to the ninth structure example, the photodetector 700I allows the first region 710, the third region 730, and the second region 720 to be arranged in the thickness direction of the semiconductor substrate. This makes it possible to further decrease the chip area.

(Tenth Structure Example)

Figure 89:
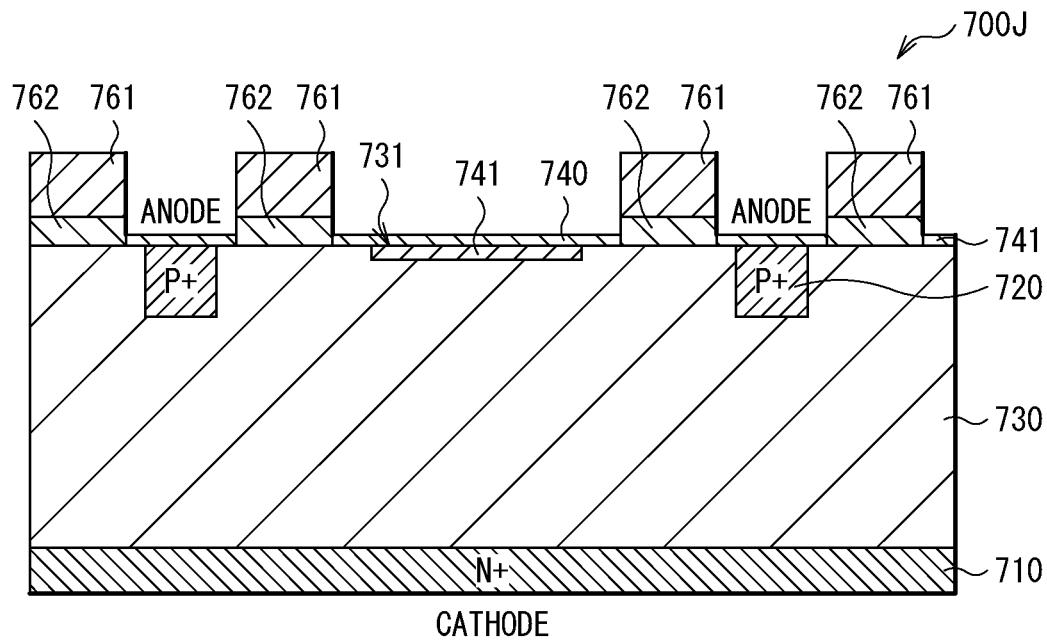

FIG. 89 is a vertical cross-sectional view of a structure of a photodetector 700J according to a tenth structure example.

As illustrated in FIG. 89, the photodetector 700J is different from the photodetector 700I according to the ninth structure example in that the plurality of second regions 720 is provided.

Specifically, the plurality of second regions 720 is provided on the second surface side of the semiconductor substrate to be isolated from each other. In addition, the control gate 761 is provided above the semiconductor substrate around each of the second regions 720 with the gate insulating film 762 interposed in between. The control gates 716 may be provided on both sides of the second region 720 or the control gate 716 may be provided to surround the whole of the periphery of the second region 720.

Here, in the photodetector 700J, the region between the plurality of second regions 720 and between the plurality of control gates 761 is the light absorbing region 731. The insulating film 740 is provided on the semiconductor substrate of the light absorbing region 731. The pinning layer 741 may be thus provided at the interface between the second surface of the semiconductor substrate on which the light absorbing region 731 is provided and the insulating film 740.

According to the tenth structure example, the photodetector 700J is able to extract currents from the third region 730 more efficiently.

(Eleventh Structure Example)

Figure 90:
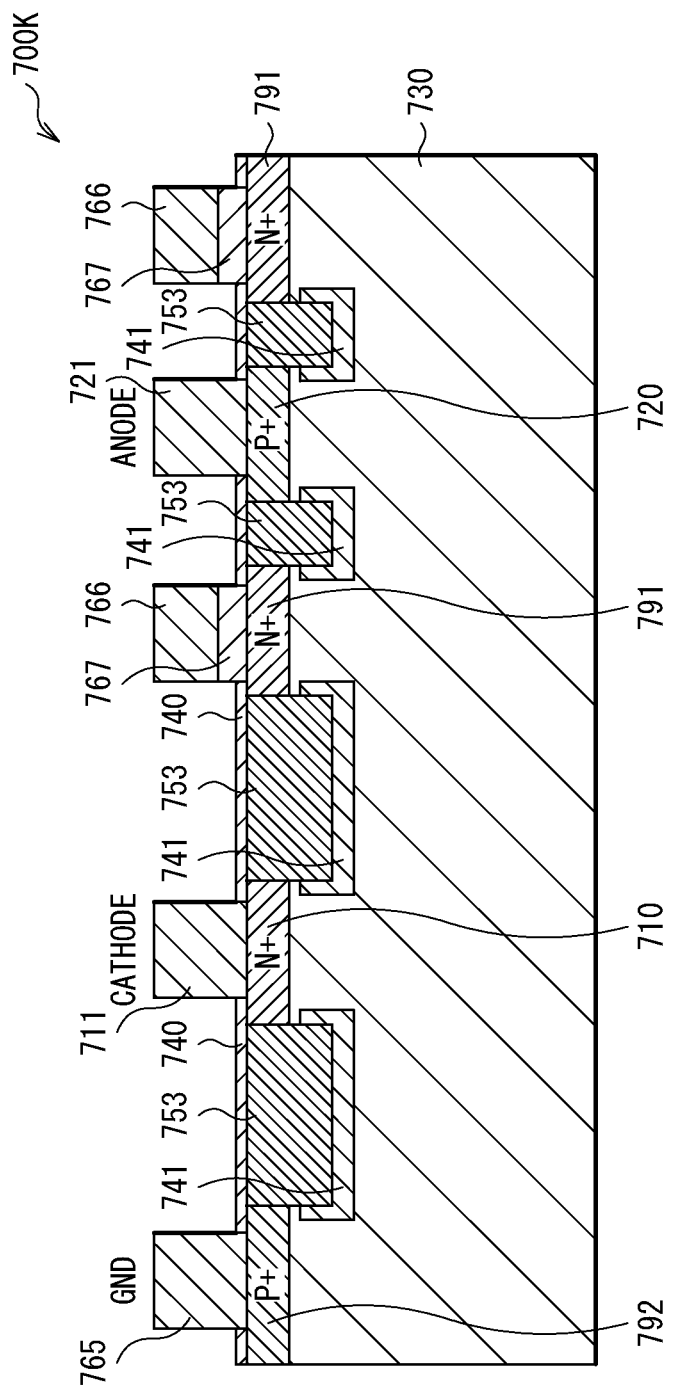

FIG. 90 is a vertical cross-sectional view of a structure of a photodetector 700K according to an eleventh structure example.

As illustrated in FIG. 90, the photodetector 700K includes the first region 710, a first electrode 711, the second region 720, a second electrode 721, the third region 730, a reset region 791, a reset electrode 766, a gate insulating film 767, a ground region 792, a ground electrode 765, an in-plane separation layer 753, and a pinning layer 741.

The first region 710, the first electrode 711, the second region 720, the second electrode 721, and the third region 730 have been described for the photodetector 700A according to the first structure example or the like and are not thus described here. It is to be noted that the photodetector 700K is provided with the first region 710, the first electrode 711, the second region 720, and the second electrode 721 on the same surface side of the semiconductor substrate.

The reset region 791 is a region (e.g., an N+ layer) of the first electrical conduction type. The reset electrode 766 is provided above the reset region 791 with the gate insulating film 767 interposed in between. The reset region 791 allows the electric charge remaining inside the third region 730 to be discharged to the outside of the third region 730 by voltage application from the reset electrode 766. The reset region 791 may be provided on both sides of the second region 720 or the reset region 791 may be provided to surround the periphery of the second region 720.

The ground region 792 is a region (e.g., a P+ layer) of the second electrical conduction type. The ground region 792 is electrically coupled to the ground electrode 765 and supplies the third region 730 with a ground potential. The ground region 792 may be provided to be isolated from the first region 710 and the second region 720.

The in-plane separation layers 753 are provided between the first region 710, the second region 720, the reset region 791, and the ground region 792 provided on the same surface side of the semiconductor substrate including the third region 730. Each of the in-plane separation layers 753 is formed by using an insulator such as silicon oxide ($SiO_x$), silicon nitride ($SiN_x$), silicon oxynitride (SiON), or a so-called low-k material. The in-plane separation layers 753 electrically separate the first region 710, the second region 720, the reset region 791, and the ground region 792 from each other. The in-plane separation layers 753 may be provided to extend to regions that are greater than the first region 710, the second region 720, the reset region 791, and the ground region 792 in formation depth.

In the photodetector 700K, the pinning layer 741 may be provided at the interface between the semiconductor substrate including the third region 730 and each of the in-plane separation layers 753 that are insulators. Specifically, the pinning layer 741 may be provided to cover the side surfaces and the bottom surface of each of the in-plane separation layers 753 buried in the semiconductor substrate.

According to the eleventh structure example, the photodetector 700K is able to suppress the occurrence of aliasing or dark currents and increase the electrical separation property between electrodes.

(Twelfth Structure Example)

FIG. 91 is a vertical cross-sectional view of a structure of a photodetector 700L according to a twelfth structure example.

As illustrated in FIG. 91, the photodetector 700L includes, for example, the first region 710, the second region 720, the third region 730, the first electrode 711, a via 712, a first surface insulating layer 751, a pixel separation layer 750, the second electrode 721, the control gate 761, and the gate insulating film 762.

The first region 710 is a region (e.g., an N+ layer) of the first electrical conduction type that is provided on a first surface side of a semiconductor substrate such as silicon (Si). The second region 720 is a region (e.g., a P+ layer) of the second electrical conduction type that is provided on a second surface side of a semiconductor substrate such as silicon (Si) opposite to the first surface. The third region 730 is a region (e.g., an i layer) of the third electrical conduction type that is provided between the first region 710 and the second region 720 of a semiconductor substrate such as silicon (Si).

The first electrode 711 is provided above the first surface of the semiconductor substrate with the first surface insulating layer 751 interposed in between. The first electrode 711 is electrically coupled to the first region 710 through the via 712 or the like that extends through the first surface insulating layer 751. The first electrode 711 functions, for example, as a cathode electrode. The first electrode 711 is provided, for example, across the pixel separation layer 750 along the boundary between pixels. The first electrode 711 is electrically coupled to the first region 710 of each of the pixels through the via 712 provided for each pixel.

The pixel separation layer 750 is provided to penetrate the semiconductor substrate in the thickness direction and electrically isolates a plurality of pixels provided in the in-plane direction of the semiconductor substrate from each other. The pixel separation layer 750 may be provided in a lattice along the boundary between the respective pixels arranged, for example, in a matrix in the in-plane direction of the semiconductor substrate.

The second electrode 721 is provided on the second surface of the semiconductor substrate opposite to the first surface. The second electrode 721 is electrically coupled to the second region 720. The second electrode 721 functions, for example, as an anode electrode.

The control gate 761 is a gate electrode provided above the second surface of the semiconductor substrate with the gate insulating film 762 interposed in between. The voltage application allows the control gate 761 to control a potential barrier in the third region 730.

The first electrode 711, the via 712, the second electrode 721, and the control gate 761 may be each provided by using, for example, metal such as aluminum (Al), copper (Cu), tungsten (W), titanium (Ti), or tantalum (Ta), polysilicon (poly-Si), or other electrically conductive materials. The first surface insulating layer 751, the pixel separation layer 750, and the gate insulating film 762 may be each provided by using an insulator such as silicon oxide ($SiO_x$), silicon nitride ($SiN_x$), silicon oxynitride (SiON), or a so-called low-k material.

In the photodetector 700L, the pinning layer 741 may be provided at the interface between the pixel separation layer 750 and the third region 730. Specifically, the pinning layer 741 may be provided to cover the side surfaces of the pixel separation layer 750.

According to the twelfth structure example, the photodetector 700L is able to suppress the occurrence of aliasing or dark currents even in a case where the photodetector 700L is provided to have a back-illuminated pixel array structure.

(Thirteenth Structure Example)

FIG. 92 is a vertical cross-sectional view of a structure of a photodetector 700M according to a thirteenth structure example. Each of FIGS. 93A and 93B is a top view of an example of a planar structure of the photodetector 700M according to the thirteenth structure example. The cross-sectional structure of the photodetector 700M illustrated in FIG. 92 corresponds to the cross-sectional structure taken along an A-AA cutting plane of each of FIGS. 93A and 93B.

As illustrated in FIGS. 92, 93A, and 93B, the thirteenth structure example corresponds to a structure in which the pinning layer 741 of the second electrical conduction type according to the first structure example is replaced with a pinning layer 742 having negative fixed electric charge or electrostatic property. The components other than the pinning layer 742 are not thus described in detail here. It is to be noted that the pinning layer 742 may be stacked on the semiconductor substrate as illustrated in FIG. 92 or may be buried inside the semiconductor substrate as illustrated in FIG. 96 described below.

The pinning layer 742 is a layer having negative fixed electric charge or a layer having a negative electrostatic property. It is possible to form the pinning layer 742 like this by using, for example, silicon oxide ($SiO_2$), silicon nitride (SiN), silicon oxynitride (SiON), hafnium oxide ($HfO_2$), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), a variety of resins, or the like. In addition, the pinning layer 742 may be formed as a multilayer film formed by stacking a plurality of the materials described above in combination. It is to be noted that the pinning layer 742 may be formed by using any other material as long as the material is an insulating material having negative fixed electric charge or a negative electrostatic property.

According to the thirteenth structure example, the photodetector 700M is able to suppress the occurrence of aliasing or dark currents.

(Fourteenth Structure Example)

FIG. 94 is a vertical cross-sectional view of a structure of a photodetector 700N according to a fourteenth structure example. Each of FIGS. 95A and 95B is a top view of an example of a planar structure of the photodetector 700N according to the fourteenth structure example. The cross-sectional structure of the photodetector 700N illustrated in FIG. 94 corresponds to the cross-sectional structure taken along an A-AA cutting plane of each of FIGS. 95A and 95B.

As illustrated in FIGS. 94 to 95B, the fourteenth structure example corresponds to a structure in which the pinning layer 741 of the second electrical conduction type according to the second structure example is replaced with the pinning layer 742 having negative fixed electric charge or electrostatic property that has been described in the thirteenth structure example. Each of the components is not thus described in detail here. It is to be noted that the pinning layer 742 may be stacked on the semiconductor substrate as illustrated in FIG. 94 or may be buried inside the semiconductor substrate as illustrated in FIG. 96 described below.

According to the fourteenth structure example, the photodetector 700N is able to further suppress the occurrence of aliasing or dark currents by the electrons generated at the interface between the semiconductor substrate and the insulating film 740.

(Fifteenth Structure Example)

FIG. 96 is a vertical cross-sectional view of a structure of a photodetector 700O according to a fifteenth structure example. Each of FIGS. 97A, 97B, 99A, and 99B is a plan view of an example of a region in which the pinning layer 742 is formed on the front surface side of a semiconductor layer including the third region 730. Each of FIGS. 98A, 98B, 100A, and 100B is a plan view of an example of a region in which the pinning layer 742 is formed at the interface between a semiconductor layer including the third region 730 and the buried insulating film 782. It is to be noted that the cross-sectional structure of the photodetector 700O illustrated in FIG. 96 corresponds to the cross-sectional structure taken along an A-AA cutting plane of each of FIGS. 97A to 100B.

As illustrated in FIGS. 96 to 100B, the fifteenth structure example corresponds to a structure in which the pinning layer 741 of the second electrical conduction type according to the third structure example is replaced with the pinning layer 742 having negative fixed electric charge or electrostatic property that has been described in the thirteenth structure example. Each of the components is not thus described in detail here. It is to be noted that the pinning layer 742 may be buried inside the semiconductor substrate as illustrated in FIG. 96 or may be stacked on the semiconductor substrate as illustrated in FIGS. 92 and 94 described above.

According to the fifteenth structure example, the photodetector 700O is able to suppress the occurrence of aliasing or dark currents even in a case where the substrate in which the photodetector 700O is formed is a SOI substrate.

(Sixteenth Structure Example)

FIG. 101 is a vertical cross-sectional view of a structure of a photodetector 700P according to a sixteenth structure example. Each of FIGS. 102A, 102B, 104A, and 104B is a plan view of an example of a region in which the pinning layer 742 is formed on the front surface side of an electric charge generation layer 783. Each of FIGS. 103A, 103B, 105A, and 105B is a plan view of an example of a region in which the pinning layer 742 is formed at the interface between a semiconductor layer including the third region 730 and the buried insulating film 782. It is to be noted that the cross-sectional structure of the photodetector 700P illustrated in FIG. 101 corresponds to the cross-sectional structure taken along an A-AA cutting plane of each of FIGS. 102A to 105B.

As illustrated in FIGS. 101 to 105B, the sixteenth structure example corresponds to a structure in which the pinning layer 741 of the second electrical conduction type according to the fourth structure example is replaced with the pinning layer 742 having negative fixed electric charge or electrostatic property that has been described in the thirteenth structure example. Each of the components is not thus described in detail here. It is to be noted that the pinning layer 742 may be buried inside the electric charge generation layer 783 as illustrated in FIG. 101 or may be stacked on the electric charge generation layer 783 as illustrated in FIGS. 92 and 94 described above.

According to the sixteenth structure example, the photodetector 700P allows the photoelectric conversion characteristics for incident light to increase.

(Seventeenth Structure Example)

FIG. 106 is a vertical cross-sectional view of a structure of a photodetector 700Q according to a seventeenth structure example.

As illustrated in FIG. 106, the seventeenth structure example corresponds to a structure in which the pinning layer 741 of the second electrical conduction type according to the eleventh structure example is replaced with the pinning layer 742 having negative fixed electric charge or electrostatic property that has been described in the thirteenth structure example. Each of the components is not thus described in detail here.

According to the seventeenth structure example, the photodetector 700Q is able to suppress the occurrence of aliasing or dark currents and increase the electrical separation property between electrodes.

(Eighteenth Structure Example)

FIG. 107 is a vertical cross-sectional view of a structure of a photodetector 700R according to an eighteenth structure example.

As illustrated in FIG. 107, the eighteenth structure example corresponds to a structure in which the pinning layer 741 of the second electrical conduction type according to the twelfth structure example is replaced with the pinning layer 742 having negative fixed electric charge or electrostatic property that has been described in the thirteenth structure example. Each of the components is not thus described in detail here.

According to the eighteenth structure example, the photodetector 700R is able to suppress the occurrence of aliasing or dark currents even in a case where the photodetector 700R is provided to have a back-illuminated pixel array structure.

6. Sixth Embodiment (Basic Structure)

Next, a basic structure of a photodetector according to a sixth embodiment of the present disclosure is described with reference to FIGS. 108A to 110. FIG. 108A is a plan view of a structure of a photodetector 800 according to the present embodiment from the second surface side. FIG. 108B is a vertical cross-sectional view of a structure of the photodetector 800 in an A-AA cutting plane of FIG. 108A. FIG. 108C is a vertical cross-sectional view of a structure of the photodetector 800 in a B-BB cutting plane of FIG. 108A. FIG. 109 is a plan view of an example of the disposition of a pixel transistor included in the pixel circuit included in the photodetector 800. FIG. 110 is a circuit diagram illustrating an example of an equivalent circuit of a pixel circuit included in the photodetector 800 that functions as a DPD sensor and PD.

As illustrated in FIGS. 108A to 108C, the photodetector 800 includes, for example, a first region 810, a second region 820, a third region 830, a first electrode 811, a second electrode 821, a control gate CG, a first electrical conduction type region 891, the transfer gate TRG, the floating diffusion FD, and an extraction electrode 893.

The first region 810 is a region (e.g., an N+ layer) of the first electrical conduction type that is provided on a first surface side of a semiconductor substrate such as silicon (Si). The second region 820 is a region (e.g., a P+ layer) of the second electrical conduction type that is provided on a second surface side of a semiconductor substrate such as silicon (Si) opposite to the first surface. The second region 820 may be provided in the shape of an island, for example, substantially in the middle of a rectangular pixel region. The third region 830 is a region (e.g., an N− layer) of the first electrical conduction type that is provided between the first region 810 and the second region 820 of a semiconductor substrate such as silicon (Si) and has a lower concentration of electrically conductive impurities than that of the first region 810.

The first electrode 811 is provided on the first surface of the semiconductor substrate. The first electrode 811 is electrically coupled to the first region 810. The first electrode 811 functions, for example, as a cathode electrode. The second electrode 821 is provided on the second surface of the semiconductor substrate opposite to the first surface. The second electrode 821 is electrically coupled to the second region 820. The second electrode 821 functions, for example, as an anode electrode.

The control gate CG is a gate electrode provided above the second surface of the semiconductor substrate with a gate insulating film (not illustrated) interposed in between. The voltage application allows the control gate CG to control a potential barrier in the third region 830. The control gates CG may be provided, for example, on both sides of the second region 820 in the first direction (i.e., the extending direction of an A-AA cutting plane in FIG. 108A) of a plane of the semiconductor substrate.

The first electrical conduction type region 891 is a region (e.g., an N layer) of the first electrical conduction type that is provided on the second surface side of the semiconductor substrate. The first electrical conduction type region 891 is provided, for example, to have a lower concentration of electrically conductive impurities than that of the first region 810 and have a higher concentration of electrically conductive impurities than that of the third region 830. The first electrical conduction type region 891 is provided to extend from the second region 820 in the second direction (i.e., the extending direction of a B-BB cutting plane in FIG. 108A) orthogonal to the first direction of a plane of the semiconductor substrate.

The floating diffusion FD is a region (e.g., a P++ layer) of the second electrical conduction type that has a higher concentration of electrically conductive impurities than that of the second region 820. The floating diffusion FD is provided on the second surface side of the semiconductor substrate. The floating diffusion FD may be provided on an end side of the first electrical conduction type region 891 extending from the second region 820 in the second direction.

The transfer gate TRG is a gate electrode provided above the second surface of the semiconductor substrate with a gate insulating film (not illustrated) interposed in between. The transfer gate TRG is provided between the second region 820 and the floating diffusion FD and transfers electric charge from the second region 820 to the floating diffusion FD by voltage application.

Here, the first electrical conduction type region 891 may be provided to the region below the transfer gate TRG and the region surrounding the region provided with the floating diffusion FD. This allows the first electrical conduction type region 891 to function as a channel that transfers electric charge from the second region 820 to the floating diffusion FD. In addition, the first electrical conduction type region 891 makes it possible to prevent the electric charge resulting from photoelectric conversion by the third region 830 from directly entering the floating diffusion FD.

The extraction electrode 893 is provided on the first surface of the semiconductor substrate and electrically coupled to the floating diffusion FD. The extraction electrode 893 is able to output the electric charge accumulated in the floating diffusion FD to the pixel circuit or the like.

The first electrode 811, the second electrode 821, the control gate CG, the transfer gate TRG, and the extraction electrode 893 may be each provided by using, for example, metal such as aluminum (Al), copper (Cu), tungsten (W), titanium (Ti), or tantalum (Ta), polysilicon (poly-Si), or other electrically conductive materials.

Thus, as illustrated in FIGS. 108A and 108B, the photodetector 800 includes the first region 810, the second region 820, the third region 830, the first electrode 811, the second electrode 821, and the control gate CG. This allows the photodetector 800 to function as a DPD (Dynamic Photo-Diode) sensor.

In addition, as illustrated in FIGS. 108A and 108C, the photodetector 800 includes, for example, the first region 810, the second region 820, the third region 830, the first electrode 811, the first electrical conduction type region 891, the transfer gate TRG, the floating diffusion FD, and the extraction electrode 893. This allows the photodetector 800 to function as normal PD (PhotoDiode).

Here, in a case where the photodetector 800 functions as normal PD, the electric charge extracted from the floating diffusion FD is subjected to signal processing by the pixel circuit to be converted to a pixel signal.

FIG. 110 illustrates an equivalent circuit diagram of a pixel circuit included in the photodetector 800. It is to be noted that DPD/PD in FIG. 110 indicates a photoelectric conversion section having a PIN diode structure of the first region 810, the third region 830, and the second region 820.

As illustrated in FIG. 110, the pixel circuit of a DPD sensor includes the photoelectric conversion section DPD and the switch transistor SW. In the pixel circuit of the DPD sensor, the photoelectric conversion section DPD is electrically coupled to the power supply Va through the switch transistor SW.

The pixel circuit of the PD includes the photoelectric conversion section PD, the transfer transistor TRG, the floating diffusion FD, the reset transistor RST, the amplifier transistor AMP, and the selection transistor SEL. In the pixel circuit of the PD, the photoelectric conversion section PD is electrically coupled to the floating diffusion FD through the transfer transistor TRG. In addition, the power supply Vd is coupled to the floating diffusion FD further through the reset transistor RST. In addition, the gate of the amplifier transistor AMP is coupled to the floating diffusion FD. The drain of the amplifier transistor AMP is coupled to the power supply Vd and the source of the amplifier transistor AMP is coupled to the external output Output through the selection transistor SEL. It is to be noted that the power supply Va on the DPD sensor side and the power supply Vd on the PD side may be different power supplies from each other or may be the same power supply.

The photodetector 800 includes such pixel circuits. This allows the photodetector 800 to function as both a DPD sensor and PD.

In addition, as illustrated in FIG. 109, at least any one or more of the pixel transistors included in the pixel circuit described above may be formed in the pixel transistor region Tr of the photodetector 800. Specifically, the reset transistor RST, the amplifier transistor AMP, the selection transistor SEL, or the switch transistor SW may be formed in the pixel transistor regions Tr provided at both ends of the pixel region in the first direction (i.e., the extending direction of the A-AA cutting plane in FIG. 108A).

For example, the reset transistor RST and the amplifier transistor AMP may be formed in the pixel transistor region Tr on one of the sides of the transfer gate TRG. In addition, the selection transistor SEL and the switch transistor SW may be formed in the pixel transistor region Tr on the other side of the transfer gate TRG.

(Operation Example)

Subsequently, an operation example of the photodetector 800 according to the present embodiment serving as a ToF (Time of Flight) sensor is described with reference to FIGS. 111 to 113C.

FIG. 111 is a timing chart diagram illustrating an example of a ToF sensor operation of the photodetector 800 according to the present embodiment. FIG. 112 is an explanatory diagram describing a light source used for the ToF sensor. FIG. 113A is a vertical cross-sectional view describing the state of the photodetector 800 at a timing of (1) in FIG. 111. FIG. 113B is a vertical cross-sectional view describing the state of the photodetector 800 at a timing of (2) in FIG. 111. FIG. 113C is a vertical cross-sectional view describing the state of the photodetector 800 at a timing of (3) in FIG. 111.

As illustrated in FIGS. 111 and 113A, first, positive voltage is applied to the voltage $V_{SW}$ to be applied to the gate of the switch transistor SW at a timing of (1) in FIG. 111 to turn on the switch transistor SW. Subsequently, it is assumed that the voltage Va to be applied to the second electrode 821 is negative voltage (e.g., −1 V). In this case, the voltage Vc to be applied to the first electrode 811 is 0 V. Reverse bias is thus applied between the first region 810 and the second region 820 of the photodetector 800. It is to be noted that the voltage $V_{con}$ to be applied to the control gate CG is set to negative voltage (e.g., −1 V).

Here, as illustrated in FIGS. 111, 112, and 113B, the pulsed negative voltage $V_{light}$ is applied to the light source LD such as a laser diode or LED (Light Emitting Diode) at a timing of (2) in FIG. 111 to irradiate a target with the pulsed light. At the same time, positive voltage (e.g., +1 V) is applied as the voltage Va to be applied to the second electrode 821 to apply forward bias between the first region 810 and the second region 820 of the photodetector 800. In addition, the voltage $V_{con}$ to be applied to the control gate CG is set to positive voltage (e.g., +1 V).

After that, the pulsed light reflected on the target enters the photodetector 800 and a current value outputted from the second electrode 821 increases with delay from a timing of (2). This allows the photodetector 800 to calculate the distance to the target by calculating the difference between the light emission timing $t_2$ of the light source LD and the delay time $t_1$ of the detection of light.

Further, as illustrated in FIGS. 111 and 113C, as the voltage Va to be applied to the second electrode 821 at a timing of (3) in FIG. 111, negative voltage (e.g., −1 V) is applied. This applies reverse bias between the first region 810 and the second region 820 of the photodetector 800. The state of the photodetector 800 is thus reset. It is to be noted that the voltage $V_{con}$ to be applied to the control gate CG may be similarly set to negative voltage (e.g., −1 V).

Repeating the operation described above with the time from (1) to (3) as one frame allows the photodetector 800 to detect the distance to a target for each of frames.

In contrast, application voltage $V_{TRG}$ to the gate of the transfer gate TRG and application voltage $V_{RST}$ to the gate of the reset transistor RST are 0 V throughout one frame. The transfer gate TRG and the reset transistor RST are a pixel circuit on the PD side. In addition, the voltage of the extraction electrode 893 electrically coupled to the floating diffusion FD does not change throughout one frame.

Further, an operation example of the photodetector 800 according to the present embodiment serving as PD is described with reference to FIGS. 114 to 115E.

FIG. 114 is a timing chart diagram illustrating an example of a PD operation of the photodetector 800 according to the present embodiment. FIG. 115A is a vertical cross-sectional view describing the state of the photodetector 800 at a timing of (1) in FIG. 114 and FIG. 115B is a vertical cross-sectional view describing the state of the photodetector 800 at a timing of (2) in FIG. 114. FIG. 115C is a vertical cross-sectional view describing the state of the photodetector 800 at a timing of (3) in FIG. 114 and FIG. 115D is a vertical cross-sectional view describing the state of the photodetector 800 at a timing of (4) in FIG. 114. FIG. 115E is a vertical cross-sectional view describing the state of the photodetector 800 at a timing of (5) in FIG. 114.

As illustrated in FIGS. 114 and 115A, first, the voltage $V_{SW}$ to be applied to the gate of the switch transistor SW at a timing of (1) in FIG. 114 is set to 0 V to turn off the switch transistor SW and the voltage Va to be applied to the second electrode 821 is set to 0 V. In addition, the pulsed voltage $V_{RST}$ (e.g., +1 V) is applied to the gate of the reset transistor RST to discharge the electric charge accumulated in the floating diffusion FD to the power supply Vd and reset the state of the floating diffusion FD.

After that, as illustrated in FIG. 115B, the pulsed voltage $V_{TRG}$ (e.g., −3 V) is applied to the gate of the transfer transistor TRG to transfer the electric charge present in the second region 820 to the floating diffusion FD and reset the state of the second region 820. This allows the photodetector 800 to begin to receive incident light at a timing of (2) in FIG. 114.

Subsequently, as illustrated in FIGS. 114 and 115C, the photodetector 800 photoelectrically converts light entering the third region 830 and accumulates the electric charge resulting from the photoelectric conversion in the second region 820.

After a predetermined time passes from a timing of (1) in FIG. 114, the pulsed voltage $V_{RST}$ (e.g., +1 V) is applied to the gate of the reset transistor RST at a timing of (4) in FIG. 114 as illustrated in FIGS. 114 and 115D to discharge the electric charge accumulated in the floating diffusion FD to the power supply Vd and reset the state of the floating diffusion FD.

As illustrated in FIG. 115E, the pulsed voltage $V_{TRG}$ (e.g., −3 V) is then applied to the gate of the transfer transistor TRG to transfer the electric charge accumulated in the second region 820 to the floating diffusion FD and read out signal charge from the extraction electrode 893. This causes the photodetector 800 to enter the same state as the state at a timing of (2) in FIG. 114 at a timing of (5) in FIG. 114. This makes it possible to begin to receive incident light again.

The operation described above is repeated with the time from (1) to (4) as one frame. This allows the photodetector 800 to convert the electric charge corresponding to the amount of received light to an electric signal for each of frames and output the electric signal as an image signal.

(Circuit Structure of Pixel Array)

Further, an example of a circuit configuration in which the photodetector 800 according to the present embodiment is configured as a pixel array in which a plurality of pixels arranged in a matrix is described with reference to FIG. 116. FIG. 116 is a block diagram illustrating a functional configuration in which the photodetector 800 according to the present embodiment is a pixel array.

As illustrated in FIG. 116, a DPD control circuit 801, a DPD signal detection circuit 803, a PD control circuit 802, and a PD signal detection circuit 804 are coupled to a photoelectric conversion section DPD/PD of each of the pixels.

The DPD control circuit 801 and the DPD signal detection circuit 803 of each of the pixels are coupled to a DPD horizontal control section 8210, a DPD signal processing section 8220, and a vertical control unit 8300. In addition, the PD control circuit 802 and the PD signal detection circuit 804 of each of the pixels are coupled to a PD horizontal control section 8110, a PD signal processing section 8120, and the vertical control unit 8300. In addition, each of the pixels is coupled to a DPD/PD switching control unit 8400 that switches the DPD operation or the PD operation of the photoelectric conversion section DPD/PD.

The DPD/PD switching control unit 8400 is coupled to the DPD horizontal control section 8210, the PD horizontal control section 8110, and each of the pixels. The DPD/PD switching control unit 8400 switches the DPD/PD operations of each of the pixels by outputting a DPD/PD switching signal.

It is to be noted that the DPD/PD operations may be switched collectively for all the pixels in accordance with an application such as imaging or distance measurement or may be switched for each predetermined pixel of the pixel array. In addition, the DPD/PD operations may be switched in a time division manner or for each of frames.

The vertical control unit 8300 is coupled to the DPD horizontal control section 8210 and the PD horizontal control section 8110. In a case where the photoelectric conversion section DPD/PD performs the DPD operation and the PD operation, the vertical control unit 8300 outputs readout signals to the DPD horizontal control section 8210 and the PD horizontal control section 8110 row by row.

In a case where the readout signals for each of the rows are inputted, the DPD horizontal control section 8210 reads out the DPD signals of the respective pixels column by column and outputs the DPD signals that have been read out to the DPD signal processing section 8220.

After performing signal processing on the inputted DPD signals, the DPD signal processing section 8220 outputs the DPD signals subjected to the signal processing as ToF data.

In a case where the readout signals for each of the rows are inputted, the PD horizontal control section 8110 reads out the PD signals of the respective pixels column by column and outputs the PD signals that have been read out to the PD signal processing section 8120.

After performing signal processing on the inputted PD signals, the PD signal processing section 8120 outputs the PD signals subjected to the signal processing as image data.

A ToF light source control unit 8500 is coupled to the vertical control unit 8300 and the DPD signal processing section 8220. The ToF light source control unit 8500 controls a light emission timing of the light source LD that emits light in the ToF operation. The ToF light source control unit 8500 may control the signal processing of a DPD signal or the readout of a DPD signal by outputting a timing signal of the light source LD for light emission to the vertical control unit 8300 and the DPD signal processing section 8220.

(Variations)

Subsequently, variations of the structure of the photodetector 800 according to the present embodiment are described with reference to FIGS. 117A to 127C.

(First Variation)

FIG. 117A is a plan view of a structure of a photodetector 800A according to a first variation from the second surface side. FIG. 117B is a vertical cross-sectional view of a structure of the photodetector 800A in an A-AA cutting plane of FIG. 117A. FIG. 117C is a vertical cross-sectional view of a structure of the photodetector 800A in a B-BB cutting plane of FIG. 117A.

As illustrated in FIGS. 117A to 117C, the photodetector 800A is different from the photodetector 800 described with reference to FIGS. 108A to 108C in that the photodetector 800A further includes a first electrical conduction type region 895, an overflow gate OFG, an overflow drain OFD, and a discharge electrode 897.

The first electrical conduction type region 895 is a region (e.g., an N layer) of the first electrical conduction type that is provided on the second surface side of the semiconductor substrate. The first electrical conduction type region 895 is provided, for example, to have a lower concentration of electrically conductive impurities than that of the first region 810 and have a higher concentration of electrically conductive impurities than that of the third region 830. The first electrical conduction type region 895 may be provided to extend from the second region 820 in the direction opposite to the extending direction of the first electrical conduction type region 891.

The overflow drain OFD is a region (e.g., a P++ layer) of the second electrical conduction type that has a higher concentration of electrically conductive impurities than that of the second region 820. The overflow drain OFD is provided on the second surface side of the semiconductor substrate. The overflow drain OFD may be provided on an end side of the first electrical conduction type region 895 extending from the second region 820.

The overflow gate OFG is a gate electrode provided above the second surface of the semiconductor substrate with a gate insulating film (not illustrated) interposed in between. The overflow gate OFG is provided between the second region 820 and the overflow drain OFD. The overflow gate OFG controls the discharge of electric charge from the second region 820 to the overflow drain OFD.

Here, the first electrical conduction type region 895 may be provided to the region below the overflow gate OFG and the region surrounding the region provided with the overflow drain OFD. This allows the first electrical conduction type region 895 to function as a channel that discharges electric charge from the second region 820 to the overflow gate OFG. In addition, the first electrical conduction type region 895 makes it possible to prevent the electric charge resulting from photoelectric conversion by the third region 830 from directly entering the overflow drain OFD.

The discharge electrode 897 is provided on the first surface of the semiconductor substrate and electrically coupled to the overflow drain OFD. The discharge electrode 897 is electrically coupled to the power supply. The discharge electrode 897 is able to further discharge the electric charge discharged to the overflow drain OFD to the power supply.

This allows the photodetector 800A to discharge the electric charge generated over the saturated amount of electric charge in the PD operation from the second region 820 to the overflow drain OFD. The electric charge discharged to the overflow drain OFD is further discharged to the power supply through the discharge electrode 897. This allows the photodetector 800A to suppress blooming from occurring in the PD operation.

According to the first variation, the photodetector 800A further includes the overflow gate OFG and the overflow drain OFD, thereby making it possible to suppress blooming in the PD operation.

(Second Variation)

FIG. 118A is a plan view of a structure of a photodetector 800B according to a second variation from the second surface side. FIG. 118B is a vertical cross-sectional view of a structure of the photodetector 800B in an A-AA cutting plane of FIG. 118A. FIG. 118C is a vertical cross-sectional view of a structure of the photodetector 800B in a B-BB cutting plane of FIG. 118A.

As illustrated in FIGS. 118A to 118C, the photodetector 800B is different from the photodetector 800 described with reference to FIGS. 108A to 108C in that the photodetector 800B further includes a pixel separation layer 850 that defines a pixel region.

The pixel separation layer 850 is provided to extend from the second surface side of the semiconductor substrate in the thickness direction of the semiconductor substrate to surround the outer periphery of a rectangular pixel region. The pixel separation layer 850 electrically separates adjacent pixels. The formation depth of the pixel separation layer 850 may be greater, for example, than the formation depth of the second region 820, the first electrical conduction type region 891, and the pixel transistor region Tr. The pixel separation layer 850 may be provided by using an insulator such as silicon oxide ($SiO_x$), silicon nitride ($SiN_x$), silicon oxynitride (SiON), or a so-called low-k material.

According to the second variation, the photodetector 800B is able to electrically separate adjacent pixels by the pixel separation layer 850. This makes it possible to suppress the crosstalk between the pixels.

(Third Variation)

FIG. 119A is a plan view of a structure of a photodetector 800C according to a third variation from the second surface side. FIG. 119B is a vertical cross-sectional view of a structure of the photodetector 800C in an A-AA cutting plane of FIG. 119A. FIG. 119C is a vertical cross-sectional view of a structure of the photodetector 800C in a B-BB cutting plane of FIG. 119A.

As illustrated in FIGS. 119A to 119C, the photodetector 800C is different from the photodetector 800B according to the second variation in that the photodetector 800C further includes the first electrical conduction type region 895, the overflow gate OFG, the overflow drain OFD, and the discharge electrode 897.

According to the third variation, the photodetector 800C further includes the overflow gate OFG and the overflow drain OFD, thereby making it possible to suppress blooming in the PD operation.

(Fourth Variation)

FIG. 120A is a plan view of a structure of a photodetector 800D according to a fourth variation from the second surface side. FIG. 120B is a vertical cross-sectional view of a structure of the photodetector 800D in an A-AA cutting plane of FIG. 120A. FIG. 120C is a vertical cross-sectional view of a structure of the photodetector 800D in a B-BB cutting plane of FIG. 120A.

As illustrated in FIGS. 120A to 120C, the photodetector 800D is different from the photodetector 800B described with reference to FIGS. 118A to 118C in that the photodetector 800D further includes a metal layer 852 inside the pixel separation layer 850.

The metal layer 852 is provided inside the pixel separation layer 850 by using metal having a light shielding property. Specifically, the metal layer 852 is provided to extend from the second surface side of the semiconductor substrate in the thickness direction of the semiconductor substrate. In addition, the side surfaces and the bottom surface of the metal layer 852 are covered with the pixel separation layer 850. The metal layer 852 has a light shielding property. This makes it possible to prevent light incident on the photodetector 800D from the oblique direction from entering adjacent the pixels. The metal layer 852 may be provided by using, for example, metal such as aluminum (Al), copper (Cu), tungsten (W), titanium (Ti), or tantalum (Ta) or alloy thereof.

According to the fourth variation, the metal layer 852 allows the photodetector 800D to prevent the entry of light between the pixels. It is thus possible to further suppress the crosstalk between the pixels.

(Fifth Variation)

FIG. 121A is a plan view of a structure of a photodetector 800E according to a fifth variation from the second surface side. FIG. 121B is a vertical cross-sectional view of a structure of the photodetector 800E in an A-AA cutting plane of FIG. 121A. FIG. 121C is a vertical cross-sectional view of a structure of the photodetector 800E in a B-BB cutting plane of FIG. 121A.

As illustrated in FIGS. 121A to 121C, the photodetector 800E is different from the photodetector 800D according to the fourth variation in that the first electrical conduction type region 895, the overflow gate OFG, the overflow drain OFD, and the discharge electrode 897 are further provided.

According to the fifth variation, the photodetector 800E further includes the overflow gate OFG and the overflow drain OFD, thereby making it possible to suppress blooming in the PD operation.

(Sixth Variation)

FIG. 122A is a plan view of a structure of a photodetector 800F according to a sixth variation from the second surface side. FIG. 122B is a vertical cross-sectional view of a structure of the photodetector 800F in an A-AA cutting plane of FIG. 122A. FIG. 122C is a vertical cross-sectional view of a structure of the photodetector 800F in a B-BB cutting plane of FIG. 122A.

As illustrated in FIGS. 122A to 122C, the photodetector 800F is different from the photodetector 800 described with reference to FIGS. 108A to 108C in that the control gate CG is provided to have a vertical gate structure.

Specifically, the control gate CG may include a dug electrode 865 and a gate insulating film 863. The dug electrode 865 may be provided to extend from the second surface side of the semiconductor substrate in the thickness direction of the semiconductor substrate and the side surfaces and the bottom surface of the dug electrode 865 may be provided with the gate insulating film 863. It is to be noted that the dug electrode 865 may be provided in the shape of a rectangle in the in-plane direction of the semiconductor substrate.

According to the sixth variation, the photodetector 800F makes it possible to further increase the controllability of a potential barrier generated in the region adjacent to the second region 820 in the DPD operation. It is thus possible to further increase the detection characteristics of incident light.

(Seventh Variation)

FIG. 123A is a plan view of a structure of a photodetector 800G according to a seventh variation from the second surface side. FIG. 123B is a vertical cross-sectional view of a structure of the photodetector 800G in an A-AA cutting plane of FIG. 123A. FIG. 123C is a vertical cross-sectional view of a structure of the photodetector 800G in a B-BB cutting plane of FIG. 123A.

As illustrated in FIGS. 123A to 123C, the photodetector 800G is different from the photodetector 800F according to the sixth variation in that the first electrical conduction type region 895, the overflow gate OFG, the overflow drain OFD, and the discharge electrode 897 are further provided.

According to the seventh variation, the photodetector 800G further includes the overflow gate OFG and the overflow drain OFD, thereby making it possible to suppress blooming in the PD operation.

(Eighth Variation)

FIG. 124A is a plan view of a structure of a photodetector 800H according to an eighth variation from the second surface side. FIG. 124B is a vertical cross-sectional view of a structure of the photodetector 800H in an A-AA cutting plane of FIG. 124A. FIG. 124C is a vertical cross-sectional view of a structure of the photodetector 800H in a B-BB cutting plane of FIG. 124A.

As illustrated in FIGS. 124A to 124C, the photodetector 800H includes, for example, the first region 810, the second region 820, the third region 830, the first electrode 811, a via 812, a first surface insulating layer 851, the pixel separation layer 850, the metal layer 852, the second electrode 821, a control gate 861, a gate insulating film 862, the pixel transistor region Tr, the first electrical conduction type region 891, a transfer gate 892, a gate insulating film 894, the floating diffusion FD, and the extraction electrode 893.

The first region 810 is a region (e.g., an N+ layer) of the first electrical conduction type that is provided on the first surface side of the semiconductor substrate. The second region 820 is a region (e.g., a P+ layer) of the second electrical conduction type that is provided on a second surface side of the semiconductor substrate opposite to the first surface. The third region 830 is a region (e.g., an i layer or an N− layer) of the third electrical conduction type that is provided between the first region 810 and the second region 820 of the semiconductor substrate.

The first electrode 811 is provided above the first surface of the semiconductor substrate with the first surface insulating layer 851 interposed in between. The first electrode 811 is electrically coupled to the first region 810 through the via 812 or the like that extends through the first surface insulating layer 851. The first electrode 811 functions, for example, as a cathode electrode. The first electrode 811 is provided across the pixel separation layer 850 provided on the boundary between pixels. The first electrode 811 is electrically coupled to the first region 810 of each of the pixels through the via 812 provided for each pixel. This allows the first electrode 811 to supply a common potential to the first region 810 of each of the pixels electrically isolated by the pixel separation layer 850.

The pixel separation layer 850 is provided to penetrate the semiconductor substrate in the thickness direction and electrically isolates a plurality of pixels provided in the in-plane direction of the semiconductor substrate from each other. The pixel separation layer 850 may be provided in a lattice along the boundary between the respective pixels arranged, for example, in a matrix in the in-plane direction of the semiconductor substrate.

The metal layer 852 is provided inside the pixel separation layer 850 by using metal having a light shielding property. Specifically, the metal layer 852 is provided to extend from the second surface side of the semiconductor substrate in the thickness direction of the semiconductor substrate. In addition, the side surfaces and the bottom surface of the metal layer 852 are covered with the pixel separation layer 850. The metal layer 852 makes it possible to prevent incident light from the oblique direction from entering adjacent the pixels. The metal layer 852 may be provided by using, for example, metal such as aluminum (Al), copper (Cu), tungsten (W), titanium (Ti), or tantalum (Ta) or alloy thereof.

The second electrode 821 is provided on the second surface of the semiconductor substrate opposite to the first surface. The second electrode 821 is electrically coupled to the second region 820. The second electrode 821 functions, for example, as an anode electrode.

The control gate 861 is a gate electrode provided above the second surface of the semiconductor substrate with the gate insulating film 862 interposed in between. The voltage application allows the control gate 861 to control a potential barrier in the third region 830.

The first electrical conduction type region 891 is a region (e.g., an N layer) of the first electrical conduction type that is provided on the second surface side of the semiconductor substrate. The first electrical conduction type region 891 is provided, for example, to have a lower concentration of electrically conductive impurities than that of the first region 810 and have a higher concentration of electrically conductive impurities than that of the third region 830. The first electrical conduction type region 891 is provided to extend from the second region 820 in one direction.

The floating diffusion FD is a region (e.g., a P++ layer) of the second electrical conduction type that has a higher concentration of electrically conductive impurities than that of the second region 820. The floating diffusion FD is provided on the second surface side of the semiconductor substrate. The floating diffusion FD may be provided inside the first electrical conduction type region 891 on an end side of the first electrical conduction type region 891 extending from the second region 820.

The transfer gate 892 is a gate electrode provided above the second surface of the semiconductor substrate with the gate insulating film 894 interposed in between. The transfer gate 892 is provided on the first electrical conduction type region 891 between the second region 820 and the floating diffusion FD and is able to transfer electric charge from the second region 820 to the floating diffusion FD by voltage application.

The extraction electrode 893 is provided on the first surface of the semiconductor substrate and electrically coupled to the floating diffusion FD. The extraction electrode 893 is able to output the electric charge accumulated in the floating diffusion FD to the pixel circuit or the like.

The pixel transistor region Tr is a region provided with at least any one or more of the pixel transistors included in the pixel circuit.

The first electrode 811, the via 812, the second electrode 821, the control gate 861, the transfer gate 892, and the extraction electrode 893 may be each provided by using, for example, metal such as aluminum (Al), copper (Cu), tungsten (W), titanium (Ti), or tantalum (Ta), polysilicon (poly-Si), or other electrically conductive materials. The first surface insulating layer 851, the pixel separation layer 850, and the gate insulating films 862 and 894 may be each provided by using an insulator such as silicon oxide ($SiO_x$), silicon nitride ($SiN_x$), silicon oxynitride (SiON), or a so-called low-k material.

According to the eighth variation, the photodetector 800H has a so-called back-illuminated structure. This allows the photodetector 800H to increase the detection efficiency of light. In addition, the photodetector 800H includes the pixel separation layer 850 and the metal layer 852. This makes it possible to increase the separation property between pixels and the optical crosstalk characteristics between pixels.

(Ninth Variation)

FIG. 125A is a plan view of a structure of a photodetector 800I according to a ninth variation from the second surface side. FIG. 125B is a vertical cross-sectional view of a structure of the photodetector 800I in an A-AA cutting plane of FIG. 125A. FIG. 125C is a vertical cross-sectional view of a structure of the photodetector 800I in a B-BB cutting plane of FIG. 125A.

As illustrated in FIGS. 125A to 125C, the photodetector 800I is different from the photodetector 800H according to the eighth variation in that the first electrical conduction type region 895, the overflow gate 896, a gate insulating film 898, the overflow drain OFD, and the discharge electrode 897 are further provided.

According to the ninth variation, the photodetector 800I further includes the overflow gate OFG and the overflow drain OFD, thereby making it possible to suppress blooming in the PD operation.

(Tenth Variation)

FIG. 126A is a plan view of a structure of a photodetector 800J according to a tenth variation from the second surface side. FIG. 126B is a vertical cross-sectional view of a structure of the photodetector 800J in an A-AA cutting plane of FIG. 126A. FIG. 126C is a vertical cross-sectional view of a structure of the photodetector 800J in a B-BB cutting plane of FIG. 126A.

As illustrated in FIGS. 126A to 126C, the photodetector 800J is different from the photodetector 800H according to the eighth variation in that the first region 810 is electrically coupled to a side wall electrode 853 provided inside the pixel separation layer 850 and only the first surface insulating layer 851 is provided on the first surface of the semiconductor substrate.

Specifically, the side wall electrode 853 is provided to be stepped in the thickness direction of the semiconductor substrate. The first region 810 is provided to have a rectangular shape that has one side open along the first surface of the semiconductor substrate and a side surface of the pixel separation layer 850. This allows the side wall electrode 853 to be electrically coupled to the first region 810 on the stepped bottom surface formed in the thickness direction of the semiconductor substrate.

According to the tenth variation, it is possible to electrically couple the photodetector 800J to the first region 810 even in a case where there is no electrode or no wiring line on the first surface of the semiconductor substrate. This makes it possible to further increase the aperture ratio. This allows the photodetector 800J to further increase the detection efficiency of light.

(Eleventh Variation)

FIG. 127A is a plan view of a structure of a photodetector 800K according to an eleventh variation from the second surface side. FIG. 127B is a vertical cross-sectional view of a structure of the photodetector 800K in an A-AA cutting plane of FIG. 127A. FIG. 127C is a vertical cross-sectional view of a structure of the photodetector 800K in a B-BB cutting plane of FIG. 127A.

As illustrated in FIGS. 127A to 127C, the photodetector 800K is different from the photodetector 800J according to the tenth variation in that the first electrical conduction type region 895, the overflow gate OFG, the overflow drain OFD, and the discharge electrode 897 are further provided.

According to the eleventh variation, the photodetector 800K further includes the overflow gate OFG and the overflow drain OFD, thereby making it possible to suppress blooming in the PD operation.

(Operation Example of Pixel Array)

Here, an operation example is described with reference to FIGS. 128 to 130 in which the photodetector 800 according to the present embodiment is configured as a pixel array in which a plurality of pixels is arranged in a matrix. FIG. 128 is a schematic diagram illustrating an example of a planar configuration of a pixel array in which a plurality of pixels is arranged in a matrix. FIG. 129 is a conceptual diagram describing the switching between the DPD operation and the PD operation of the photodetector 800 according to the present embodiment. FIG. 130 is a flowchart diagram illustrating an example of a flow of the switching between the DPD operation and the PD operation of the photodetector 800 according to the present embodiment.

As illustrated in FIG. 128, the photodetector 800 according to the present embodiment may include a ToF pixel $P_{ToF}$ and an imaging pixel $P_{img}$ in a pixel array. The ToF pixel $P_{ToF}$ acquires ToF information by the DPD operation. The imaging pixel $P_{img}$ acquires imaging information by the PD operation. For example, the ToF pixels $P_{ToF}$ may be periodically disposed in the pixel array with predetermined intervals in between.

In such a case, the ToF pixel $P_{ToF}$ and the imaging pixel $P_{img}$ may be made in the pixel array in advance as pixels having different functions. Alternatively, each of the pixels in the pixel array may be selectively switched between a pixel operating as the ToF pixel $P_{ToF}$ and a pixel operating as the imaging pixel $P_{img}$.

Alternatively, as illustrated in FIG. 129, each of the pixels in the pixel array of the photodetector 800 may be switchable to acquire imaging information and ToF information by switching and performing the DPD operation and the PD operation. For example, the photodetector 800 may acquire imaging information and ToF information by switching the respective operation modes of each of the pixels for each frame. Specifically, the photodetector 800 may acquire imaging information and ToF information by switching a frame for the DPD operation and a frame for the PD operation to perform sensing. In this case, the photodetector 800 may switch the operation modes of all the pixels collectively or selectively switch the operation modes of a specific pixel.

Subsequently, a flow of a specific operation is described with reference to FIG. 130 to cause the photodetector 800 to switch the DPD operation and the PD operation. FIG. 130 is a flowchart diagram describing an example of a flow of an operation of switching the DPD operation and the PD operation of the photodetector 800 according to the present embodiment. The photodetector 800 illustrated in FIG. 130 switches the DPD operation and the PD operation on the basis of whether the illuminance is high or low.

As illustrated in FIG. 130, a threshold is first set in advance for switching the DPD operation and the PD operation (S101). In the operation example illustrated in FIG. 130, the threshold is set for a parameter relating to illuminance.

Next, to perform the DPD operation, the photon count control circuit is controlled to be turned on (S102). Subsequently, after the state of the photodetector 800 is reset (S103), reverse bias is applied to the photodetector 800 and the bias is then inverted from reverse bias to forward bias (S104). This causes the photodetector 800 to detect an optical signal (S105).

Further, the number of output pulses is counted (S106) and the count value is outputted to the signal processing circuit (S107). After that, the signal processing circuit calculates the average of the counted values of the specific pixels (S108). Further, it is determined whether or not the calculated average of count values is greater than the threshold set in advance (S109). In a case where the calculated average of count values is less than or equal to the threshold (S109/No), the processing flow returns to S102. The photodetector 800 continuously executes the DPD operation.

In contrast, in a case where the calculated average of count values is greater than the threshold (S109/Yes), the processing flow moves to S301. The photon count control circuit is controlled to be turned off (S301). Further, to cause the photodetector 800 to perform the PD operation, an accumulation-type photodiode control circuit is controlled to be turned on (S201). Subsequently, after the state of the photodetector 800 is reset (S202), reverse bias is applied to the photodetector 800 (S203). This causes the electric charge resulting from photoelectric conversion by the photodetector 800 to be accumulated (S204). After that, the accumulated electric charge is transferred to the floating diffusion FD (S205) and an optical signal is outputted (S206).

Further, it is determined whether or not the output voltage of the outputted optical signal is less than the threshold (S207). In a case where the output voltage is greater than or equal to the threshold (S207/No), the processing flow returns to S201. The photodetector 800 continuously executes the PD operation. In contrast, in a case where the output voltage of the outputted optical signal is less than the threshold (S207/Yes), the processing flow moves to S302. The accumulation-type photodiode control circuit is controlled to be turned off (S302). Further, to cause the photodetector 800 to perform the DPD operation, a photon count control circuit is controlled to be turned on (S102).

According to the operation example of the flow described above, the photodetector 800 is able to count photons in the DPD operation in a case of low illuminance and perform imaging in the PD operation in a case of high illuminance. This allows the photodetector 800 to improve S/N by counting photons in the DPD operation in a case of low illuminance and to suppress power consumption by performing imaging in the accumulation-type PD operation in a case of high illuminance.

It is to be noted that a threshold for switching these DPD operation and accumulation-type PD operation may be set, for example, to a value at which prominent deterioration in S/N is observed in the accumulation-type PD operation. For example, the threshold for switching the DPD operation and the accumulation-type PD operation may be set to a value corresponding to about several hundred photons detected per frame. The photodetector 800 may be controlled to count photons in the PDP operation in a case where the number of detected photons is less than the threshold and to perform imaging in the accumulation-type PD operation in a case where the number of detected photons is greater than the threshold.

(Example of Application to Photon Count)

Subsequently, an example is described with reference to FIGS. 131 to 135 in which the photodetector 800 according to the present embodiment is applied to photon count.

First, an overview of a photon count operation by DPD is described with reference to FIGS. 131 and 132. FIG. 131 is a block diagram illustrating an overview of the photon count operation by DPD. FIG. 132 is a graphical chart illustrating the relationship between a photon entering the DPD and a detected signal.

As illustrated in FIGS. 131 and 132, first, light obtained by reflecting illumination light on a target is received by an optical receiver in the photon count operation by DPD. The received light serves as a received optical pulse by being converted to an electric signal by an optical receiver such as DPD. The counter circuit then counts the received light pulses, thereby making it possible to generate a counter signal corresponding to the number of received light pulses. The counter signal is information having the intensity corresponding to the number of photons. After that, the image processing circuit is able to acquire image information by performing signal processing on the generated counter signal.

In addition, an example of a photon count operation is described with reference to FIGS. 133 to 134C in which the photodetector 800 according to the present embodiment is configured as DPD that is able to detect one incident photon.

FIG. 133 is a timing chart diagram illustrating an example of the photon count operation of the photodetector 800 according to the present embodiment. FIG. 134A is a vertical cross-sectional view describing the state of the photodetector 800 at a timing of (1) in FIG. 133. FIG. 134B is a vertical cross-sectional view describing the state of the photodetector 800 at a timing of (2) in FIG. 133. FIG. 134C is a vertical cross-sectional view describing the state of the photodetector 800 at a timing of (3) in FIG. 133.

As illustrated in FIGS. 133 and 134A, first, positive voltage is applied to the voltage $V_{SW}$ to be applied to the gate of the switch transistor SW at a timing of (1) in FIG. 133 to turn on the switch transistor SW. Subsequently, it is assumed that the voltage Va to be applied to the second electrode 821 is negative voltage (e.g., −1 V). In this case, the voltage Vc to be applied to the first electrode 811 is 0 V. Reverse bias is thus applied between the first region 810 and the second region 820 of the photodetector 800. It is to be noted that the voltage $V_{con}$ to be applied to the control gate CG is set to negative voltage (e.g., −1 V).

Here, as illustrated in FIGS. 133 and 134B, positive voltage (e.g., +1 V) is applied as the voltage Va to be applied to the second electrode 821 at a timing of (2) in FIG. 133 to apply forward bias between the first region 810 and the second region 820 of the photodetector 800. In addition, the voltage $V_{con}$ to be applied to the control gate CG is set to positive voltage (e.g., +1 V).

In a case where a photon then enters the photodetector 800, a current pulse is outputted to the second electrode 821 through photoelectric conversion by the third region 830. A waveform detector thus detects the outputted current pulse to allow a counter to measure the incident photon. This allows the photodetector 800 to detect one incident photon in the photon count operation by the DPD.

Further, as illustrated in FIGS. 133 and 134C, as the voltage Va to be applied to the second electrode 821 at a timing of (3) in FIG. 133, negative voltage (e.g., −1 V) is applied. This applies reverse bias between the first region 810 and the second region 820 of the photodetector 800. The state of the photodetector 800 is thus reset. It is to be noted that the voltage $V_{con}$ to be applied to the control gate CG may be similarly set to negative voltage (e.g., −1 V).

The operation described above is repeated with the time from (1) to (3) as a count period. This allows the photodetector 800 to perform a photon count operation by DPD.

(Circuit Structure of Pixel Array that Performs Photon Count Operation)

Further, an example of a circuit configuration of a pixel array that executes a photon count operation in the photodetector 800 according to the present embodiment is described with reference to FIG. 135. FIG. 135 is a block diagram illustrating a functional configuration in which the photodetector 800 according to the present embodiment is applied to a pixel array that executes the photon count operation.

As illustrated in FIG. 135, the DPD control circuit 801, the DPD signal detection circuit 803, the PD control circuit 802, the PD signal detection circuit 804, and a counter circuit 805 are coupled to the photoelectric conversion section DPD/PD of each pixel.

The DPD control circuit 801, the DPD signal detection circuit 803, and the counter circuit 805 of each of the pixels are coupled to the DPD horizontal control section 8210, the DPD signal processing section 8220, and the vertical control unit 8300. In addition, the PD control circuit 802 and the PD signal detection circuit 804 of each of the pixels are coupled to a PD horizontal control section 8110, a PD signal processing section 8120, and the vertical control unit 8300. In addition, each of the pixels is coupled to a DPD/PD switching control unit 8400 that switches the DPD operation or the PD operation of the photoelectric conversion section DPD/PD.

The DPD/PD switching control unit 8400 is coupled to the DPD horizontal control section 8210, the PD horizontal control section 8110, and each of the pixels. The DPD/PD switching control unit 8400 switches the DPD/PD operations of each of the pixels by outputting a DPD/PD switching signal.

It is to be noted that the DPD/PD operations may be switched collectively for all the pixels in accordance with an application or may be switched for each predetermined pixel of the pixel array. In addition, the DPD/PD operations may be switched in a time division manner or for each of frames.

The vertical control unit 8300 is coupled to the DPD horizontal control section 8210 and the PD horizontal control section 8110. In a case where the photoelectric conversion section DPD/PD performs the DPD operation and the PD operation, the vertical control unit 8300 outputs readout signals to the DPD horizontal control section 8210 and the PD horizontal control section 8110 row by row.

In a case where the readout signals for each of the rows are inputted, the DPD horizontal control section 8210 reads out the DPD signals of the respective pixels column by column and outputs the DPD signals that have been read out to the DPD signal processing section 8220.

After performing signal processing on the inputted DPD signals, the DPD signal processing section 8220 outputs the DPD signals subjected to the signal processing as photon count data.

In a case where the readout signals for each of the rows are inputted, the PD horizontal control section 8110 reads out the PD signals of the respective pixels column by column and outputs the PD signals that have been read out to the PD signal processing section 8120.

After performing signal processing on the inputted PD signals, the PD signal processing section 8120 outputs the PD signals subjected to the signal processing as image data.

As described above, the photodetector 800 according to the present embodiment is also usable as a photon counter that uses the DPD operation in addition to an image sensor that uses the PD operation and a ToF sensor that uses the DPD operation.

7. Seventh Embodiment (Basic Structure)

Subsequently, a basic structure of a photodetector according to a seventh embodiment of the present disclosure is described with reference to FIGS. 136 to 140. FIG. 136 is a vertical cross-sectional view of a structure of a photodetector 900 according to the present embodiment. FIG. 137 is a graphical chart describing various time responses of a current outputted from the photodetector 900. FIG. 138 is a graphical chart illustrating a linearity deviation for the various time responses illustrated in FIG. 137. FIG. 139 is a plan view of a pixel array configuration of the photodetector 900 according to the present embodiment. FIG. 140 is a graphical chart illustrating the relationship between an output of a normal pixel NP and an output of a reference pixel OBP in the pixel array illustrated in FIG. 139.

As illustrated in FIG. 136, the photodetector 900 includes, for example, a first region 910, a second region 920, a third region 930, a control gate 963, and a gate insulating film 964.

The first region 910 is a region (e.g., an N+ layer) of the first electrical conduction type that is provided on a first surface side of a semiconductor substrate such as silicon (Si). The second region 920 is a region (e.g., a P+ layer) of the second electrical conduction type that is provided on a second surface side of a semiconductor substrate such as silicon (Si) opposite to the first surface. The third region 930 is a region (e.g., an i layer) of the third electrical conduction type that is provided between the first region 910 and the second region 920 of a semiconductor substrate such as silicon (Si).

The first region 910 is electrically coupled, for example, to a first electrode (not illustrated) provided on the first surface of the semiconductor substrate. The first electrode functions, for example, as a cathode electrode. In addition, the second region 920 is electrically coupled to a second electrode (not illustrated) provided on the second surface of the semiconductor substrate. The second electrode functions, for example, as an anode electrode.

The control gate 963 is a gate electrode provided above the second surface of the semiconductor substrate with the gate insulating film 964 interposed in between. The voltage application allows the control gate 963 to control a potential barrier in the third region 930.

The photodetector 900 outputs the magnitude of the amount of incident light as the magnitude of delay of the rise time of a forward current in a case where the polarity of bias is inverted from reverse bias to forward bias. However, in a case where the photodetector 900 is configured as a pixel array in which a plurality of pixels is arranged, a local temperature change in the pixel array or a difference in profile between the respective pixels may vary the relationship between the amount of incident light and the delay characteristics of a forward current in the respective pixels.

Specifically, as illustrated in FIG. 137, the rise time of a forward current after the polarity of bias is inverted from reverse bias to forward bias may vary between the respective pixels in the pixel array. In such a case, as illustrated in FIG. 138, some pixels may have a linearity deviation between the amount of incident light and the delay time of a rising forward current. In addition, the respective pixels may have different offsets in the relationship between the amount of incident light and the delay time of a rising forward current.

As illustrated in FIG. 139, the reference pixels OBP are provided to be adjacent to the normal pixels NP in the pixel array in the photodetector 900 according to the present embodiment. Each of the normal pixels NP is a pixel that photoelectrically converts incident light and emits an output corresponding to the incident light. Each of the reference pixels OBP is a pixel that is provided with a light shielding section on the incidence surface of incident light and emits an output independent of the incident light. The light shielding section blocks the incident light. The reference pixel OBP is also referred to as optical black (Optical Black) pixel.

As illustrated in FIG. 140, the photodetector 900 is able to detect delay of the rise time of a forward current corresponding to the amount of incident light with higher accuracy by calculating delay of the rise time of a forward current in the normal pixel NP on the basis of the rise time of a forward current in the reference pixel OBP. Further, the photodetector 900 according to the present embodiment is provided with the reference pixel OBP adjacent to the normal pixel NP. This makes it possible to further suppress the influence of variations due to a local temperature change in the pixel array, a difference in profile between the respective pixels, or the like. For example, the reference pixels OBP may be provided along the outer edge of the normal pixels NP arranged in a matrix as illustrated in FIG. 139.

The photodetector 900 according to the present embodiment thus makes it possible to suppress variations of outputs of the respective pixels in the pixel array in which the plurality of pixels is arranged. It is thus possible to detect the amount of incident light with higher accuracy.

(Variations)

Subsequently, variations of the structure of the photodetector 900 according to the present embodiment are described with reference to FIGS. 141 to 149.

(First Variation)

FIG. 141 is a schematic plan view describing a first variation of the planar disposition of the normal pixel NP and the reference pixel OBP. FIG. 142 is a vertical cross-sectional view of a cross-sectional configuration taken along an A-AA cutting plane of FIG. 141.

As illustrated in FIG. 141, the normal pixels NP and the reference pixels OBP may be arranged in a pixel array in a checker pattern (a checker flag pattern). Specifically, the normal pixels NP and the reference pixels OBP may be alternately disposed in both the row direction and the column direction of a matrix arrangement.

In such a case, as illustrated in FIG. 142, the normal pixels NP and the reference pixels OBP adjacent to each other are electrically separated from each other by a pixel separation layer 950 including an insulator and each include the first region 910, the second region 920, and the third region 930 similarly. However, each of the reference pixels OBP is provided, for example, with a light shielding section BM including metal or the like on the incidence surface side of the first region 910. This blocks light entering the third region 930 and allows the reference pixel OBP to emit an output independent of the incident light.

Outputs from the normal pixel NP and the reference pixel OBP are inputted to an output circuit Out. The output circuit Out is able to detect delay of the rise time of a forward current in the normal pixel NP with higher accuracy on the basis of the rise time of a forward current in the adjacent reference pixel OBP.

According to the first variation, the normal pixels NP and the reference pixels OBP are alternately disposed in the pixel array. This makes it possible to further suppress the influence of variations in the pixel array in the in-plane direction.

(Second Variation)

FIG. 143 is a schematic plan view describing a second variation of the planar disposition of the normal pixel NP and the reference pixel OBP. FIG. 144 is a vertical cross-sectional view of a cross-sectional configuration taken along a B-BB cutting plane of FIG. 143.

As illustrated in FIG. 143, the normal pixels NP and the reference pixels OBP may be provided in the pixel array to be different in planar area. Specifically, each of the reference pixels OBP may be provided to have smaller planar area than that of each of the normal pixels NP.

For example, the normal pixels NP and the reference pixels OBP may be continuously arranged in a first direction (the column direction in FIG. 143) of the matrix arrangement. The normal pixels NP and the reference pixels OBP may be alternately arranged in a second direction (the row direction in FIG. 143) orthogonal to the first direction of the matrix arrangement. In this case, the reference pixels OBP may be provided to be smaller than the normal pixels NP in width in the second direction (the row direction in FIG. 143) to be provided to have smaller planar area than that of the normal pixels NP.

In such a case, as illustrated in FIG. 144, the normal pixels NP and the reference pixels OBP adjacent to each other are electrically separated from each other by a pixel separation layer 950 including an insulator and each include the first region 910, the second regions 920 (second regions 920N and 920B), and the third region 930 similarly. In addition, each of the reference pixels OBP further includes the light shielding section BM including metal or the like on the incidence surface side of the first region 910.

Here, the second region 920N of the normal pixel NP and the second region 920B of the reference pixel OBP are provided to have the same size. The size of the second regions 920N and 920B from which outputs are extracted to the output circuit Out is the main factor for determining the rise time of a forward current. The second regions 920N and 920B in the same size therefore allows the normal pixels NP and the reference pixels OBP to have an equalized reference for the rise time of a forward current. This allows the output circuit Out to detect delay of the rise time of a forward current in the normal pixel NP on the basis of the rise time of a forward current in the reference pixel OBP.

According to the second variation, the reference pixel OBP including the light shielding section BM has smaller planar area than the planar area of the normal pixel NP in the pixel array. This makes it possible to increase the aperture ratio of the pixel array.

(Third Variation)

FIG. 145 is a schematic plan view describing a third variation of the planar disposition of the normal pixel NP and the reference pixel OBP. FIG. 146 is a vertical cross-sectional view of a cross-sectional configuration taken along a C-CC cutting plane of FIG. 145.

As illustrated in FIG. 145, the reference pixel OBP may be provided for the plurality of normal pixels NP in the pixel array. For example, the one reference pixel OBP may be periodically provided for the three normal pixels NP.

In such a case, as illustrated in FIG. 146, the normal pixels NP and the reference pixels OBP adjacent to each other are electrically separated from each other by a pixel separation layer 950 including an insulator and each include the first region 910, the second region 920, and the third region 930. In addition, each of the reference pixels OBP further includes, for example, the light shielding section BM including metal or the like on the incidence surface side of the first region 910. This blocks light entering the third region 930 and allows the reference pixel OBP to emit an output independent of the incident light.

According to the third variation, it is possible to decrease the proportion of the reference pixels OBP each including the light shielding section BM to the normal pixels NP in the pixel array. This makes it possible to increase the aperture ratio of the pixel array. Even in such a case, the photodetector 900 is able to sufficiently suppress the influence due to variations in the pixel array in the in-plane direction.

(Fourth Variation)

FIG. 147 is a schematic plan view describing a fourth variation of the planar disposition of the normal pixel NP and the reference pixel OBP.

As illustrated in FIG. 147, the reference pixels OBP may be periodically provided in a pixel array in which the normal pixels NP are arranged in a matrix. For example, the one reference pixel OBP may be periodically provided for a pixel group of eight rows×eight columns.

In such a case, the proportion decreases of the reference pixels OBP to the normal pixels NP. It is therefore desirable that the photodetector 900 in operation monitor the rise time of a forward current from each of the reference pixels OBP. The photodetector 900 may, for example, compensate for or correct an output from the reference pixel OBP on the basis of a result of the monitoring or issue an alert on the basis of a predetermined criterion.

According to the fourth variation, it is possible to decrease the proportion of the reference pixels OBP each including the light shielding section BM to the normal pixels NP in the pixel array. This makes it possible to increase the aperture ratio of the pixel array. Even in such a case, the photodetector 900 is able to sufficiently suppress the influence due to variations in the pixel array in the in-plane direction.

(Fifth Variation)

FIG. 148 is a vertical cross-sectional view of a fifth variation of a cross-sectional configuration of the normal pixel NP and the reference pixel OBP. FIG. 149 is a graphical chart illustrating the relationship between aperture area of the reference pixel OBP and the delay time of a rising forward current.

As illustrated in FIG. 148, the respective reference pixels OBP provided in the pixel array may be provided to include the light shielding sections BM that are different in area from each other. The light shielding sections BM are each provided on the incidence surface of light. For example, light shielding sections BM1, BM2, BM3, BM4, BM5, and BM6 may be provided in a plurality of reference pixels OBP1, OBP2, OBP3, OBP4, OBP5, and OBP6 to have smaller area in this order.

In such a case, as illustrated in FIG. 149, it is possible to create a calibration curve for the photodetector 900. The calibration curve indicates the relationship between a change in aperture area by the light shielding section BM and the delay time of a rising forward current. The photodetector 900 is thus able to confirm the delay time of a rising forward current in a case of one incident photon, a dynamic lens for measurement, or the like in a simple manner by creating the calibration curve for each amount of incident light.

(Circuit Structure of Pixel Array)

Further, first to fourth circuit configurations are described with reference to FIGS. 150 to 153 in which the photodetector 900 according to the present embodiment is configured as a pixel array in which a plurality of pixels is arranged in a matrix.

(First Circuit Configuration)

FIG. 150 is a block diagram illustrating the first circuit configuration in which the photodetector 900 according to the present embodiment is a pixel array.

As illustrated in FIG. 150, the normal pixel NP and the reference pixel OBP each include the photoelectric conversion section DPD/PD, a drive circuit 901, a waveform detection section 902, and a counter 903. The electric charge or current outputted from the photoelectric conversion section DPD/PD is detected by the waveform detection section 902 and then measured by the counter 903. In addition, the drive circuit 901 controls the driving of the photoelectric conversion section DPD/PD on the basis of the electric charge or current detected by the waveform detection section 902.

The respective outputs of the normal pixel NP and the reference pixel OBP are read out under the control of a vertical control unit 9300 and a horizontal control unit 9010. The outputs that have been read out are subjected to signal processing by a signal processing unit 9020 and then outputted as image outputs. As described in the first circuit configuration, the reference pixel OBP may be disposed on the outer edge section of the normal pixel NP.

(Second Circuit Configuration)

FIG. 151 is a block diagram illustrating the second circuit configuration in which the photodetector 900 according to the present embodiment is a pixel array.

As illustrated in FIG. 151, the normal pixel NP and the reference pixel OBP each include the photoelectric conversion section DPD/PD, the drive circuit 901, the waveform detection section 902, and the counter 903. The electric charge or current outputted from the photoelectric conversion section DPD/PD is detected by the waveform detection section 902 and then measured by the counter 903. In addition, the drive circuit 901 controls the driving of the photoelectric conversion section DPD/PD on the basis of the electric charge or current detected by the waveform detection section 902.

The respective outputs of the normal pixel NP and the reference pixel OBP are read out under the control of a vertical control unit 9300 and a horizontal control unit 9010. The outputs that have been read out are subjected to signal processing by a signal processing unit 9020 and then outputted as image outputs. As described in the second circuit configuration, the reference pixel OBP may be disposed inside the pixel array of the normal pixels NP.

(Third Circuit Configuration)

FIG. 152 is a block diagram illustrating the third circuit configuration in which the photodetector 900 according to the present embodiment is a pixel array.

As illustrated in FIG. 152, the photodetector 900 may be configured as a pixel array in which the normal pixel NP and the reference pixel OBP are associated one by one.

The normal pixel NP and the reference pixel OBP each include the photoelectric conversion section DPD/PD, the drive circuit 901, and the waveform detection section 902. In addition, each pair of the normal pixel NP and the reference pixel OBP includes the one counter 903. The counter 903 measures incident photons on the basis of a result of detection by the respective waveform detection sections 902 of the normal pixel NP and the reference pixel OBP.

The respective outputs of the normal pixel NP and the reference pixel OBP are read out for each pair of the normal pixel NP and the reference pixel OBP under the control of the vertical control unit 9300 and the horizontal control unit 9010. The outputs that have been read out are subjected to signal processing by a signal processing unit 9020 and then outputted as image outputs.

As described in the third circuit configuration, the normal pixel NP and the reference pixel OBP are provided to be associated one by one. This allows the photodetector 900 to further increase the accuracy of an output from each of the normal pixels NP.

(Fourth Circuit Configuration)

FIG. 153 is a block diagram illustrating the fourth circuit configuration in which the photodetector 900 according to the present embodiment is a pixel array.

As illustrated in FIG. 153, the photodetector 900 may further include the light source LD and a ToF light source control unit 9500. The photodetector 900 may be operable as a ToF sensor.

Specifically, the ToF light source control unit 9500 is coupled to the vertical control unit 9300 and the signal processing section 9020. The ToF light source control unit 9500 controls a light emission timing of the light source LD in the ToF operation. The signal processing unit 9020 is able to calculate the time of flight of light reflected on a target and make a ToF output on the basis of a light emission timing of the light source LD and the delay time of an output from the normal pixel NP. This also allows the photodetector 900 to operate as a ToF sensor.

8. Application Examples

The following describes an application example of the photodetector according to any of the first to seventh embodiments described above with reference to FIGS. 154 to 162.

(Stacked Configuration Example)

The photodetector described above may be provided to have the stacked structure illustrated in FIG. 154. Specifically, as illustrated in FIG. 154, the photodetector may be provided to have a structure in which a light receiving chip 1100 and a logic chip 1200 are stacked. The light receiving chip 1100 receives incident light and performs photoelectric conversion. The logic chip 1200 performs arithmetic processing on an output from the light receiving chip 1100. The chips of the light receiving chip 1100 and the logic chip 1200 may be electrically coupled by TSV (Through-Silicon Via), a so-called CuCu junction, or the like.

The photodetector described above is applicable to a solid-state imaging element. A solid-state imaging element 1 in which the photodetector described above is used may be provided to have the substrate configuration of any of A to C in FIG. 155.

A of FIG. 155 illustrates an example in which the solid-state imaging element 1 includes one semiconductor substrate 1110 and a support substrate 1210 that is stacked under the semiconductor substrate 1110.

In this case, in the upper semiconductor substrate 1110, a pixel array region 1151 in which a plurality of pixels is arranged, a control circuit 1152 that controls the respective pixels in the pixel array region 1151, and a logic circuit 1153 including a signal processing circuit of pixel signals are formed.

The control circuit 1152 includes a vertical control unit, a horizontal control unit, and the like. The logic circuit 1153 includes a column processing unit and a signal processing unit. The column processing unit performs an AD conversion process or the like on a pixel signal. The signal processing unit performs a distance calculation process of calculating distance from the ratio of pixel signals outputted from the respective pixels in the pixel array region 1151, a calibration process, and the like.

Alternatively, as illustrated in B of FIG. 155, it is possible to configure the solid-state imaging element 1 in which a first semiconductor substrate 1120 in which the pixel array region 1151 and the control circuit 1152 are formed and a second semiconductor substrate 1220 in which the logic circuit 1153 is formed are stacked. It is to be noted that the first semiconductor substrate 1120 and the second semiconductor substrate 1220 are electrically coupled, for example, by a through via or a Cu—Cu metallic bond.

Alternatively, it is also possible for the solid-state imaging element 1 to have a configuration in which a first semiconductor substrate 1130 and a second semiconductor substrate 1230 are stacked as illustrated in C of FIG. 155. The first semiconductor substrate 1130 is provided with only the pixel array region 1151. The second semiconductor substrate 1230 is provided with an area control circuit 1154 provided with a control circuit and a signal processing circuit for each of the pixels or provided with a control circuit and a signal processing circuit on the basis of the area of a plurality of pixels. The control circuit controls each pixel. The signal processing circuit processes a pixel signal. The first semiconductor substrate 1130 and the second semiconductor substrate 1230 are electrically coupled, for example, by a through via or a Cu—Cu metallic bond.

As with the solid-state imaging element 1 in C of FIG. 155, a configuration in which a control circuit and a signal processing circuit are provided for each of the pixels or provided on an area basis allows the solid-state imaging element 1 to set the optimum drive timing and gain for each divided control unit. It is thus possible to acquire the optimized distance information in spite of distance or reflectance. In addition, the solid-state imaging element 1 is also able to calculate the distance information by driving only a portion of the pixel array region 1151 rather than the whole of the pixel array region 1151. This also makes it possible to suppress power consumption in accordance with an operation mode.

(Planar Layout)

As illustrated in FIG. 156, the light receiving chip 1100 of the photodetector may include the pixel array region 1151 including light receiving elements 30 having planar matrix disposition corresponding to the pixels.

As illustrated in FIG. 157, the logic chip 1200 may include a pixel circuit region 1261 provided in association with the pixel array region 1151. The pixel circuit region 1261 is provided with pixel circuits 1270 having planar matrix disposition for the respective pixels. The pixel circuits 1270 control the respective pixels included in the pixel array region 1151. Each of the pixel circuits 1270 is driven and controlled by a vertical control unit 1262 and a horizontal control unit 1263 provided around the pixel circuit region 1261. Pixel signals read out from each of the pixel circuits 1270 are outputted to the outside as image data by being subjected to signal processing by a signal processing unit 1264.

In addition, the photodetector described above may be provided to have the circuit configuration illustrated in FIG. 158.

Specifically, each of the pixels in the pixel array includes, for example, the light receiving element 30 operable as DPD, a drive circuit 1271, a waveform detection section 1272, and a counter 1273.

The electric charge or current outputted from the light receiving element 30 is detected by the waveform detection section 1272 and then measured by the counter 1273. The counter 1273 has, for example, a function of detecting the "current rise time" for a ToF application and a function of detecting "how many times a current rises" for a photon count application. In addition, the drive circuit 1271 may control the driving of the light receiving element 30 on the basis of the electric charge or current detected by the waveform detection section 1272.

The vertical control unit 1262 and the horizontal control unit 1263 read out the outputs from the respective pixels by controlling the pixels. The outputs that have been read out are subjected to signal processing by the signal processing unit 1264 and then outputted as image data.

(Configuration Example of Imaging Device)

In addition, the photodetector described above is applicable to a solid-state imaging device 1010A, for example, illustrated in FIG. 159.

The solid-state imaging device 1010A has a structure in which a sensor board 1020 and a circuit board 1030 are vertically stacked. The photodetector described above is applicable, for example, as a light receiver of a sensor unit 1021.

The sensor board 1020 includes, for example, the sensor unit 1021 and a row selection unit 1025. The sensor unit 1021 includes a plurality of sensors 1040 disposed in a matrix. Each of the sensors 1040 includes, for example, a photodiode 1041, a transfer transistor (that is also referred to as transfer gate) 1042, a reset transistor 1043, an amplification transistor 1044, a selection transistor 1045, and a floating diffusion region section (FD) 1046. The row selection unit 1025 selects the respective sensors 1040 of the sensor unit 1021 row by row on the basis of an address signal supplied from the circuit board 1030 side. It is to be noted that the row selection unit 1025 is provided to the sensor board 1020 here, but it is also possible to provide the row selection unit 1025 to the circuit board 1030.

The circuit board 1030 includes, for example, a signal processing unit 1031, a memory unit 1032, a data processing unit 1033, a control unit 1034, a current source 1035, a decoder 1036, a row decoder 1037, an interface (IF) unit 1038, and the like. In addition, there is provided a sensor drive unit (not illustrated) that drives the respective sensors 1040 of the sensor unit 1021.

The signal processing unit 1031 is able to perform predetermined signal processing, for example, on analog signals in parallel (column parallel) in units of sensor columns. The analog signals are read out for each of the sensor rows from the respective sensors 1040 of the sensor unit 1021. The predetermined signal processing includes digitization (AD conversion). The signal processing unit 1031 then includes an analog-digital converter (an AD converter) 1050 that digitizes the analog signals read out from the respective sensors 1040 of the sensor unit 1021 to signal lines 1026. The signal processing unit 1031 transfers image data (digital data) subjected to the AD conversion to the memory unit 1032.

As the signal lines 1026, for example, a row control line is provided for each of the sensor rows and a column signal line (a vertical signal line) is provided for each of the sensor columns for the sensor unit 1021 in which the sensors 1040 are arranged in a matrix.

It is to be noted that the signal processing unit 1031 may further include a reference voltage generation section 1054 that generates reference voltage to be used for AD conversion by the AD converter 1050. The reference voltage generation section 1054 includes, for example, a DA converter (a digital-analog converter), but this is not limitative.

The AD converter 1050 includes, for example, a comparator (a comparator) 1051 and a counter section 1052. The comparator 1051 uses an analog signal read out from each of the sensors 1040 of the sensor unit 1021 through the signal line 1026 as a comparison input and uses reference voltage supplied from the reference voltage generation section 1054 as a reference input to compare both of the inputs.

For example, an up/down counter is used as the counter section 1052. The counter section 1052 is supplied with a clock CK at the same timing as the start timing to supply the comparator 1051 with reference voltage. The counter section 1052 that is an up/down counter performs down count or up count in synchronization with the clock CK to measure the period of the pulse width of an output pulse of the comparator 1051 (i.e., the comparison period from the start of a comparison operation to the end of the comparison operation). A count result (a count value) of the counter section 1052 is then a digital value (image data) obtained by digitizing the analog signal.

A data latch unit 1055 latches the image data digitized by the AD converter 1050. The memory unit 1032 stores the image data subjected to the predetermined signal processing by the signal processing unit 1031. The data processing unit 1033 reads out the pieces of image data stored in the memory unit 1032 in predetermined order, performs various kinds of processing on the image data, and outputs the image data to the outside of the chip through the interface (IF) 1038.

The control unit 1034 controls the respective operations of the sensor drive unit (not illustrated) and the signal processing unit 1031 such as the memory unit 1032 and the data processing unit 1033, for example, on the basis of a horizontal synchronization signal XHS, a vertical synchronization signal XVS, and a reference signal such as a master clock MCK provided from the outside of the chip. The control unit 1034 then performs control while synchronizing circuits (such as the row selection unit 1025 and the sensor unit 1021) on the sensor board 1020 side and the signal processing unit 1031 (such as the memory unit 1032 and the data processing unit 1033) on the circuit board 1030 side.

The respective signal lines 1026 are coupled to the current source 1035. Analog signals are read out for each of the sensor columns, for example, from the respective sensors 1040 of the sensor unit 1021 through the respective signal lines 1026. The current source 1035 has a configuration of a load MOS circuit including a MOS transistor in which a gate potential is biased to a constant potential, for example, to supply a predetermined current to the signal line 1026. The current source 1035 including such a load MOS circuit supplies a constant current to the amplification transistor 1044 of each of the sensors 1040 included in a selected row to bring the amplification transistor 1044 into operation as a source follower.

In a case where the respective sensors 1040 of the sensor unit 1021 are selected row by row on the basis of the control of the control unit 1034, the decoder 1036 provides the row selection unit 1025 with an address signal that designates the address of the selected row. The row decoder 1037 designates a row address for writing image data to the memory unit 1032 or reading out image data from the memory unit 1032 on the basis of the control of the control unit 1034.

The sensor board 1020 and the circuit board 1030 are electrically coupled through a coupling section such as TSV (Through-Silicon Via) that extends, for example, through a semiconductor substrate. For coupling using the TSV, for example, it is possible to use a so-called Twin TSV system in which the two TSVs of TSV provided to the sensor board 1020 and TSV provided from the sensor board 1020 to the circuit board 1030 are coupled with the front surfaces of the chips facing the outside, a so-called Shared TSV system in which the sensor board 1020 and the circuit board 1030 are coupled to each other by a TSV that extends from the sensor board 1020 to the circuit board 1030, or the like.

In addition, the sensor board 1020 and the circuit board 1030 are electrically coupled, for example, through a coupling section such as a so-called metal junction in which electrode pads formed on the respective junction surfaces of the sensor board 1020 and the circuit board 1030 are bonded together. The electrode pads are then formed by using metal such as copper and this is also referred to as Cu—Cu junction. In addition, a bump junction or the like is also usable for the coupling section between the sensor board 1020 and the circuit board 1030.

A solid-state imaging device to which the photodetector described above is applied may have, for example, the cross-sectional structure illustrated in each of FIGS. 160A and 160B. FIG. 160A is a cross-sectional configuration example of an effective pixel and FIG. 160B is a cross-sectional configuration example of a light shielding pixel.

As illustrated in FIGS. 160A and 160B, a solid-state imaging device 1300 to which the photodetector is applied is provided to have a stacked structure in which a lower substrate 1320 and an upper substrate 1310 are stacked. The lower substrate 1320 and the upper substrate 1310 are electrically coupled at a CuCu junction section 1370 including a coupling structure in which metal electrodes are bonded to each other.

The lower substrate 1320 includes a circuit section 1380 including a logic circuit such as a signal readout circuit and a signal processing circuit and a memory circuit.

The upper substrate 1310 includes a wiring section 1360, a pixel section 1350, a back surface electrode section 1340, and a light incidence section 1330. The upper substrate 1310 is provided by stacking the wiring section 1360, the pixel section 1350, the back surface electrode section 1340, and the light incidence section 1330 in order from the stacked surface side with the lower substrate 1320.

The wiring section 1360 includes a wiring layer 1361 and an interlayer insulating film 1362. The wiring section 1360 transmits an output from each of the pixels included in the pixel section 1350 to the circuit section 1380 through the CuCu junction section 1370.

The pixel section 1350 includes a first region 1351 of the first electrical conduction type (N+), a second region 1352 of the second electrical conduction type (P+), a third region 1353 of the third electrical conduction type (i), and a pixel separation layer 1355 that electrically separates pixels. The pixel section 1350 converts the light entering the solid-state imaging device 1300 to a signal and outputs the signal to the wiring section 1360.

The back surface electrode section 1340 includes a first electrode 1342 that is electrically coupled to the first region 1351 and an insulating film 1341 in which the first electrode 1342 is buried and planarized. In the effective pixel illustrated in FIG. 160A, the first electrode 1342 is provided to have the pixel's incidence surface of light open. In contrast, in the light shielding pixel (the optical black pixel corresponding to the reference pixel OBP described above) illustrated in FIG. 160B, the first electrode 1342 is provided to cover the pixel's incidence surface of light to block light entering the pixel.

The light incidence section 1330 includes a color filter 1332 and an on-chip lens 1331. The color filter 1332 controls the wavelength band of light entering the pixel section 1350 for each of the pixels. The on-chip lens 1331 condenses the incident light at the center of the pixel.

It is to be noted that it may be optionally selected whether or not the color filter 1332 and the on-chip lens 1331 are provided depending on an application of the solid-state imaging device 1300 such as ToF or sensing.

In addition, a portion of the circuits included in the circuit section 1380 may be provided to the upper substrate 1310. Alternatively, all of the circuits included in the circuit section 1380 may be provided to the same substrate as that of the pixel section 1350. In such a case, the circuit section 1380 is provided in the peripheral region of the pixel region in which the pixel section 1350 is arranged.

(Configuration Example of Distance Image Sensor)

FIG. 161 is a block diagram illustrating a configuration example of a distance image sensor that is an electronic apparatus using a sensor chip in which the photodetector described above is used.

As illustrated in FIG. 161, the distance image sensor 2201 includes an optical system 2202, a sensor chip 2203, an image processing circuit 2204, a monitor 2205, and a memory 2206. Then, after light is projected onto a subject from a light source device 2211, the distance image sensor 2201 receives the light (the modulated light or the pulsed light) reflected on the front surface of the subject. This allows the distance image sensor 2201 to acquire a distance image corresponding to the distance to the subject.

The optical system 2202 includes one or more lenses. The optical system 2202 guides image light (incident light) from the subject to the sensor chip 2203 to form an image on the light receiving surface (the sensor unit) of the sensor chip 2203.

As the sensor chip 2203, the photodetector described above may be applied. A distance signal and a light emission timing signal are supplied to the image processing circuit 2204. The distance signal is obtained from a light reception signal outputted from the sensor chip 2203 and indicates distance. The light emission timing signal is outputted from the light source device 2211.

The image processing circuit 2204 performs image processing for constructing a distance image on the basis of the light emission timing signal supplied from the light source device 2211 and the distance signal supplied from the sensor chip 2203. The distance image (the image data) resulting from the image processing is supplied to the monitor 2205 and displayed on the monitor 2205 or supplied to the memory 2206 and stored (recorded) in the memory 2206.

The application of the photodetector described above to the distance image sensor 2201 configured in this way makes it possible to acquire, for example, a more accurate distance image with an increase in the characteristics of the DPD pixel.

(Configuration Example of Distance Measurement Module)

FIG. 162 is a block diagram illustrating a configuration example of a distance measurement module that outputs distance measurement information by using the photodetector.

The distance measurement module 1000 includes a light emitting unit 1011, a light emission control unit 1012, and a light receiving unit 1013.

The light emitting unit 1011 includes a light source that emits light having a predetermined wavelength. The light emitting unit 1011 emits irradiation light whose brightness periodically changes and irradiates an object with the irradiation light. For example, the light emitting unit 1011 includes a light emitting diode as a light source. The light emitting diode emits infrared light having a wavelength in a range of 780 nm to 1000 nm. The light emitting unit 1011 emits the irradiation light in synchronization with a light emission control signal CLKp of a rectangular wave supplied from the light emission control unit 1012.

It is to be noted that the light emission control signal CLKp is not limited to a rectangular wave as long as the light emission control signal CLKp is a periodic signal. For example, the light emission control signal CLKp may be a sine wave.

The light emission control unit 1012 supplies the light emission control signal CLKp to the light emitting unit 1011 and the light receiving unit 1013 and controls the irradiation timing of the irradiation light. The frequency of this light emission control signal CLKp is, for example, 20 megahertz (MHz). It is to be noted that the frequency of the light emission control signal CLKp is not limited to 20 megahertz (MHz), but may be 5 megahertz (MHz) or the like.

The light receiving unit 1013 receives reflected light that has been reflected from an object, calculates distance information for each of the pixels in accordance with a result of the light reception, generates a depth image in which the distance to the object is represented by a gradation value for each of the pixels, and outputs the depth image.

The photodetector described above is used for the light receiving unit 1013. The solid-state imaging element serving as the light receiving unit 1013 calculates distance information for each of the pixels from the signal strength detected by the respective pixels in the pixel array unit, for example, on the basis of the light emission control signal CLKp.

As described above, it is possible to incorporate the photodetector described above as the light receiving unit 1013 of the distance measurement module 1000 that obtains and outputs distance information regarding the distance to the subject, for example, in an indirect ToF method. The photodetector described above is adopted as the light receiving unit 1013 of the distance measurement module 1000. This makes it possible to increase the distance measurement characteristics as the distance measurement module 1000.

As described above, the photodetector described above includes a distance measurement module, thereby making it possible to increase the distance measurement characteristics.

9. Appendix

The example has been described above in which electrons are used as chiefly signal carriers in the photodetector, but it is also possible to use holes as signal carriers.

Here, FIG. 163A illustrates a configuration of the photodetector 10 in which electrons are used as signal carriers and FIG. 163B illustrates a configuration of a photodetector 10A in which holes are used as signal carriers.

As illustrated in FIG. 163A, the photodetector 10 includes, for example, the first region 11 of the N+ type, the second region 12 of the P+ type, the third region 13 of the i type, the first electrode 21 electrically coupled to the first region 11, the pixel separation layer 15 that separates pixels, the second electrode 22 electrically coupled to the second region 12, and the control gate 25 and the gate insulating film 26 that control the potential of the third region 13.

In the photodetector 10 illustrated in FIG. 163A, the second region 12 provided to detect a signal carrier is configured as a P+ type semiconductor region and the first region 11 provided to generate an electric field in the substrate is configured as an N+ semiconductor region. This allows the photodetector 10 to detect an electron in the second region 12 as a signal carrier.

In contrast, as illustrated in FIG. 163B, the photodetector 10A includes, for example, the first region 11A of the P+ type, the second region 12A of the N+ type, the third region 13 of the i type, the first electrode 21 electrically coupled to the first region 11, the pixel separation layer 15 that separates pixels, the second electrode 22 electrically coupled to the second region 12, and the control gate 25 and the gate insulating film 26 that control the potential of the third region 13.

In the photodetector 10A illustrated in FIG. 163B, the second region 12A provided to detect a signal carrier is configured as an N+ type semiconductor region and the first region 11A provided to generate an electric field in the substrate is configured as a P+ semiconductor region. This allows the photodetector 10A to detect a hole in the second region 12A as a signal carrier.

The technology according to the present disclosure relates to a semiconductor device such as an image sensor whose possible application includes imaging and sensing. Specifically, the technology according to the present disclosure relates to a photodetector that is able to perform an operation such as photon count and ToF (Time-of-Flight).

The photodetector according to the present disclosure is configured as a back-illuminated CMOS image sensor. This makes it possible to decrease wiring lines on the light incidence surface side and increase the aperture ratio of the light receiving unit. This increases the sensitivity of a sensor of the photodetector.

It is to be noted that the technology according to the present disclosure also allows for a combination of the embodiments described above as appropriate. In addition, depending on which of the characteristics, for example, such as the sensitivity of a pixel or the operation mode of a sensor is prioritized, it is possible to appropriately select a variety of technical features such as how many electric charge detection sections (such as the first regions or the second regions) and voltage application sections (such as cathode electrodes or anode electrodes) are provided in the pixels, where electric charge detection sections (such as the first regions or the second regions) and voltage application sections (such as cathode electrodes or anode electrodes) are disposed in the pixels, what shape an electric charge detection section has, where an electric charge detection section is disposed, whether or not a portion or all of an anode electrode, a cathode electrode, a pixel transistor, a logic circuit section, and a memory circuit section are structured to be shared between a plurality of pixels, whether or not an on-chip lens and a color filter are provided, whether or not an inter-pixel light shielding section is provided, whether or not a separation region is provided, what shape an inter-pixel light shielding section or a separation region has, how deep an inter-pixel light shielding section or a separation region is provided, what thickness an on-chip lens and a substrate have, what type of substrate is provided, what film design a substrate has, whether or not any bias is applied to the incidence surface, and whether or not a reflecting member is provided.

The technology according to the present disclosure has been described above with reference to the first to seventh embodiments and the modification examples. The technology according to the present disclosure is not, however, limited to the embodiments or the like described above, but a variety of modifications are possible.

Further, not all of the components and operations described in the respective embodiments are necessary as the components and operations according to the present disclosure. For example, among components according to the respective embodiments, a component that is not described in an independent claim reciting the most generic concept of the present disclosure should be understood as an optional component.

Terms used throughout this specification and the appended claims should be construed as "non-limiting" terms. For example, the term "including" or "included" should be construed as "not limited to what is described as being included". The term "having" should be construed as "not limited to what is described as being had".

The terms used herein are used merely for the convenience of description and include terms that are not used to limit the configuration and the operation. For example, the terms such as "right", "left", "up", and "down" only indicate directions in the drawings being referred to. In addition, the terms "inside" and "outside" only indicate a direction toward the center of a component of interest and a direction away from the center of a component of interest, respectively. The same applies to terms similar to these and to terms with the similar purpose.

It is to be noted that the technology according to the present disclosure may have the following configurations. The technology according to the present disclosure having the following configurations allows the first electrode extending from the second surface of the semiconductor substrate in the thickness direction of the semiconductor substrate to be electrically coupled to the first region on the bottom surface and allows the second electrode to be electrically coupled to the second region from the second surface side of the semiconductor substrate. This allows the photodetector according to the present embodiment to increase the aperture ratio of the light incidence surface side. It is thus possible to increase the detection characteristics of incident light. Effects attained by the technology according to the present disclosure are not necessarily limited to the effects described herein, but may include any of the effects described in the present disclosure.

(1)
A photodetector including
a plurality of photoelectric conversion sections that is provided to a semiconductor substrate, in which
the photoelectric conversion sections each include
a first region of a first electrical conduction type that is provided on a first surface side of the semiconductor substrate,
a second region of a second electrical conduction type that is provided on a second surface side of the semiconductor substrate opposite to the first surface,
a third region of a third electrical conduction type that is provided in a region between the first region and the second region of the semiconductor substrate, the third region absorbing incident light,
a first electrode that extends from the second surface in a thickness direction of the semiconductor substrate, the first electrode being electrically coupled to the first region on a bottom surface,
a pixel separation layer having an insulation property, the pixel separation layer being provided to a side surface of the first electrode, and
a second electrode that is electrically coupled to the second region from the second surface side.

(2)
The photodetector according to (1), further including:
an upper first electrode that extends from the bottom surface of the first electrode to the first surface, the upper first electrode being less than the first electrode in width; and
an upper pixel separation layer having an insulation property, the upper pixel separation layer being provided to a side surface of the upper first electrode.

(3)
The photodetector according to (1) or (2), in which the first electrode and the pixel separation layer are provided between the adjacent photoelectric conversion sections.

(4)
The photodetector according to (3), in which the first electrode is electrically coupled to the first region of each of the adjacent photoelectric conversion sections on the bottom surface.

(5)
The photodetector according to any one of (1) to (4), in which formation depth of the first electrode from the second surface is greater than formation depth of the second region from the second surface.

(6)
The photodetector according to any one of (1) to (5), further including a gate electrode that is provided to the second surface of the semiconductor substrate with a gate insulating film interposed in between.

(7)
The photodetector according to (6), in which the gate electrode includes a vertical gate electrode that is provided by digging the semiconductor substrate in the thickness direction.

(8)
The photodetector according to any one of (1) to (7), further including a potential control region of the first electrical conduction type that is provided on the second surface side of the semiconductor substrate with the second region and an insulating layer interposed in between, the potential control region being configured to control a potential.

(9)
The photodetector according to any one of (1) to (8), in which the first regions and the second regions are different from each other between the respective photoelectric conversion sections in formation depth in the thickness direction of the semiconductor substrate.

(10)
The photodetector according to any one of (1) to (9), further including a multilayer wiring layer that is stacked on the second surface of the semiconductor substrate.

(11)
The photodetector according to (10), in which the multilayer wiring layer includes a light shielding structure that extends in an in-plane direction of the semiconductor substrate.

(12)
The photodetector according to any one of (1) to (11), further including an uneven structure that is provided to the first surface of the semiconductor substrate, the uneven structure scattering or diffracting the incident light.

(13)
The photodetector according to any one of (1) to (12), further including:
a floating diffusion region of the second electrical conduction type that is provided on the second surface side of the semiconductor substrate; and
a transfer gate transistor that is provided between the second region and the floating diffusion region, the transfer gate transistor controlling transfer of electric charge from the second region to the floating diffusion region.

(14)
The photodetector according to (13), further including:
an overflow drain region of the second electrical conduction type that is provided on an opposite side to the floating diffusion region with the second region interposed in between; and
an overflow gate transistor that is provided between the second region and the overflow drain region, the overflow gate transistor controlling transfer of electric charge from the second region to the overflow drain region.

(15)
The photodetector according to any one of (1) to (14), further including a pinning layer that is provided at an interface between the semiconductor substrate and an insulative material, in which
the pinning layer includes a layer having an electrostatic property or a layer of the second electrical conduction type.

(16)
The photodetector according to any one of (1) to (15), further including:
a fourth region of the first electrical conduction type that is provided closer to the first surface side than the second region, the fourth region being provided in contact with the second region; and
an insulating layer that surrounds a junction surface between the second region and the fourth region in an in-plane direction of the semiconductor substrate.

(17)
The photodetector according to any one of (1) to (15), further including:
a fourth region of the first electrical conduction type that is provided closer to the first surface side than the second region, the fourth region being provided in contact with the second region; and
a fifth region of the second electrical conduction type that is provided closer to the second surface side than the first region, the fifth region being provided in contact with the first region.

(18)
The photodetector according to any one of (1) to (17), in which a plurality of the photoelectric conversion sections includes the photoelectric conversion section of a reference pixel and the photoelectric conversion section of a normal pixel, the reference pixel being provided with a light shielding section on an incidence surface of the incident light, the normal pixel not being provided with the light shielding section.

(19)
The photodetector according to (18), in which the reference pixel is provided to be adjacent to the normal pixel.

(20)
The photodetector according to any one of (1) to (19), in which the first electrode includes a cathode electrode and the second electrode includes an anode electrode.

(30)
A photodetector including
a plurality of photoelectric conversion sections that is provided to a semiconductor substrate, in which
the photoelectric conversion sections each include
a first region of a first electrical conduction type that is provided on a first surface side of the semiconductor substrate,
a second region of a second electrical conduction type that is provided on a second surface side of the semiconductor substrate opposite to the first surface, a third region of a third electrical conduction type
that is provided in a region between the first region
and the second region of the semiconductor substrate, the third region absorbing incident light,
a third electrode and a fourth electrode that each
extend from the second surface in a thickness
direction of the semiconductor substrate,
a plurality of through insulating layers that extends
from respective bottom surfaces of the third electrode and the fourth electrode to the first surface,
the plurality of through insulating layers being
less than the third electrode and the fourth electrode in width,
a pixel separation layer having an insulation property, the pixel separation layer being provided to
respective side surfaces of the third electrode and
the fourth electrode,
a potential control region of the second electrical
conduction type that is electrically coupled to a
bottom surface of the third electrode exposed from
the through insulating layer,
a reset region of the first electrical conduction type
that is electrically coupled to a bottom surface of
the fourth electrode exposed from the through
insulating layer,
a first electrode that is electrically coupled to the first
region from the first surface side, and
a second electrode that is electrically coupled to the
second region from the second surface side.

(31)
A photodetector including
a plurality of photoelectric conversion sections that is
provided to a semiconductor substrate, in which
the photoelectric conversion sections each include
a first region of a first electrical conduction type that
is provided to the semiconductor substrate, the
first region being electrically coupled to a first
electrode,
a second region of a second electrical conduction
type that is provided to the semiconductor substrate to be isolated from the first region, the
second region being electrically coupled to a second electrode,
a fourth region of the first electrical conduction type
that is provided in contact with the second region
in a depth direction of the semiconductor substrate,
an insulating layer that surrounds a junction surface
between the second region and the fourth region in
an in-plane direction of the semiconductor substrate, and
a third region of a third electrical conduction type
that is provided to the semiconductor substrate,
the third region absorbing incident light.

(32)
A photodetector including
a plurality of photoelectric conversion sections that is
provided to a semiconductor substrate, in which
the photoelectric conversion sections each include
a first region of a first electrical conduction type that
is provided to the semiconductor substrate, the
first region being electrically coupled to a first
electrode,
a second region of a second electrical conduction
type that is provided to the semiconductor substrate to be isolated from the first region, the
second region being electrically coupled to a second electrode,
a fifth region of the second electrical conduction type
that is provided on a side of the first region on
which the second region is provided, the fifth
region being provided in contact with the first
region,
a fourth region of the first electrical conduction type
that is provided on a side of the second region on
which the first region is provided, the fourth
region being provided in contact with the second
region, and
a third region of a third electrical conduction type
that is provided in a region between the fourth
region and the fifth region of the semiconductor
substrate, the third region absorbing incident light.

(33)
A photodetector including
a plurality of photoelectric conversion sections that is
provided to a semiconductor substrate, in which
the photoelectric conversion sections each include
a first region of a first electrical conduction type that
is provided to the semiconductor substrate, the
first region being electrically coupled to a first
electrode,
a second region of a second electrical conduction
type that is provided to the semiconductor substrate to be isolated from the first region, the
second region being electrically coupled to a second electrode,
a third region of a third electrical conduction type
that is provided in a region between the first region
and the second region of the semiconductor substrate, the third region absorbing incident light,
and
a pinning layer that is provided at an interface
between a front surface of the semiconductor
substrate corresponding to the third region and an
insulative material as a layer having an electrostatic property or a layer of the second electrical
conduction type.

(34)
A photodetector including
a plurality of photoelectric conversion sections that is
provided to a semiconductor substrate, in which
the photoelectric conversion sections each include
a first region of a first electrical conduction type that
is provided on a first surface side of the semiconductor substrate, the first region being electrically
coupled to a first electrode,
a second region of a second electrical conduction
type that is provided on a second surface side of
the semiconductor substrate opposite to the first
surface, the second region being electrically
coupled to a second electrode,
a third region of a third electrical conduction type
that is provided in a region between the first region
and the second region of the semiconductor substrate, the third region absorbing incident light,
a floating diffusion region of the second electrical
conduction type that is provided on the second
surface side of the semiconductor substrate, and
a transfer gate transistor that is provided between the
second region and the floating diffusion region,
the transfer gate transistor controlling transfer of electric charge from the second region to the floating diffusion region.

(35) A photodetector including a plurality of photoelectric conversion sections each including a first region of a first electrical conduction type that is provided to a semiconductor substrate, the first region being electrically coupled to a first electrode, a second region of a second electrical conduction type that is provided to the semiconductor substrate to be isolated from the first region, the second region being electrically coupled to a second electrode, and a third region of a third electrical conduction type that is provided in a region between the first region and the second region of the semiconductor substrate, the third region absorbing incident light, in which a plurality of the photoelectric conversion sections includes the photoelectric conversion section of a reference pixel and the photoelectric conversion section of a normal pixel, the reference pixel being provided with a light shielding section on an incidence surface of the incident light, the normal pixel not being provided with the light shielding section, and the reference pixel is provided to be adjacent to the normal pixel.

This application claims the benefit of U.S. Provisional Patent Application No. 62/873,527 filed with the United States Patent and Trademark Office on Jul. 12, 2019, U.S. Provisional Patent Application No. 62/880,214 filed with the United States Patent and Trademark Office on Jul. 30, 2019, and U.S. Provisional Patent Application No. 62/880,497 filed with the United States Patent and Trademark Office on Jul. 30, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A photodetector, comprising:
a plurality of photoelectric conversion sections that is provided to a semiconductor substrate, wherein the photoelectric conversion sections comprise:
a first region of a first electrical conduction type that is provided on a first surface side of the semiconductor substrate;
a second region of a second electrical conduction type that is provided on a second surface side of the semiconductor substrate opposite to the first surface side of the semiconductor substrate;
a third region of a third electrical conduction type that is provided in a region between the first region and the second region of the semiconductor substrate, the third region directly abutting the first region and the second region and absorbing incident light;
a first electrode extending adjacent a portion of the third region from the second surface side of the semiconductor substrate, the first electrode being electrically coupled to the first region on bottom surfaces thereof;
a pixel separation layer having an insulation property, the pixel separation layer being provided between and abutting side surfaces of the first electrode and the third region; and
a second electrode that is electrically coupled to the second region on the second surface side of the semiconductor substrate.

2. The photodetector according to claim 1, further comprising:
an upper first electrode that extends from the bottom surface of the first electrode to the first surface side of the semiconductor substrate, the upper first electrode being less than the first electrode in width; and
an upper pixel separation layer having an insulation property, the upper pixel separation layer being provided to a side surface of the upper first electrode between the upper first electrode and the first region.

3. The photodetector according to claim 1, wherein the first electrode and the pixel separation layer are provided between adjacent photoelectric conversion sections.

4. The photodetector according to claim 3, wherein the first electrode is electrically coupled to the first region of each of the adjacent photoelectric conversion sections on bottom surfaces thereof.

5. The photodetector according to claim 1, wherein formation depth of the first electrode from the second surface side of the semiconductor substrate is greater than formation depth of the second region from the second surface side of the semiconductor substrate.

6. The photodetector according to claim 1, further comprising a gate electrode that is provided on the second surface side of the semiconductor substrate with a gate insulating film interposed in between.

7. The photodetector according to claim 6, wherein the gate electrode comprises a vertical gate electrode that is provided by digging the semiconductor substrate in a thickness direction.

8. The photodetector according to claim 1, further comprising a potential control region of the first electrical conduction type that is provided on the second surface side of the semiconductor substrate with the second region and an insulating layer interposed in between, the potential control region being configured to control a potential.

9. The photodetector according to claim 1, wherein the first regions and the second regions are different from each other between the respective photoelectric conversion sections in formation depth in a thickness direction of the semiconductor substrate.

10. The photodetector according to claim 1, further comprising a multilayer wiring layer that is stacked on the second surface of the semiconductor substrate.

11. The photodetector according to claim 10, wherein the multilayer wiring layer comprises a light shielding structure that extends in an in-plane direction of the semiconductor substrate.

12. The photodetector according to claim 1, further comprising an uneven structure that is provided to the first surface of the semiconductor substrate, the uneven structure scattering or diffracting the incident light.

13. The photodetector according to claim 1, further comprising:
a floating diffusion region of the second electrical conduction type that is provided on the second surface side of the semiconductor substrate; and
a transfer gate transistor that is provided between the second region and the floating diffusion region, the transfer gate transistor controlling transfer of electric charge from the second region to the floating diffusion region.

14. The photodetector according to claim 13, further comprising:
an overflow drain region of the second electrical conduction type that is provided on an opposite side to the floating diffusion region with the second region interposed in between; and
an overflow gate transistor that is provided between the second region and the overflow drain region, the overflow gate transistor controlling transfer of electric charge from the second region to the overflow drain region.

15. The photodetector according to claim 1, further comprising a pinning layer that is provided at an interface between the semiconductor substrate and an insulative material, wherein the pinning layer comprises a layer having an electrostatic property or a layer of the second electrical conduction type.

16. The photodetector according to claim 1, further comprising:
a fourth region of the first electrical conduction type that is provided closer to the first surface side than the second region, the fourth region being provided in contact with the second region; and
an insulating layer that surrounds a junction surface between the second region and the fourth region in an in-plane direction of the semiconductor substrate.

17. The photodetector according to claim 1, further comprising:
a fourth region of the first electrical conduction type that is provided closer to the first surface side than the second region, the fourth region being provided in contact with the second region; and
a fifth region of the second electrical conduction type that is provided closer to the second surface side than the first region, the fifth region being provided in contact with the first region.

18. The photodetector according to claim 1, wherein a plurality of the photoelectric conversion sections comprises the photoelectric conversion section of a reference pixel and the photoelectric conversion section of a normal pixel, the reference pixel being provided with a light shielding section on an incidence surface of the incident light, the normal pixel not being provided with the light shielding section.

19. The photodetector according to claim 18, wherein the reference pixel is provided to be adjacent to the normal pixel.

20. The photodetector according to claim 1, wherein the first electrode comprises a cathode electrode and the second electrode includes an anode electrode.

* * * * *